(12) United States Patent
Ludwig

(10) Patent No.: US 10,546,382 B2
(45) Date of Patent: *Jan. 28, 2020

(54) ADVANCED LENSLESS LIGHT-FIELD IMAGING SYSTEMS FOR ENABLING A WIDE RANGE OF ENTIRELY NEW APPLICATIONS

(71) Applicant: NRI R&D PATENT LICENSING, LLC, San Antonio, TX (US)

(72) Inventor: Lester F. Ludwig, San Antonio, TX (US)

(73) Assignee: NRI R&D Patent Licensing, LLC, San Antonio, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/283,604

(22) Filed: Feb. 22, 2019

(65) Prior Publication Data
US 2019/0188875 A1   Jun. 20, 2019

Related U.S. Application Data

(63) Continuation of application No. 15/647,230, filed on Jul. 11, 2017, now Pat. No. 10,217,235.
(Continued)

(51) Int. Cl.
*G06T 7/557* (2017.01)
*H01L 27/30* (2006.01)
(Continued)

(52) U.S. Cl.
CPC ............ *G06T 7/557* (2017.01); *H01L 27/28* (2013.01); *H01L 27/288* (2013.01); *H01L 27/30* (2013.01);
(Continued)

(58) Field of Classification Search
CPC ........... G06T 7/557; G06T 2207/10052; G06T 2207/10024; H01L 27/288; H01L 27/307; H04N 9/045; H04N 5/3745; H04N 5/378
See application file for complete search history.

(56) References Cited

U.S. PATENT DOCUMENTS 4,424,524 A   1/1984   Daniele
4,692,739 A   9/1987   Dorn
(Continued)

FOREIGN PATENT DOCUMENTS

CA   2318395 A1   7/1999

OTHER PUBLICATIONS

R. H. Dicke, "Scatter-Hole Cameras for X-Rays and Gamma Rays," Astrophys. J. 153, L101 (1968).
(Continued)

*Primary Examiner* — Christopher K Peterson

(57) ABSTRACT

Continuing a sequence of lensless light-field imaging camera patents beginning 1999, the present invention adds light-use efficiency, predictive-model design, distance-parameterized interpolation, computational efficiency, arbitrary shaped surface-of-focus, angular diversity/redundancy, distributed image sensing, plasmon surface propagation, and other fundamentally enabling features. Embodiments can be fabricated entirely by printing, transparent/semi-transparent, layered, of arbitrary size/curvature, flexible/bendable, emit light, focus and self-illuminate at zero-separation distance between (planar or curved) sensing and observed surfaces, robust against damage/occultation, implement color sensing without use of filters or diffraction, overlay on provided surfaces, provided color and enhanced multi-wavelength color sensing, wavelength-selective imaging of near-infrared/near-ultraviolet, and comprise many other fundamentally enabling features. Embodiments can be thinner, larger/smaller, more light-use efficient, and higher-performance
(Continued)

than recently-popularized coded aperture imaging cameras. Vast ranges of diverse previously-impossible applications are enabled: credit-card cameras/phones, in-body monitoring of healing/disease, advanced biomarker analysis systems, perfect eye-contact video conferencing, seeing fabrics/skin/housings, and manufacturing-monitoring, wear-monitoring, and machine vision capabilities.

22 Claims, 97 Drawing Sheets

Related U.S. Application Data

(60) Provisional application No. 62/528,384, filed on Jul. 3, 2017, provisional application No. 62/360,472, filed on Jul. 11, 2016.

(51) Int. Cl.
| | | |
|---|---|---|
| *H01L 27/28* | (2006.01) | |
| *H04N 5/225* | (2006.01) | |
| *H04N 9/04* | (2006.01) | |
| *H04N 5/3745* | (2011.01) | |
| *H04N 5/378* | (2011.01) | |

(52) U.S. Cl.
CPC ............ *H01L 27/307* (2013.01); *H04N 5/225* (2013.01); *H04N 5/22541* (2018.08); *H04N 5/378* (2013.01); *H04N 5/3745* (2013.01); *H04N 9/045* (2013.01); *G06T 2207/10024* (2013.01); *G06T 2207/10052* (2013.01)

(56) References Cited

U.S. PATENT DOCUMENTS

| | | | |
|---|---|---|---|
| 5,340,978 | A | 8/1994 | Rostoker |
| 5,424,855 | A | 6/1995 | Nakamura |
| 5,929,845 | A | 7/1999 | Wei |
| 6,057,538 | A | 5/2000 | Clarke |
| 6,787,810 | B2 | 9/2004 | Choi |
| 6,867,821 | B2 | 3/2005 | De Schipper |
| 7,034,866 | B1 | 4/2006 | Colmenarez |
| 7,535,468 | B2 | 5/2009 | Uy |
| 7,598,949 | B2 | 10/2009 | Han |
| 7,859,526 | B2 | 12/2010 | Konicek |
| 8,026,879 | B2 | 9/2011 | Booth |
| 8,125,559 | B2 | 2/2012 | Ludwig |
| 8,284,290 | B2 | 10/2012 | Ludwig |
| 8,305,480 | B2 | 11/2012 | Ludwig |
| 8,754,842 | B2 | 6/2014 | Ludwig |
| 8,816,263 | B2 | 8/2014 | Ludwig |
| 8,830,375 | B2 | 9/2014 | Ludwig |
| 8,885,035 | B2 | 11/2014 | Ludwig |
| 8,890,850 | B2 | 11/2014 | Chung |
| 9,019,237 | B2 | 4/2015 | Ludwig |
| 9,160,894 | B2 | 10/2015 | Ludwig |
| 9,172,850 | B2 | 10/2015 | Ludwig |
| 9,594,019 | B1 | 3/2017 | Ludwig |
| 9,594,239 | B1 | 3/2017 | Ludwig |
| 9,632,344 | B2 | 4/2017 | Ludwig |
| 9,709,483 | B2 | 7/2017 | Ludwig |
| 9,735,303 | B2 | 8/2017 | Ludwig |
| 10,024,791 | B2 | 7/2018 | Ludwig |
| 10,217,235 | B2* | 2/2019 | Ludwig ................. G06T 7/557 |
| 2009/0256810 | A1 | 10/2009 | Pasquariello |
| 2012/0274596 | A1 | 11/2012 | Ludwig |
| 2017/0112376 | A1 | 4/2017 | Gill et al. |

OTHER PUBLICATIONS

E. Fenimore and T. Cannon, "Coded Aperture Imaging with Uniformly Redundant Arrays," Appl. Opt. 17, 337-347 (1978).
Fenimore, E, "Coded aperture imaging: predicted performance of uniformly redundant arrays" Applied Optics 17.22 (1978): 3562-3570.
A. Busboom, H. Elders-Boll, H. Schotten, "Uniformly Redundant Arrays," Experimental Astronomy, Jun. 1998, vol. 8, Issue 2, pp. 97-123.
R. Ng, M. Levoy, M. Bredif, G. Duval, M. Horowitz, P. Hanrahan, "Light Field Photography with a Hand-Held Plenoptic Camera," Stanford University Computer Science Tech Report CSTR 2005-02, 2005, pp. 1-11.
A. Veeraraghavan, et al. "Dappled photography: Mask enhanced cameras for heterodyned light fields and coded aperture refocusing." ACM Trans. Graph. 26.3 (2007): 69, pp. 1-12.
Gottesman, S. R., "Coded Apertures: Past, Present, and Future Application and Design." Optical Engineering Applications. International Society for Optics and Photonics, 2007, pp. 1-12.
R. Marcia, Z. Harmany R. Willett, "Compressive Coded Aperture Imaging," Computational Imaging VII, SPIE Proceedings vol. 7246 (72460G), Feb. 3, 2009, pp. 1-13.
M. Hirsch, BiDi Screen: Depth and Lighting Aware Interaction and Display MS Thesis, MIT, Aug. 13, 2009, pp. 1-4.
C. Zhou, S. Nayar, "Computational cameras: Convergence of Optics and Processing." IEEE Transactions on Image Processing 20. 12 (2011): 3322-3340.
R. Butler, "Lytro Light Field Camera first look with Ren Ng," Digital Photography Review, Oct. 19, 2011, pp. 1-9.
V. Koifman, "Toshiba Announces Light Field Camera Module," Image Sensors World, Dec. 27, 2012, pp. 1-7.
H. Jiang, G. Huang, P. Wilford, "Multi-view lensless compressive imaging," APSIPA Transactions on Signal and Information Processing, 3, (2014) doi:10. 1017/ATSIP.2014.16, pp. 1-4.
D. G. Stork, P. R. Gill. "Lensless Ultra-Miniature CMOS Computational Imagers and Sensors." Proc. SENSORCOMM (2013): 186-190.
T. Barribeau, "Shooting Full Panoramas Is Easy with Bendable Flexcam Camera," Imaging Resource, Aug. 19, 2013, pp. 1-4.
H. Everts, "A Flexible Camera: A Radically Different Approach to Imaging" Columbia Engineering, Apr. 13, 2016, pp. 1-4.
D. Sims, Y. Yue, S. Nayar, "Towards Flexible Sheet Cameras: Deformable Lens Arrays with Intrinsic Optical Adaptation," IEEE International Conference on Computational Photography (ICCP), May 2016, pp. 1-11.
LightField Forum, "New Light Field Tech to use Transparent Sensor Layers instead of Microlenses," LightField Forum, May 15, 2016, pp. 1-2.
M. J. Cieslak, "Coded-Aperture Imaging Systems: Past, Present, and Future Development—A Review," Radiation Measurements, vol. 92, Sep. 2016, pp. 59-71.
M. S. Asif, et al, "Flatcam: Thin, Lensless Cameras Using Coded Aperture and Computation." IEEE Transactions on Computational Imaging (2017), pp. 1-12.
Hitachi, "Lensless-Camera Technology for Easily Adjusting Focus on Video Images after Image Capture," Nov. 15, 2016, pp. 1-3.
D. L. Cade, "Hitachi's Lensless Camera Uses Moire and Math, Not Glass, to Take Photos", Hitachi Press Release, Nov. 16, 2016, pp. 1-11.
Hitachi, "Lensless-Camera Technology for Easily Adjusting Focus on Video Images after Image Capture", Hitachi Press Release, Nov. 15, 2016, pp. 1-4.
G. Kim, et al., "Lensless Photography with only an image sensor," arXiv preprint arXiv:1702.06619 (2017), pp. 1-16.
R. Perkins, "Ultra-Thin Camera Creates Images Without Lenses," CalTech, Jun. 21, 2017, pp. 1-2.
Bhattacharya, R., et al. "Organic LED Pixel Array on a Dome", Proceedings of the IEEE, vol. 93, Issue 7, Jul. 5, 2005, pp. 1273-1280.
Levoy, "Light Fields and Computational Imaging," IEEE Computer, vol. 39, Issue 8, Aug. 2006, pp. 46-55.
Vuuren, et al., "Organic Photodiodes: The Future of Full Color Detection and Image Sensing," Advanced Materials, vol. 28, Issue 24, Jun. 22, 2016, pp. 4766-4802.

(56) References Cited

OTHER PUBLICATIONS

Han, et al., "Narrow-Band Organic Photodiodes for High-Resolution Imaging," ACS Appl. Mater. Interfaces 2016, vol. 8, pp. 26143-26151.

Pierre, et al., "Charge-Integrating Organic Heterojunction Phototransistors for Wide-Dynamic-Range Image Sensors," Nature Photonics, vol. 11, No. 3, Feb. 2017, pp. 1-8.

Lui, et al., "Flexible Organic Phototransistor Array with Enhanced Responsivity via Metal-Ligand Charge Transfer," ACS Appl. Mater. Interfaces 2016, vol. 8, pp. 7291-7299.

Yokota, et al., "Ultraflexible Organic Photonic Skin," Science Advances, vol. 2, No. 4, pp. 1-9, Apr. 1, 2016.

Sirringhaus, "Materials and Applications for Solution-Processed Organic Field-Effect Transistors," Proceedings of the IEEE, vol. 97, No. 9, Sep. 2009, pp. 1570-1579.

\* cited by examiner

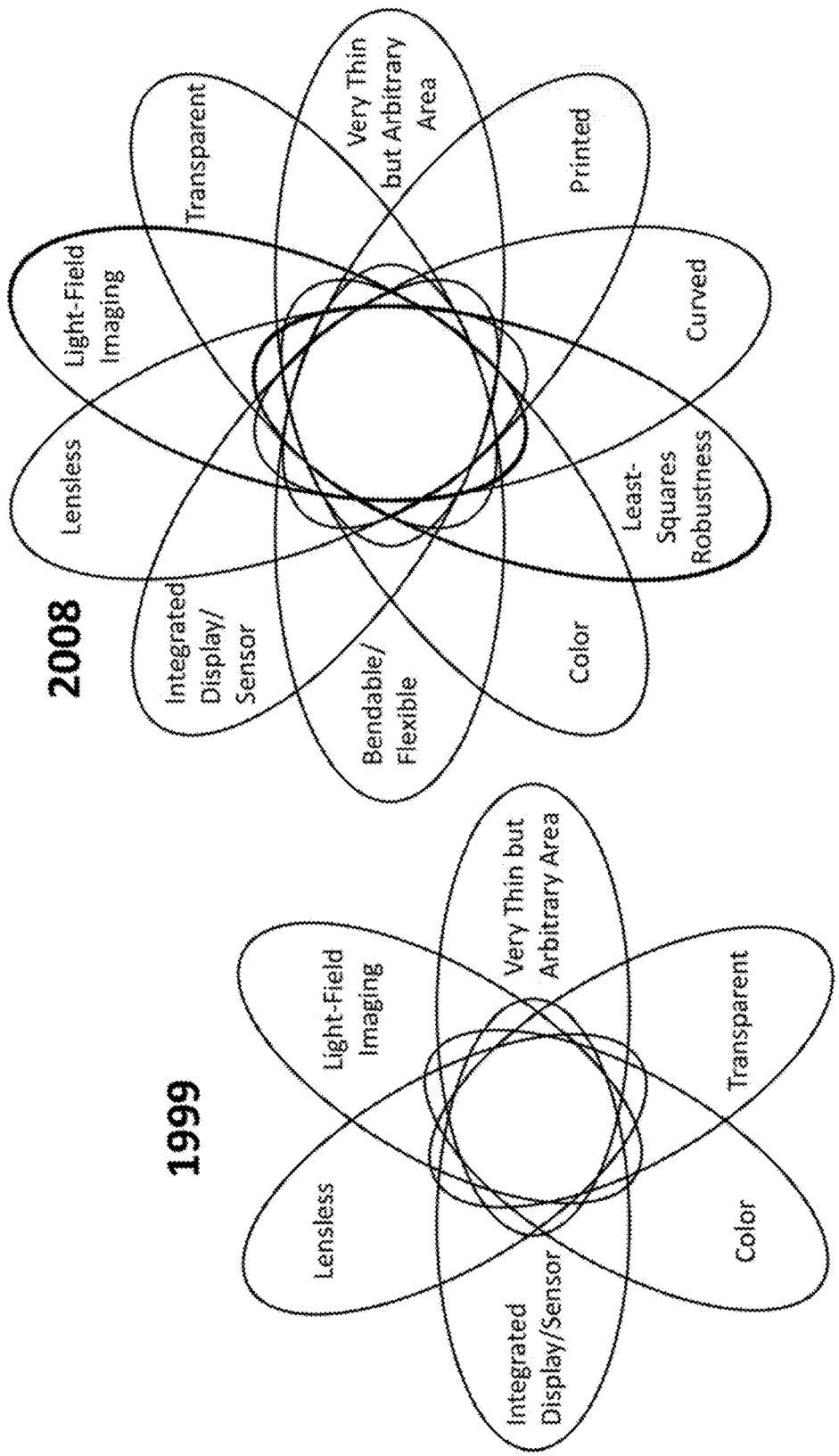

| Patent Number or Reference Citation | First Inventor / First Author | Priority or Publication Date | Patent/Publication Title |
|---|---|---|---|
| {W8} | Dicke | 1-Feb-68 | Scatter Hole Cameras for X-Rays and Gamma Rays |
| {W5a} | Fenimore | 1-Feb-78 | Coded Aperture Imaging with Uniformly Redundant Arrays |
| {W5b} | Fenimore | 15-Nov-78 | Coded Aperture Imaging: Predicted Performance of Uniformly Redundant Arrays |
| 4,424,524 | DANIELE | 3-Jul-82 | READ/WRITE BAR FOR MULTI-MODE REPRODUCTION MACHINE |
| 4,692,739 | DORN | 27-Jun-85 | CONTROL DEVICE USING LIGHT-EMITTING DIODES FOR BOTH MANUAL INPUT AND DISPLAY OF DATA |
| 5,340,978 | ROSTOKER | 30-Sep-92 | IMAGE-SENSING DISPLAY PANELS WITH LCD DISPLAY PANEL AND PHOTOSENSING E ELEMENT ARRAY |
| 5,424,855 | NAKAMURA | 4-May-94 | CONTROL CIRCUIT FOR ARRAY OF LIGHT-EMITTING DIODES |
| 5,929,845 | WEI | 3-Sep-96 | IMAGE SCANNER AND DISPLAY APPARATUS |
| 6,057,538 | CLARKE | 4-Sep-97 | IMAGE SENSOR IN WHICH EACH LENS ELEMENT IS ASSOCIATED WITH A PLURALITY OF PIXELS |
| {P31} | Busboom | 1-Jun-98 | Uniformly Redundant Arrays |
| | Present Inventor | 21-Jan-99 | Priority Date for of Inventor's 1999 Patent Family |
| 7,034,866 | COLMENAREZ | 12-Nov-00 | COMBINED DISPLAY-CAMERA FOR AN IMAGE PROCESSING SYSTEM |
| 6,867,821 | SCHIFFER | 26-Jul-01 | IMAGE-SENSING DISPLAY DEVICE WITH PARTICULAR LENS AND SENSOR ARRANGEMENT |
| 8,026,879 | BOOTH | 31-Dec-01 | ENERGY SENSING LIGHT EMITTING DIODE DISPLAY |
| 6,787,810 | CHOI | 15-Feb-03 | IMAGE INPUT/OUTPUT DEVICE FOR DISPLAYING AN IMAGE ON A SINGLE PANEL |
| 7,535,468 | UY | 21-Jun-04 | INTEGRATED SENSING DISPLAY |
| 7,598,949 | HAN | 22-Oct-04 | MULTI-TOUCH SENSING LIGHT EMITTING DIODE DISPLAY AND METHOD FOR USING THE SAME |
| {P40} | R. Ng | 1-Apr-05 | Light Field Photography with a Hand-Held Plenoptic Camera |
| 7,609,326 | KONICEK | 1-May-06 | ACTIVE MATRIX EMISSIVE DISPLAY AND OPTICAL SCANNER SYSTEM, METHODS AND APPLICATIONS |
| 8,896,850 | CHUNG | 12-Jul-07 | ORGANIC LIGHT-EMITTING DIODE PANEL AND TOUCH-SCREEN SYSTEM INCLUDING THE SAME |
| {W9} | Veeraraghavan | 29-Jul-07 | Dappled photography: Mask enhanced cameras for heterodyned light fields and coded aperture refocusing |
| {W6} | Gottesman | 26-Sep-07 | Coded apertures: past, present, and future application and design |
| | Present Inventor | 6-Apr-08 | First Priority Date for of Inventor's 2008-2009 Patent Family |
| 2009/0256818 | PASQUARIELLO | 15-Apr-08 | TOUCH SCREEN DISPLAY |
| | Present Inventor | 25-May-08 | Priority Date for of Inventor's Second 2008 Patent Family |
| {P32} | Marcia | 2-Feb-09 | Compressive coded aperture imaging |
| {P34} | Hirsch | 13-Aug-09 | BiDi Screen: Depth and Lighting Aware Interaction and Display |
| | Present Inventor | 1-Mar-10 | Priority Date for of Inventor's First 2010 Patent Family |
| {P35} | Grosse | 1-Mar-10 | Coded Aperture Projection |
| | Present Inventor | 9-Jul-10 | Priority Date for of Inventor's Second 2010 Patent Family |
| | Present Inventor | 20-Apr-10 | Priority Date for of Inventor's First 2011 Patent Family |
| | Present Inventor | 11-Jul-11 | Priority Date for of Inventor's Second 2011 Patent Family |
| {W7} | Zhou | 18-Oct-11 | Computational Cameras: Convergence of Optics and Processing |
| {P41} | Butler | 19-Oct-11 | Lytro Light Field Camera first look with Ren Ng |
| {P42} | Kaufman | 27-Dec-12 | Toshiba Announces Light Field Camera Module |
| {W10} | Jiang | 17-Jun-13 | Multi-View in Lensless Compressive Imaging |
| {P4} | Stork | 30-Aug-13 | Lensless Ultra-Miniature CMOS Computational Imagers and Sensors |
| {P36} | Bambeau | 15-Aug-13 | Shooting Full Panoramas is Easy with Bendable Flexcam Camera |
| {P37} | Evarts | 13-Apr-16 | A Flexible Camera: A Radically Different Approach to Imaging |
| {P38} | Sims | 1-May-16 | Towards Flexible Sheet Cameras: Deformable Lens Arrays with Intrinsic Optical Adaptation |
| {P43} | (Univ of Michigan) | 15-Mar-16 | New Light Field Tech to use Sensor Layers Instead of Microlenses |
| | Present Inventor | 11-Jul-16 | Priority Date for of Inventor's 2016 Patent Family |
| {W6} | Cieslak | 1-Sep-16 | Coded-Aperture Imaging Systems: Past, Present, and Future |
| {P5} | Asif | 1-Sep-16 | FlatCam: Thin, Lensless Cameras Using Coded Aperture and Computation |
| {P12} | Hitachi | 15-Nov-16 | Lensless-Camera Technology for Easily Adjusting Focus on Video Images after Image Capture |
| {P10} | Cade | 16-Nov-16 | Hitachi's Lensless Camera Uses Moire and Math, Not Glass, to Take Photos |
| {P14} | Hitachi | 21-Nov-16 | Lensless Camera Technology for Adjusting Video Focus After Image Capture |
| {P13} | Hitachi | 5-Dec-16 | Technical Explanation of Hitachi Lensless Camera |
| {W11} | Kim | 21-Feb-17 | Lensless Photography with only an image sensor |
| {P39} | Perkins | 21-Jun-17 | Ultra-Thin Camera Creates Images Without Lenses |

Figure 7

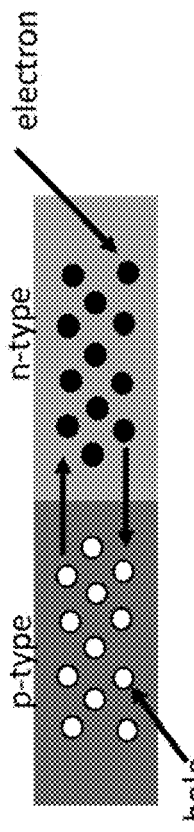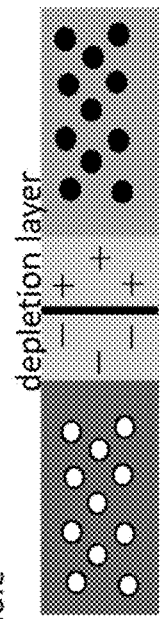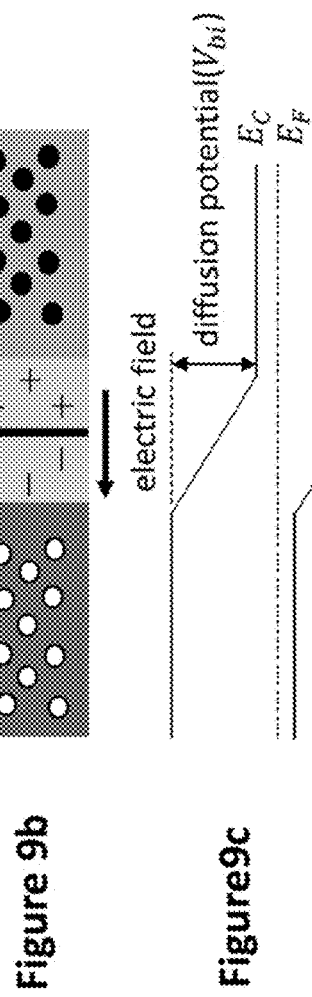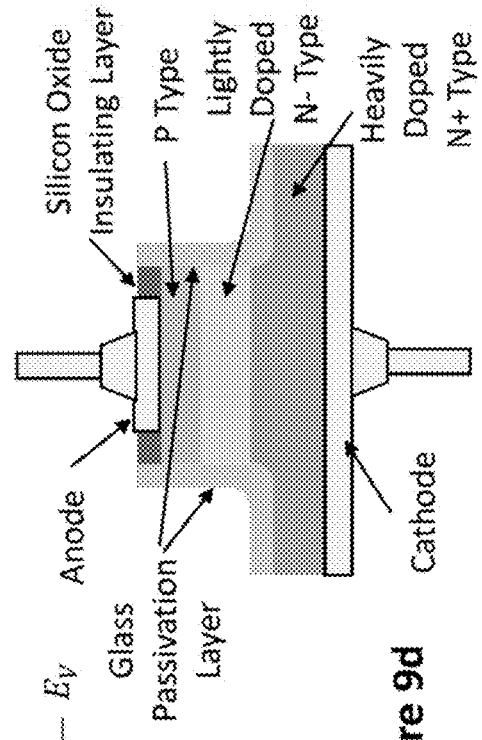
Figure 9a
Figure 9b
Figure 9c
Figure 9d

Figure 10b  Band diagram of a simple LED

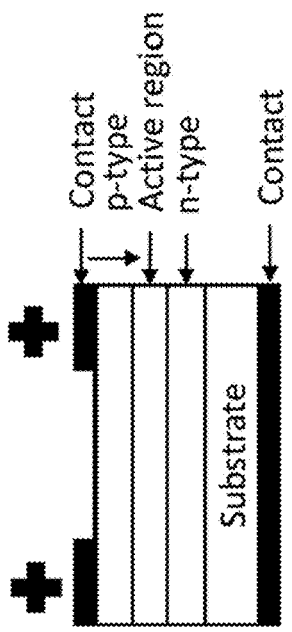
Figure 11a A simple P-N LED
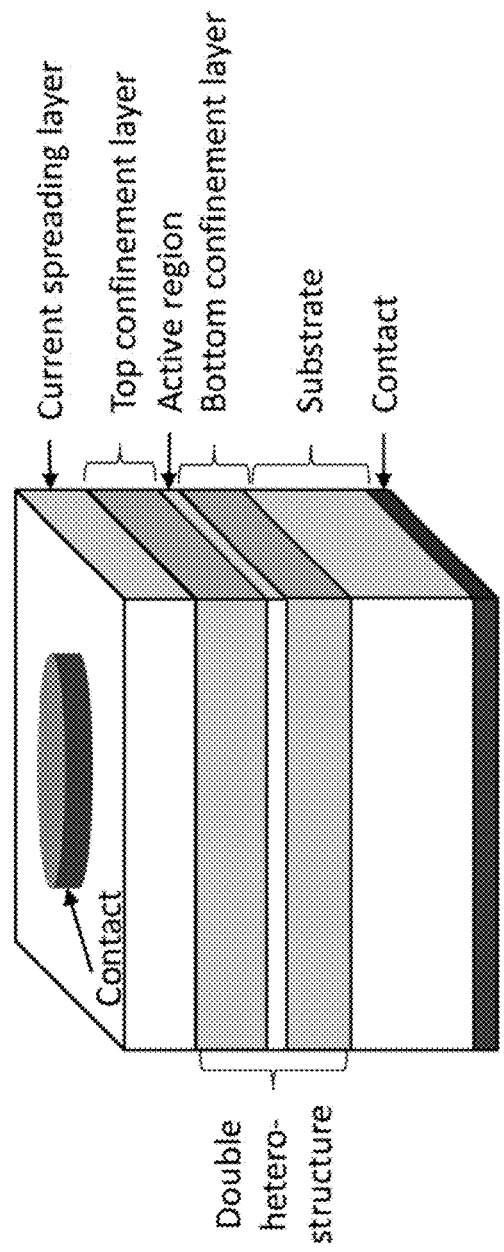
Figure 11b P-N LED with double hetero-structure Adapted from G. Gu, G. Parthasarathy, P. Burrows, T. Tian, I. Hill, A. Kahn, S. Forrest, "Transparent stacked organic light emitting devices. I. Design principles and transparent compound electrodes," *Journal of Applied Physics*, October 1999, vol. 86 no. 8, pp.4067-4075.

Band diagram of a simple photodiode

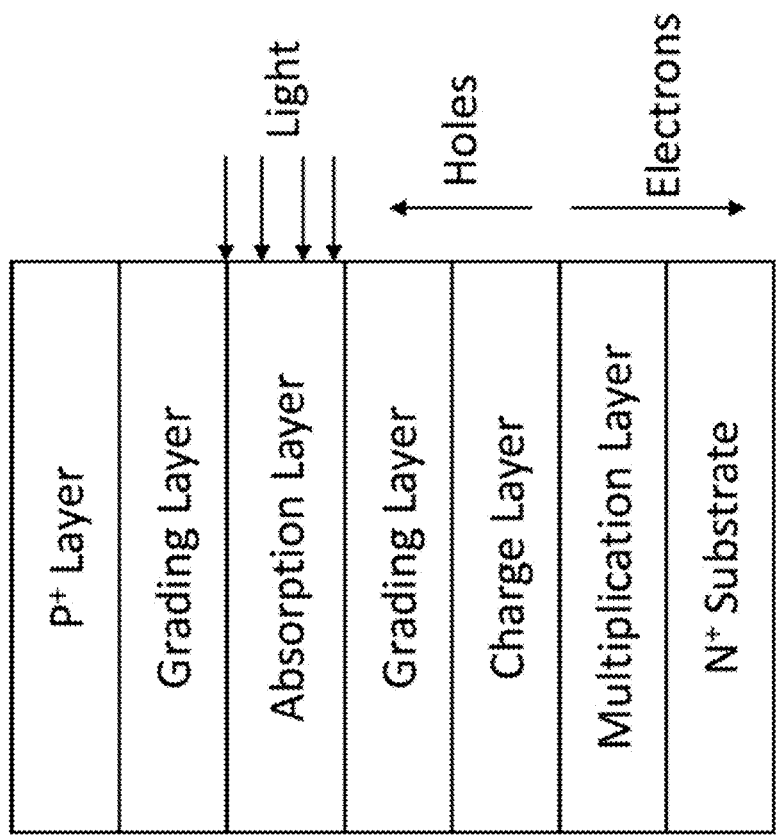
Figure 14b  Avalanche photodiode (APD)
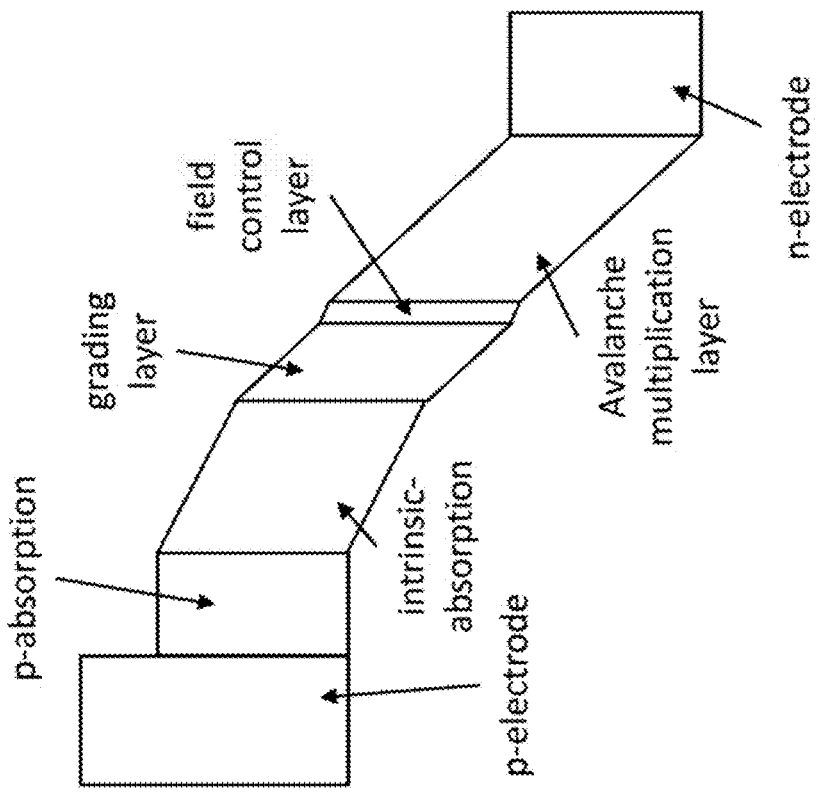
Figure 14a  Avalanche photodiode (APD)

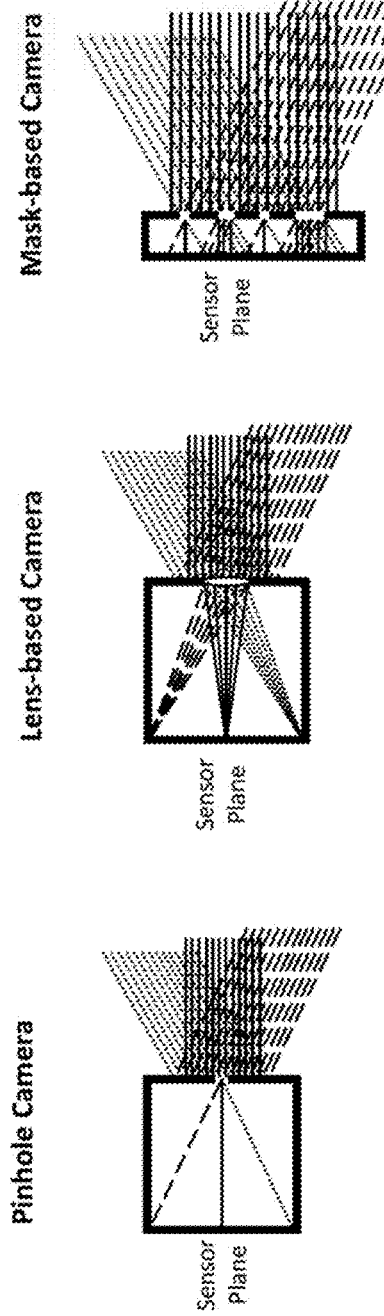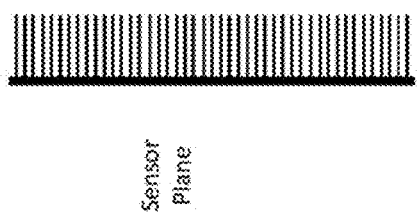
Figure 16c
Figure 16b
Figure 16d
Figure 16a

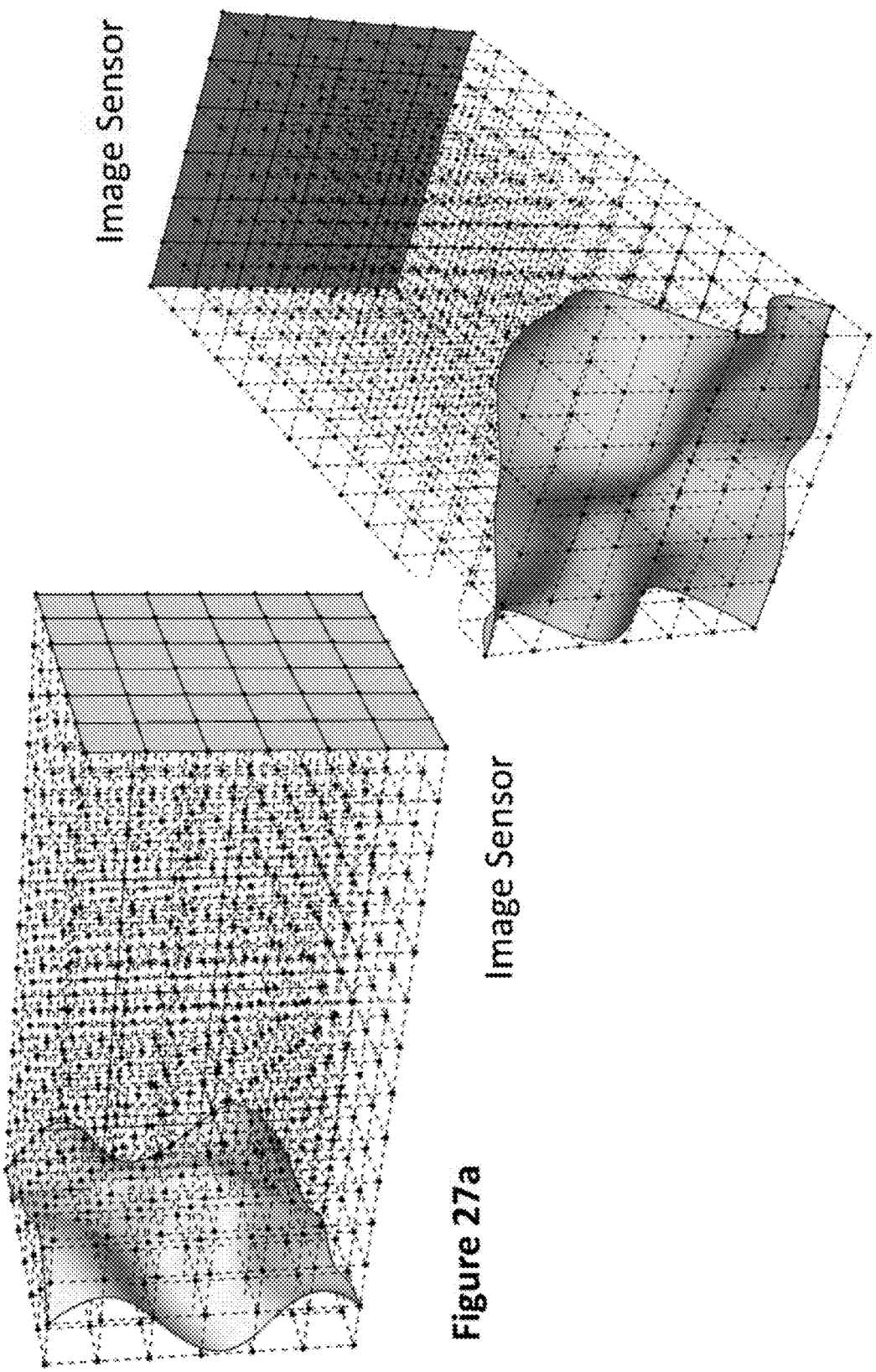

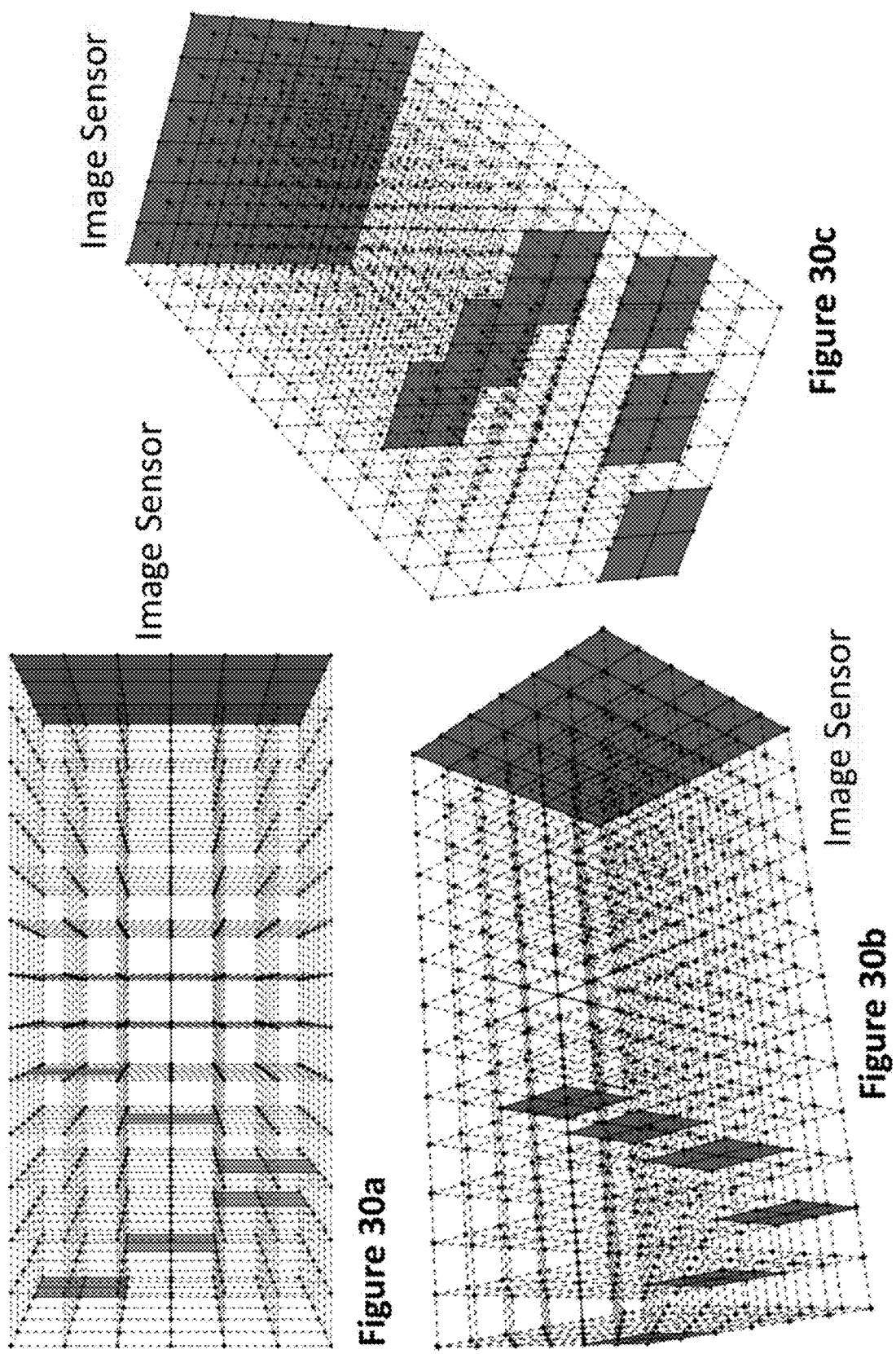

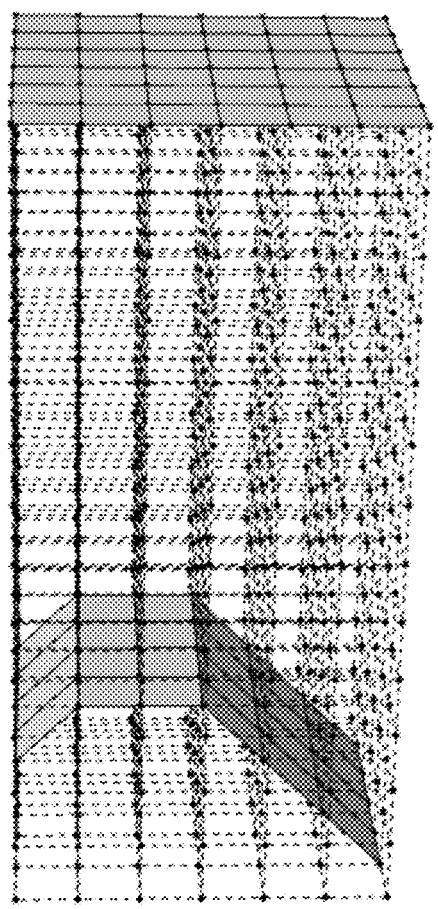
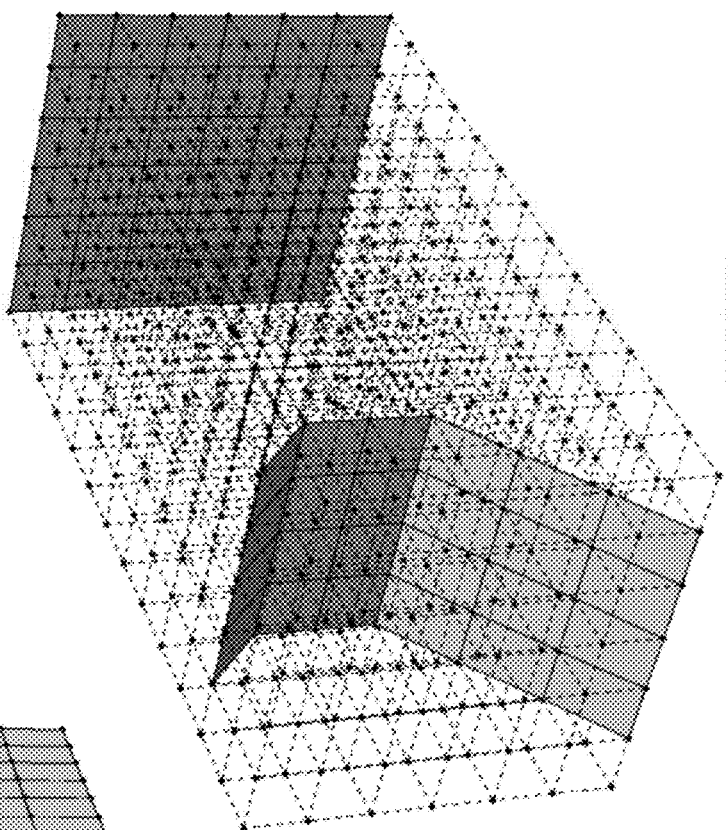
Figure 31a
Figure 31b

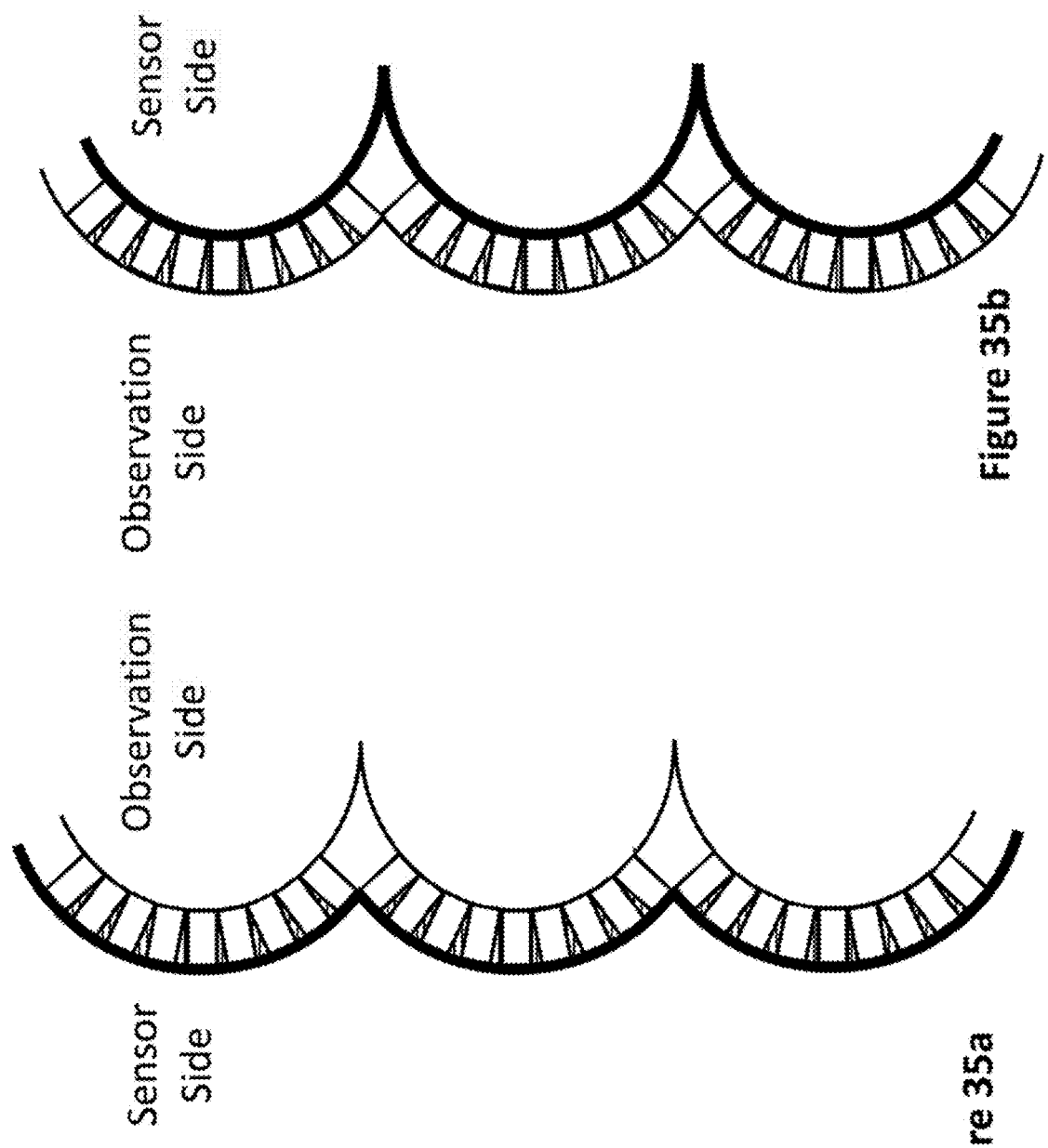

Rice Flat Cam

Assume mask is coordinate-separable into for $\Phi_L X \Phi_R$ $$\hat{X}_{LS} = \underset{X}{\arg\min} \|\Phi_L X \Phi_R^T - Y\|_2^2$$

$$\hat{X}_{Tik} = \underset{X}{\arg\min} \|\Phi_L X \Phi_R^T - Y\|_2^2 + \tau \|X\|_2^2$$

Optimal solutions have the form $\hat{X}_{Tik}$ = function of SVDs of $\Phi_L$, $\Phi_R$ and $\tau$

Rambus

Assume $x$ is flattened (vectorized) measured image and that measurements $y$ include additive noise $n$ $$y = Ax + n$$

Find $\hat{x}$ minimizing the error/cost function $$C = \|A\hat{x} - y\|^2 + \|\Gamma\hat{x}\|^2$$

Optimal solutions have the form $$\hat{x} = (A^T A + \Gamma^T \Gamma)^{-1} A^T y$$

For equal error sensitivity $$\hat{x} = (A^T A + \gamma I)^{-1} A^T y$$

Figure 45

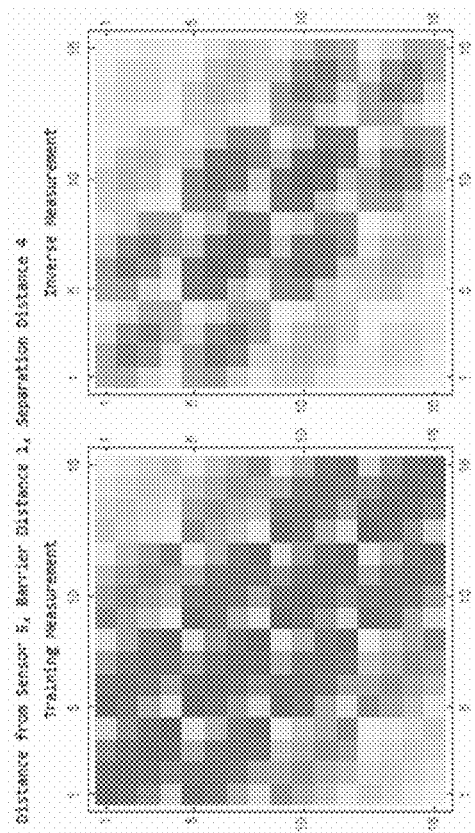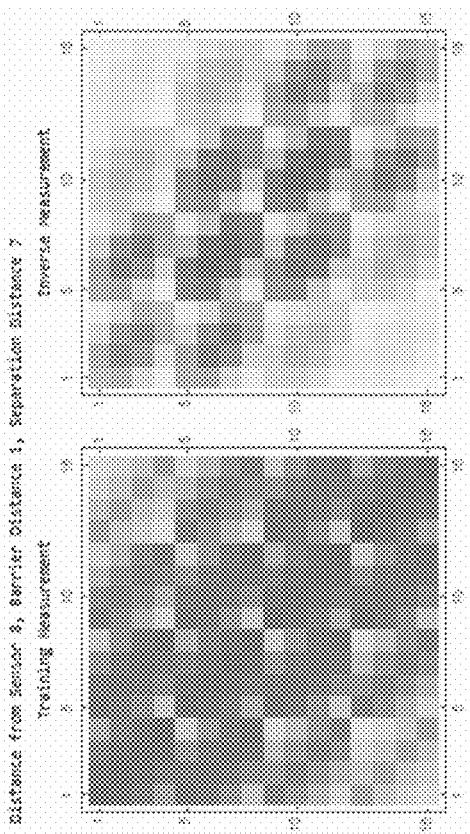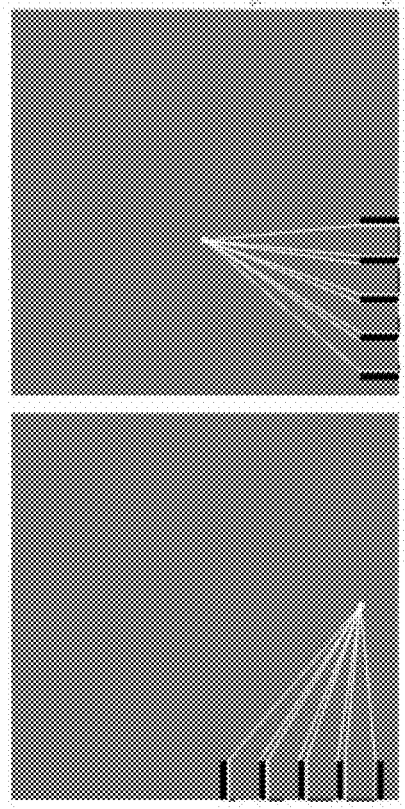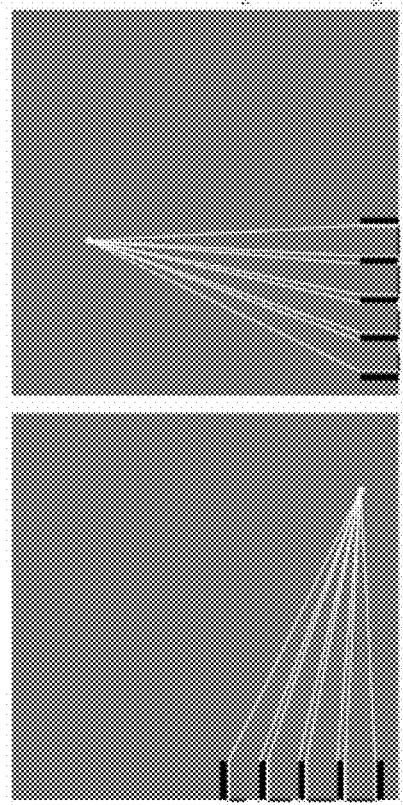
Figure 51d
Figure 51e

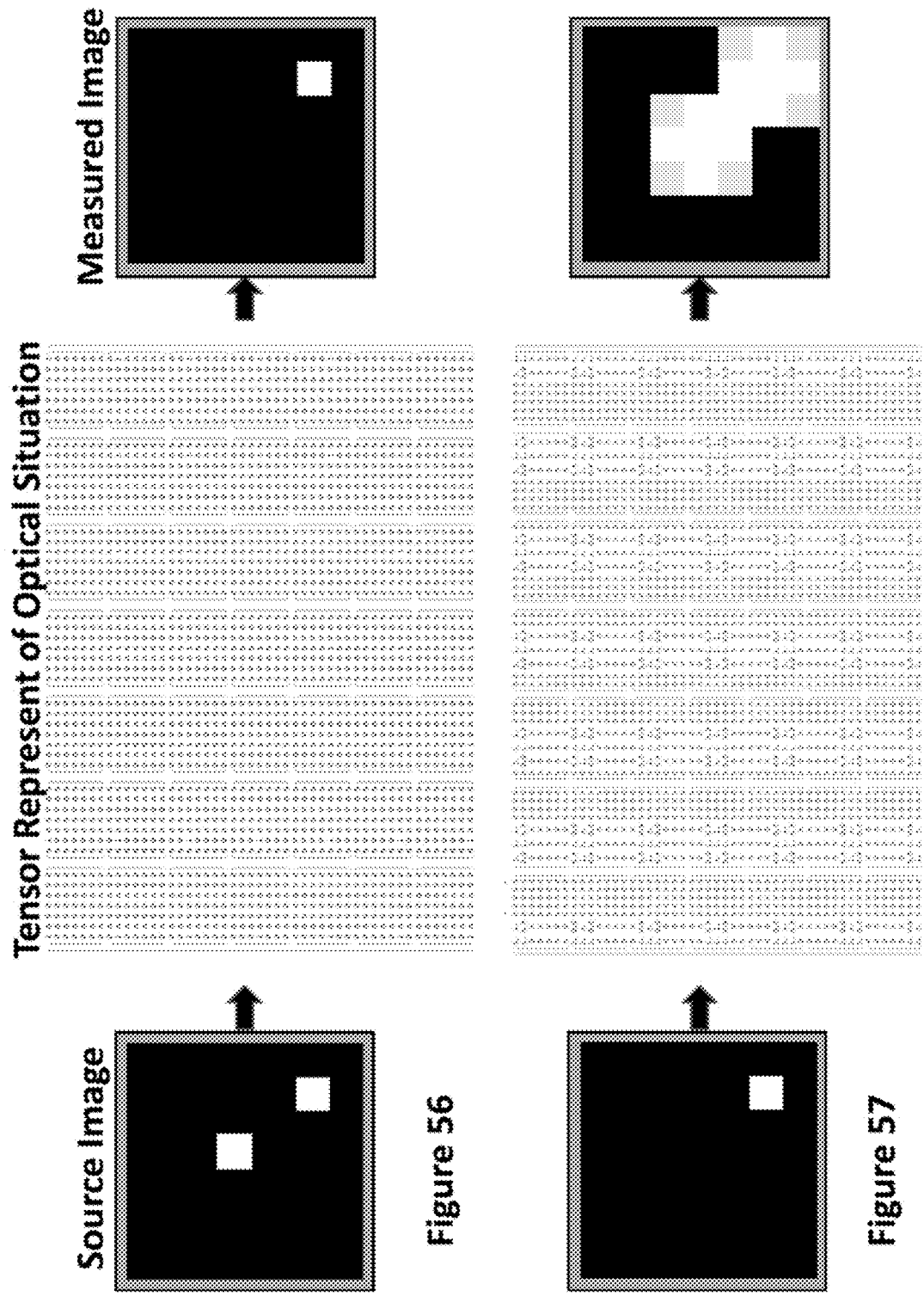

Piecewise-Linear Interpolation Between Measured-Dataset Separation-Distances

Figure 66    Mathematical Recovery of Image from Measured Image Array Data

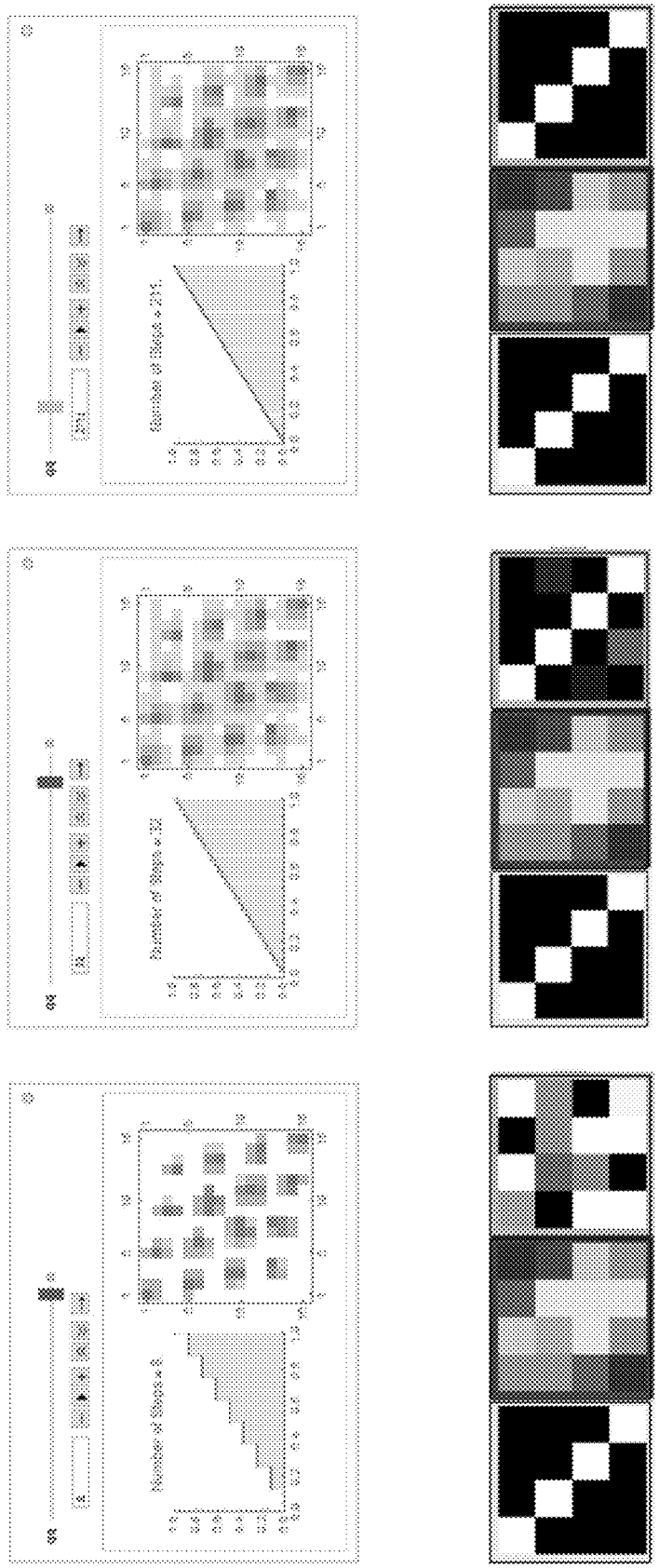
Figure 69a Quantization Control

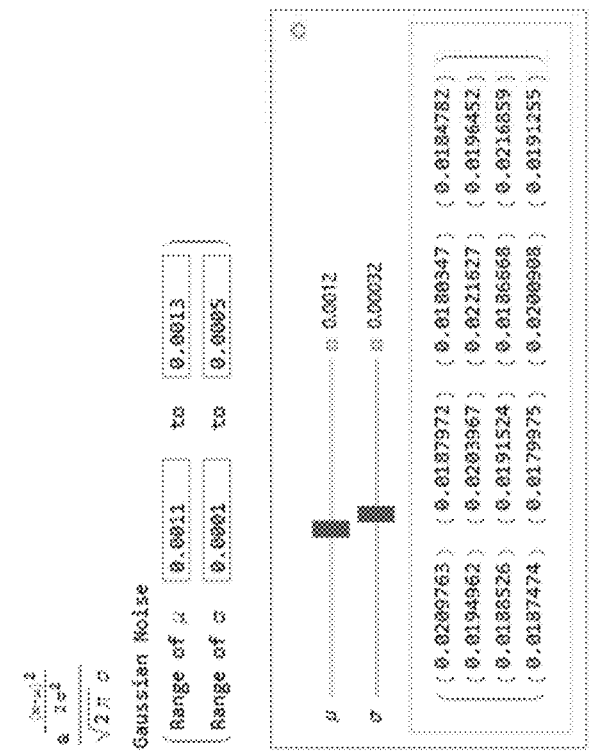
Figure 69c Added Noise Control
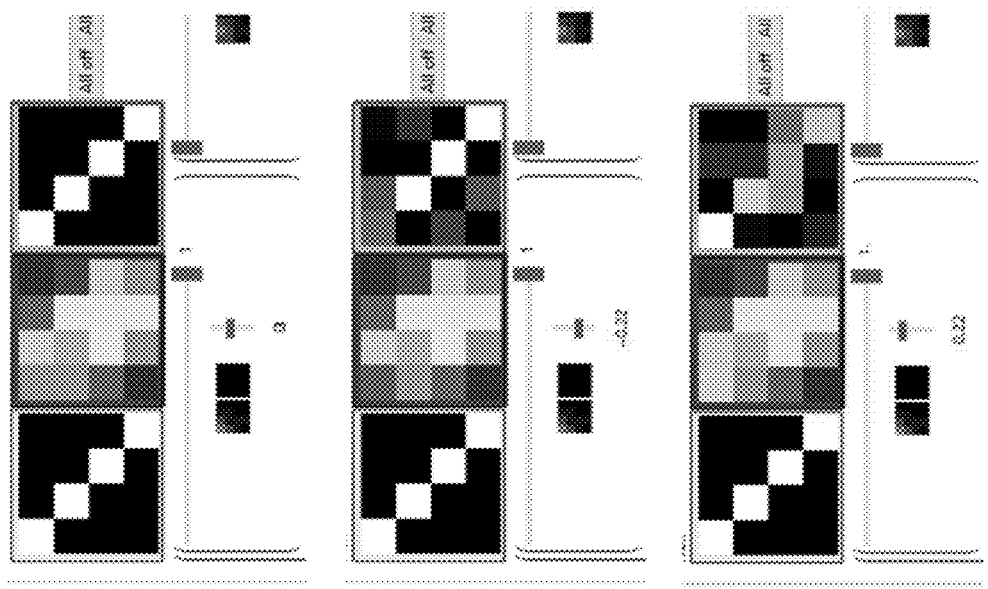
Figure 69b Offset Control

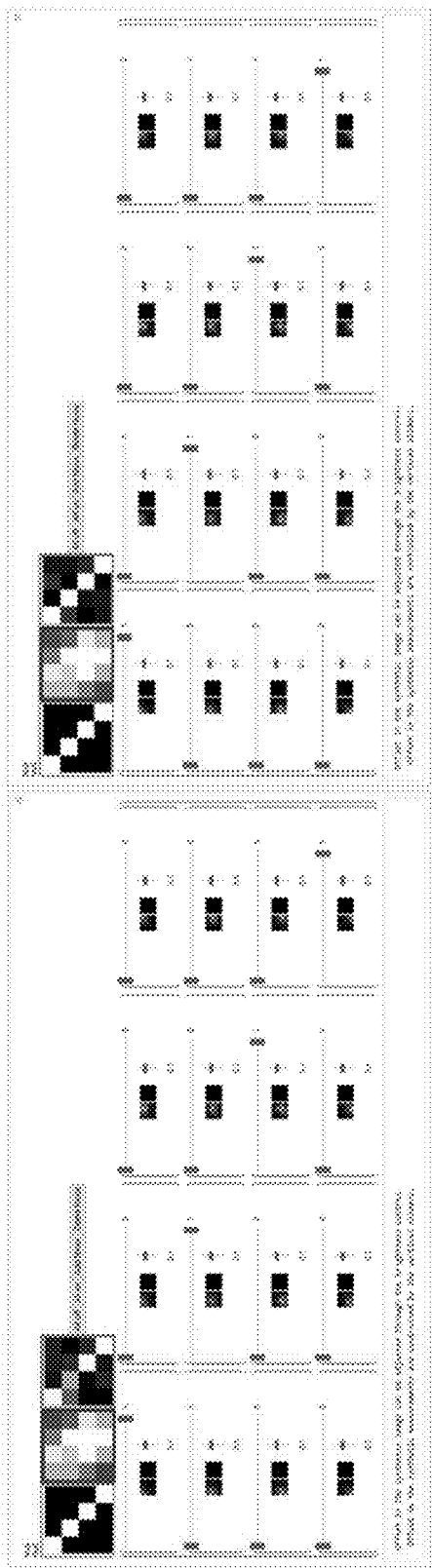
Figure 70a  Step32-offset
Figure 70b  Step32-offset & noise
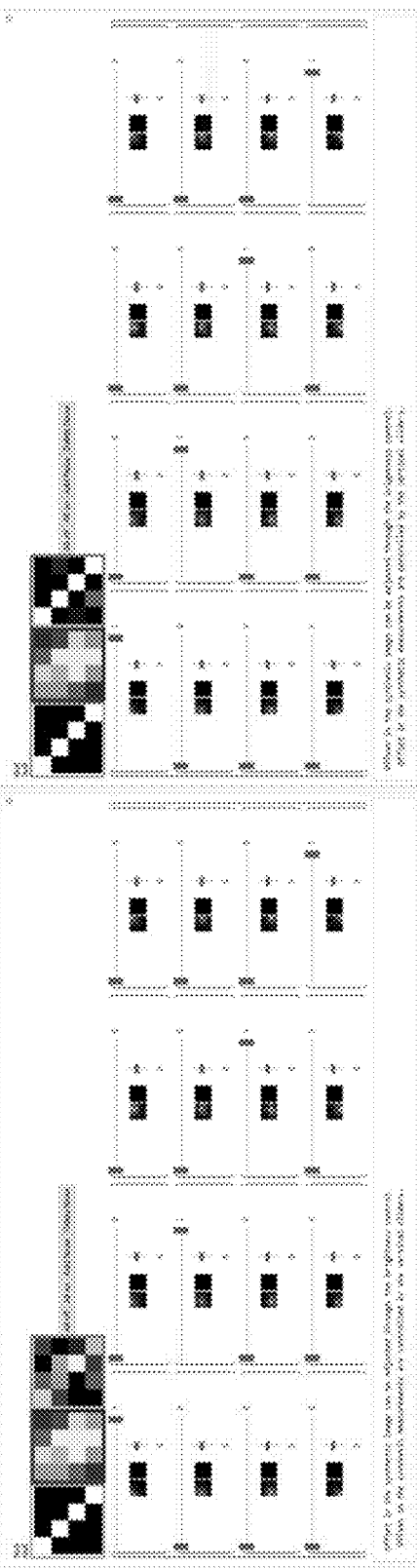
Figure 70c  Step32-noise
Figure 70d  step32

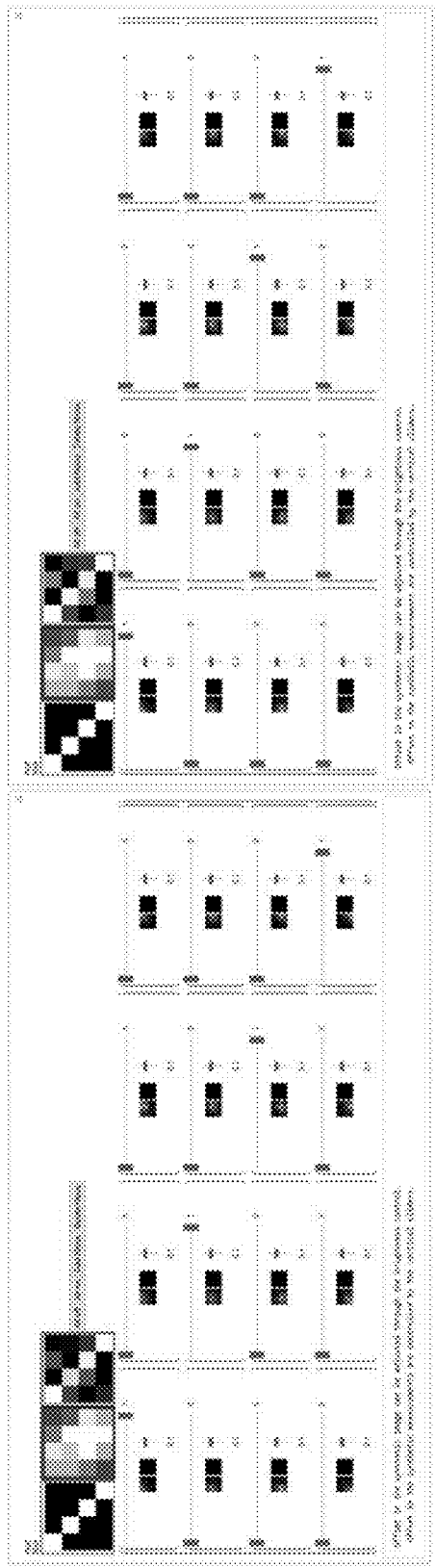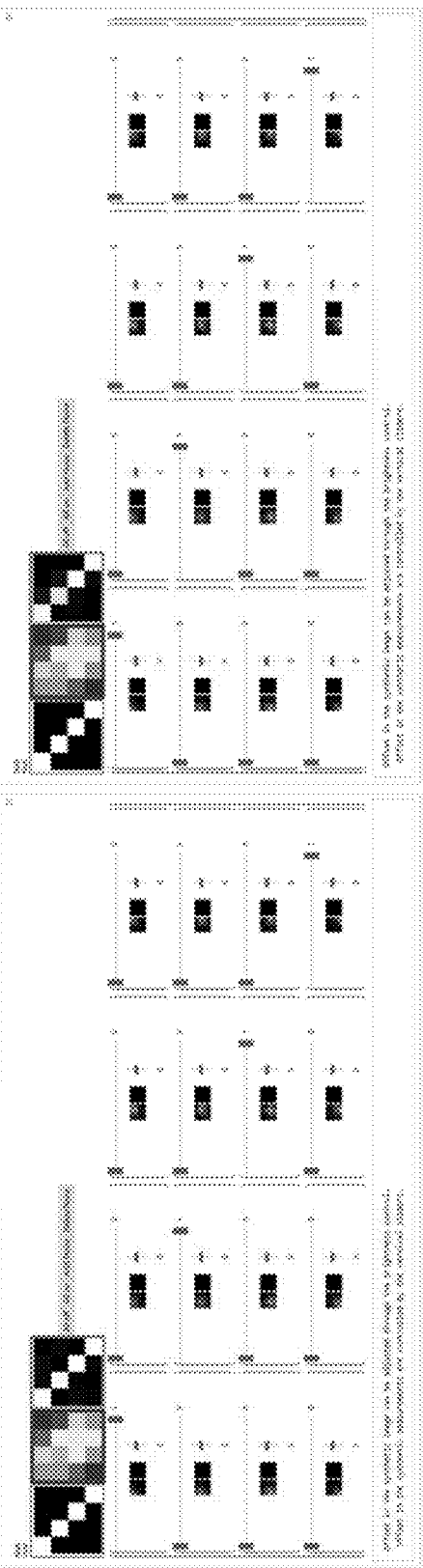
Figure 71a  Step64-offset    Figure 71b  Step64-offset & noise
Figure 71c  Step64-noise     Figure 71d  step64

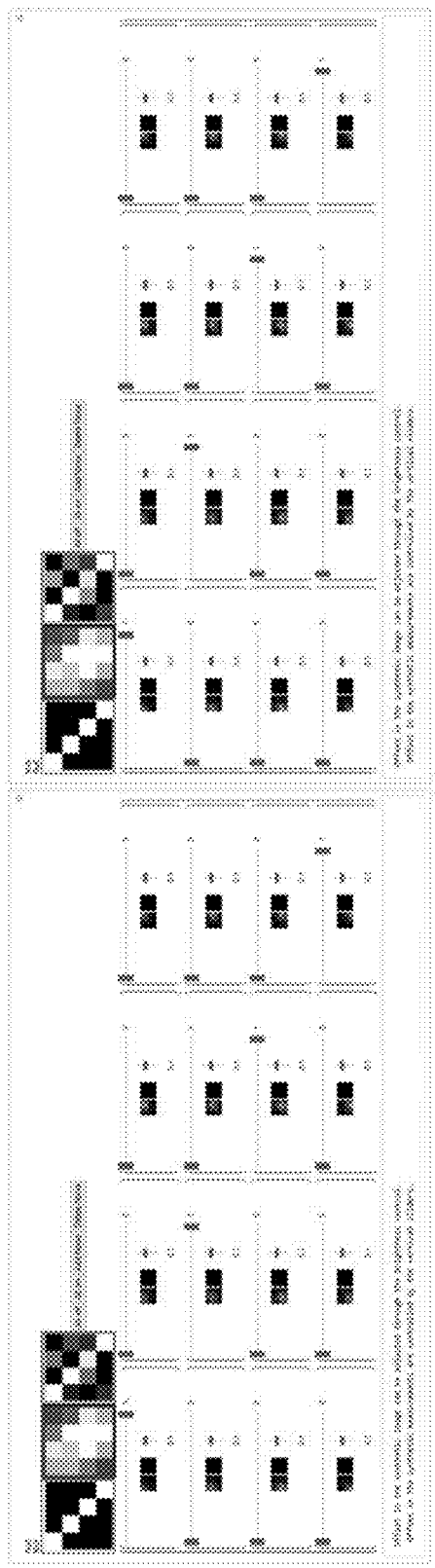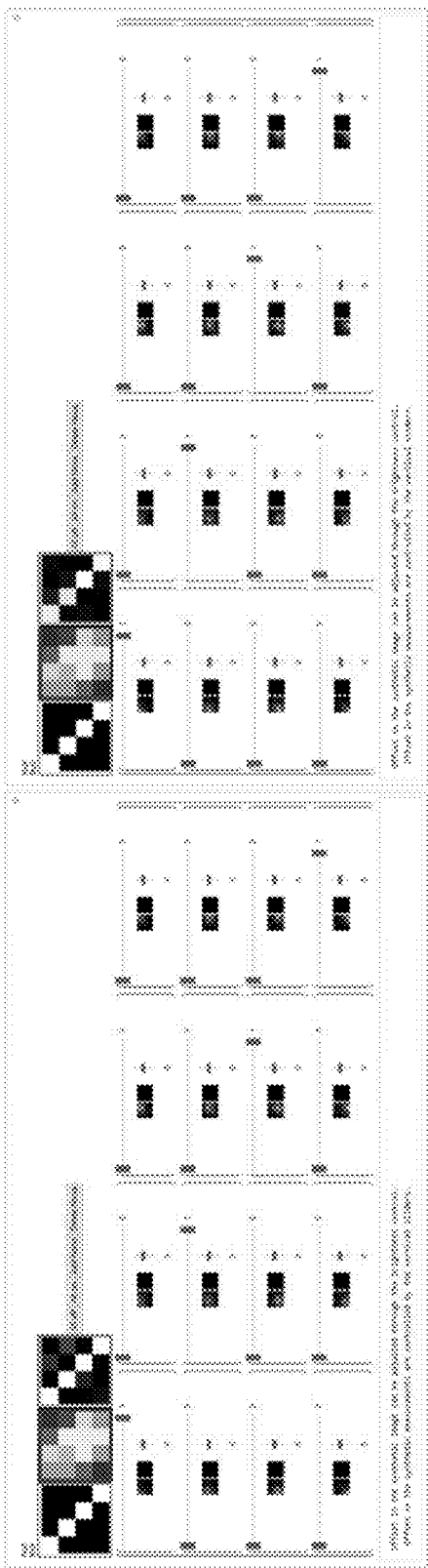
Figure 72a Step128-offset    Figure 72b Step128-offset & noise    Figure 72c Step128-noise    Figure 72d step128

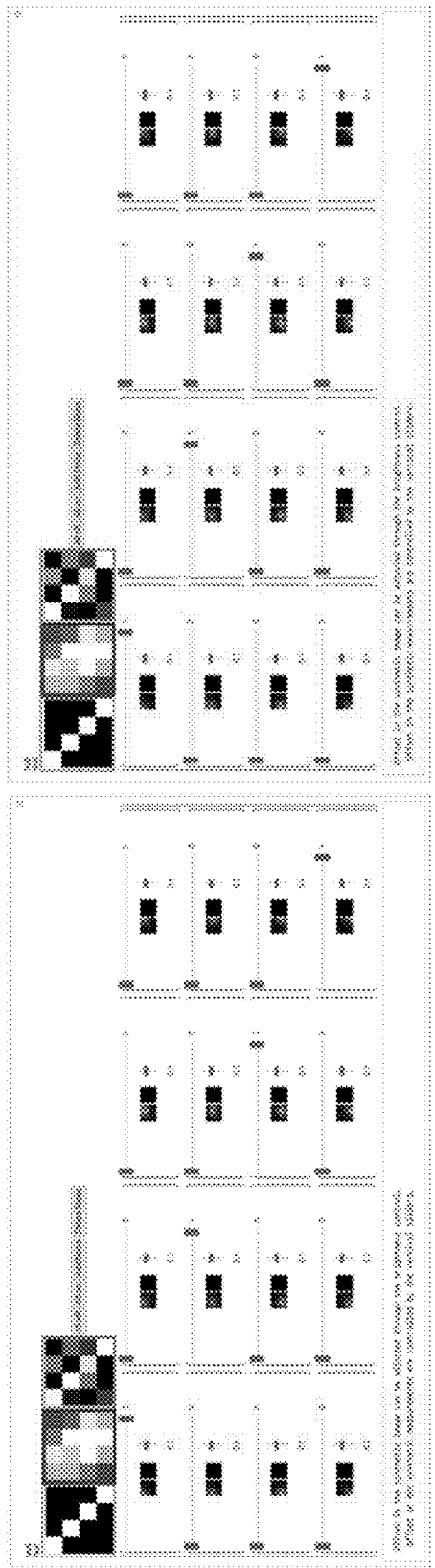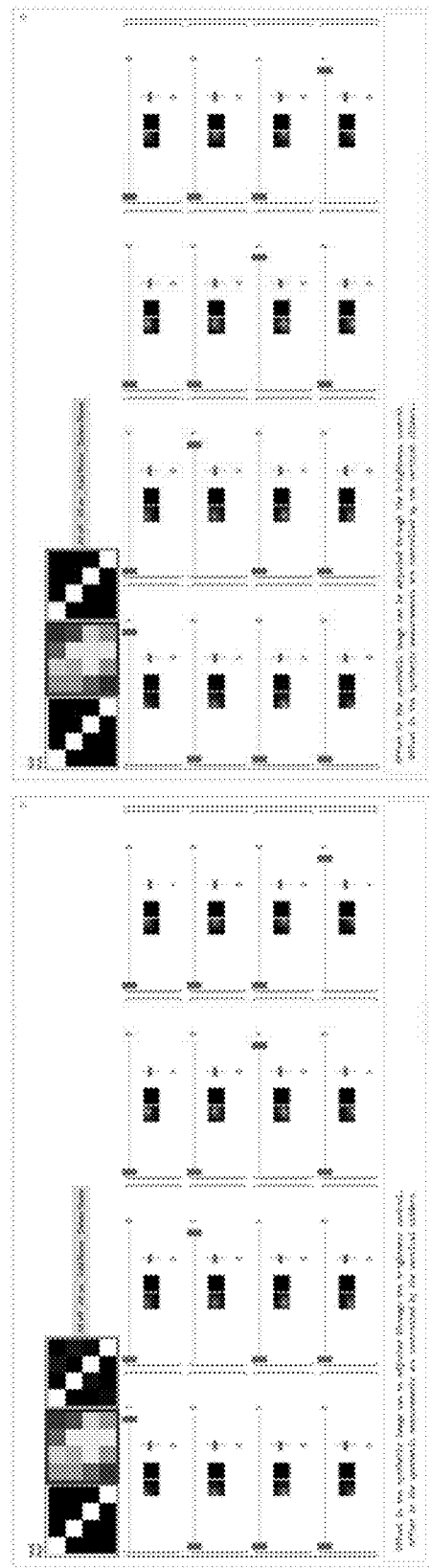
Figure 73a  Step140-offset    Figure 73b  Step140-offset & noise    Figure 73c  Step140-noise    Figure 73d  step140

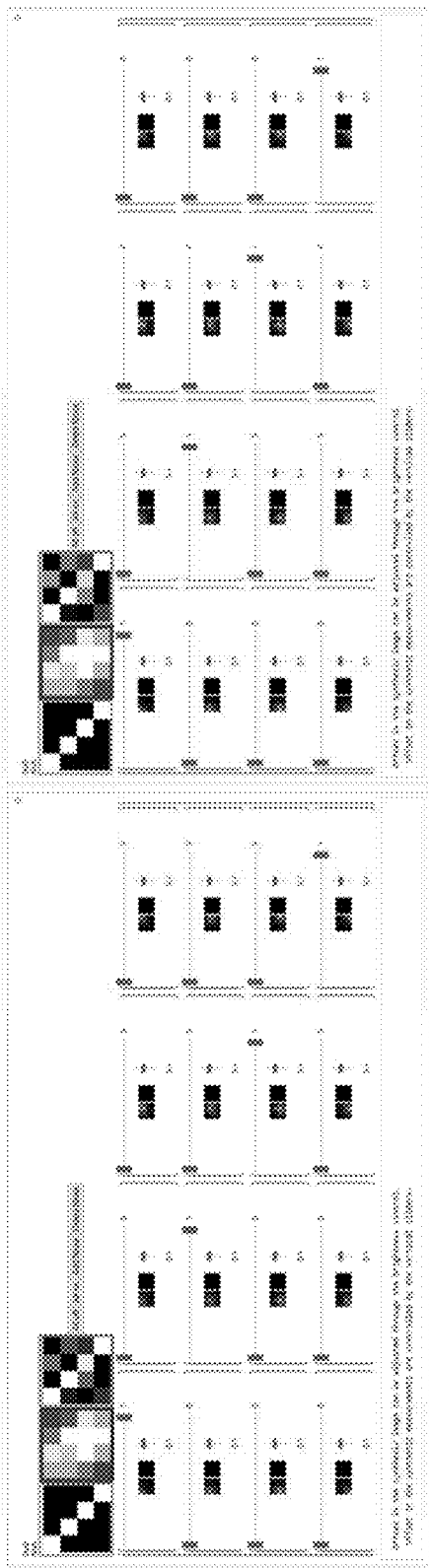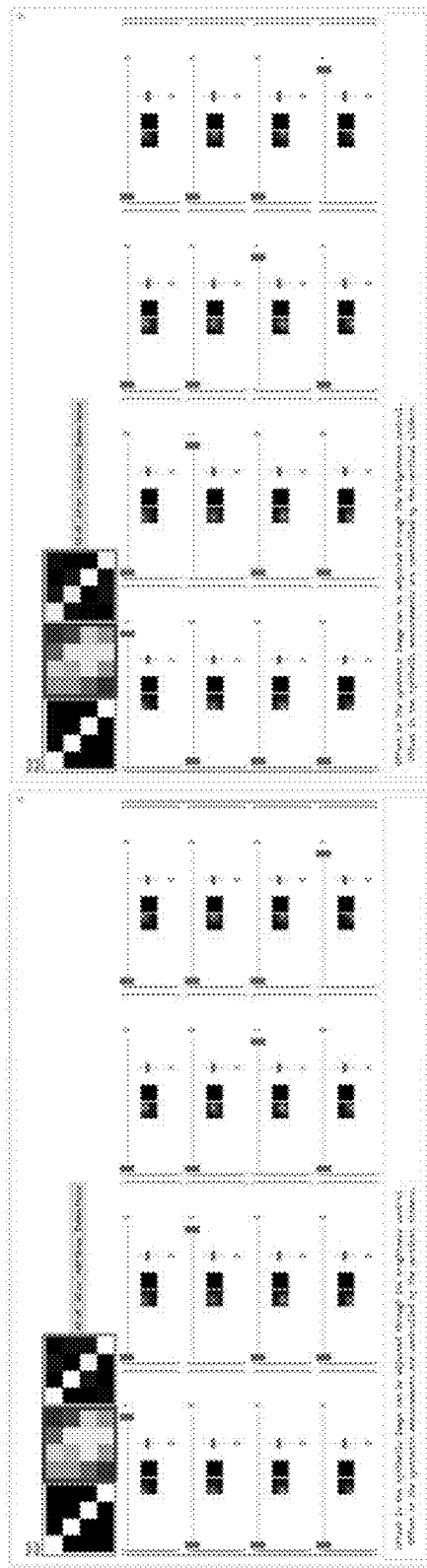
Figure 74a Step150-offset    Figure 74b Step150-offset & noise
Figure 74c Step150-noise     Figure 74d step150

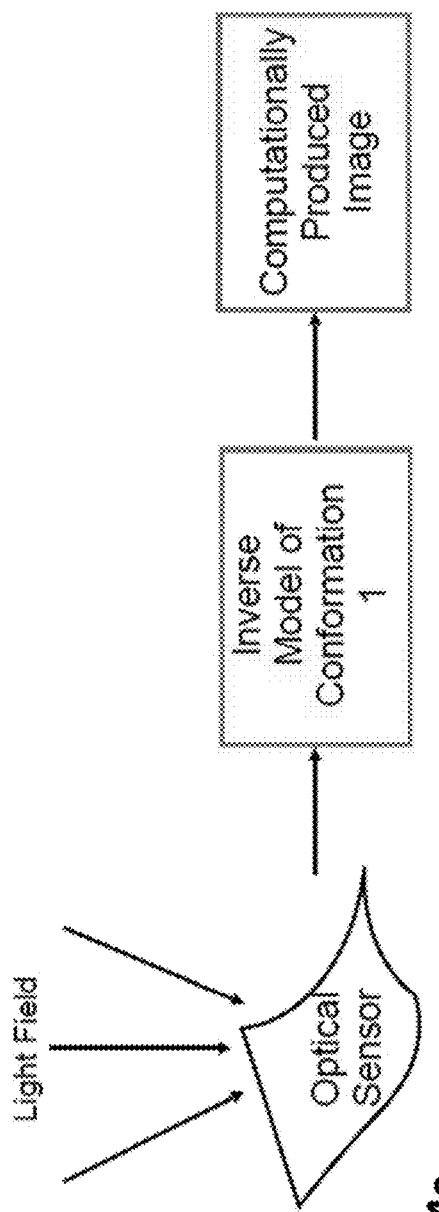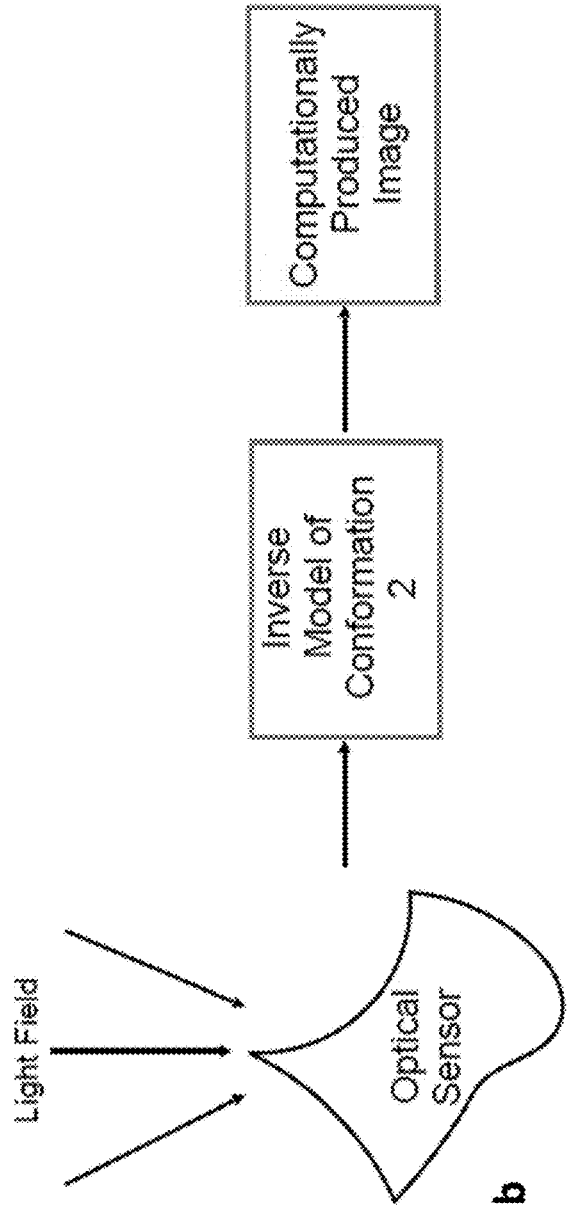
Figure 84a
Figure 84b

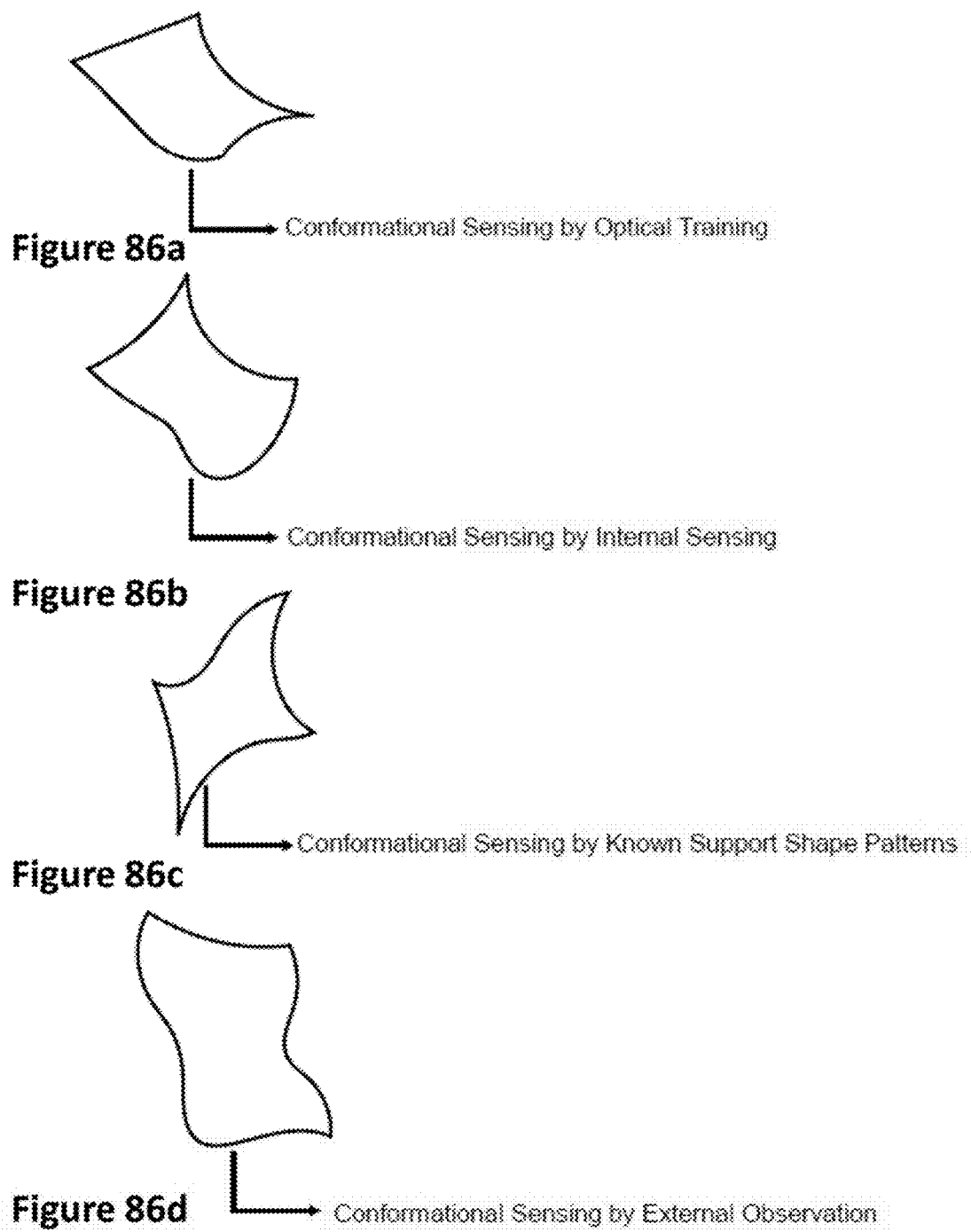
Figure 86a — Conformational Sensing by Optical Training
Figure 86b — Conformational Sensing by Internal Sensing
Figure 86c — Conformational Sensing by Known Support Shape Patterns
Figure 86d — Conformational Sensing by External Observation

ADVANCED LENSLESS LIGHT-FIELD IMAGING SYSTEMS FOR ENABLING A WIDE RANGE OF ENTIRELY NEW APPLICATIONS

CROSS REFERENCE TO RELATED APPLICATIONS

The present application is a continuation of U.S. patent application Ser. No. 15/647,230, filed on Jul. 11, 2017, which claims priority to U.S. Provisional Patent App. No. 62/360,472, filed on Jul. 11, 2016, and U.S. Provisional Application No. 62/528,384, filed on Jul. 3, 2017, which are all hereby incorporated herein by reference as if set forth in full.

COPYRIGHT & TRADEMARK NOTICES

A portion of the disclosure of this patent document may contain material, which is subject to copyright protection. Certain marks referenced herein may be common law or registered trademarks of the applicant, the assignee or third parties affiliated or unaffiliated with the applicant or the assignee. Use of these marks is for providing an enabling disclosure by way of example and shall not be construed to exclusively limit the scope of the disclosed subject matter to material associated with such marks.

BACKGROUND OF THE INVENTION

Field of the Invention

The invention pertains to computational imaging and light-field sensors, and more specifically to lensless camera arrangements leveraging a wide range of curved, polygon, rigid, flexible, elastic, and plastic attributes.

Overview of the Invention

FIG. 1 depicts an example conceptual view of the underlying principles of the invention, facilitating a wide range of implementation methods and architectures. In this depiction, an Optical Scene creates a Light-Field that is directed to an Optical Sensor which is preceded by one or more Lensless Optical Structure(s) that in some manner alters the light field in a predictable spatial manner. The Optical Sensor produces (typically time-varying) electrical signals and/or computational data responsive (instantly and/or within some time-delay) to light incident to the surface or other substructure(s) within the Optical Sensor at any given moment. The depicted Inverse Model can be configured to, in some appropriate manner, undo the effects of the incoming light's optical travel first within the Light-Field preceding the optical structure(s) and then through the Lensless Optical Structure(s) to where it reaches the Optical Sensor, resulting in a computationally-produced image which, for example, can be arranged to be useful for human or machine use.

A family of technologies relating to lensless imaging wherein an (even primitive) light sensing array is configured by (simple or more complex) optical structures to create a light-field sensor and focused images are obtained via numerical computation employing algorithms executed on one or more instances of a computational environment (for example comprising a computer, microprocessor, Graphical Processing Unit (GPU) chip, Digital Signal Processing (DSP) chip, etc.) has been described in earlier patent filings by the present inventor. These include for example:

U.S. Pat. No. 9,172,850 "Lensless imaging camera performing image formation in software employing micro-optic elements creating overlap of light from distant sources over multiple photo sensor elements"

U.S. Pat. No. 9,160,894 "Lensless imaging camera performing image formation in software and employing micro-optic elements that impose light diffractions"

U.S. Pat. No. 8,830,375 "Vignetted optoelectronic array for use in synthetic image formation via signal processing, lensless cameras, and integrated camera-displays"

U.S. Pat. No. 8,816,263 "Vignetted planar spatial light-field sensor and spatial sampling designs for far-field lensless synthetic imaging via signal processing image formation"

U.S. Pat. No. 8,754,842 "Combined display and image capture without simple or compound lenses for video conferencing eye-contact and other applications"

U.S. Pat. No. 8,305,480 "Synthetic Image Formation via Signal Processing for Vignetted Optoelectronic Arrays, Lensless Cameras, and Integrated Camera-Displays"

U.S. Pat. No. 8,284,290 "Synthetic Image Formation Signal Processing Hardware for Vignetted Optoelectronic Arrays, Lensless Cameras, and Integrated Camera-Displays"

U.S. Pat. No. 8,125,559 "Image Formation for Large Photosensor Array Surfaces"

U.S. Pat. No. 9,019,237 "Multitouch Parameter And Gesture User Interface Employing an LED-Array Tactile Sensor That Can Also Operate as a Display"

C.A. 2,318,395 "Multifunction Communication Service Device"

U.S. Pat. No. 9,632,344 "Use of LED or OLED Array to Implement Integrated Combinations of Touch Screen Tactile, Touch Gesture Sensor, Color Image Display, Hand-Image Gesture Sensor, Document Scanner, Secure Optical Data Exchange, and Fingerprint Processing Capabilities"

U.S. application Ser. No. 13/547,024 "Use of OLED Displays as a High-Resolution Optical Tactile Sensor for High Dimensional Touchpad (HDTP) User Interfaces"

Allowed U.S. application Ser. No. 13/072,588 "Color Imaging Using Color LED Array as Light-Field Image Sensor"

U.S. application Ser. No. 14/333,177 "Vignetted planar spatial light-field sensor and spatial sampling designs for far-field lensless synthetic imaging via signal processing image formation"

U.S. application Ser. No. 14/478,920 "Vignetted Optoelectronic Array for Use in Synthetic Image Formation via Signal Processing, Lensless Cameras, and Integrated Camera-Displays"

as well as other past, current, and planned future patent filings. The approach can also be used to implement lensless microscopy and optical tomography, for example as has been described in earlier patent filings by the inventor, for example including:

U.S. Pat. No. 8,885,035 "Electronic imaging flow-microscope for environmental remote sensing, bioreactor process monitoring, and optical microscopic tomography"

U.S. application Ser. No. 14/105,108 "Small-Profile Lensless Optical Microscopy Imaging and Tomography Instruments and Elements For Low Cost And Integrated Microscopy"

U.S. Pat. No. 9,594,239 "Optical Tomography for Microscopy, Cell Cytometry, Microplate Array Instrumentation, Crystallography, and Other Applications"

U.S. Pat. No. 9,594,019 "Optical Tomography for Microscopy, Cell Cytometry, Microplate Array Instrumentation, Crystallography, and Other Applications"

U.S. application Ser. No. 15/289,815 "Electronic Imaging Flow-Microscope for Environmental Remote Sensing, Bioreactor Process Monitoring, and Optical Microscopic Tomography"

U.S. application Ser. No. 15/457,963 "Cylindrical Optical Tomography for Microscopy, Cell Cytometry, Microplate Array Instrumentation, Crystallography, and Other Applications"

as well as other past, current, and planned future patent filings. Broader uses and additional functions are possible as taught in yet other past and current patent filings as well as other planned and emergent patent filings.

As indicated in the above patent filings, an immense number of capabilities and features result from this approach. For example, although the light sensing array can comprise a CMOS imaging chip, the light sensing array can comprise an array of printed organic-semiconductor photodiodes, including printed Organic Light Emitting Diodes (OLEDs) that are electrically interfaced and/or physically structured to operate at least as light sensing (square) "pixel" or (rectangular) "pel" elements; because such a sensing array is fabricated by layered printing of inks (comprising conductive materials, semiconducting materials, and insulating materials, the types inks including transparent types) on arbitrary surfaces (such as glass, rigid plastics, or flexible plastics) that may be flat or curved, the optical sensing array can be rendered in a wide variety of ways, shapes, sizes, curvatures, etc. on a flat, curved, bendable, deformable surface that may also be used for performing other function. Further, the optical structures required to invoke light-field sensing capabilities can be as simple as a crudely formed array of vignetting passages, and these optical structures can be for example printed using light-path impeding inks, an applicable light-field sensor array can be entirely fabricated by printing layers of electrical, structural, and optical inks on flat, curved, bendable, and/or deformable surface that can also be used for performing other structural, electrical, sensing, physically-supporting, physical-boundary, and/or physical-surface functions. It is noted that in addition to printed organic-semiconductor photodiodes and/or OLEDs, the light sensing array can alternatively or additionally comprise one or more of printed organic-semiconductor phototransistors, silicon or other crystal-lattice photodiodes, silicon or other crystal-lattice phototransistors, silicon or other crystal-lattice LEDs, silicon or other crystal-lattice CMOS light sensors, charge-coupled light sensors, printed non-organic semiconductor photodiodes, printed non-organic semiconductor LEDs, printed non-organic semiconductor phototransistors, or other type of electrically-responsive light-sensing elements. As described and implied in the above patent materials, and as to be further described and implied throughout the present patent applications, these advanced lensless light-field imaging systems and methods for enabling a wide range of entirely new applications.

These earlier inventor's patent families and the inventor's present patent application individually and collectively (1) employ many independent advancements in material science, organic electronics, and manufacturing processes together with (2) novel adaptations of and structures for optoelectronic devices, novel physical, optical, electronic and optoelectronic device configurations and (3) corresponding novel mathematical and signal flow structures arranged to be implemented by signal processing algorithms, and other novel system elements and method steps. The aforementioned independent advancements in material science, organic electronics, and manufacturing processes include:

Materials, methods, and manufacturing techniques for bendable and flexible active and passive electronic and optoelectronic components and interconnections;

Materials, methods, and manufacturing techniques for printable/printed active and passive electronic and optoelectronic components and interconnections.

Materials, methods, and manufacturing techniques for transparent active and passive electronic and optoelectronic components and interconnections;

Materials, methods, and manufacturing techniques for multiply-layered/stackable active and passive electronic and optoelectronic components and interconnections;

Materials, methods, structures, and manufacturing techniques for implementing and optimizing light-sensing and light-emitting aspects of optoelectronic components.

Novel adaptations of and structures for optoelectronic devices, novel physical, optical, electronic and optoelectronic device configurations comprised by the inventor's earlier patent families and used in the inventor's present patent application include for example but are not limited to:

Use of diffraction elements, vignetting structures, and other non-micro-optic elements to implement light-field imaging sensing arrays;

Use of LED or OLED array as both a display and non-contact (spatially-separated) lensless camera;

Use of transparent optoelectronic elements to implement stacked wavelength-selective light-sensing elements analogous to Stacked Organic Light Emitting Diodes (SOLEDs);

Use of bandgap responses to implement color image sensing arrays without the use of filters. diffraction gratings, or other wavelength-selective optical elements;

Curved image sensor arrays;

Bent and flexible image sensor arrays.

Corresponding novel mathematical and signal flow structures arranged to be implemented by signal processing algorithms, and other novel system elements and method steps also configurations comprised by the inventor's earlier patent families and used in the inventor's present patent application include for example but are not limited to:

Image formation signal processing;

Color separation signal processing;

Use of Moore-Penrose pseudo-inverse or other generalized inverses to provide statistical robustness from over-specified measurement data;

Use of Moore-Penrose pseudo-inverse or other generalized inverses to provide spatial robustness (using over-specified measurement data) against damage or occultation of isolated sensor elements or groups of sensor elements;

Use of Graphics Processing Unit ("GPU") for image formation (particularly applicable when camera is integrated with a display sharing the same multiplexing environment).

The inventor's early inventions (as taught in the aforecited patents) and present invention competes favorably with other lensless computational imaging approaches on their own terms in a number of ways, for example:

Significant computational efficiency advantage because no transform domain conversions are required; images are recovered by matrix multiplication of a long vector measurement vector by a pre-computed matrix, facilitating video-rate decoding Far greater light capture efficiency (incoming light loss can be nearly zero, while coded apertures typically by their very nature invoke a 45%-50% minimum loss of incoming light);

Cost reduction via printing (readily including printed interface electronics);

Can be far thinner;

Can be far larger.

The inventor's early inventions (as taught in the aforecited patents) and present invention provides a number of features not available from other lensless computational imaging approaches, including but not limited to:

No separation distance between the sensor and any vignetting or aperturing array, allowing thinner image sensor;

No need for any vignetting or aperturing array if the photosensing elements natively have adequate angular occultation or angular selectively;

Vignetting or aperturing can be done at the same spatial separation as individual photosensing pixels;

No special frequency domain requirements on any vignetting or aperturing array;

Any vignetting or aperturing array can include internally-reflective structures and have arbitrarily thin walls to preclude light loss;

Any vignetting or aperturing array can be also arranged to facilitate predictable or and/or reproducible surface plasmon propagation to selected light sensors comprised by the light sensor array in a manner that further reduces light loss;

Truly arbitrary image sensor size;

Flat or arbitrarily-curved image sensor shape;

Distributed image sensing;

Angular diversity/redundancy advantage;

Enveloping imaging, contact imaging (including local illumination in contact imaging);

"Seeing skin"—rigid, flexible, deformable, manipulatable;

Integrated in a visual light-emitting display;

Overlay on provided surfaces;

Self-illuminating;

Zero separation distance focus;

Curved-surface contact focus;

Can provide one or more simultaneous computationally-controlled focus (mixed focus);

Can provide one or more simultaneous computationally-controlled viewpoint(s);

Can provide one or more simultaneous computationally-controlled stereo/3D live imaging;

Can provide full-color and enhanced (meta-RGB) color image capture;

Can include IR and UV capabilities;

Can include multiple-wavelength spectroscopic capabilities without diffraction-grading or prism optics;

Can be integrated into a visual display.

FIG. 2 depicts an illustrative representational view of the confluence of the expanded features and capabilities taught in the inventor's 1999 patent family. This depiction and the elements therein are intended as only illustrative and representative and does not provide or suggest a comprehensive or exhaustive listing, structure, or characterization.

Similarly, FIG. 3 depicts an illustrative representational view of the confluence of the expanded features and capabilities taught in the inventor's 2008 patent family. This depiction and the elements therein are intended as only illustrative and representative and does not provide or suggest a comprehensive or exhaustive listing, structure, or characterization. Additional patent families A 2008-2009 patent family of the present inventor contributed additional implementations, features, and applications that include use as a display and a touch and touch-gesture user interface. A 2010 patent family and 2011 patent family of the present inventor contributed additional implementations, features, and applications that include use not only as a display touch user interface, and touch-gesture user interface but also as a lensless imaging camera, a touch and touch-gesture user interface, free-space hand gesture interface, document scanner, fingerprint sensor, secure information exchange. Although not all of the applications, arrangements, and configurations of those 2008-2009, 2010, and 2011 patent families are explicitly considered in the present patent application, the technologies, systems, and methods described the present patent application are in various ways directly applicable and to the applications, arrangements, and configurations described in those patent families.

A 2009-2010 patent family and a 2013 patent family of the present inventor contributed the addition of optical tomography capabilities employing controlled light sources is also noted in FIG. 3. Although not all of the applications, arrangements, and configurations of those 2009-2010 and 2013 patent families are explicitly considered in the present patent application, the technologies, systems, and methods described the present patent application are in various ways directly applicable and to the applications, arrangements, and configurations described in those patent families.

FIG. 4 depicts an illustrative representational view of the confluence of the expanded features and capabilities associated with the present invention. This depiction and the elements therein are intended as only illustrative and representative and does not provide or suggest a comprehensive or exhaustive listing, structure, or characterization.

Relations to and Developments in Related Technologies

A brief review of the following related concepts and technologies are next provided:

A. Lensless Coded Aperture Imaging;

B. Lens-Based Light-Field Imaging;

C. Use of LEDs as Light Sensors and Light Sensing Arrays;

D. Flexible Cameras and Transparent Image Sensors;

E. Transparent Electronics;

F. Organic Semiconductors and Organic Optoelectronics;

G. Printed Electronics and Optoelectronics;

H. Flexible and Bendable electronics;

I. Flexible and Bendable optoelectronics.

A summarizing functional- and timeline-comparison table is then presented.

A. Relations to Lensless Coded Aperture Imaging

Coded apertures are planar, binary-valued (partially-opaque/partially-transmitting) optical masks gratings, grids, etc. positioned in front of an image sensor array and designed to cast structured shadows that permit mathematical calculations characterizing and permitting the imaging of incoming radiation fields. Originally developed for high-energy photon (x-rays, gamma rays, and other classes of high-energy non-visible wavelength photons) radiation-imaging that cannot be focused by lenses of curved mirrors, the beginnings of coded aperture imaging date back to at least 1968 [P62]. A number of coded aperture telescopes use this high-energy imaging approach for imaging astronomical X-ray ad gamma ray sources.

Partially predating and later developing in parallel with the inventor's comprehensive lensless light-field imaging program (beginning with the inventor's 1999 patent family) is the related and now recently-popularized (2011-2016) coded-aperture lensless imaging (recently termed a lensless "Computational Renaissance'" [P6]). Coded aperture imaging appears to have continued to develop in the exclusive context of high-energy photon non-visible (x-rays, gamma rays, etc.) radiation-imaging for decades but developing a rich mathematical theory (see for example [P31], [P32], [P63], [P64]) relating to the theory of information codes and the relatively "flat" spectral properties of the optical Modulation Transfer Function (discussed in part in various earlier papers but see [P45]) when the coded aperture employs various types of "Uniformly Redundant Array" codes ("URA", "MURA," etc.), variations or alternatives to these, or indeed randomly-generated patterns. At this writing it is not yet clear when attention to these coded aperture imaging approaches were first adapted for use in visible-light imaging, but at this writing it does not appear this was explored or discussed in the literature before 2000. There was some work circa 1973 involving shadow casting and coded masks relating to holography [B8]. Further brief historical treatment and reviews of technology developments in coded aperture lensless imaging are provided in [B1], [P5], and [P65].

By 2006 various forms of computer-controlled spatial-light modulators were being used to implement the optical coded aperture function [P34], [P35], [P47], notably using the LCD of an LCD display screen as part of the MIT "BiDi Screen" [P34]. The MIT "BiDi Screen" also featured distance ranging obtained from the coded aperture, described earlier in [P68]. Although the MIT "BiDi Screen" included coded aperture imaging, the images produced were not focused when any non-proximate distance from the screen.

As will be discussed later, most of these systems formulate the image recovery transformation as (1) an ill-posed, usually regularized, inverse problem and/or (2) a spectral-method transform problem.

Broader views of computations imaging have subsequently to appear in the literature (see for example [P66]) which migrate the "optical coding" paradigm/abstraction to other contexts, for example wavefront coding, including a lens, sensor-plane coding, etc.). In addition, there have also been several relatively recent systems replacing coded apertures with other types of lensless optical elements:

The 2008 Rice University [P48] and later 2013 Bell Labs [P59], [P32], [P69], [P71], [P72] "single pixel" lensless camera approach uses a computer-controlled aperture or micro-mirror spatial light modulator to sequentially implement a time-multiplexed series of coded aperture images. These approaches can include sub-Nyquist rate "compressive sampling" which can also be applied more broadly than optical sensing; se for example [P60].

The post-2010 lensless imaging work at Cornell, later adopted to create ultraminiature imagers and pre-commercialized by Rambus [P4] (and winning best-paper award at the 2013 SensorComm Conference), replaced the coded aperture with various types of admirable intricate-design spiral-arm diffraction elements whose optical Modulation Transfer Function possesses no spectral zeros (as explicitly anticipated in the inventor's 1999 patent family). The resulting diffracted light is measured by a small but conventional CMOS imaging sensor. Although the available Rambus papers and presentation slides describe various means of numerical image recovery, inversion by numerical division by the Fourier transform optical Modulation Transfer Function in the Fourier numerical domain has been described as the preferred method in an attended public presentation (again as explicitly taught in the inventor's 1999 patent family). The Rambus system also makes distance range measurements in keeping with similar abilities of coded aperture imaging [P34], [P47]. The spiral-arm diffraction element/CMOS imaging sensor approach was later admirably extended to longer wavelengths through use of a microbolometer to implement a miniature lensless far-field 8-14 μm thermal-wavelength infrared computational imager [P61].

Hitachi announced a lensless light-field imaging camera, targeted for 2018, that employs Moire patterns rather than a coded aperture [P11], [P12], [P13], [P14].

CalTech announced an early-stage computational imaging camera employing phase array methods [P39].

A University of Utah project utilizes a bare commercial CMOS image sensor set a large distance away from a large "low" resolution LED-display, using pixel-by-pixel training sequences (as taught in a 2008 inventor's patent family) and recovering the image as a regularized ill-posed inverse problem [P70].

Although the coded aperture imaging area and the three alternatives described above each have their own "world," it is possible to create an overarching framework that includes all of these. As will be discussed, it is the inventor's view that the inventor's comprehensive lensless light-field imaging program (beginning with the inventor's 1999 patent family) arguably if not straightforwardly includes and provides a framework admitting most of these in at least some sense, as well as including the many other original innovations from the inventor's comprehensive lensless light-field imaging program). For other selective perspectives and far more historical and contextual information see for example [P6], [P66]. From an even broader view, all such approaches can be abstracted into the notion of "computational imaging" from which various fundamental principles can be explored; for example see [P66], [P73].

As to further how the above compare and sequence over time with respect to the inventor's comprehensive lensless light-field imaging program, FIG. 5 depicts a more detailed view of the inventor's comprehensive lensless light-field imaging program (beginning with the inventor's 1999 patent family) and includes recently-popularized coded-aperture lensless imaging. FIG. 6 depicts a functional "timeline" view of lensless imaging, including both the inventor's comprehensive lensless light-field imaging program (beginning with the inventor's 1999 patent family) is and recently-popularized (2011-2016) coded-aperture lensless imaging stemming from radiation-imaging work dating from 1968 [P62]. Additionally, FIG. 7 includes in its vertical time-line depiction representative literature in lensless imaging with respect to the inventor's comprehensive lensless light-field imaging program.

As an additional note, since the fate of many captured images is to be compressed by image compression algorithms comprising at least some linear transformation operations, the coded aperture could conceptually be modified to impose additional coding functions, in particular those useful in compressing an image suitable for image decompression on the viewing or applications side. This has been shown to be possible and considerable work has been done in this area; see for example.

B. Relations to Lens-Based Light-Field Imaging

A light-field is most generally a 5-dimensional vector function representation of physical arrangement of directional light paths and intensities at each point in a space of optical propagation. The ideas date back to Faraday but was named and formalized in 1936 by Andrey Gershun. That said, the concept of a light field camera dates back to the 1908 "Integral Photograph" work and proposals by Gabriel Lippmann, winner that same year of the Nobel Prize for the invention of color photography (also known for being the predictor of the now widely employed converse piezoelectric effect and inventor of the telescope position compensating coelostat).

A Stanford team including Ren Ng formalized a light-field camera using a ('plenoptic") microlens-array technique [P40], leading not long thereafter to the well-respected Lytro refocusable light-field camera [P41]. Toshiba subsequently announce a 2013 refocusable light-field OEM camera module product [P42] using miniaturized similar technology. Recent (2016) developments in this area implement light-field imaging without the use of microlenses by employing layers of "optical" sensors instead [P43].

The inventor's 1999 patent family taught lensless computational imaging with light-field capabilities and (albeit for color imaging sensing) layered optical sensors. Also, as indicated in the previous subsection, coded aperture image sensors are typically capable of performing as light-field cameras (see for example [P67]).

It is notated notion, description, mathematical treatment, and measurement, of light-fields, and image rendering from them, have other historical and contemporary threads. A 2006 survey of light-field imaging from a simplified 4-dimensional representation computational imaging viewpoint employed in Image Based Rendering (IBR), computer-graphics fly-bys and related applications is presented in [P46]. Light-fields (and their analogs in acoustics, seismology, and energy fields) are also in various forms are inherently and thus fundamentally relevant to at least wave-field inversion and wave-field Inverse Source Problems (ISPs), tomography, holography, broader Image Based Rendering (IBR) applications, and 3D graphics rendering; for a 'unified' treatment regarding imaging, wavefield inversion and tomography see for example the book by Devaney [B3]. Additionally there are various other methods for measuring and sampling empirical light-fields; a few examples are described in the book by Zhang and Chen [B4].

Although presented before, FIG. 7 includes in its vertical time-line depiction representative literature in light-field imaging with respect to the inventor's comprehensive lensless light-field imaging program.

C. Use of LEDs as Light Sensors and Light Sensing Arrays

A number of earlier U.S. patents and U.S. patent Applications discuss various aspects of using LED and OLED arrays used in various combinations or sequences of light sensing and light-emitting modes and in one manor or another the integration of light sensing and light-emitting semiconductors in a common display panel, control panel, or image reader. Some of these employ time-multiplexed operating modes, some of these spatially interleave light sensing and light-emitting semiconductor elements, but none of these teach use as visual imaging camera.

U.S. Pat. No. 4,424,524 by Daniele (filed 1982) teaches a linear array of LEDs that selectively function as light emitters and light sensors for line-scanning a document on a rotating drum. No image display is involved.

U.S. Pat. No. 4,692,739 by Dorn teaches use of LEDs to form user operator panel control elements used both for receiving data from an operator to change the logic state of a device and for displaying the entered data back to the operator; current is selectively applied to an LED to display the data and alternately a photo-current produced by the LED is sensed by detecting the fall-off in the photo-current caused by the operator covering the light-emitting diode. No image display or capture is involved.

U.S. Pat. No. 5,424,855 by Nakamura teaches an array of LEDs controlled so as to emit light in a write mode and sense light in a read mode wherein each LED is alternately charged for a first interval, then allowed to discharge by flow of photocurrent for a second interval.

U.S. Pat. No. 5,929,845 by Wei teaches OLED array with individual OLEDs multiplexed between emitting and sensing modes (see text portion of the document, column 2 lines 4-17, and the preceding paragraph spanning columns 1 and 2).

U.S. Pat. No. 7,598,949 by Han teaches an "optical touch sensor" using LED-array as real-time photodiodes and co-integrated light-emitters. In the "preferred embodiment" he uses an array of discrete RGB LEDs, using (higher-energy/shorter-wavelength) blue LED elements for light emission and red LED elements as photodiodes (rather than time-multiplexing between emitting and sensing modes), and alludes OLEDs and printable manufacturing methods. A video demonstration (12 MB; viewable with MS Media Player and other populate viewers) is downloadable from http://mrl.nyu.edu/~jhan/ledtouch/index.html (visited Jul. 3, 2017).

U.S. Pat. No. 7,859,526 by Konicek teaches an LED array with individual LEDs multiplexed between emitting and sensing modes.

U.S. Pat. No. 8,026,879 by Booth teaches a somewhat different "optical touch sensor" and provides discussion of OLEDs as light-emitter and light-sensors (see abstract) but different use of photosensing.

U.S. Pat. No. 8,890,850 by Chung also teaches a related "optical touch sensor" and provides discussion of OLEDs as light-emitter and light-sensors; in particular note FIGS. 4-6.

Abandoned U.S. Patent Application 2009/0256810 by Pasquariello teaches a related "optical touch sensor" and provides some discussion of multiplexing LEDs between emitting and sensing modes.

These U.S. patents discuss possible applications as camera but do not teach image formation:

The series U.S. patents by Rostoker including U.S. Pat. Nos. 5,340,978, 5,519,205, 5,529,936, 5,734,155, 5,760,834, and 5,811,320.

U.S. Pat. No. 7,535,468 by Uy;

U.S. Pat. No. 6,787,810 by Choi et al.

Although presented before, FIG. 7 includes in its vertical time-line depiction representative patents discussed in this section with respect to the inventor's comprehensive lensless light-field imaging program.

D. Flexible Cameras and Transparent Image Sensors

The limited work that has been done regarding flexible cameras has been largely in the enabling optics area. Many points regarding the value, radical enablement, and some applications of flexible cameras have been provided in papers and press releases stemming from projects at Columbia University [P37], [P38] involving work on bendable and deformable mini-lens arrays, elastic optics, and associated internal optical compensational adaptation for those. These efforts appeal for the need for the development of flexible image sensors; the prototyping work employs traditional (color) camera sensors and camera lenses.

Another approach to flexible cameras, as well as flexible image sensors and transparent image sensors, involves grid of flexible light-sensing fibers that direct light to remotely-located conventional camera element [P53].

Another third approach to flexible cameras, as well as flexible image sensors and transparent image sensors, underway in Austria [P28] also is directed to enabling optics; this effort uses novel optics and luminescent concentrator thin transparent film to gather light from an area of a transparent bendable surface and direct it to the edges of the transparent bendable surface where it is provided to photodiode arrays at those edges. The images are monochrome. As to flexible image sensors, a flexible large-area photodetector array arranged as an image sensor employing organic photodiodes (discussed below) has been reported in 2008 [P54] where image-sensing capabilities have been demonstrated by projecting an image using external image projection equipment. More recently, IMEC has made several pre-commercialization developments announced in 2013 [P55] that overlap with the inventor's patents filed many years earlier.

Although presented before, FIG. 7 includes in its vertical time-line depiction representative literature in flexible cameras with respect to the inventor's comprehensive lensless light-field imaging program.

E. Transparent Electronics

Developments in transparent electronics arguably began in earnest with the discoveries, adaptations, and refinements of transparent conductor materials (see for example [P56]. Various transparent passive electronic components were subsequently developed and are important, but a key development was the invention of the first transparent thin-film transistor (TTFT) announced in 2003 ([B16] p. 1). TTFTs are presently widely used in display technology and can be fabricated by various means, including spin-deposition and printing using ink-jet or other printing methods. Information on transparent electronic materials can be found in the book by Wagner, Keszler, and Presley [B16] (see Chapter 4) as well as information on transparent resistors ([B16] section 5.2.1), transparent capacitors ([B16] sections 5.2.2 and 5.3.4), transparent inductors ([B16] section 5.2.3), transparent PN diodes ([B16] section 5.3.1), transparent MIS (Metal-Insulator-Semiconductor) diodes ([B16] section 5.3.1), and transparent thin-film transistors (TTFT) ([B16] section 5.4). Additional information and applications are provided, for example, in the book by Facchetti and Marks [B17].

F. Organic Semiconductors and Organic Optoelectronics

Closely related with the areas of transparent electronics, printed electronics and flexible electronics is the area of organic semiconductors and organic optoelectronics. Organic semiconductor materials facilitate many aspects of transparent electronics, printed electronics and flexible electronics, for example (a) replacing the band gap employed in traditional crystalline semiconductors with the energy band transition between highest-occupied molecular orbitals and lowest-unoccupied molecular orbitals and (b) replacing the crystal lattice structure of traditional crystalline semiconductors with the structures of polymers. There are many other aspects of organic semiconductors besides these. An introductory discussion of organic semiconductor materials is provided for example in Chapter 2 of the 2004 book by Gamota, Brazis, Kalyanasundaram, and Zhang [B22] and other perspectives of organic semiconductor are provided in the 2013 book edited by Cantatore [B23], although dozens of suitable and more contemporary books and journal publications abound. One of many important aspects is that organic semiconductor materials can facilitating the use of solution-based ("ink") printing fabrication (see for example [B24]) and other techniques applicable to deposit on curved surfaces and large area surfaces and which facilitate flexible/bendable active electronics. Other important aspects of organic semiconductor materials include transparent capabilities and incorporation of a wide range of new optoelectronic capabilities.

A major commercial and technology aspect of organic electronics resulted from the development of an organic optoelectronic element known as the Organic Light Emitting Diode (OLED). Attributions are made that the OLED was discovered at Kodak when researching solar cells (see for example [B20] section 3.3) and Kodak was a leader in this area for many subsequent years. Combining with thin-film transistors, active-matrix OLED-array displays became commercially available and were used in mobile phones. Early active-matrix OLED-array displays suffered from various problems and limitations, but the underlying materials, devices, system designs, and manufacturing techniques are yielding constraint improvement, and every year or so new major products appear or announced. One example is the curved-screen OLED television sets, and the used of another generation of OLED displays have been announced for forthcoming new mass-market mobile phone products. Flexible OLED displays have been repeatedly demonstrated at the annual Consumer Electronics Shows for many consecutive years, and as will be considered again later, a bendable OLED display was included in a product-concept panoramic camera [P36]. Also as will be discussed later, transparent active-matrix OLED-array displays and transparent OLED-array pixel-addressing circuits using transparent thin-film transistors (TTFTs) and transparent capacitors, and transparent conductors have been developed (see for example [B16] section 6.3.5; [B17] Chapter 12; [B18]; [B19] section 8.2; [B23] Chapter 3.

OLED-array displays can be fabricated by printing (for example using semiconducting, conducting, insulative, and resistive inks) or non-printed methods; non-as discussion of non-printed fabrication methods can be found in [B19] chapter 3, sections 6.1 and section 6.3). Developments in materials and fabrication techniques also create extension to size (including use of OLED-array tiling; see for example [B19] section 8.3), and degrees of curvature (for example a dome-shaped OLED display [P10]. Flat panel imager addressing circuits employing thin-film transistors and PIN or MIS light sensors are also known; see for example [B18] sections 1.2, 2.2.1, 3.1, 3.2, 5.2, 6.1, and 6.2.

Attention is now is directed towards organic photodiodes. Organic photodiodes are widely viewed as providing an enabling route to new devices and new applications that were previously impossible and likely to remain outside the reach of conventional semiconductors. Although there remains great devoted favoritism in the image sensor community for crystalline semiconductor photodiodes monolithically-integrated with CMOS electronics (drawing on belief structures and early performance metrics), organic photodiodes are rapidly gaining immense validation and radically expanding interest. As stated in the opening of [P22]: "Powerful, inexpensive and even flexible when they need to be, organic photodiodes are a promising alternative to silicon-based photodetectors." More detail as to this is provided in the summarizing remarks in the opening of [P2] "Organic photodiodes (OPDs) are now being investigated for existing imaging technologies, as their properties make them interesting candidates for these applications. OPDs offer cheaper processing methods, devices that are light, flexible and compatible with large (or small) areas, and the ability to tune the photophysical and optoelectronic properties—both at a material and device level . . . with their performance now reaching the point that they are beginning to rival their inorganic counterparts in a number of performance criteria including the linear dynamic range, detectivity, and color selectivity." Additional important points are made in the opening remarks of [P17]: "There are growing opportunities and demands for image sensors that produce higher-resolution images, even in low-light conditions. Increasing the light input areas through 3D architecture within the same pixel size can be an effective solution to address this issue. Organic photodiodes (OPDs) that possess wavelength selectivity can allow for advancements in this regard. Further important remarks are provided in the opening words of [P30]: "Organic semiconductors hold the promise for large-area, low-cost image sensors and monolithically integrated photonic microsystems. published structures of organic photodiodes offer high external quantum efficiencies (EQE) of up to 76% . . . we report on organic photodiodes with state-of-the-art EQE of 70% at 0 V bias, an on/off current ratio of 106 . . . , dark current densities below 10 nA/cm2 . . . , and a lifetime of at least 3000 h . . . " Other general discussion of organic photodiodes can be found in many references, for example [B21], [P21], [P27].

Like OLEDs and often using essentially the same materials, organic photodiodes can readily be transparent [P20] or semitransparent [P19], fabricated via printing (see for example [P15], [P74]), and flexible (see for example [P2], [P54]). They can deliver high-sensitivity (see for example [P30], [P74]), overall high-performance (see for example [P2], [P17], [P19], [P22], [P30]). They can also include avalanche and photomultiplication (see for example [P18]). Additionally, like crystalline semiconductor LEDs when used as light sensors, and have been affirmed to provide wavelength selective light-sensing properties (see for example [P2], [P17], [P18], [P19], [P22], [P55]) that forgo the need for optical filters (as pointed out years many prior in several of the inventor's patents) in, for example, color imaging.

Many efforts have been directed towards combining OLED arrays with various types of photosensors to create sensors for biomedical applications. Many of these combine OLED with silicon-based photodetectors (see for example [P16], [P23]), but there have been recent efforts involving combining OLEDs with organic photodiodes (see for example [P7], [P8], [P9]). As to the enabling value of such integrations, [P23] states "Point-of-care molecular diagnostics can provide efficient and cost-effective medical care, and they have the potential to fundamentally change our approach to global health. However, most existing approaches are not scalable to include multiple biomarkers. As a solution, we have combined commercial flat panel OLED display technology with protein microarray technology to enable high-density fluorescent, programmable, multiplexed biorecognition in a compact and disposable configuration with clinical-level sensitivity."

As with crystalline semiconductor photosensors, increased performance for some applications can often be obtained by creating photo-sensitive transistors which, in effect, replace an electrically-responsive controlling input of a transistor with light-responsive controlling input. Accordingly, there is active work in the area of organic phototransistors and organic phototransistor arrays (see for example [P25], [P27], including for envisioned use as image detectors [P29]. Like organic photodiodes, organic phototransistors can also be wavelength selective (see for example [P24],[P26]), high performance (see for example [P24], [P25], [P26], [P29]), and flexible (see for example [P25], [P57]).

In addition to the aforedescribed transparent organic photodiode, transparent organic phototransistor and active matrix interface circuits for them, transparent charge-coupled devices are also known (see for example [B16] section 6.3.6).

G. Printed Electronics and Optoelectronics

Printed electronics and optoelectronics have already been mentioned through many of the above sections. Information regarding general materials for printed electronics can be found in a number of publications, for example [B17] p. 154, [B24], [B25], and [B26]. Organic semiconductor materials suitable for printing can be found in a number of publications, for example ([B22] Chapter 2). Printed electronics manufacturing processes can be found in a number of publications, for example [B22] Chapter 3. OLED-array display printed fabrication is discussed in, for example, [B19] section 6.2. Printed Organic Photodiodes are discussed in, for example, featuring high-performance [P74] and commercial availability [P15]. The important prospects for printable CMOS circuitry are discussed for example in [B16] p. 44; [B23] p. 124, and [P58].

H. Flexible and Bendable Electronics

Flexible and bendable electronics have already been mentioned through many of the above sections. Information regarding general materials for printed electronics can be found in a number of publications (see for example [B27], [B28], [B29], [B31], [B32], [P51]). General applications are discussed in [B27], [B28], [B29], and large area applications are discussed in [B30]. Fabrication by printing methods are discussed in many references (see for example [P51], [P52]), and performance improvements are frequently announced (see for example [P50]). The expected wide-acceptance of flexible electronics has been discussed in [P49]. The IOP-science multidisciplinary journal Flexible and Printed Electronics™ publishes cutting edge research across all aspects of printed, plastic, flexible, stretchable, and conformable electronics.

I. Flexible and Bendable Optoelectronics

Flexible and bendable electronics have already been mentioned through many of the above sections. Information regarding general materials for printed electronics can be found in a number of publications (see for example [B26]). Flexible TFTs for flexible OLED displays are discussed in for example [B19] section 8.1 and [P75]. High performance flexible organic photodiode arrays are discussed in for example [P54] and [P75]. High performance flexible organic phototransistors arrays are discussed in [P25]. Large-area flexible organic photodiodes sheet image scanners are discussed in [P75]. A prototype for a commercial (panoramic camera) product employing a flexible OLED display, (c) conformation deformation sensing is described in [P36]. Although not using flexible optoelectonics, the related work on transparent, flexible, scalable and disposable image sensors using thin film luminescent concentrators is presented in [P28].

J. Summarizing Functional- and Timeline-Comparison Table

Although presented earlier, FIG. 5 depicts a summarizing functional view of the inventor's comprehensive lensless light-field imaging program (beginning with the inventor's 1999 patent family), and FIG. 7 depicts a comparative timeline table of representative patents and literature with respect to the inventor's comprehensive lensless light-field imaging program.

SUMMARY OF THE INVENTION

For purposes of summarizing, certain aspects, advantages, and novel features are described herein. Not all such advantages can be achieved in accordance with any one particular embodiment. Thus, the disclosed subject matter can be embodied or carried out in a manner that achieves or optimizes one advantage or group of advantages without achieving all advantages as taught or suggested herein.

The invention provides for a rigid or flexible surface to be configured to implement a lensless light-field sensor, producing electrical signals that can be used in real time, or stored and later retrieved, and provided to a computational inverse model algorithm executing on computational hardware comprising one or more computing elements so as to implement a lensless light-field camera.

In another aspect of the invention, a rigid surface is configured to additionally function as a housing and thus operate as a "seeing housing".

In another aspect of the invention, a rigid surface is configured to additionally function as a protective plate and thus operate as a "seeing armor".

In another aspect of the invention, a rigid surface is configured to additionally function as an attachable tile and thus operate as a "seeing tile".

In another aspect of the invention, a rigid surface is configured to additionally function as an attachable film and thus operate as a "seeing film".

In another aspect of the invention, a flexible surface is configured to additionally function as an attachable film and thus operate as a "seeing film".

In another aspect of the invention, a flexible surface is configured to additionally function as a garment and thus operate as a "seeing garment".

In another aspect of the invention, a flexible surface is configured to additionally function as a shroud and thus operate as a "seeing shroud".

In another aspect of the invention, a flexible surface is configured to additionally function as an enveloping skin and thus operate as a "seeing skin".

In another aspect of the invention, the rigid or flexible surface is small in size.

In another aspect of the invention, the rigid or flexible surface is large in size.

In another aspect of the invention, the rigid or flexible surface is flat.

In another aspect of the invention, the rigid or flexible surface is curved.

In another aspect of the invention, the rigid or flexible surface is rendered as a polytope.

In another aspect of the invention, the rigid or flexible surface is rendered as a dome.

In another aspect of the invention, the rigid or flexible surface is rendered as a part of a sphere.

In another aspect of the invention, the rigid or flexible surface is rendered as a part of a spheroid.

In another aspect of the invention, the rigid or flexible surface is rendered as a sphere.

In another aspect of the invention, the rigid or flexible surface is rendered as a spheroid.

In another aspect of the invention, the rigid or flexible surface is transparent.

In another aspect of the invention, the rigid or flexible surface is translucent.

In another aspect of the invention, the rigid or flexible surface is opaque.

In another aspect of the invention, the rigid or flexible surface performs contact sensing.

In another aspect of the invention, the rigid or flexible surface is configured to perform contact image sensing with near-zero separation distance.

In another aspect of the invention, the rigid or flexible surface is configured to perform contact image sensing with zero separation distance.

In another aspect of the invention, the rigid or flexible surface performs distributed optical imaging.

In another aspect of the invention, the rigid or flexible surface performs distributed optical sensing.

In another aspect of the invention, the rigid or flexible surface performs image sensing of ultraviolet light.

In another aspect of the invention, the rigid or flexible surface performs image sensing of infrared light.

In another aspect of the invention, the rigid or flexible surface performs image sensing of selected ranges of visible color light.

In another aspect of the invention, the rigid or flexible surface performs imaging.

In another aspect of the invention, the rigid or flexible surface performs distributed chemical sensing employing optical chemical sensing properties of at least one material.

In another aspect of the invention, the rigid or flexible surface performs distributed radiation sensing employing optical radiation sensing properties of at least one material.

In another aspect of the invention, the rigid or flexible surface performs distributed magnetic field sensing employing optical magnetic field sensing properties of at least one material.

In another aspect of the invention, the rigid or flexible surface is configured to emit light.

In another aspect of the invention, the rigid or flexible surface is configured to operate as a light-emitting display.

In another aspect of the invention, the rigid or flexible surface is configured to operate as a selectively self-illuminating contact imaging sensor.

In another aspect of the invention, the computational inverse model algorithm is configured to provide variable focusing.

In another aspect of the invention, the computational inverse model algorithm is configured to mixed depth-of-field focusing.

In another aspect of the invention, the computational inverse model algorithm is configured to implement a viewpoint with a controllable location.

In another aspect of the invention, the computational inverse model algorithm is configured to implement a plurality of viewpoints, each viewpoint having a separately controllable location.

In another aspect of the invention, the computational inverse model algorithm is configured to provide pairs of outputs so as to function as a stereoscopic camera.

In another aspect of the invention, the computational inverse model algorithm is configured to capture a panoramic view.

In another aspect of the invention, the computational inverse model algorithm is configured to capture a 360-degree view.

In another aspect of the invention, the computational inverse model algorithm is configured to capture a partial spherical view.

In another aspect of the invention, the computational inverse model algorithm is configured to capture a full spherical view.

In another aspect of the invention, the rigid or flexible surface is configured to perform enveloping image sensing with near-zero separation distance.

In another aspect of the invention, the rigid or flexible surface is configured to perform contact enveloping sensing with zero separation distance.

In another aspect of the invention, the rigid or flexible surface is configured to operate as a selectively self-illuminating enveloping imaging sensor.

In another aspect of the invention, the computational inverse model algorithm is configured to operate at slow-frame video rates.

In another aspect of the invention, the computational inverse model algorithm is configured to operate at conventional video rates.

In another aspect of the invention, the computational inverse model algorithm and computational hardware is configured to operate at high-speed video rates.

In another aspect of the invention, a lensless light-field imaging system comprising An array of light sensing elements, each light-sensing element comprising a light-sensing area and configured to generate an electrical photocurrent responsive to the amplitude of incoming light striking the light-sensing surface, each light-sensing surface arranged to experience angularly-varying sensitivity responsive to the direction of each path of incoming light striking the light-sensing surface, First electronics for interfacing the array of light sensing elements, the electronics configured to provide a plurality of voltage levels, each voltage level responsive to a specific light-sensing element in the array of light sensing elements, Second electronics for converting each of the plurality of voltage levels into a corresponding electronically-represented digital number, the result comprising a plurality of electronically-represented digital numbers, and An algorithm for executing on a computational processor, the algorithm for computing a two-dimensional image representation from plurality of electronically-represented digital numbers, the two-dimensional image representation corresponding to portion of a focused image at a particular separation distance value measured perpendicular to the light-sensing surface of a particular light sensing element in the array of light sensing elements, there being a plurality of separation distance values, Wherein each of the digital numbers are responsive to the amplitude of incoming light striking the light-sensing surface of a unique associated light sensing element in the array of light sensing elements and a plurality of focused image portions, and Wherein the plurality of separation distance values are not appreciably the same numeric value.

In another aspect of the invention, the light sensing elements of the array of light sensing elements are oriented in space to form a curved surface.

In another aspect of the invention, spatial positions of the plurality of focused image portions form a planar surface.

In another aspect of the invention, the light sensing elements of the array of light sensing elements are oriented in space to form a planar surface.

In another aspect of the invention, the spatial positions of the plurality of focused image portions form a curved surface.

In another aspect of the invention, the light sensing elements of the array of light sensing elements are oriented in space to form a curved surface and the spatial positions of the plurality of focused image portions form a curved surface.

In another aspect of the invention, the algorithm is controlled by a at least one separation distance parameter.

In another aspect of the invention, the algorithm is controlled by a plurality of localized separation distance parameters.

In another aspect of the invention, the first electronics comprises multiplexing electronics.

In another aspect of the invention, the first electronics comprises at least one transimpedance amplifier circuit.

In another aspect of the invention, the light sensing elements comprise organic photodiodes.

In another aspect of the invention, the light sensing elements comprise organic light emitting diodes.

In another aspect of the invention, the light sensing elements comprise organic diodes that are co-optimized for both light emission and light sensing.

In another aspect of the invention, the light sensing elements are arranged to emit light for some interval of time.

In another aspect of the invention, the light sensing elements are arranged to emit light for some interval of time under the control of the first electronics.

In another aspect of the invention, the angularly-varying sensitivity of the light sensing elements results at least in part from the structure of the light sensing elements.

In another aspect of the invention, the angularly-varying sensitivity of the light sensing elements results at least in part from a structure attached to the array of light sensing elements.

In another aspect of the invention, the array of light sensing elements is fabricated by a printing process.

In another aspect of the invention, the structure attached to the array of light sensing elements is fabricated by a printing process.

In another aspect of the invention, the structure attached to the array of light sensing elements comprises segregated optical paths.

In another aspect of the invention, the segregated optical paths are created by separating surfaces.

In another aspect of the invention, the separating surfaces are at least partially-reflective.

In another aspect of the invention, the separating surfaces are configured to facilitate surface plasmon propagation.

In another aspect of the invention, at least one of the light sensing elements is color selective.

In another aspect of the invention, color selective property results from a band gap property of a semiconductor device element comprised by the at least one light sensor.

In another aspect of the invention, the algorithm comprises array multiplication of numerical values responsive to the plurality of electronically-represented digital numbers.

In another aspect of the invention, the algorithm comprises array multiplication of numerical values obtained from the calculation of a generalized inverse matrix.

In another aspect of the invention, the algorithm comprises array multiplication of numerical values obtained from an interpolation.

In another aspect of the invention, the algorithm comprises array multiplication of numerical values obtained from a predictive analytical model.

In another aspect of the invention, the algorithm comprises array multiplication of numerical values derived from a predictive analytical model.

In another aspect of the invention, the algorithm comprises array multiplication of numerical values derived from empirical measurements.

BRIEF DESCRIPTION OF THE DRAWINGS

The above and other aspects, features and advantages of the present invention will become more apparent upon consideration of the following description of preferred embodiments taken in conjunction with the accompanying drawing figures, wherein:

FIG. 2 depicts an illustrative representational view of the confluence of the expanded features and capabilities taught in the inventor's 1999 patent family.

FIG. 3 depicts an illustrative representational view of the confluence of the expanded features and capabilities taught in the inventor's 2008 patent family. The 2009 addition of optical tomography capabilities is also noted.

FIG. 7 depicts a timeline of representative technology-related patents and literature with respect to the inventor's comprehensive lensless light-field imaging program.

FIG. 9a, adapted from the figure available on the internet at https://en.wikibooks.org/wiki/Introduction_to_Inorganic_Chemistry/Electronic_Properties_of_Materials:_Superconductors_and_Semiconductors#/media/File:PnJunction-E.PNG as retrieved Jul. 3, 2017 (top portion), depicts a representation of the active carrier flow of a forward biased switching diode wherein, by design, current-flow directional switching functions are optimized and light-emission and light-detection capabilities of PN junctions are suppressed.

FIG. 9b, adapted from the figure available on the internet at https://en.wikibooks.org/wiki/Introduction_to_Inorganic_Chemistry/Electronic_Properties_of_Materials:_Superconductors_and_Semiconductors#/media/File:PnJunction-E.PNG as retrieved Jul. 3, 2017 (middle portion), depicts the blocked carrier flow of a reversed biased situation for the switching diode depicted in FIG. 9a.

FIG. 9c, adapted from the figure available on the internet at https://en.wikibooks.org/wiki/Introduction_to_Inorganic_Chemistry/Electronic_Properties_of_Materials:_Superconductors_and_Semiconductors#/media/File:PnJunction-E.PNG as retrieved Jul. 3, 2017 (bottom portion), depicts an energy-band representation of a switching diode wherein, by design, current-flow directional switching functions are optimized and light-emission and light-detection capabilities of PN junctions are suppressed.

FIG. 9d, adapted from the image available at http://www.leamabout-electronics.org/Semiconductors/diodes_23.php as visited on Jun. 20, 2017, depicts a representation of the physical construction of a switching diode wherein, by design, current-flow directional switching functions are optimized and light-emission and light-detection capabilities of PN junctions are suppressed.

FIG. 10b, adapted from the bottom portion of a figure available on the internet at https://en.wikipedia.org/wiki/Light-emitting_diode#/media/File:PnJunction-LED-E.svg as retrieved Jul. 3, 2017, depicts an energy-transition representation of an operating (inorganic or organic) semiconducting PN junction light-emitting diode (LED).

FIG. 11a, adapted from figure 4.7.1 of the on-line notes "Principles of Semiconductor Devices" by B. Van Zeghbroeck, 2011, available at https://ecee.colorado.edu/~bart/book/book/chapter4/ch4_7.htm as retrieved Jul. 3, 2017, depicts an abstracted structural representation of an example (inorganic or organic) simple ("simple-heterostructure") semiconducting PN junction light-emitting diode (LED).

FIG. 11b, adapted from Figure 7.1 of the on-line table of figures available on the internet at https://www.ecsarpi.edu/~schubert/Light-Emitting-Diodes-dot-org/chap07/chap07.htm as retrieved Jul. 3, 2017, depicts an abstracted structural representation of an example (inorganic or organic) more complex double-heterostructure semiconducting PN junction light-emitting diode (LED), here effectively configured as a two-PN junction sandwich.

by J. Xiang and Y. Zhao, Optical Engineering, 53(4), published Apr. 28, 2014, available at http://opticalengineering.spiedigitallibrary.org/article.aspx?articleid=1867195 as retrieved Jul. 3, 2017, depicts an example structural representation of an example simple layered-structure PIN (inorganic or organic) simple semiconducting PN junction photodiode.

FIG. 14a, adapted from FIG. 2 of U.S. Pat. No. 7,202,102 "Doped Absorption for Enhanced Responsivity for High Speed Photodiodes" to J. Yao, depicts a combined energy/structure representation of a more specialized example layered-structure avalanche semiconducting PN junction photodiode.

FIG. 14b, adapted from the first two figures in "Comparison of waveguide avalanche photodiodes with InP and InAlAs multiplication layer for 25 Gb/s operation" by J. Xiang and Y. Zhao, Optical Engineering, 53(4), published Apr. 28, 2014, available at http://opticalengineering.spiedigitallibrary.org/article.aspx?articleid=1867195 as retrieved Jul. 3, 2017, depicts an example structural representation of an example layered-structure avalanche semiconducting PN junction photodiode.

Figure 15A:
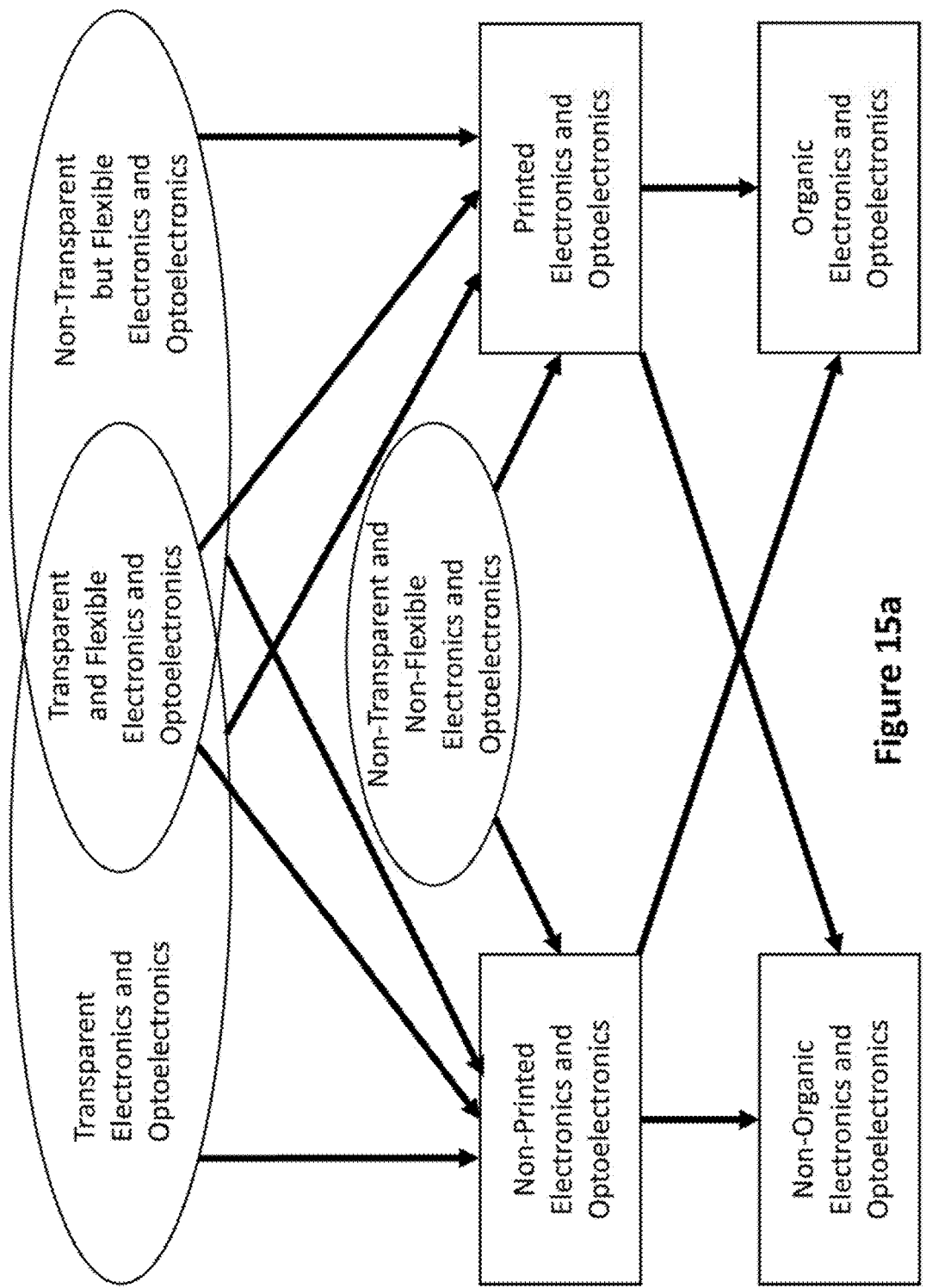

FIG. 15a depicts material science and fabrication relationships among (1) transparent/non-transparent electronics and optoelectronics, (2) flexible/non-flexible electronics and optoelectronics, (3) printed/non-printed electronics and optoelectronics, and (4) organic/non-organic electronics and optoelectronics.

Figure 15B:
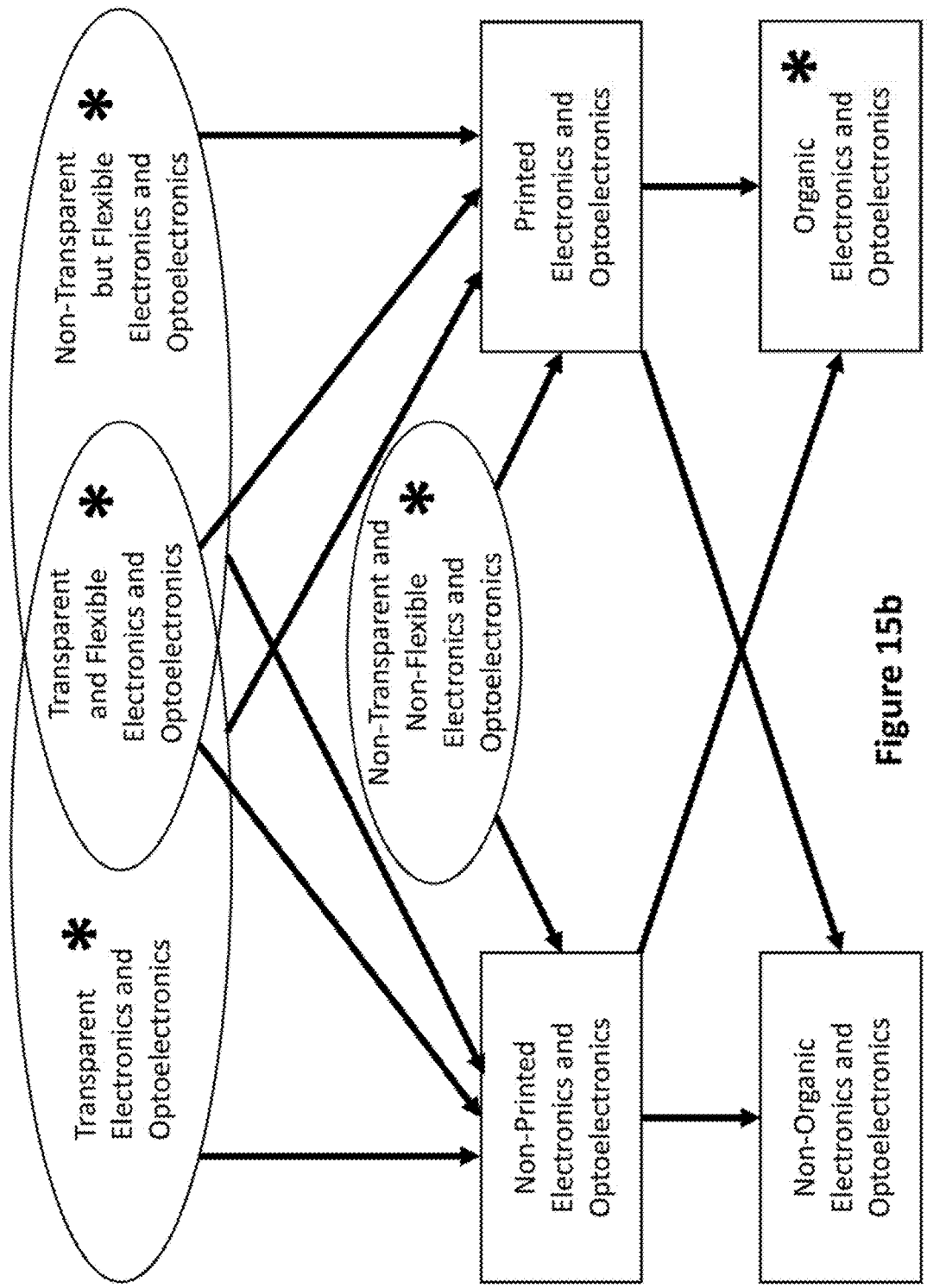

FIG. 15b provides a version of FIG. 15a where certain types of the electronics and optoelectronics are marked with asterisks (*) to signify functional contributions to various aspects of the present invention.

FIG. 16a, adapted from [P5], depicts a schematic representation of the arrangements and intended operational light paths for a pinhole camera.

FIG. 16b, adapted from [P5], depicts a schematic representation of the arrangements and intended operational light paths for a (simplified or single-lens) lens-based camera.

FIG. 16c, adapted from [P5], depicts a schematic representation of the arrangements and intended operational light paths for a mask-based camera, such as those discussed in [P62]-[P67].

FIG. 16d depicts to a schematic representation of some aspects of the present invention and the inventor's more comprehensive lensless light-field imaging program.

Figures 17, 18:
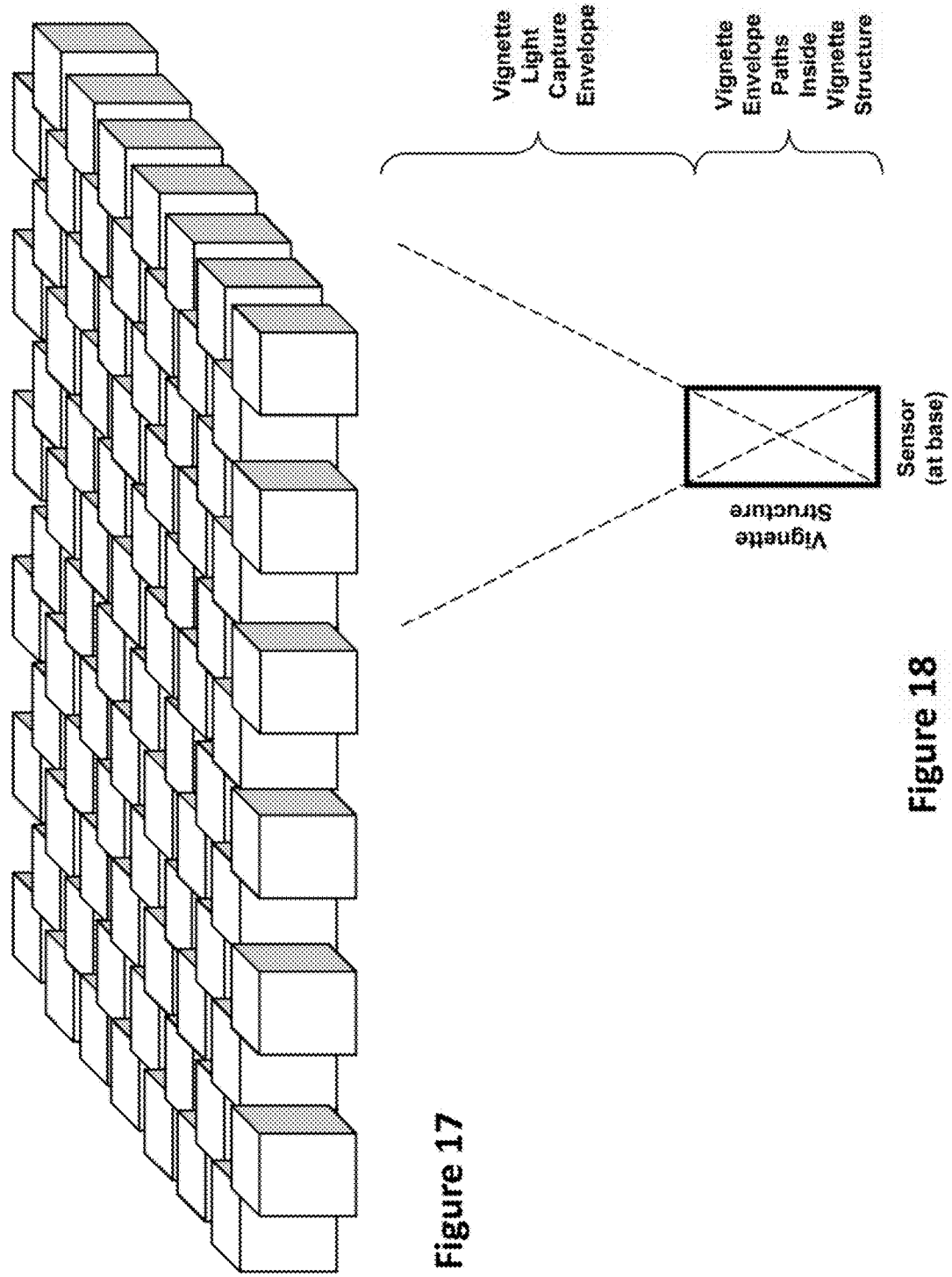

FIG. 17 depicts an array of parallel-oriented vignetting cavities; the bottom of each cavity can comprise or direct isolated light to light-sensing structure.

FIG. 18, adapted from FIG. 12 of the present inventor's U.S. Pat. No. 8,816,263 and related cases, illustrates a simplified view of how a vignette structure can limit the range of incident angles at which rays of light within a light field are able to reach the surface of the light-sensing element within a vignetting structure covering a light-sensing element. (Importantly, reflective effects within the vignette and diffraction effects are not illustrated.)

Figure 19:
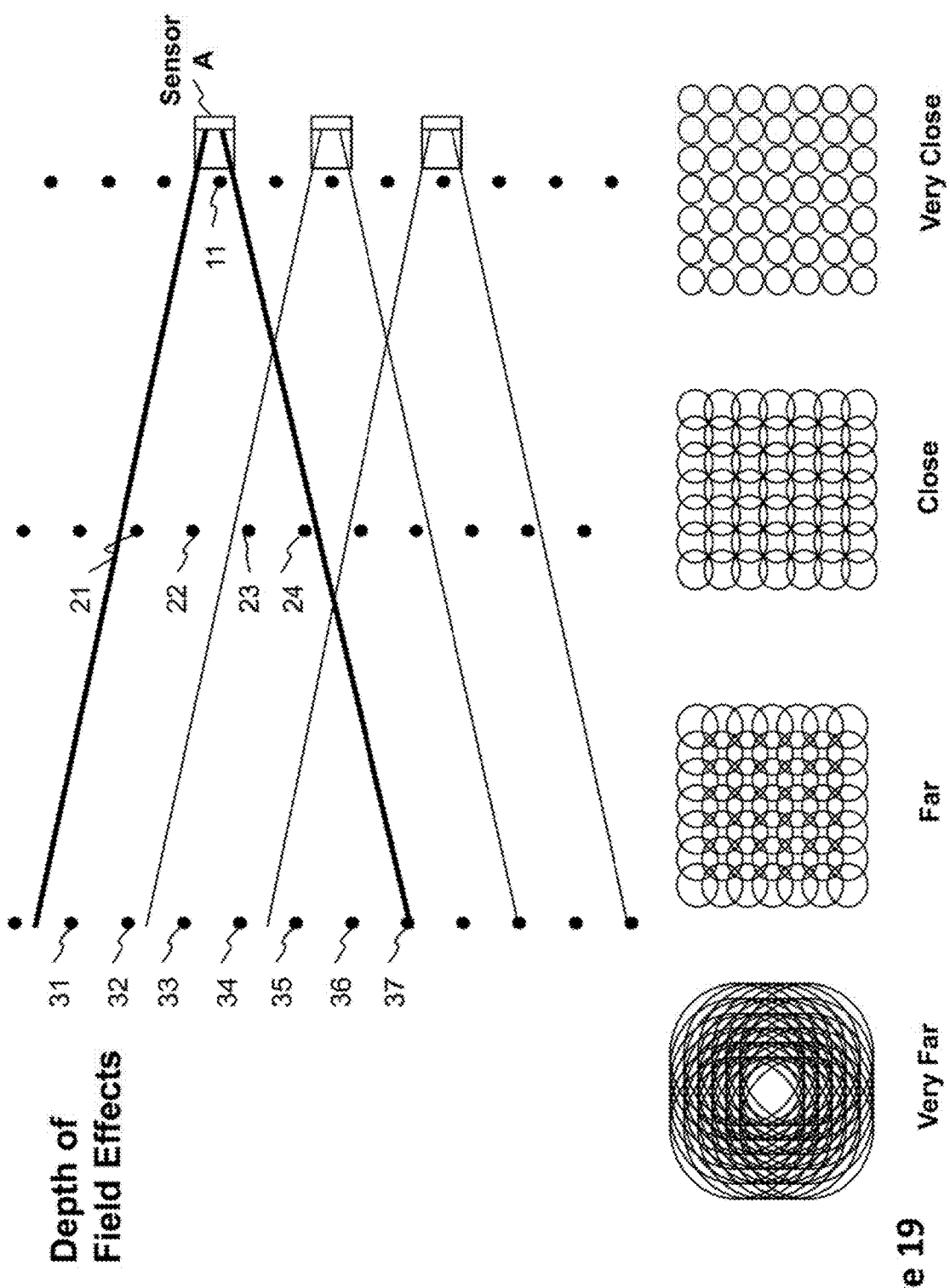

FIG. 19, composited and adapted from FIGS. 8 and 9a through 9b of the present inventor's U.S. Pat. No. 8,830,375 and related cases, illustrates a simplified view of the process by which the degree of vignette overlap increases as separation between the object in the scene and its distance from the micro-optic structure and light sensor array increases and how the degree of vignette overlap increases from 0% to values approaching 100% as the separation distance between a scene object and the micro-optic structure and light sensor array increases. (Importantly, reflective effects within the vignette and diffraction effects are not illustrated.)

Figure 20:
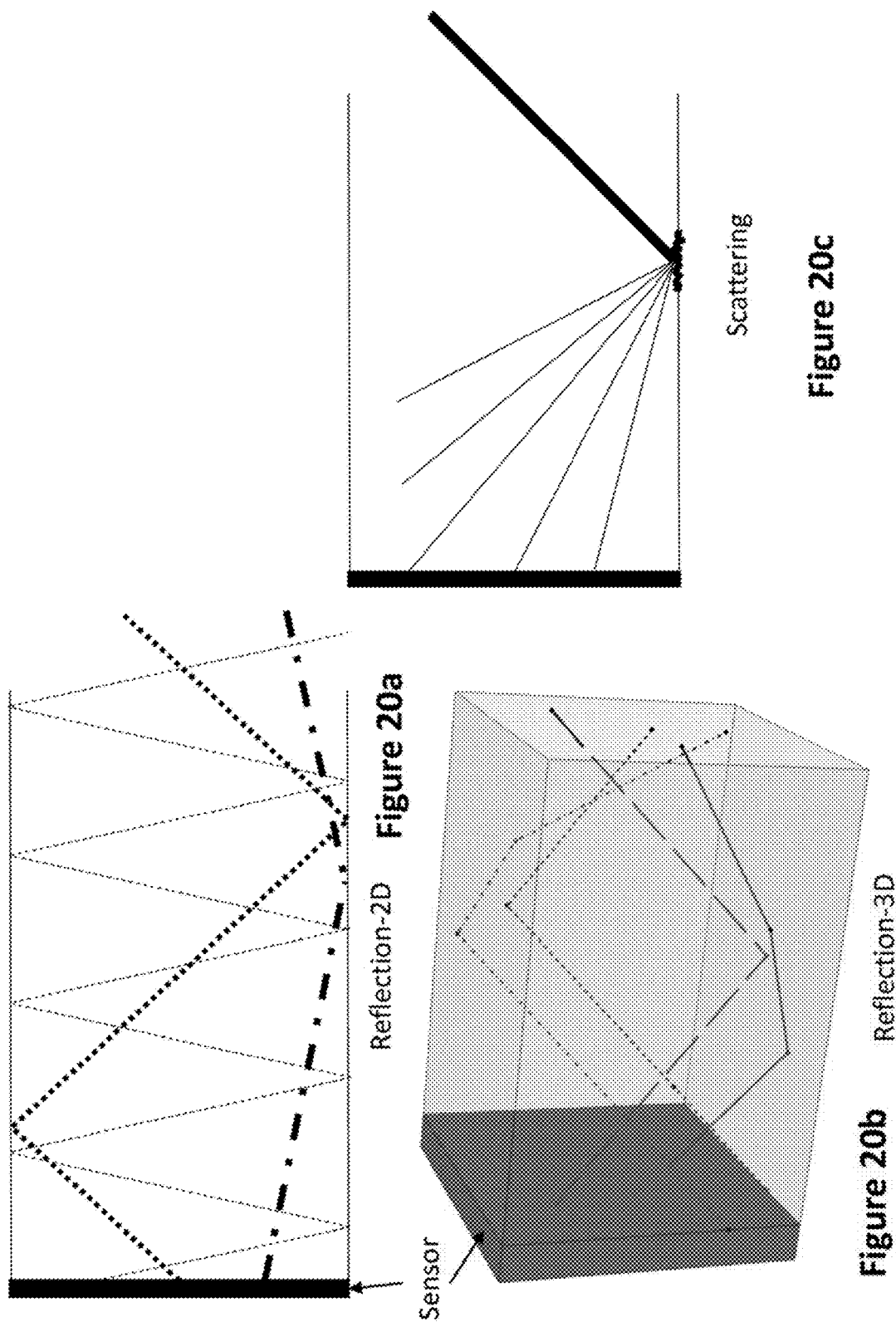

FIGS. 20a through 20c depict illustrative representations of reflection and scattering effects within a vignette. (Importantly, diffraction effects are not illustrated.)

Figure 21:
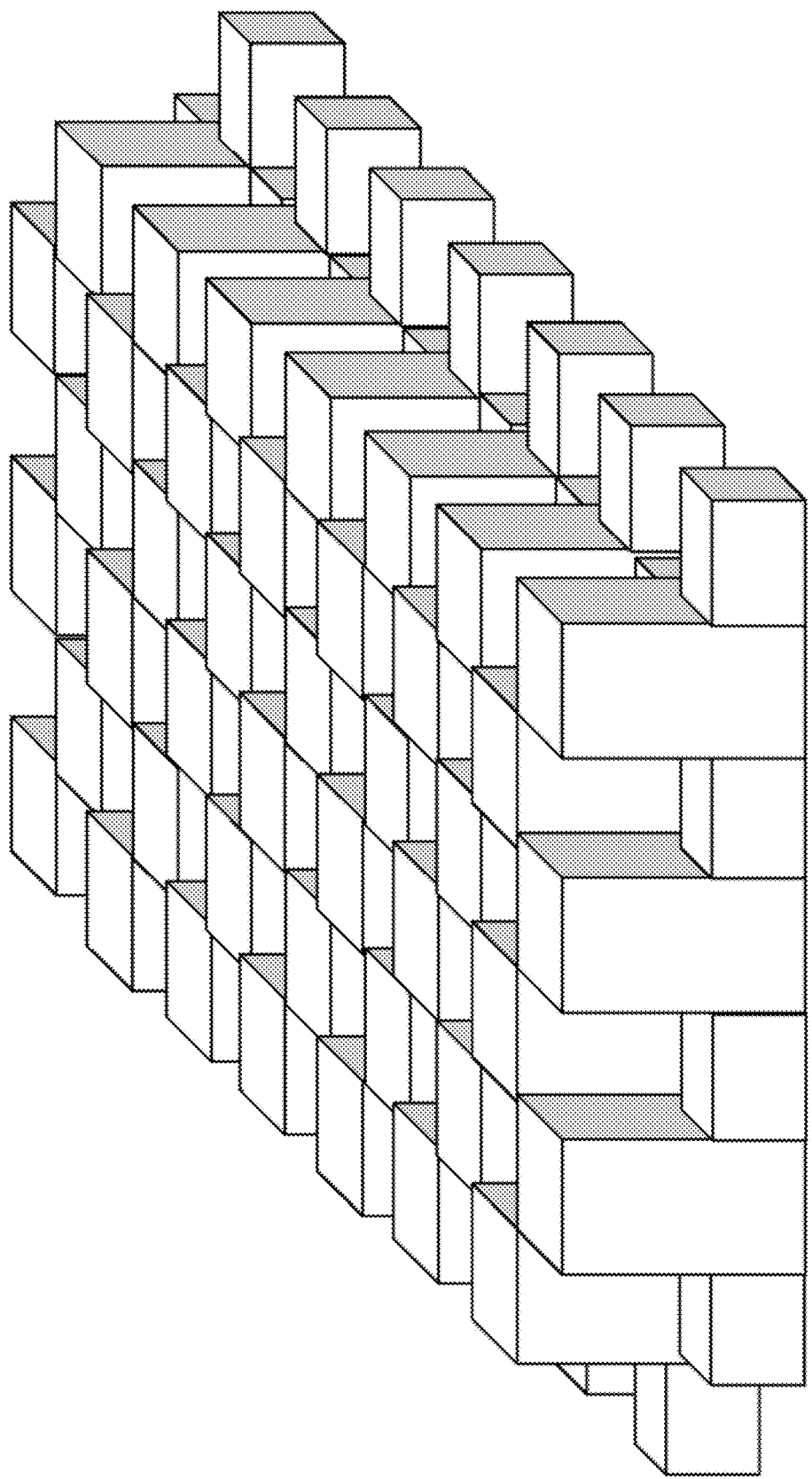

FIG. 21, adapted from FIG. 11b of the present inventor's U.S. Pat. No. 8,816,263 and related cases, depicts an array of parallel-oriented instances of alternating short" light-sensing structures and "tall", each parallel-oriented instance alternately staggered to create vignetting cavities surrounded by the sides of neighboring "tall" structures (which in some implementations can be light-emitting), the bottom of each cavity comprising a "short" light-sensing structure. In some implementations, the "tall" structures can be light-emitting.

Figures 22A, 22B, 22C:
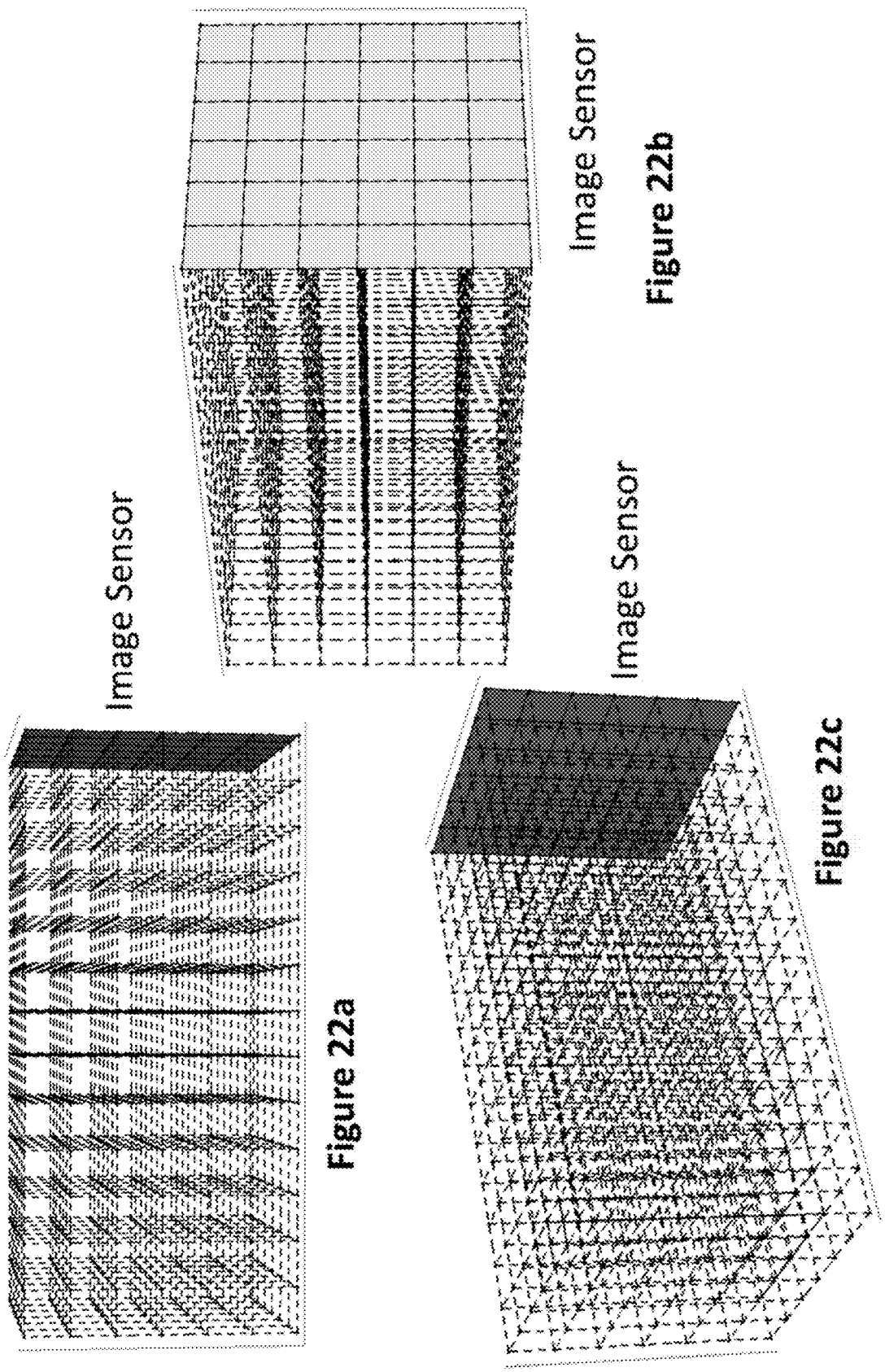

FIGS. 22a through 22c depict differing illustrative 3-dimensional views of a plane the containing the sensing surface of a planar image sensor arrangement, and extending spatially in front of the planar image sensor a coordinate grid defining numerically quantizing regions on an incoming light field that can be observed by the planar image sensor arrangement. Depending on the directional capabilities of the planar image sensor arrangement, the shape of the observable light field can have a different shape than the illustrative rectangular parallelepiped.

Figure 23B:
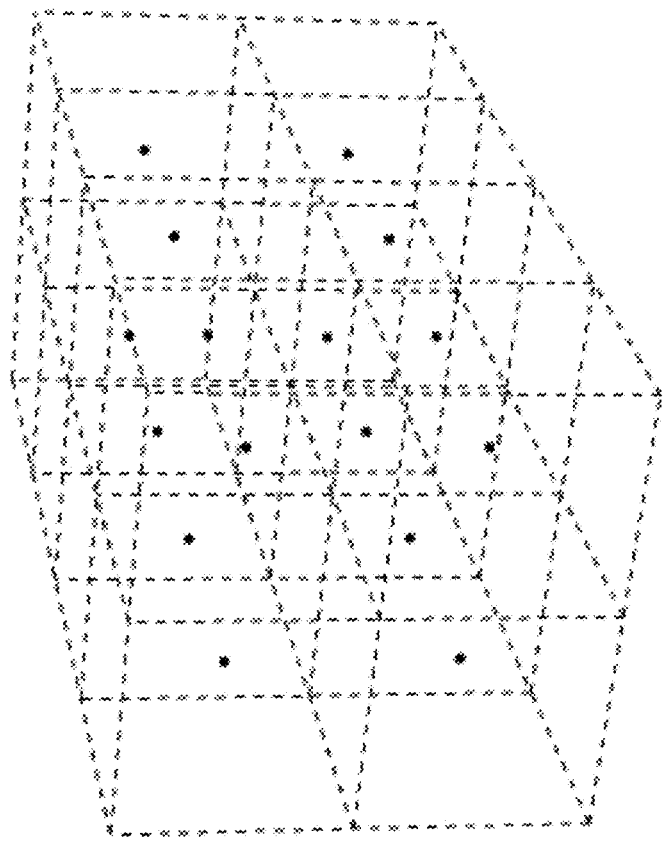
Figure 23A:
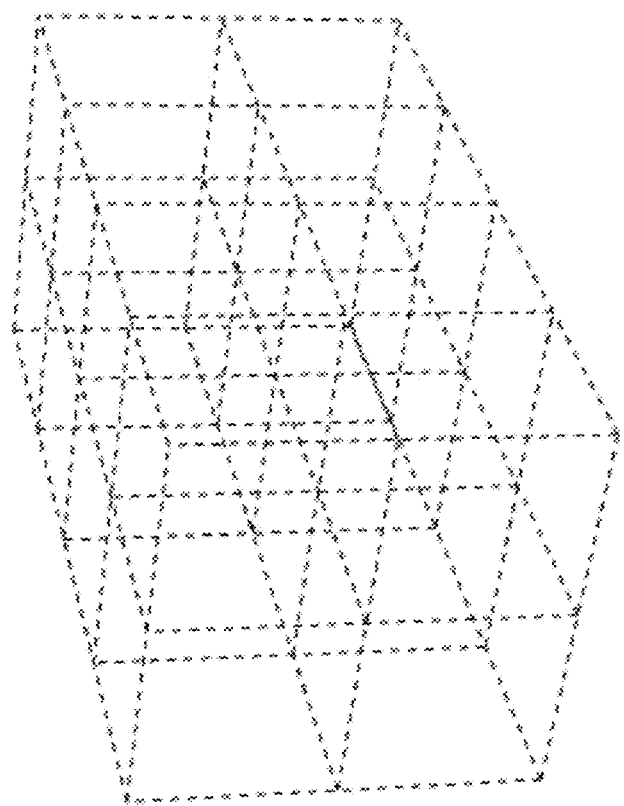

FIG. 23a depicts an example spatial quantization of a light field extending spatially in front of the planar image sensor into a lattice of distinct indexable volume elements (voxels).

FIG. 23b depicts an example spatial quantization of the light field voxel lattice of FIG. 23a by representing the aggregate of light-emission, light reflection, and/or light propagation within the voxel as (1) having a composite quantitative value of light representing the combined aggregate of light-emission, light reflection, and/or light propagation within the volume of voxel which is (2) concentrated at a point in the interior of the voxel.

Figure 24:
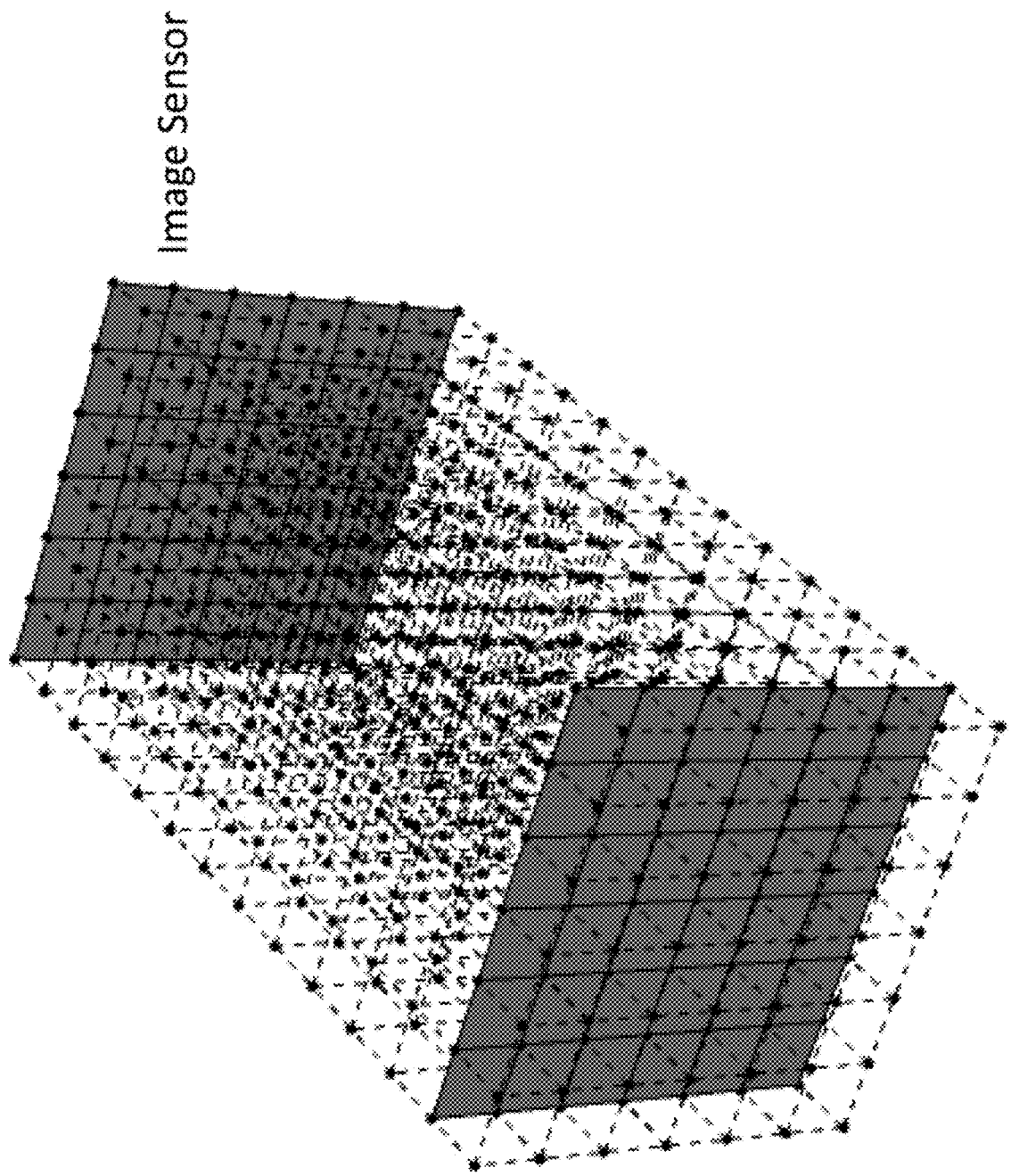

FIG. 24 depicts a pair of illustrative 3-dimensional views of an example arrangement comprising a planar array of (emitted and/or reflected) light source elements and a parallel planar array of light-sensing elements, and a spatially-quantized light-field representation between the planes. The roles of planar array of light source elements and a parallel array of light-sensing elements can be interchanged.

Figures 25A, 25B:
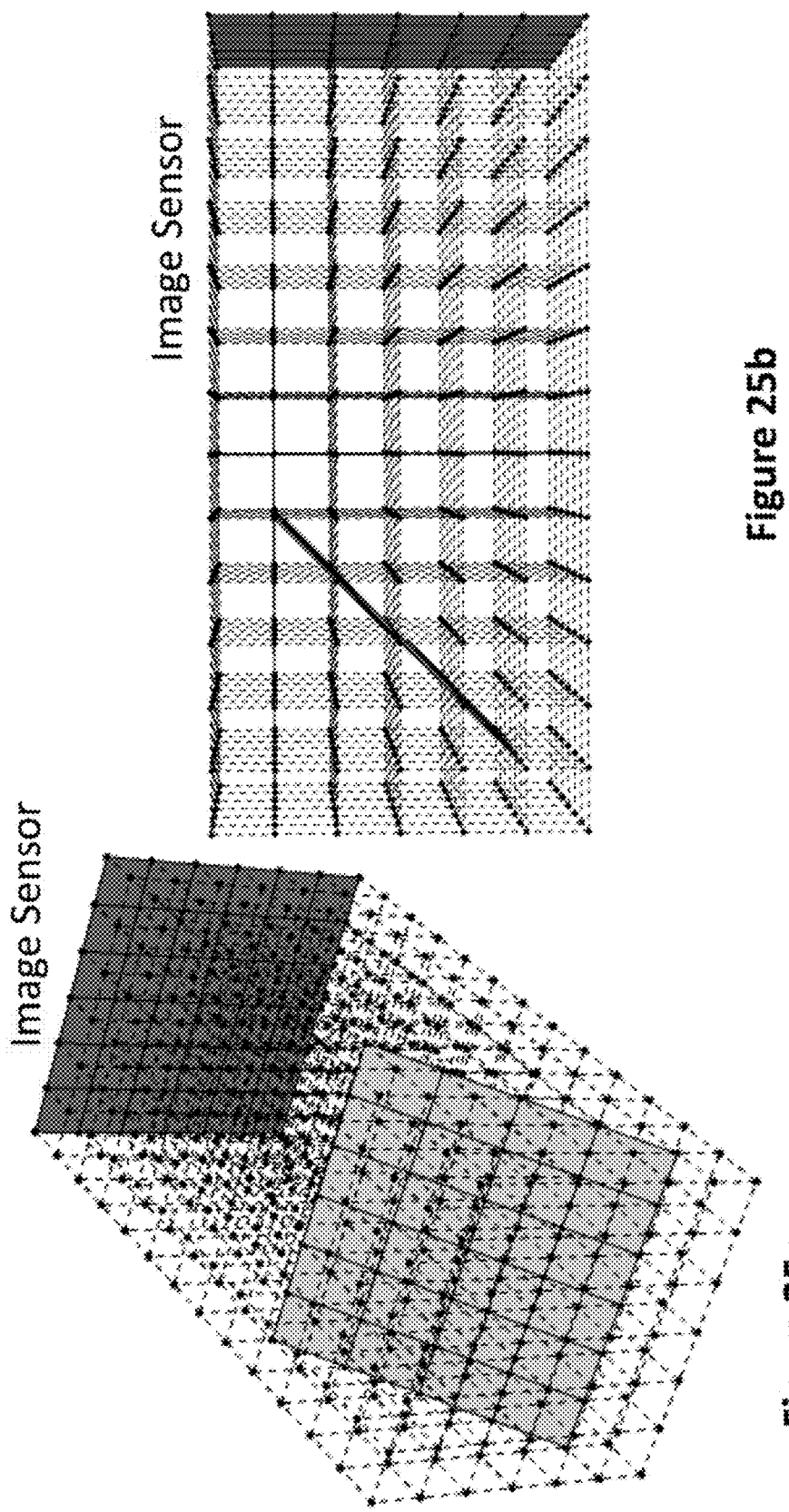

FIGS. 25a and 25b depict a pair of illustrative 3-dimensional views of an example variation of the arrangement depicted in FIG. 24 wherein a planar array of (emitted and/or reflected) light source elements and a planar array of light-sensing elements, are not parallel planes. The roles of planar array of light source elements and a parallel array of light-sensing elements can be interchanged.

Figure 26B:
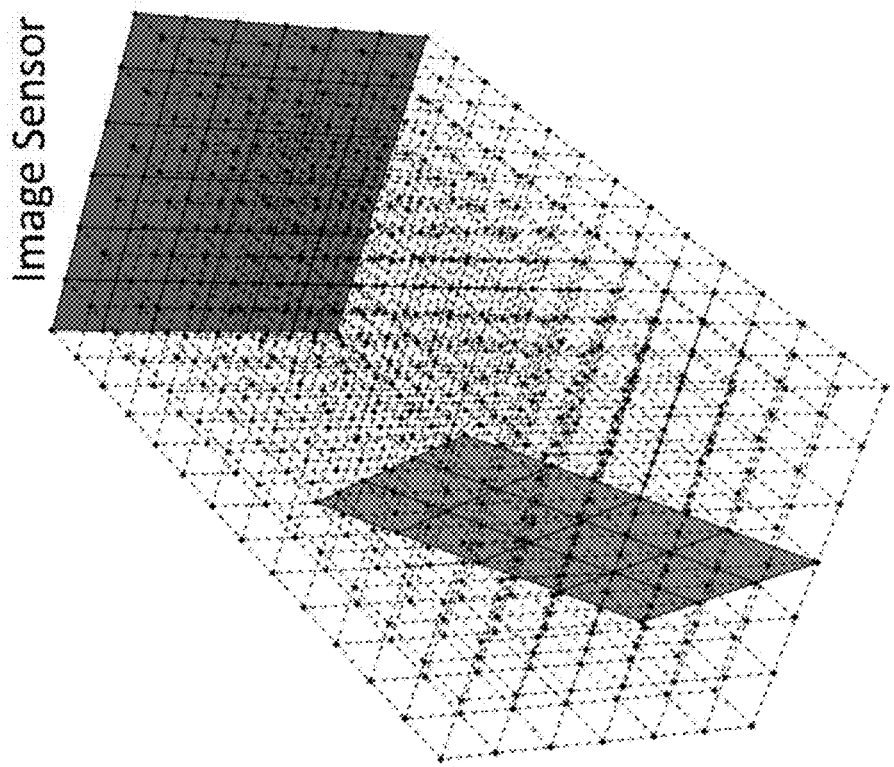
Figure 26A:
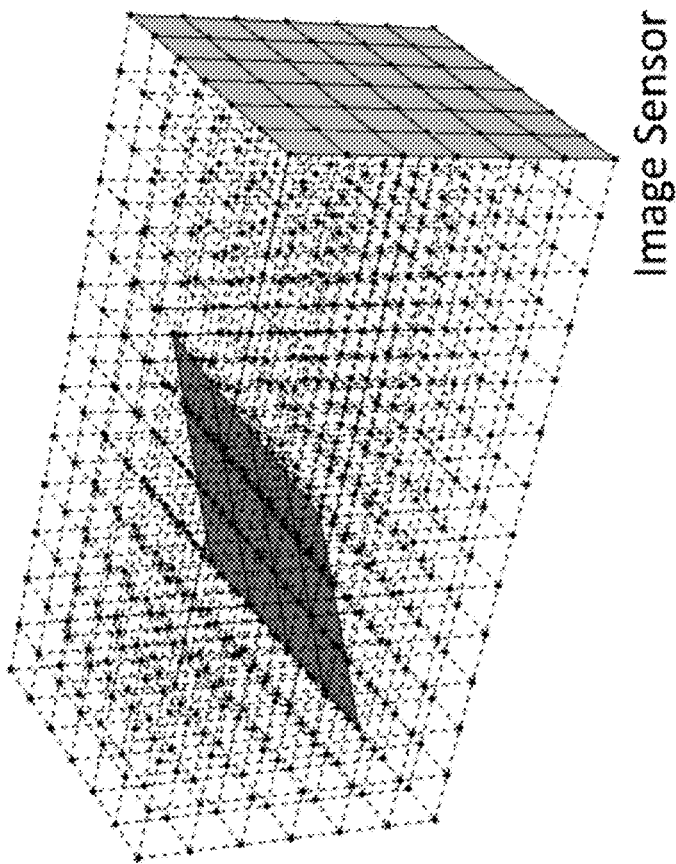

FIG. 26a depicts another illustrative 3-dimensional view of an example variation of the arrangement depicted in FIGS. 25a and 25b wherein the dihedral angle between the planes is farther from parallel. The roles of planar array of light source elements and a parallel array of light-sensing elements can be interchanged.

FIG. 26b depicts an illustrative 3-dimensional view of another example of the arrangements depicted in FIGS. 25a, 25b, and 26a wherein the dihedral angle between the planes is sloped in two dimensions. The roles of planar array of light source elements and a parallel array of light-sensing elements can be interchanged.

FIGS. 27a and 27b depict a pair of illustrative 3-dimensional views of an example of a non-planar curved surface and a planar surface with a spatially-quantized light-field representation between the two surfaces.

Figure 28B:
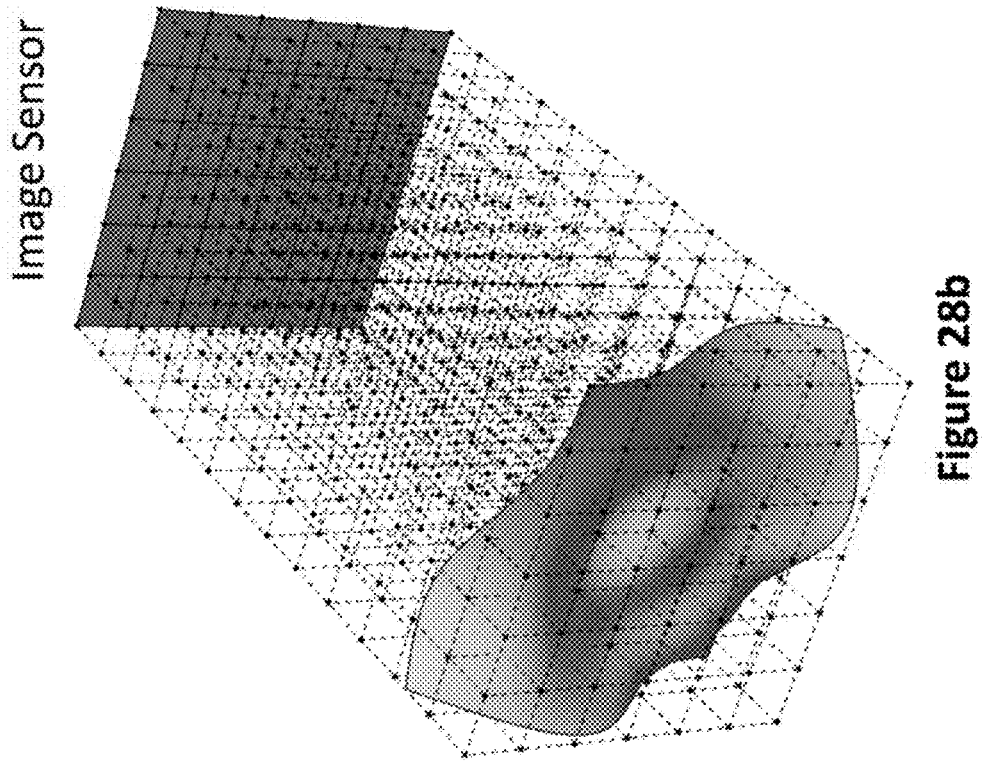
Figure 28A:
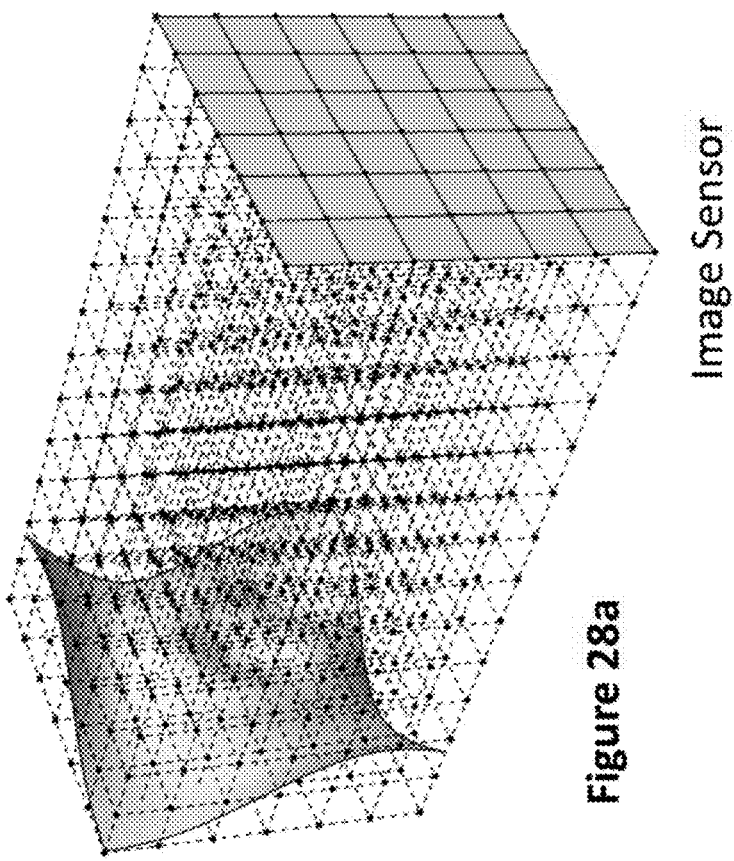

FIGS. 28a and 28b depict a pair of illustrative 3-dimensional views of a variation on FIGS. 27a and 27b featuring different example non-planar curved surface.

Figure 29A:
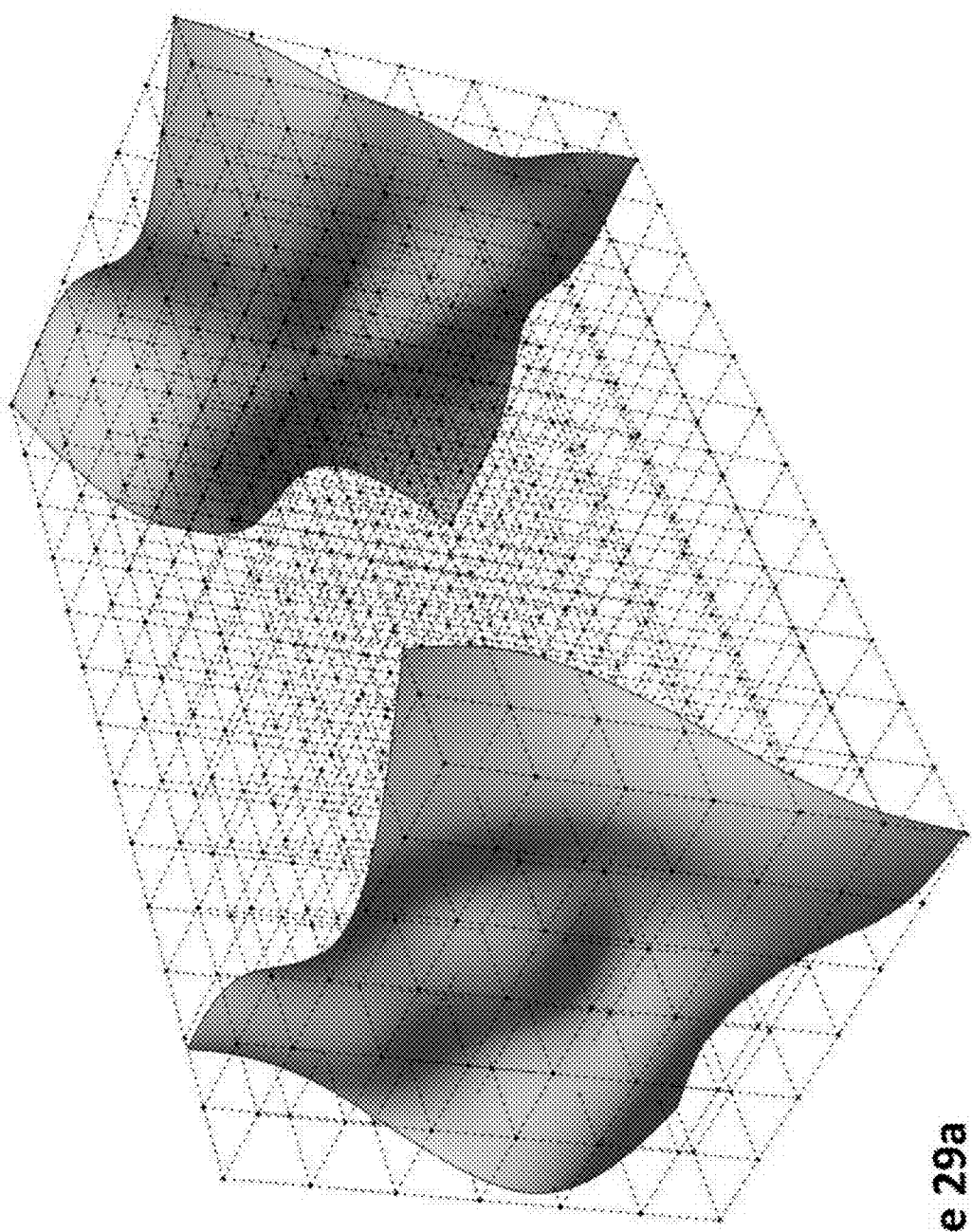

FIG. 29a depicts an illustrative example of non-planar curved surface sensor and non-planar curved surface object with a spatially-quantized light-field representation between the two surfaces. Either or both of the curved surfaces can be configured to be a camera.

Figure 29B:
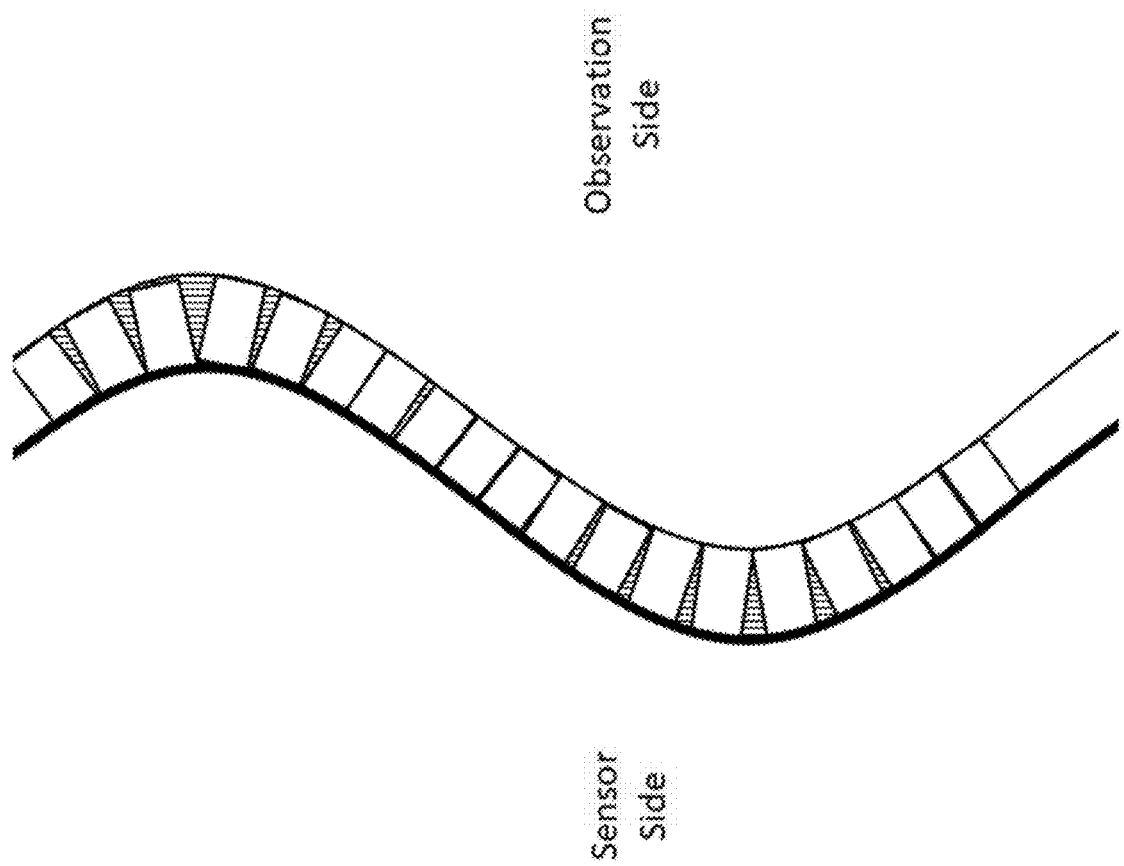

FIG. 29b depicts an example cross-section of a (rigid or flexible) curved imaging surface, for example as may be fabricated by printing or other deposition fabrication processes.

FIGS. 30a through 30c depict a variety of illustrative 3-dimensional views of an example variation of the arrangement depicted in FIGS. 24, 25a, 25b, 26a, and 25b wherein the array of (emitted and/or reflected) light source elements are split among a plurality of smaller parallel planes at different separation distances from the planar array of light-sensing elements. Depending on the spatial arrangement, some portions of some of the smaller parallel planes can be observationally occulted from some regions of the planar surface. The roles of the plurality of planar arrays of light source elements and a parallel array of light-sensing elements can be interchanged.

FIGS. 31a and 31b depict a variety of illustrative 3-dimensional views of an example variation of the arrangement depicted in FIGS. 24, 25a, 25b, 26a, and 25b wherein the array of (emitted and/or reflected) light source elements are distributed over a connected group of planes, at least one parallel to the planar array of light-sensing elements.

Figure 32A:
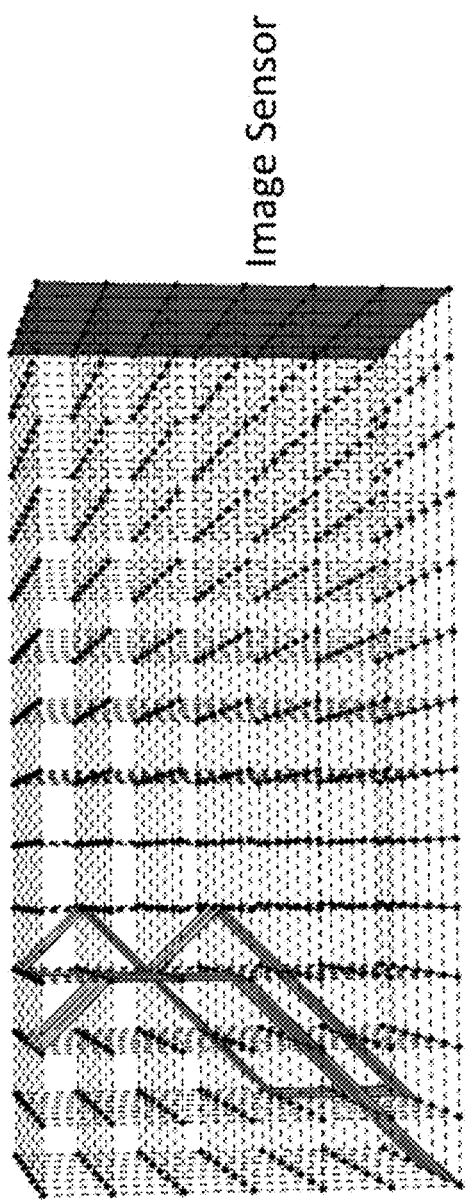
Figure 32C:
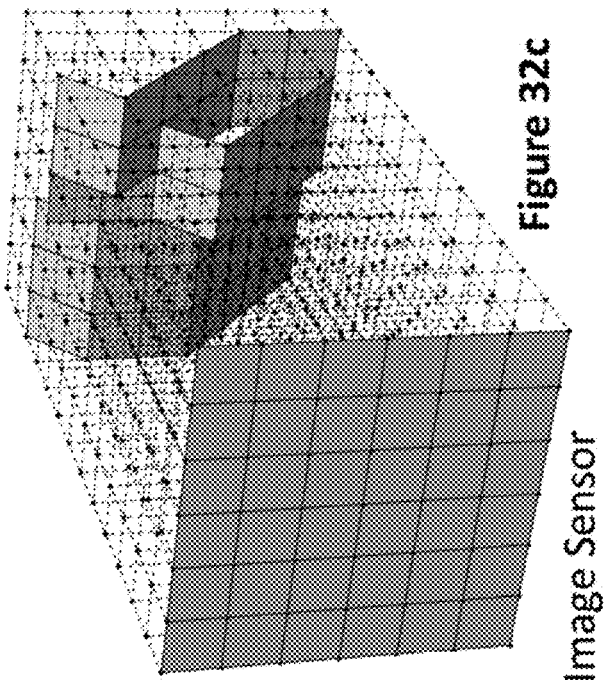
Figure 32B:
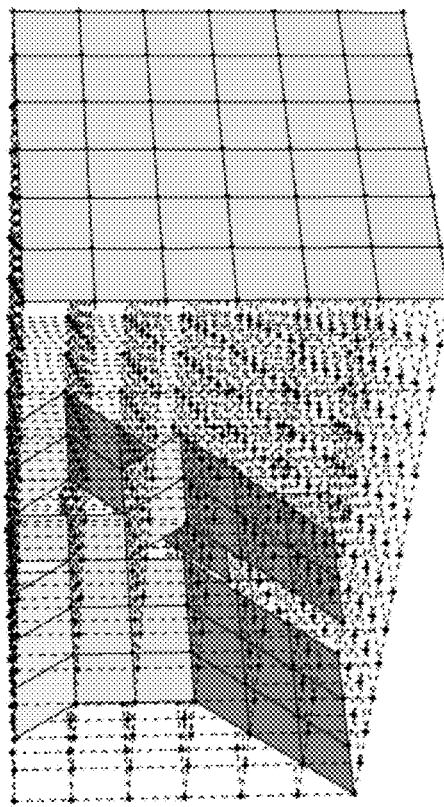

FIGS. 32a through 32c depict a variety of illustrative 3-dimensional views of an example wherein the array of (emitted and/or reflected) light source elements are distributed over a complex collection of connected and disconnected planes, some of which are parallel to the planar array of light-sensing elements, and some of which observationally occulted others from some regions of the planar surface by being situated directly in front of others.

Figure 33B:
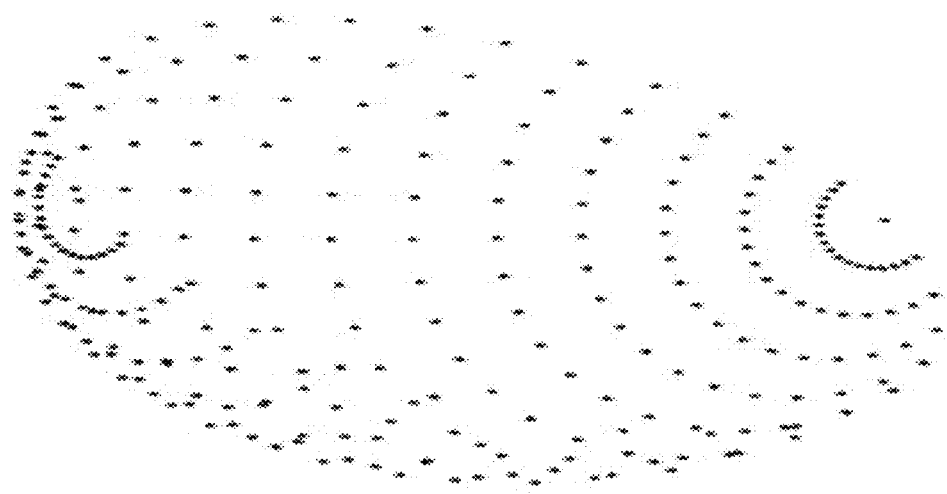
Figure 33A:
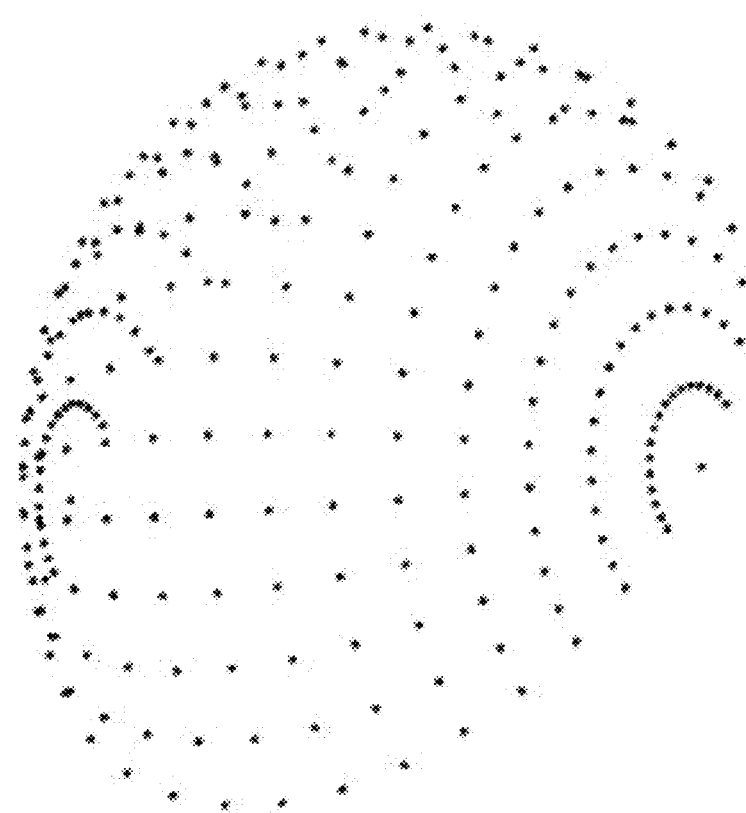
Figure 34B:
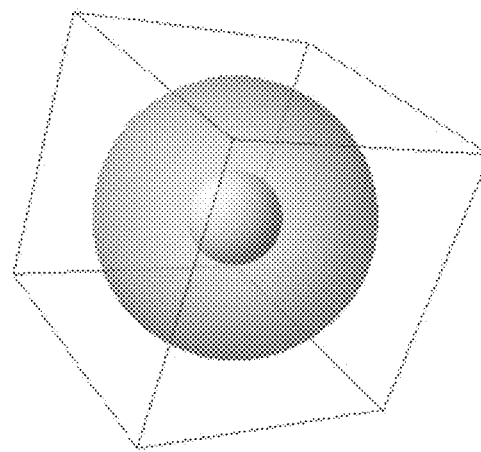
Figure 34D:
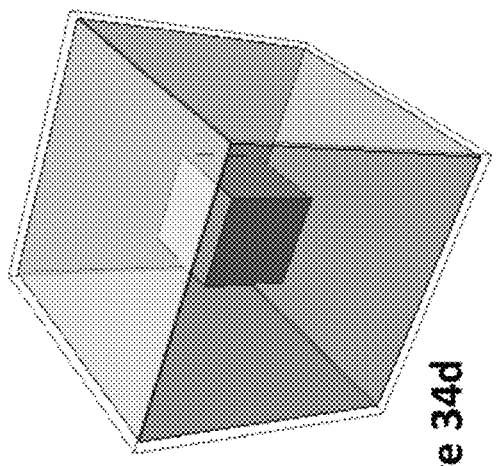
Figure 34A:
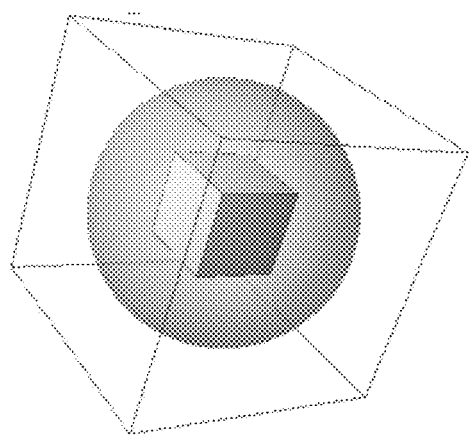
Figure 34C:
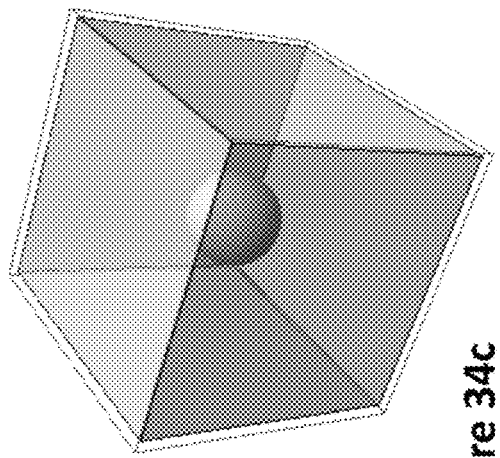

FIGS. 33a and 33b depict example inward-directed or outward-directed sensor-pixel lattice locations distributed on a rigid or elastic curved convex-shaped surface.

FIGS. 34a through 34d depicts examples of pairs of curved and sharply-angled surfaces, one of the pair inside the other of that pair. In any of the arrangements depicted, at least one of the inner surface and the outer surface can be a camera arranged to view the other surface. As considered elsewhere, the camera can be configured to provide self-illumination.

Figure 35C:
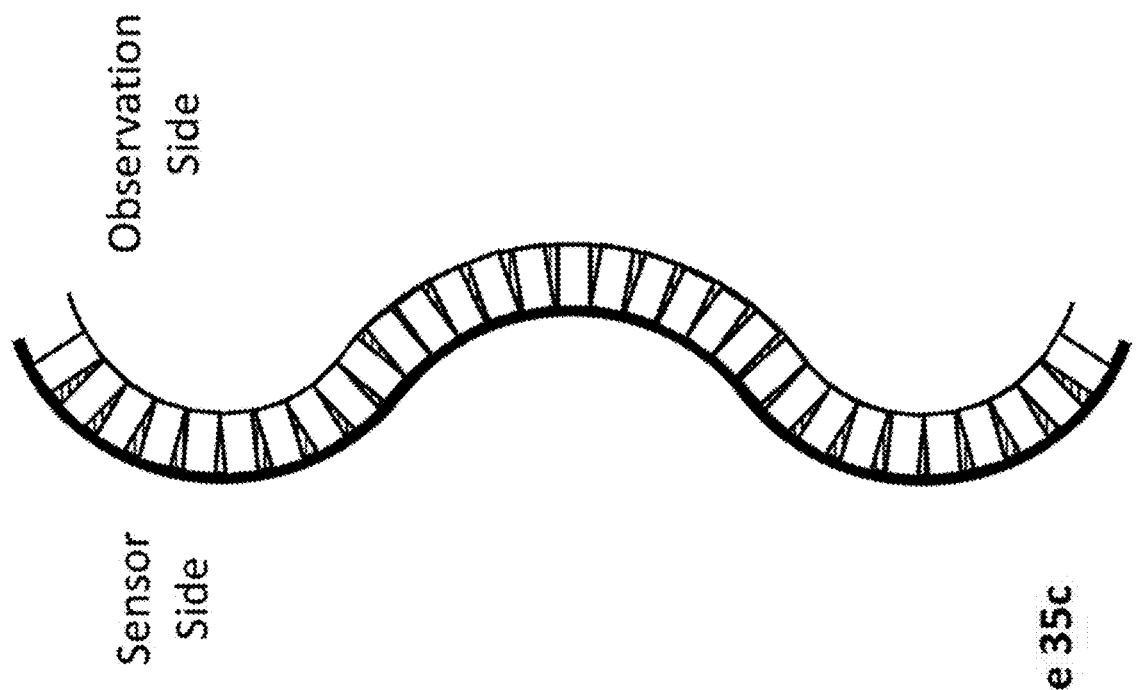

FIGS. 35a through 35c depict illustrative examples of bumpy and/or pitted sensor surfaces that can provide angular diversity. Such arrangements can also be used to provide sensor robustness via spatial diversity, to provide directed angle-orientation viewing, and to provide other types of functions. These can be combined with the generous recovery capabilities described in the mathematical treatment to follow, and enhanced further by the statistical corrections obtainable using the Moore-Penrose pseudo-inverse, to provide immense imaging robustness to a wide range of degradation and partial occultation effects.

Figure 36:
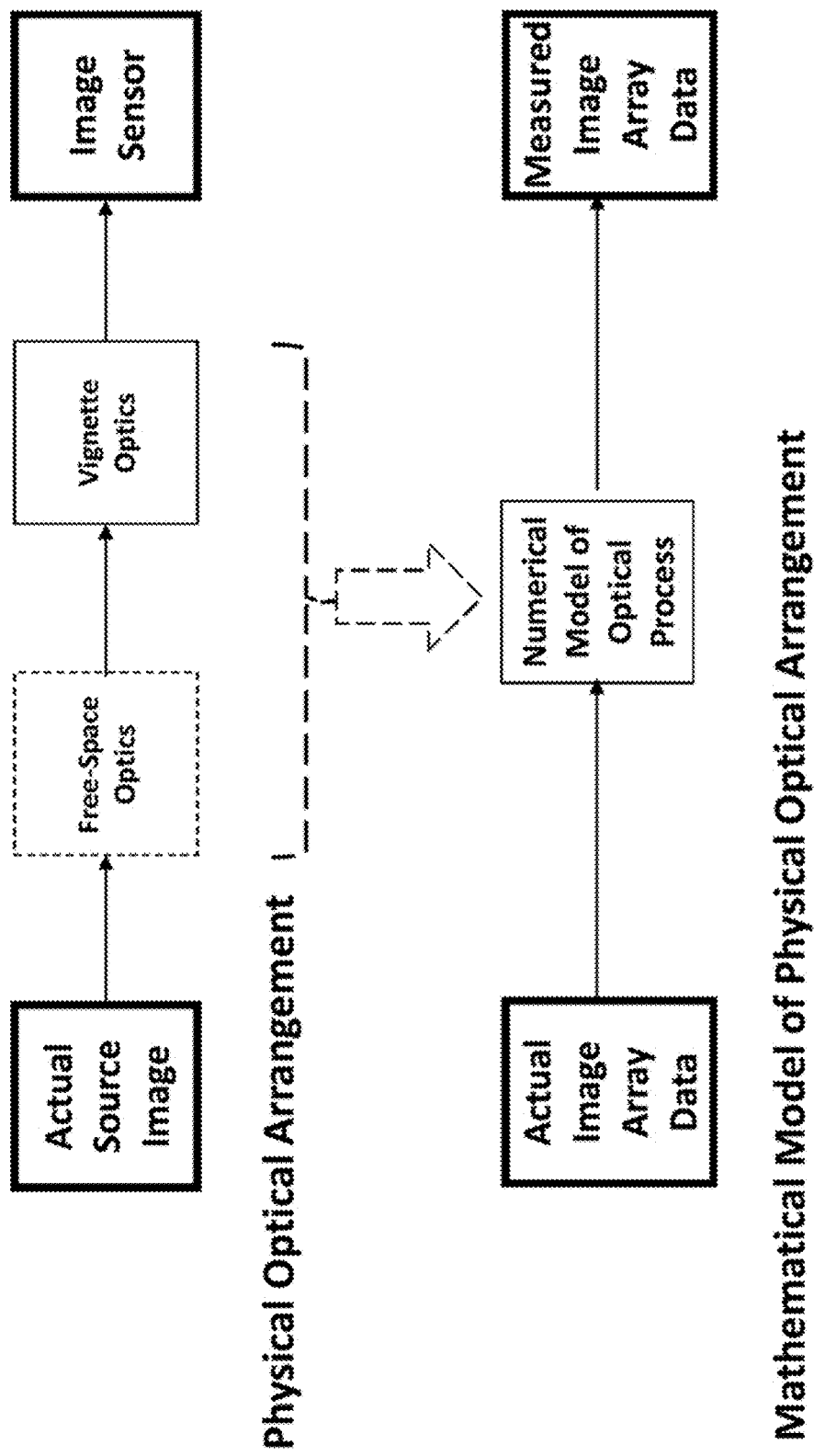

FIG. 36 depicts example correspondences between a physical optical arrangement comprising an optical process (including for example vignetting optics and free-space separation should the image sensor not be in contact with the actual source image) and a mathematical model of that physical optical arrangement (transforming an actual image array data to measured image array data by a numerical model of the optical process.

Figure 37:
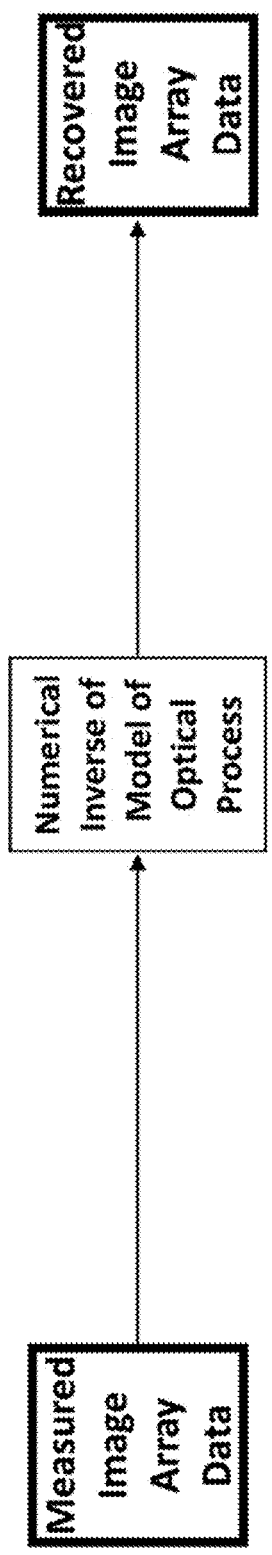

FIG. 37 depicts an illustrative example of Mathematical Recovery of an approximate representation of the actual Image from Measured Image Array Data obtained by operating on the Measured Image Array Data by a Numerical Inverse of the Model of the Optical Process as depicted in FIG. 36.

Figure 38:
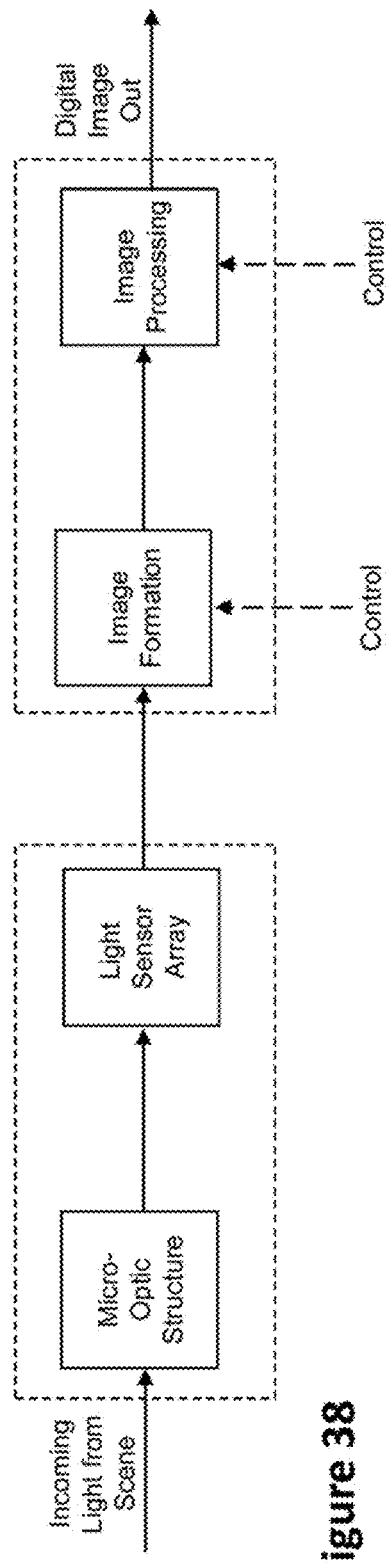

FIG. 38, adapted from FIG. 2b of the present inventor's U.S. Pat. No. 8,830,375 and related cases, depicts an exemplary embodiment comprising a micro-optic structure, a light sensor array, an image formation signal processing operation and an optional additional subsequent image processing operations, herein the micro-optic structure and light sensor array are grouped into a first subsystem, and the image formation signal processing operation and subsequent image processing operations are grouped into a second subsystem. As discussed in the present inventor's U.S. Pat. No. 8,830,375 and related cases, various other arrangements are possible and provided for by aspects of the invention.

Figure 39A:
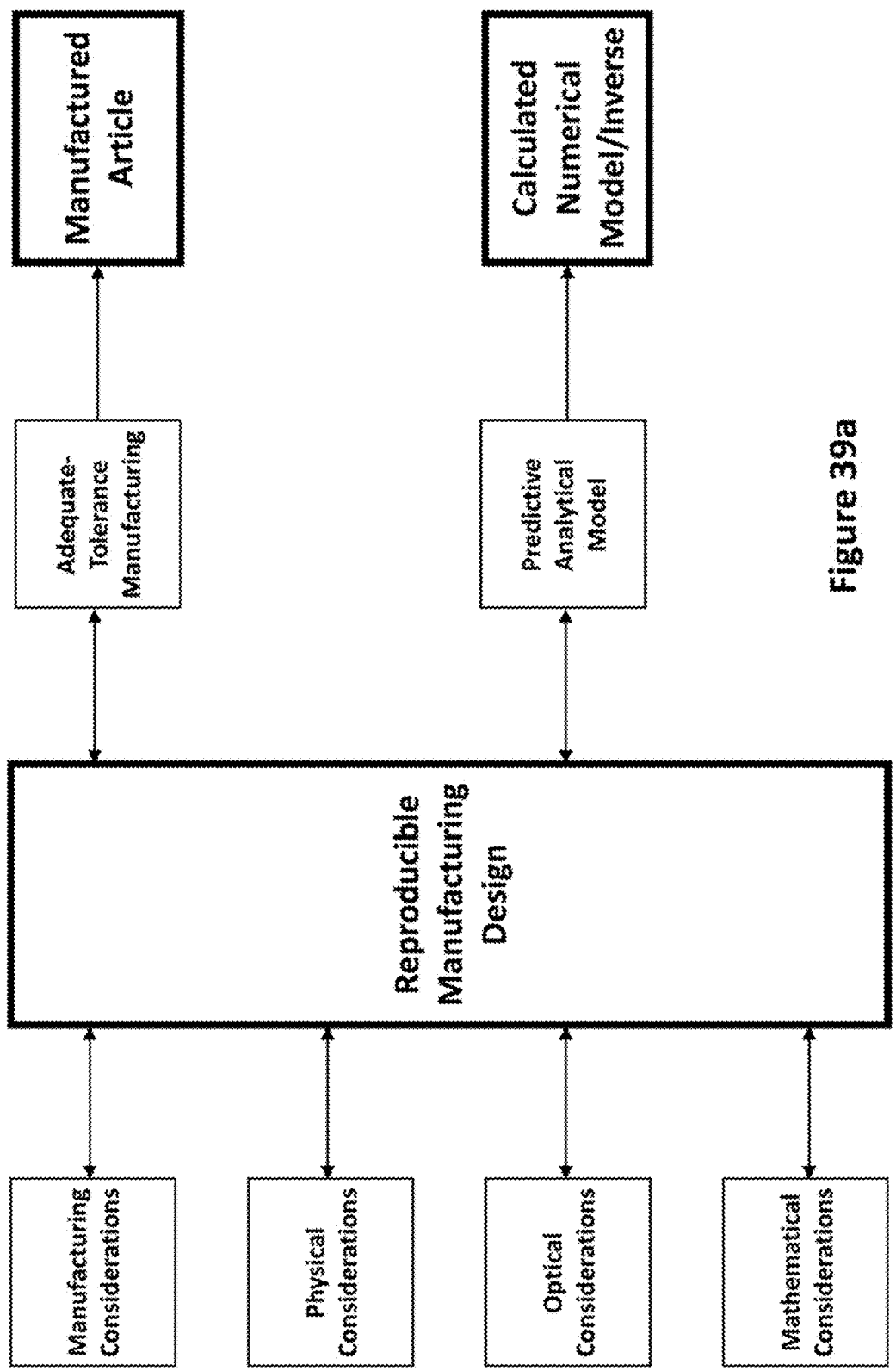

FIG. 39a depicts an example scheme wherein manufacturing, physical, optical, and mathematical considerations are used to create a reproducible manufacturing design such that is adequate manufacturing tolerances are obtained an analytical predictive model can be used to produce numerical models of the optical situations to be recovered without the use of empirical measurements.

Figure 39B:
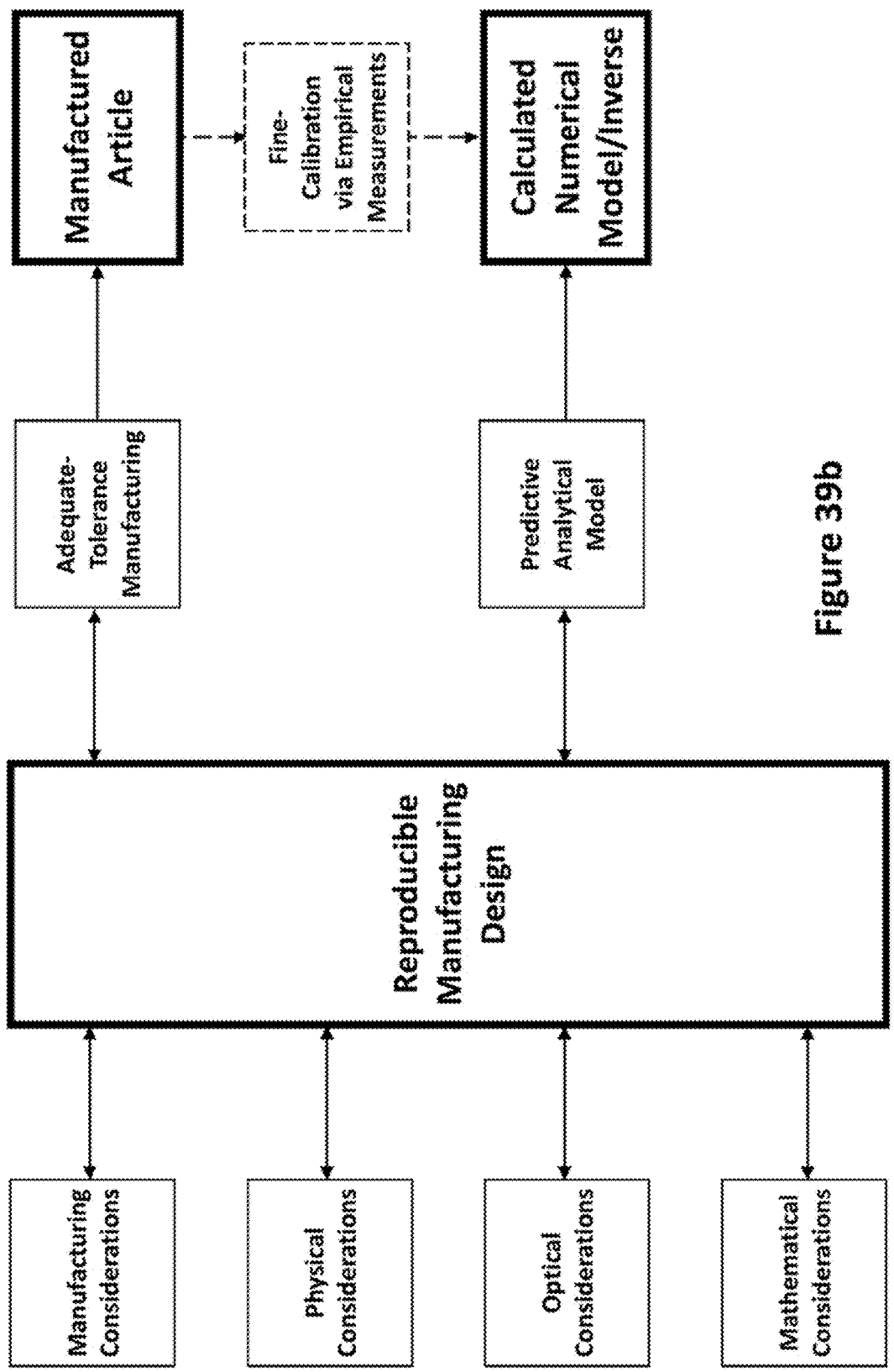

FIG. 39b depicts an example variation on the scheme presented in FIG. 39a wherein post-manufacturing empirical measurements are used to further fine-calibrate the system performance of each particular manufactured article.

Figure 40:
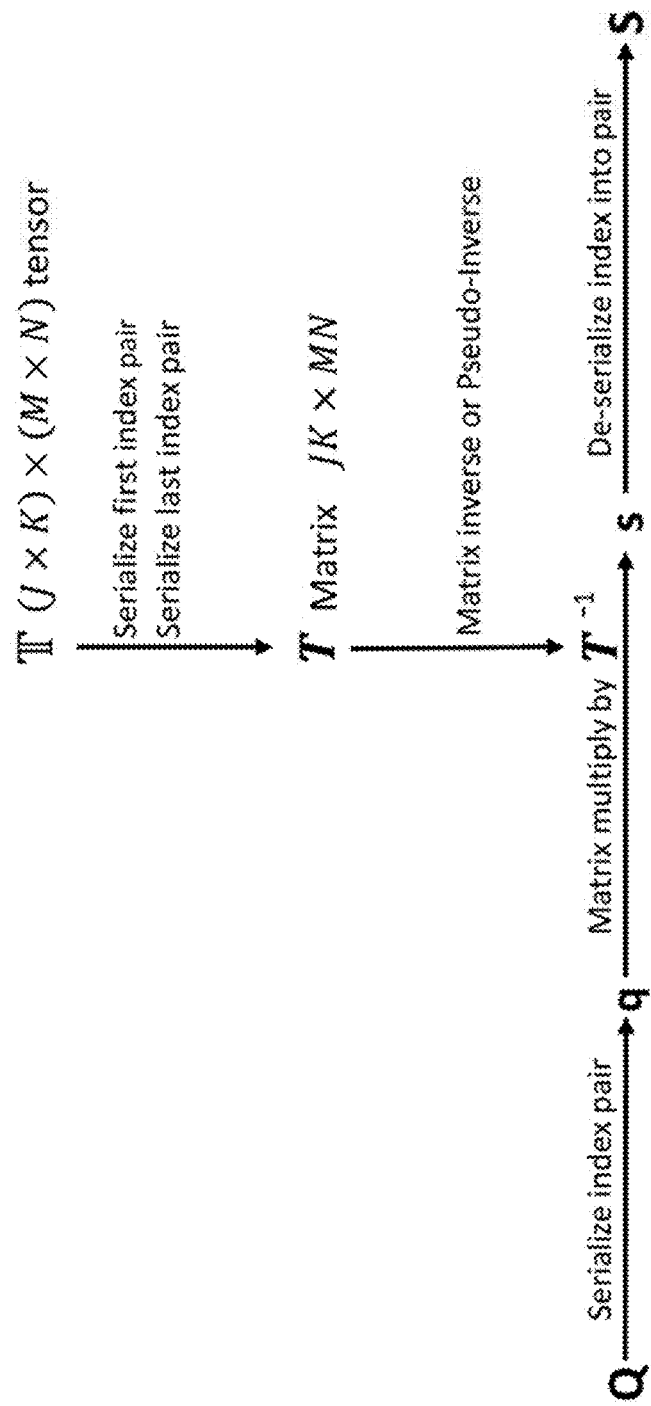

FIG. 40 depicts an example representation of example serialization processes and de-serialization processes for image recovery from an inverse or pseudo-inverse model as provided for by the invention.

Figure 41:
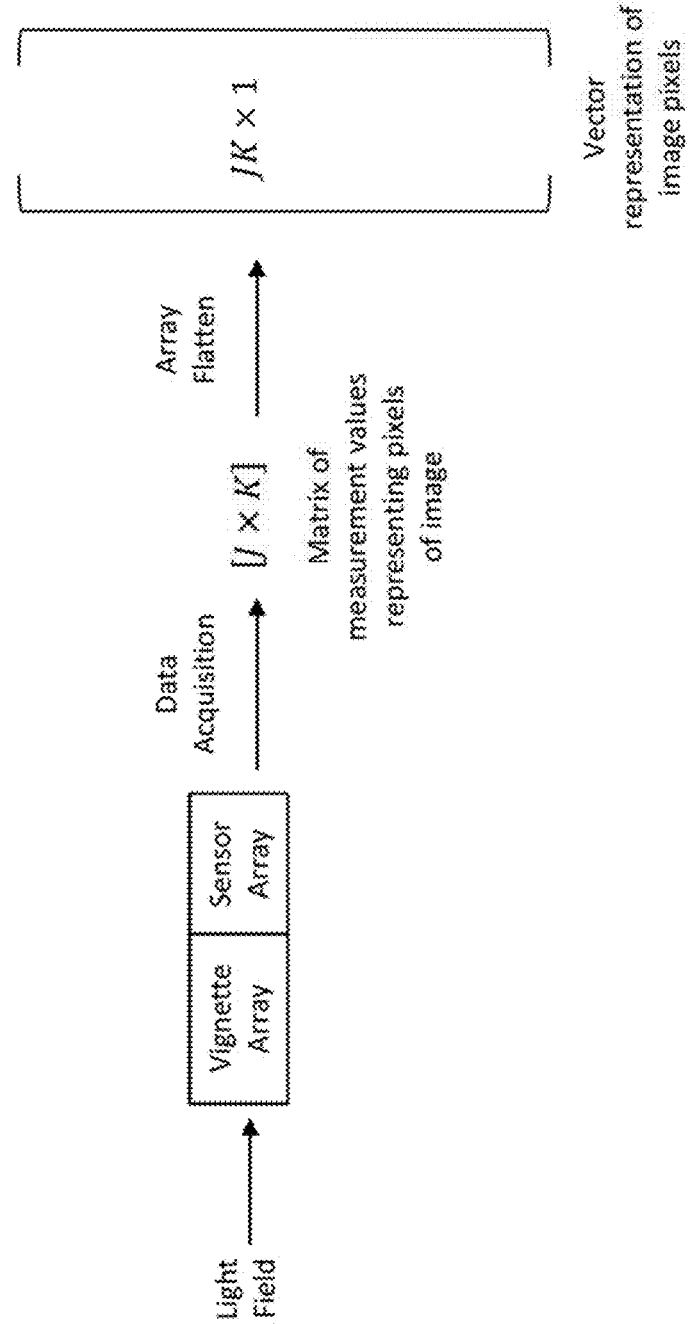

FIG. 41 depicts a representation of example serialization processes transforming a measured image produced by a light-field travelling through an optical structure (here a vignette array) at being measured by a sensor array.

Figure 42:
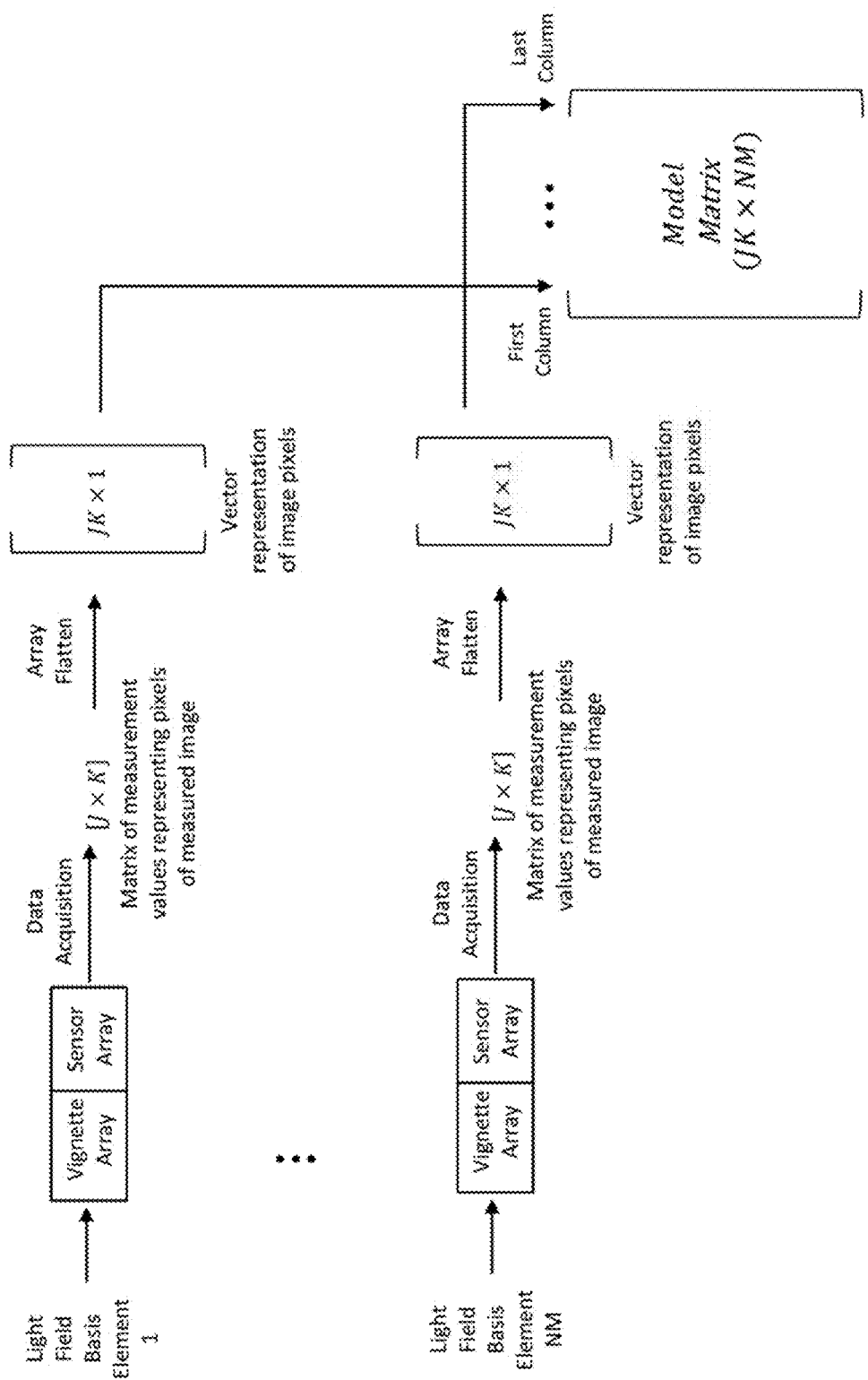

FIG. 42 depicts a representation of example empirical image-basis "training" sequence, or alternatively a collection of predictive-model-generated image-bases that directly populate a JK×NM matrix providing a numerical model of the optical environment from which a future image will later be recovered as provided for by aspects of the invention.

Figure 43A:
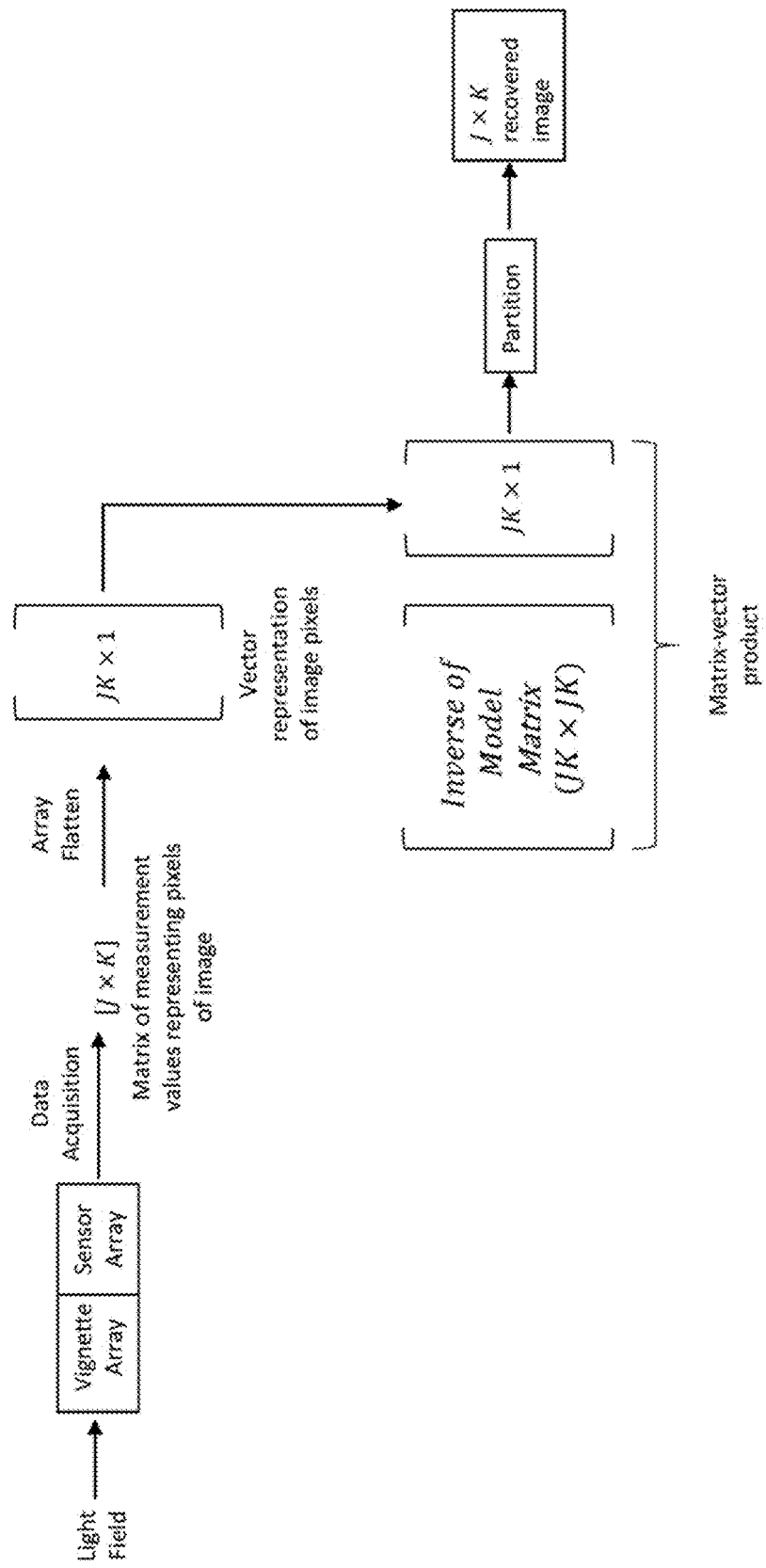

FIG. 43a depicts a representation of example image recovery process using an inverse square-matrix representing an approximate inverse model as provided for by the invention.

Figure 43B:
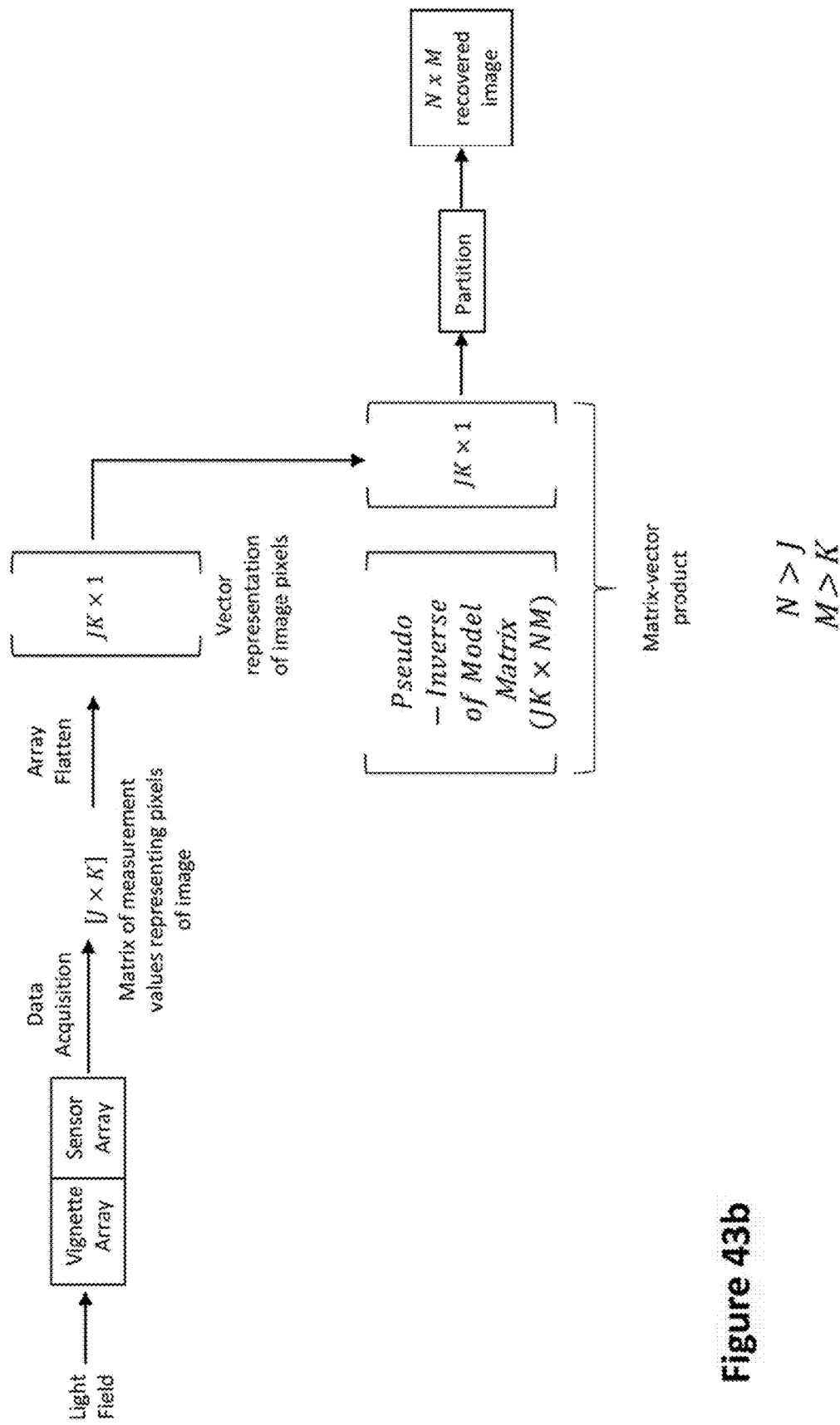

FIG. 43b depicts a representation of example image recovery process using a generalized-inverse or pseudo-inverse matrix representing an approximate pseudo-inverse underspecified model as provided for by the invention.

Figure 43C:
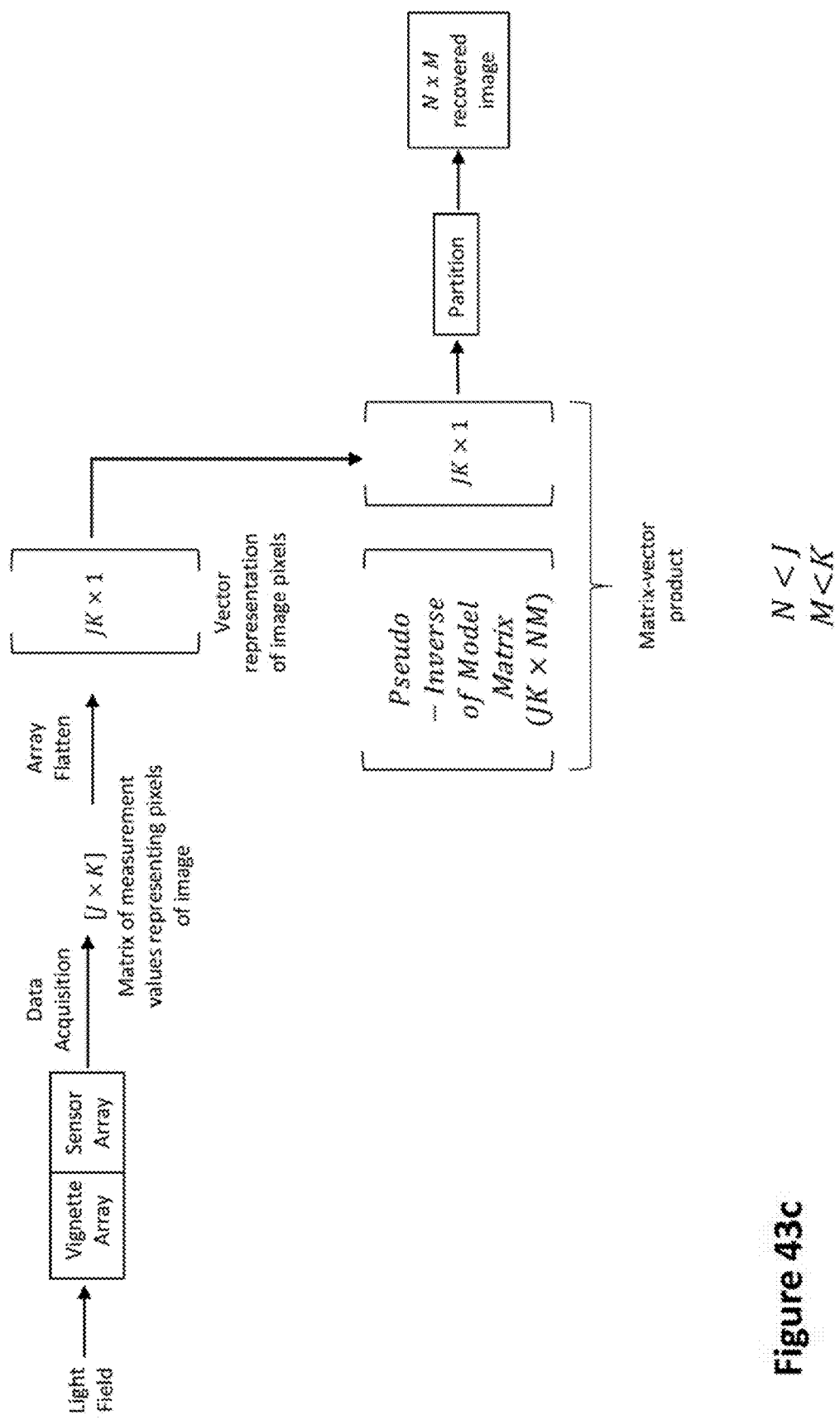

FIG. 43c depicts a representation of example image recovery process using a generalized-inverse or pseudo-inverse matrix representing an approximate pseudo-inverse overspecified model as provided for by the invention.

Figure 44A:
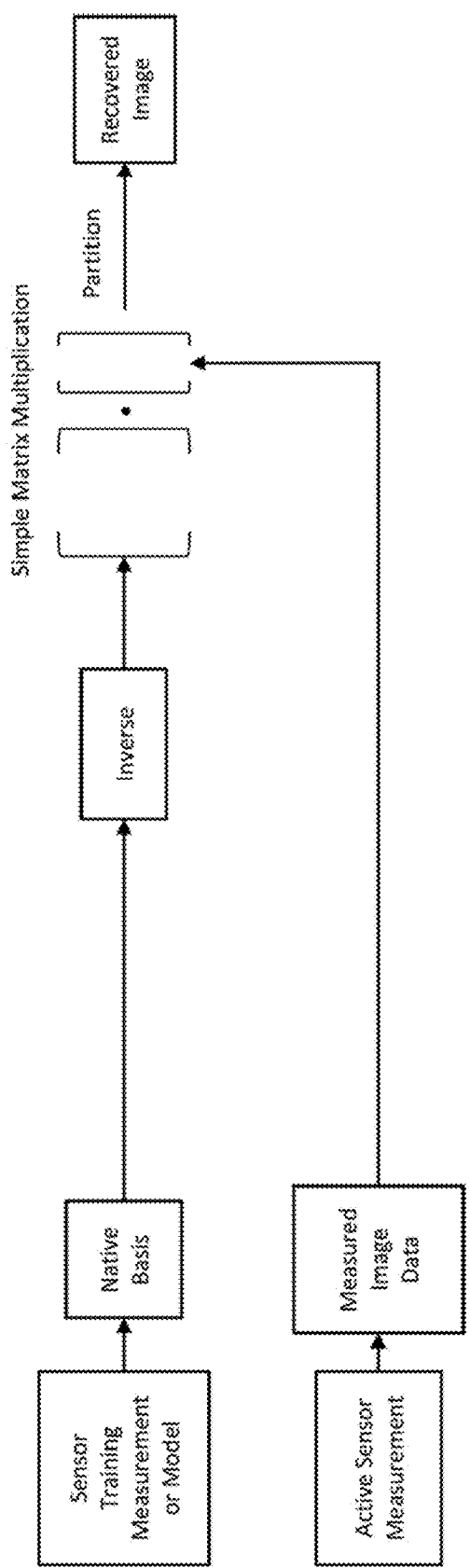

FIG. 44a depicts a simple computational approach for image recovery as provided for by the invention.

Figure 44B:
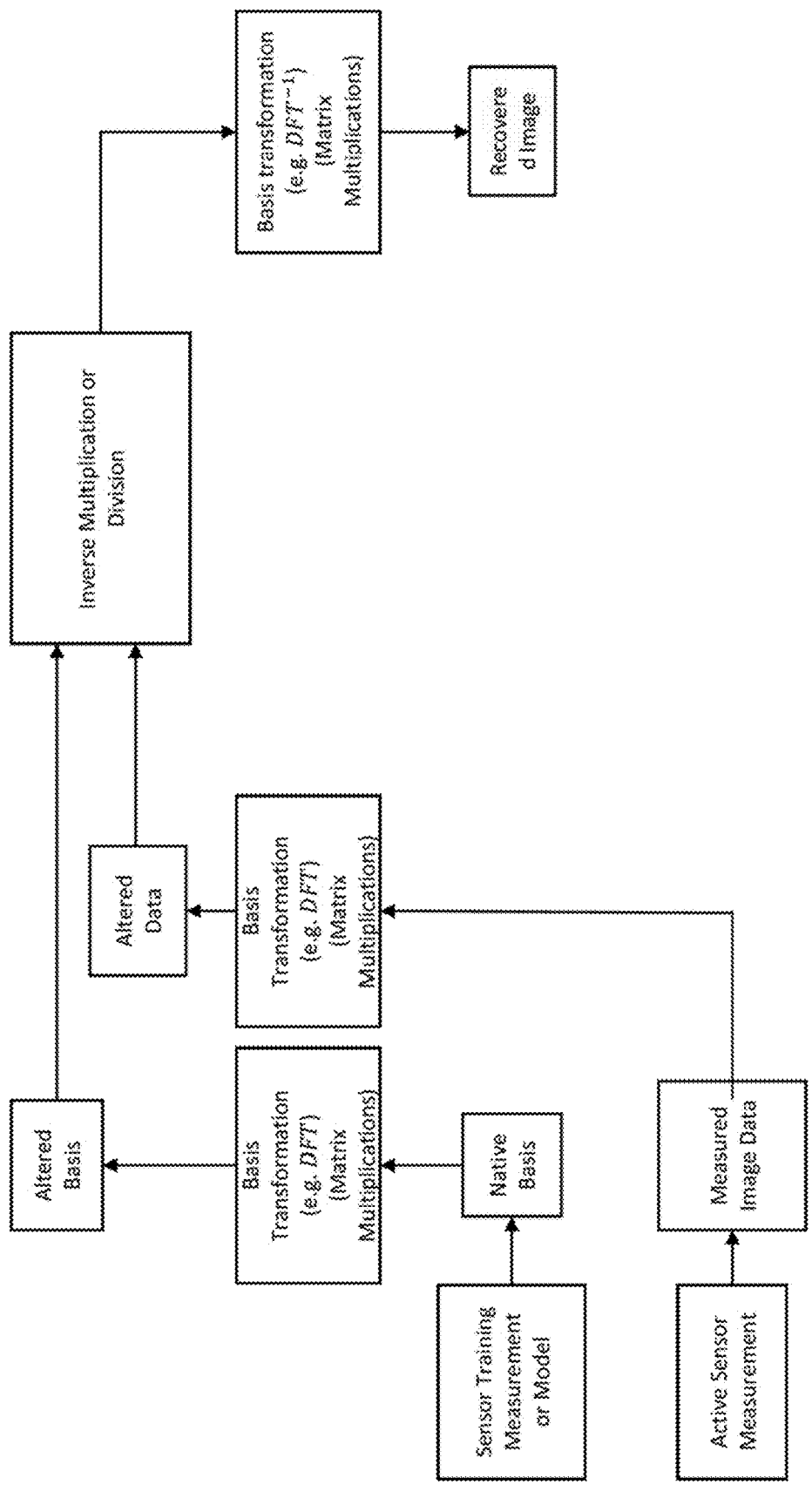

FIG. 44b depicts an example representation of a far more numerically-complex spectral or transform computation (which numerically amounts to additional basis rotation transformation steps) as would be used in spectral or transform methods.

Figure 44C:
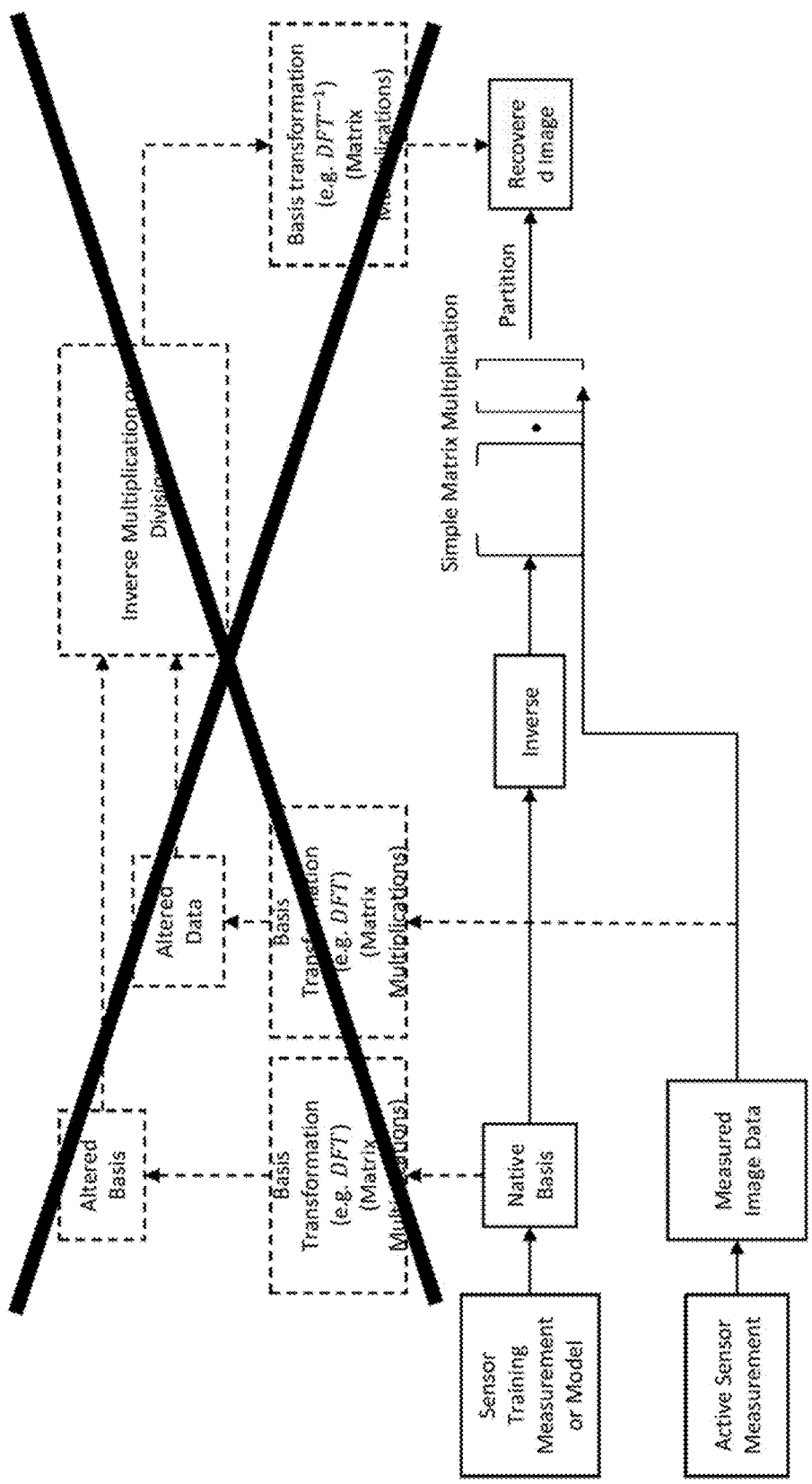

FIG. 44c depicts a comparison of the more direct computational approach depicted in FIG. 44a and the approach depicted in FIG. 44b, demonstrating comparative reasons to reject the far more numerically-complex spectral or transform computational approached represented in FIG. 44b.

FIG. 45 depicts the use of classical ill-posed inverse-problem regularization methods as employed in the Rambus [P4] and Rice University "Flat Cam" [P5] implementations as well as other coded aperture imaging implementations. These classical ill-posed inverse-problem regularization methods are widely used in many areas but also have an established role in optical systems design and analysis; see for example [B5] and [B6].

Figure 46:
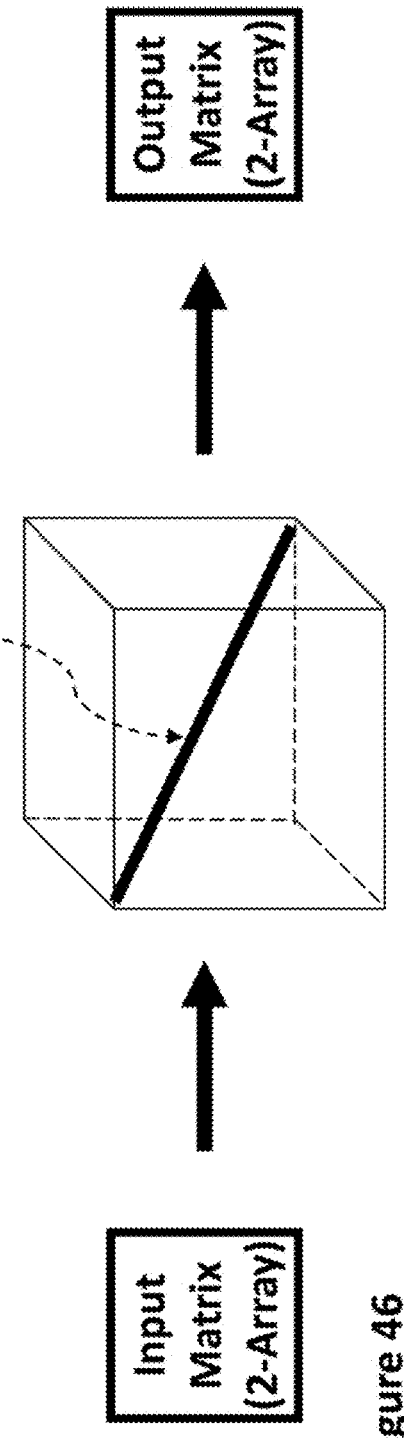

FIG. 46 depicts an abstract representation of an "Identity structure" within a (necessarily-sparse) Identity 4-tensor.

Figure 47:
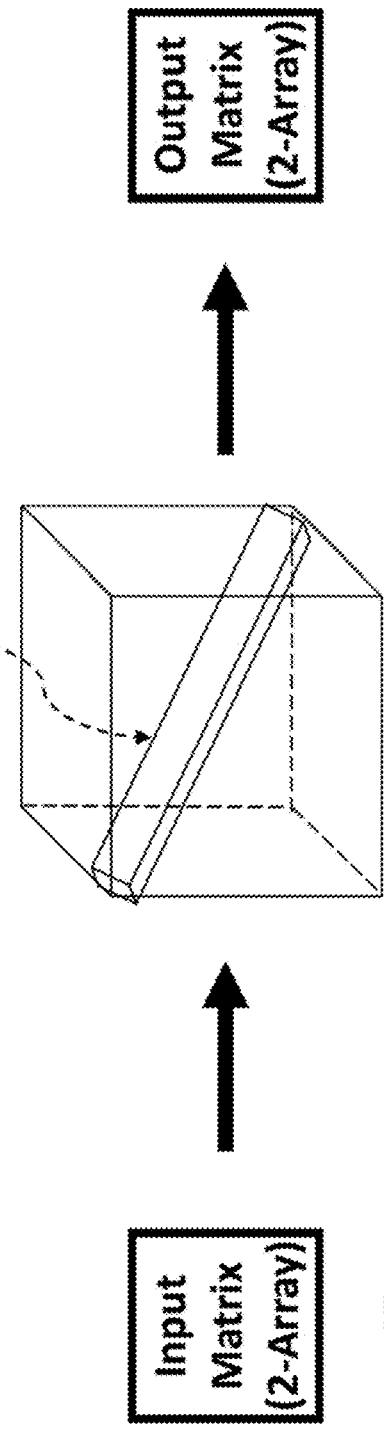

FIG. 47 depicts an abstract representation of a dilation around the "Identity structure" within a (necessarily-sparse) Identity 4-tensor.

Figure 48:
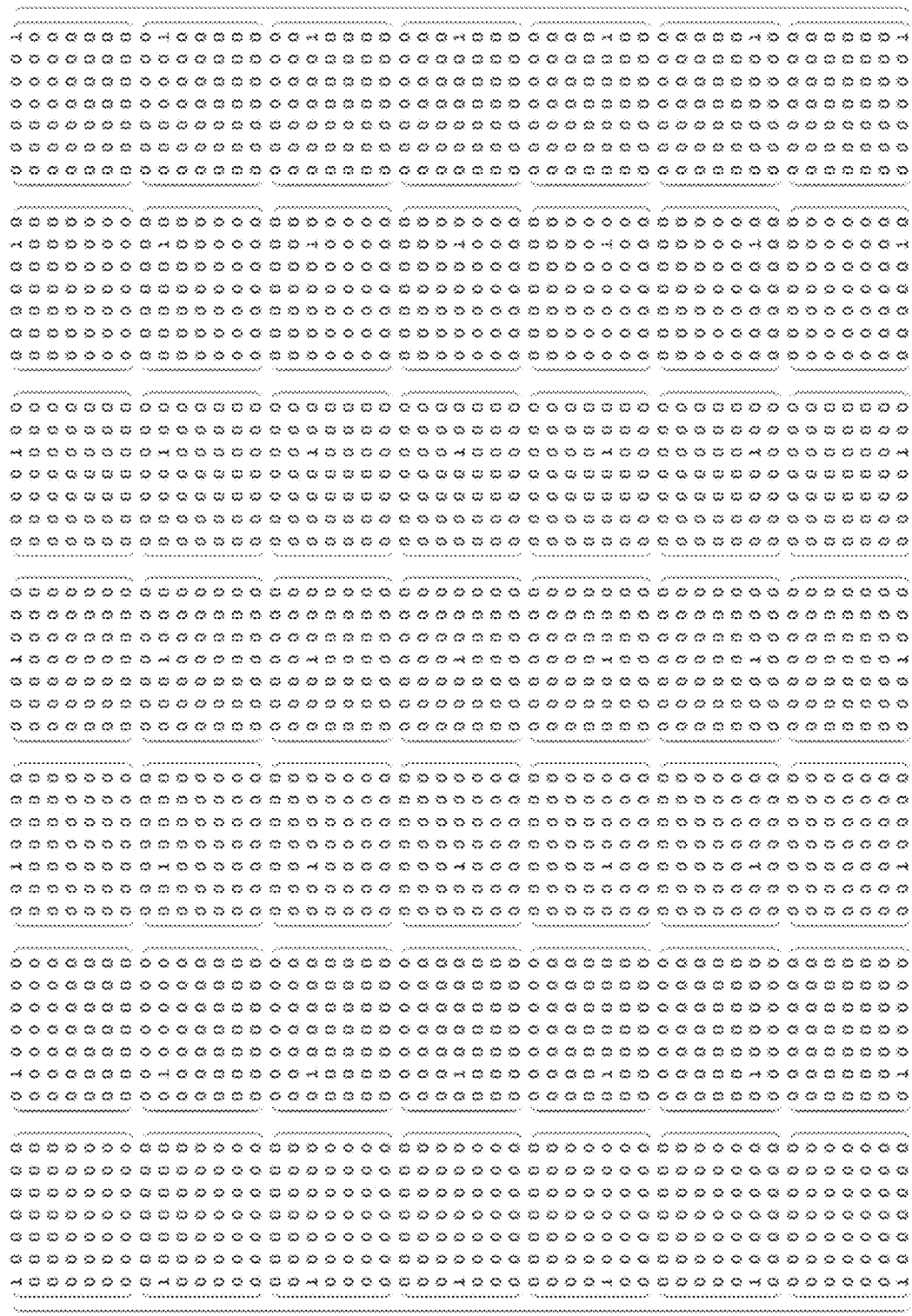

FIG. 48 depicts a ((7×7)×(7×7)) "matrix-of-matrices" representation of a (7×7×7×7) Identity 4-tensor as abstracted in FIG. 46.

Figure 49:
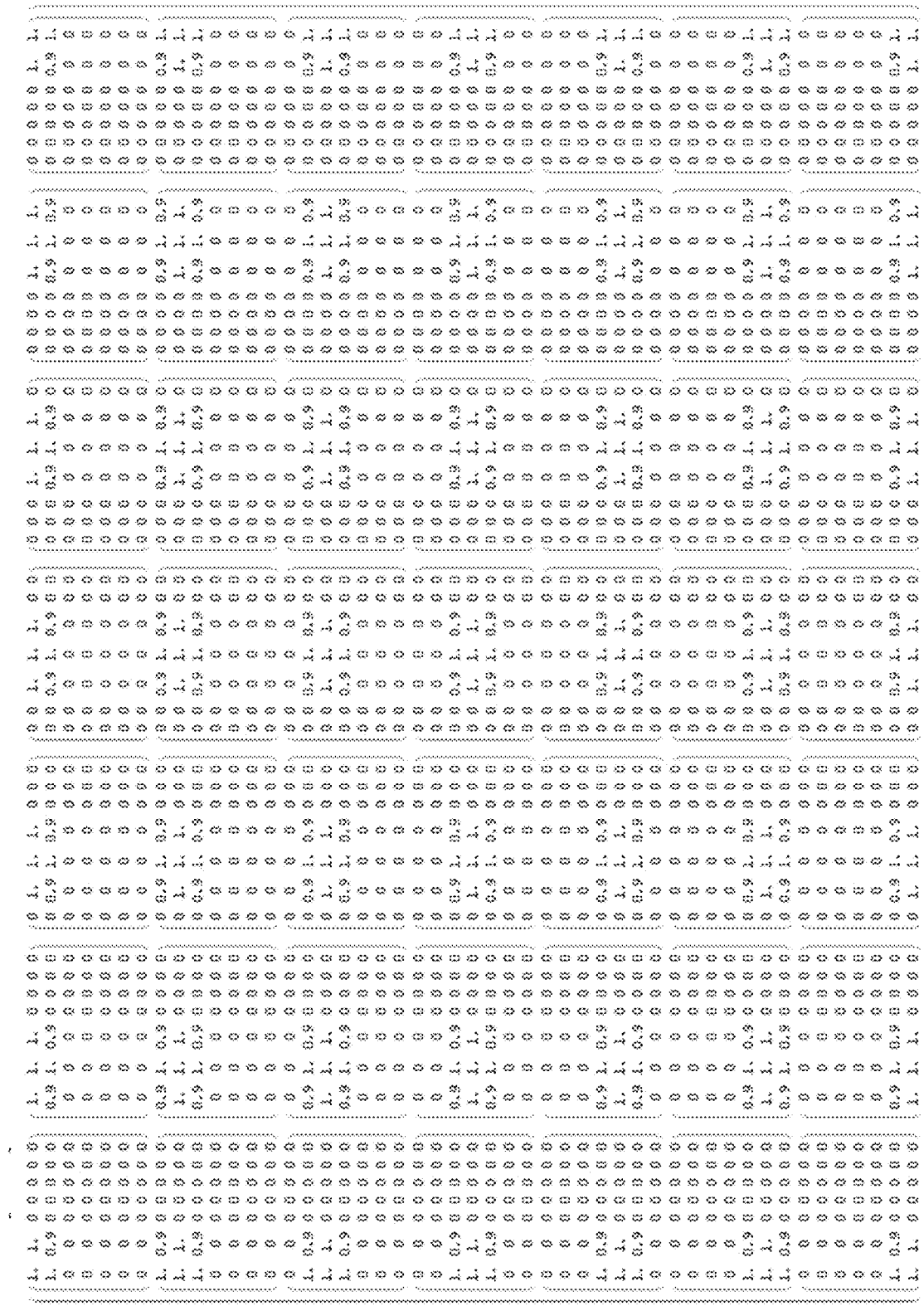

FIG. 49 depicts an example ((7×7)×(7×7)) "matrix-of-matrices" representation of the dilation around the "Identity structure" of a (7×7×7×7) 4-tensor as abstracted in FIG. 46.

Figure 50:
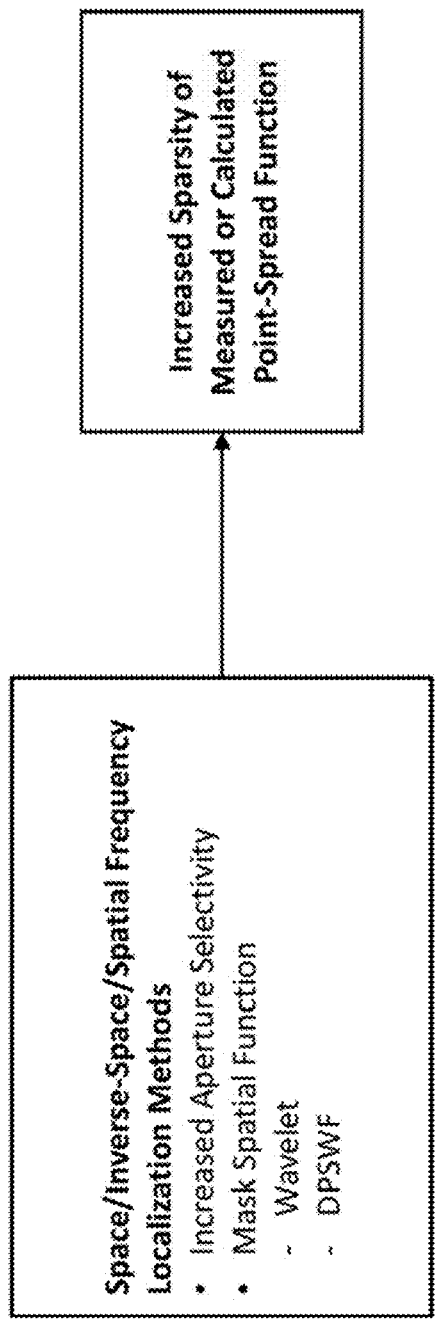
Figure 51A:
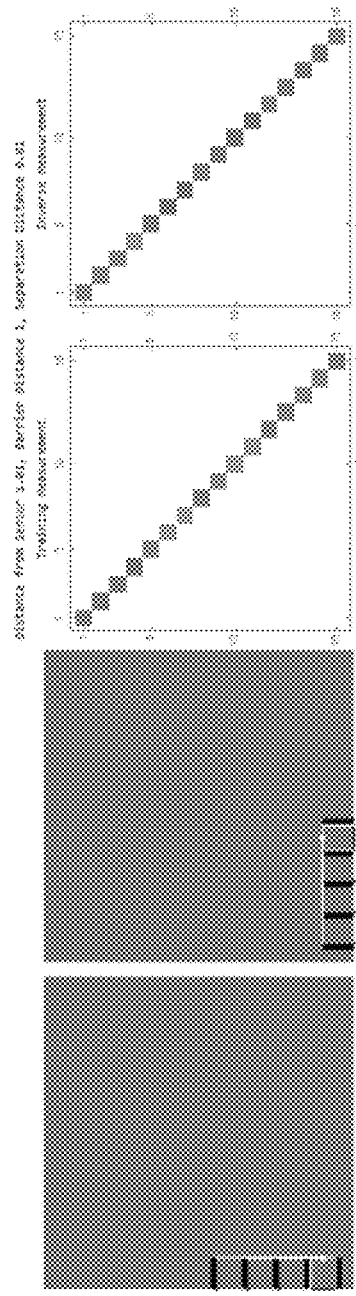
Figure 51B:
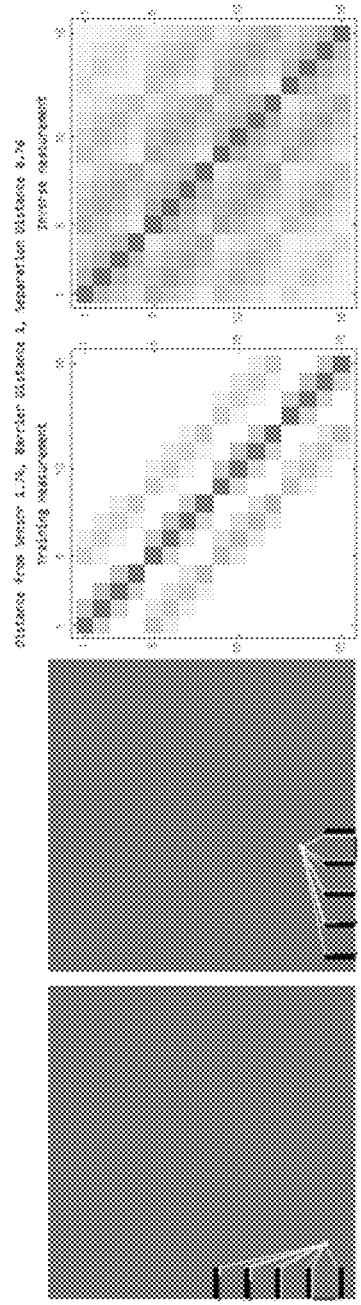
Figure 51C:
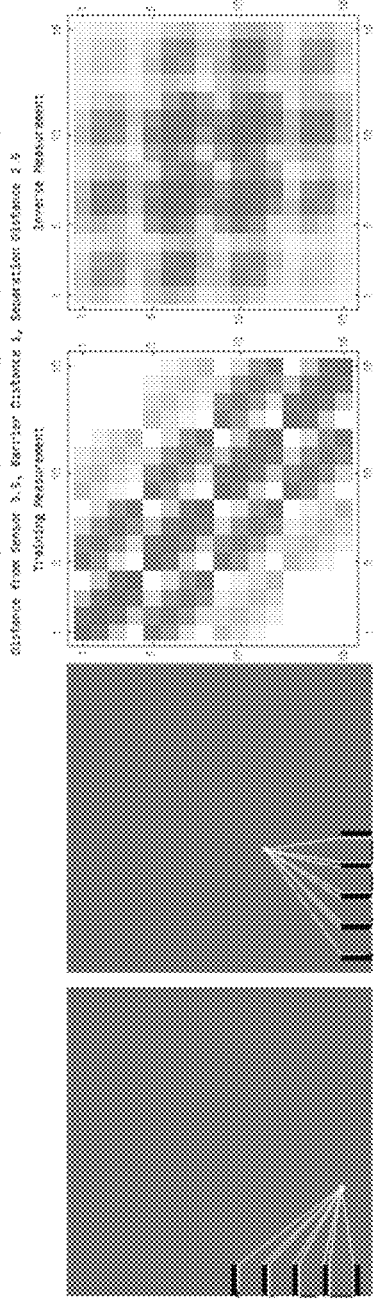

FIG. 50 depicts an abstract representation of the trade-off between Space/Inverse-Space/Spatial Frequency Localization Methods and the sparcity of numerical model tensors, matrices, and their inverses. This can be used, for example, in designing vignetting and aperture arrays.

FIGS. 51a through 51e depict how the sparcity of an example numerical model matrix serializing a numerical model 4-tensor degrades as the image source moves farther and farther from the image sensor (using numerical models at each distances predicted by an analytical geometric predictive model provided for by the invention).

Figure 52:
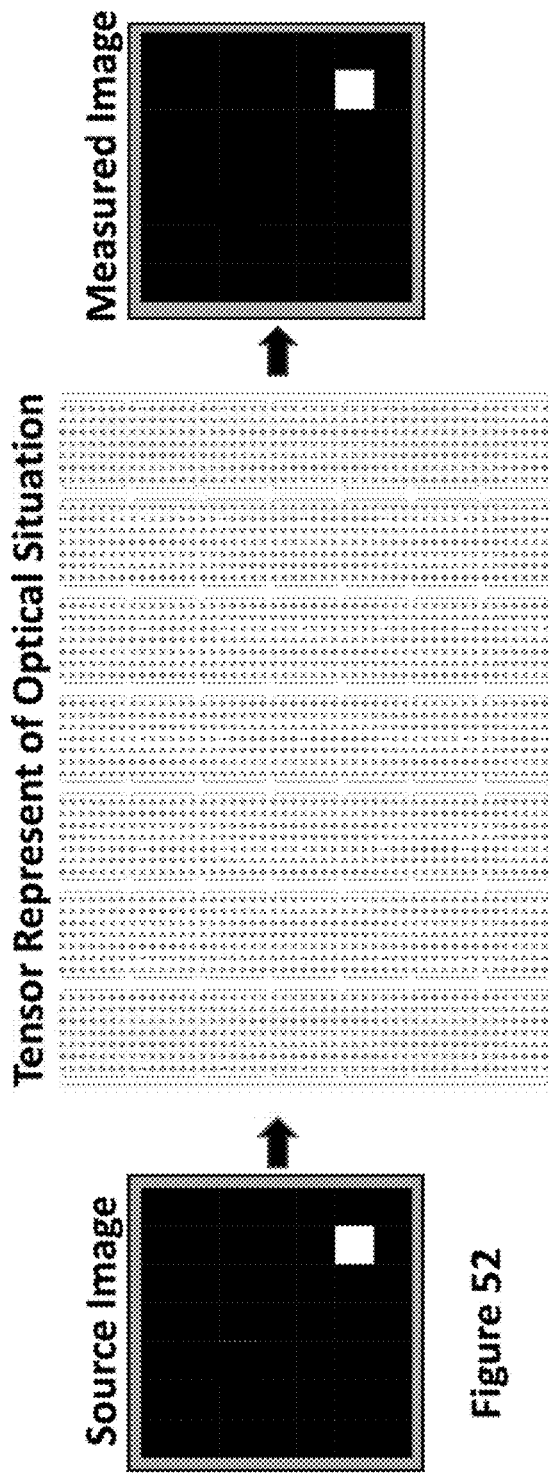

FIG. 52 depicts an example ((7×7)×(7×7)) "matrix-of-matrices" representation of the numerical model 4-tensor and example measured image (right) at zero separation distance from a single-illuminated-pixel source image (left). As described elsewhere, the source image need not be on a parallel plane and can be distributed arbitrarily in space.

Figure 53:
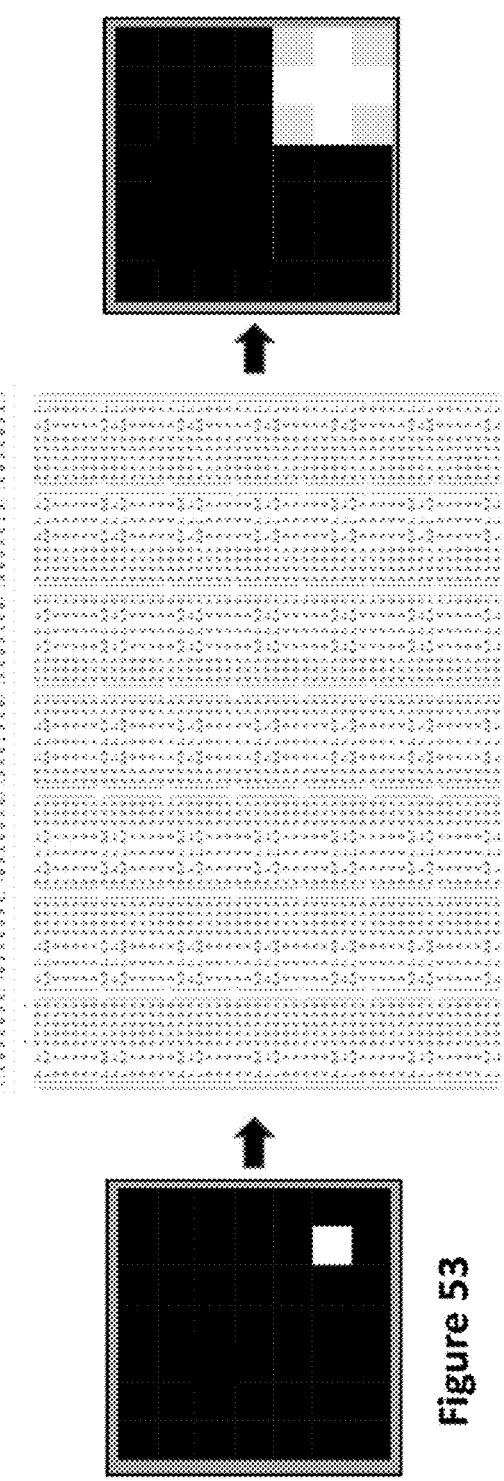

FIG. 53 depicts an example ((7×7)×(7×7)) "matrix-of-matrices" representation of the numerical model 4-tensor and example measured image (right) at a small non-zero separation distance from the same single-illuminated-pixel source image (left) as in FIG. 52.

Figure 54:
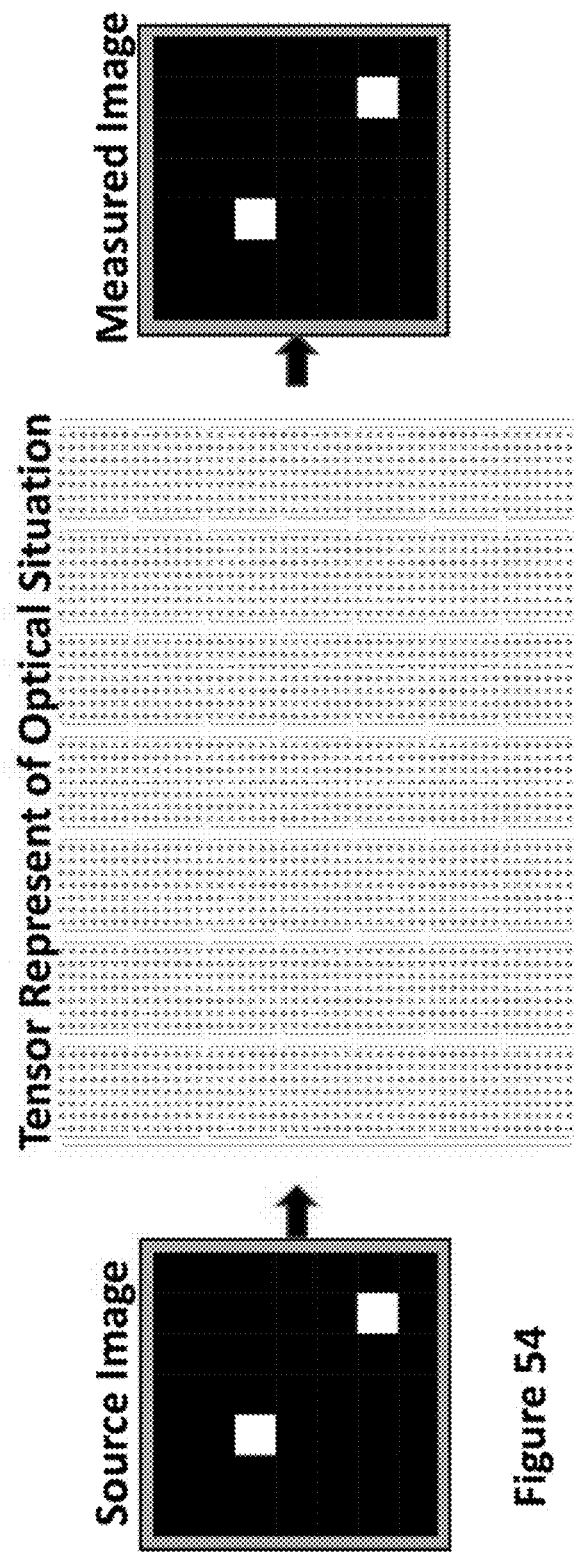

FIG. 54 depicts an example ((7×7)×(7×7)) "matrix-of-matrices" representation of the numerical model 4-tensor and example measured image (right) at zero separation distance from a two-illuminated-pixel source image (left). As described elsewhere, the source image need not be on a parallel plane and can be distributed arbitrarily in space.

Figure 55:
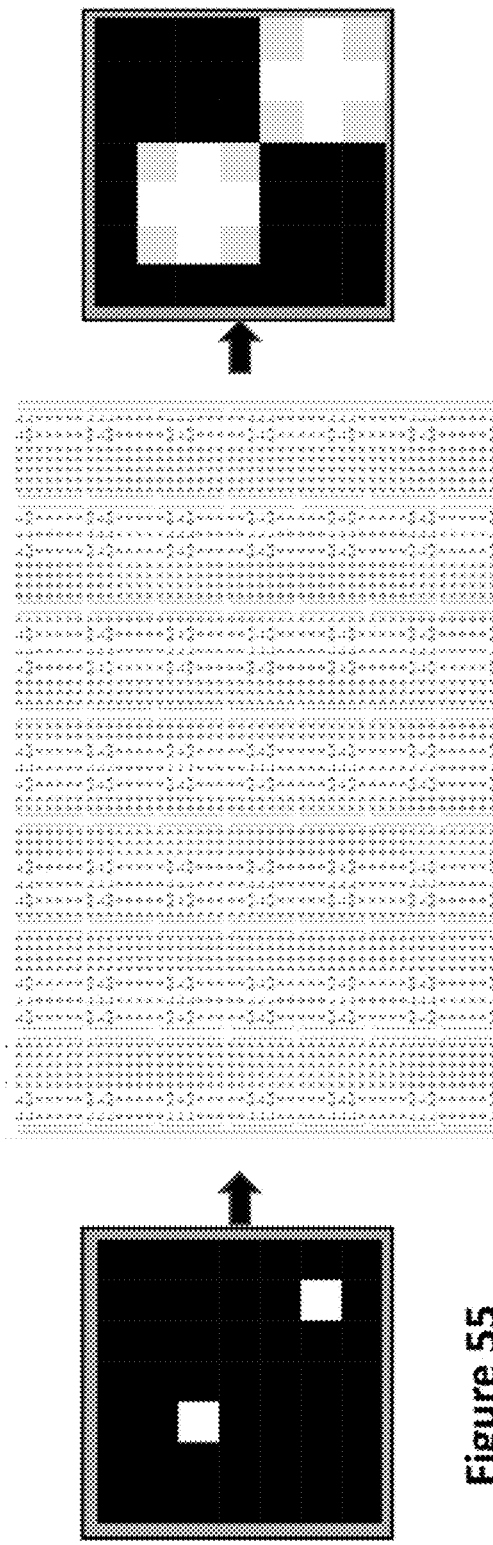

FIG. 55 depicts an example ((7×7)×(7×7)) "matrix-of-matrices" representation of the numerical model 4-tensor and example measured image (right) at a small non-zero separation distance from the same two-illuminated-pixel source image (left) as in FIG. 54.

FIG. 56 depicts an example ((7×7)×(7×7)) "matrix-of-matrices" representation of the numerical model 4-tensor and example measured image (right) at zero separation distance from a more closely-spaced two-illuminated-pixel source image (left). As described elsewhere, the source image need not be on a parallel plane and can be distributed arbitrarily in space.

FIG. 57 depicts an example ((7×7)×(7×7)) "matrix-of-matrices" representation of the numerical model 4-tensor and example measured image (right) at a small non-zero separation distance from the same more closely-spaced two-illuminated-pixel source image (left) as in FIG. 56.

Figure 58A:
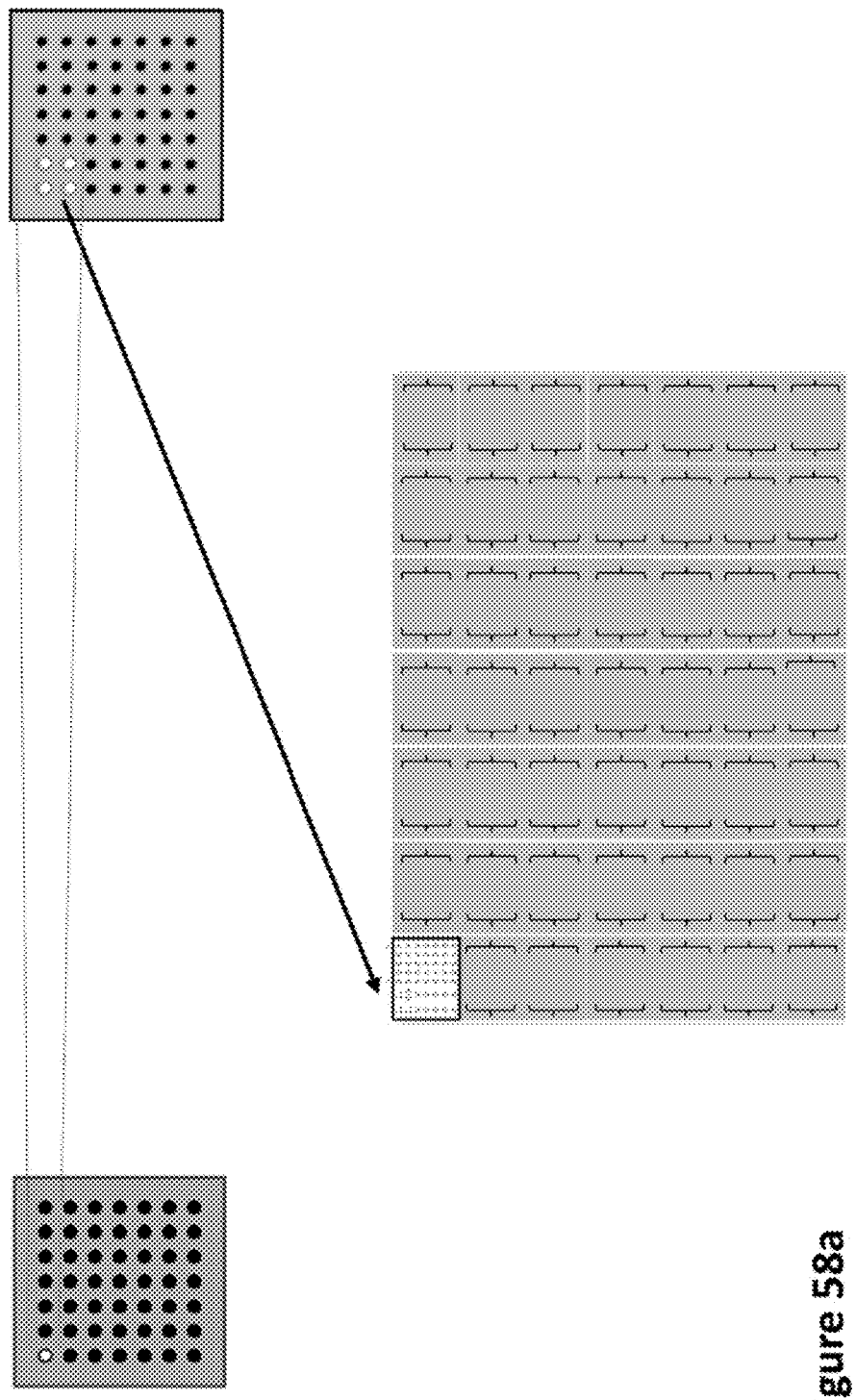
Figure 58B:
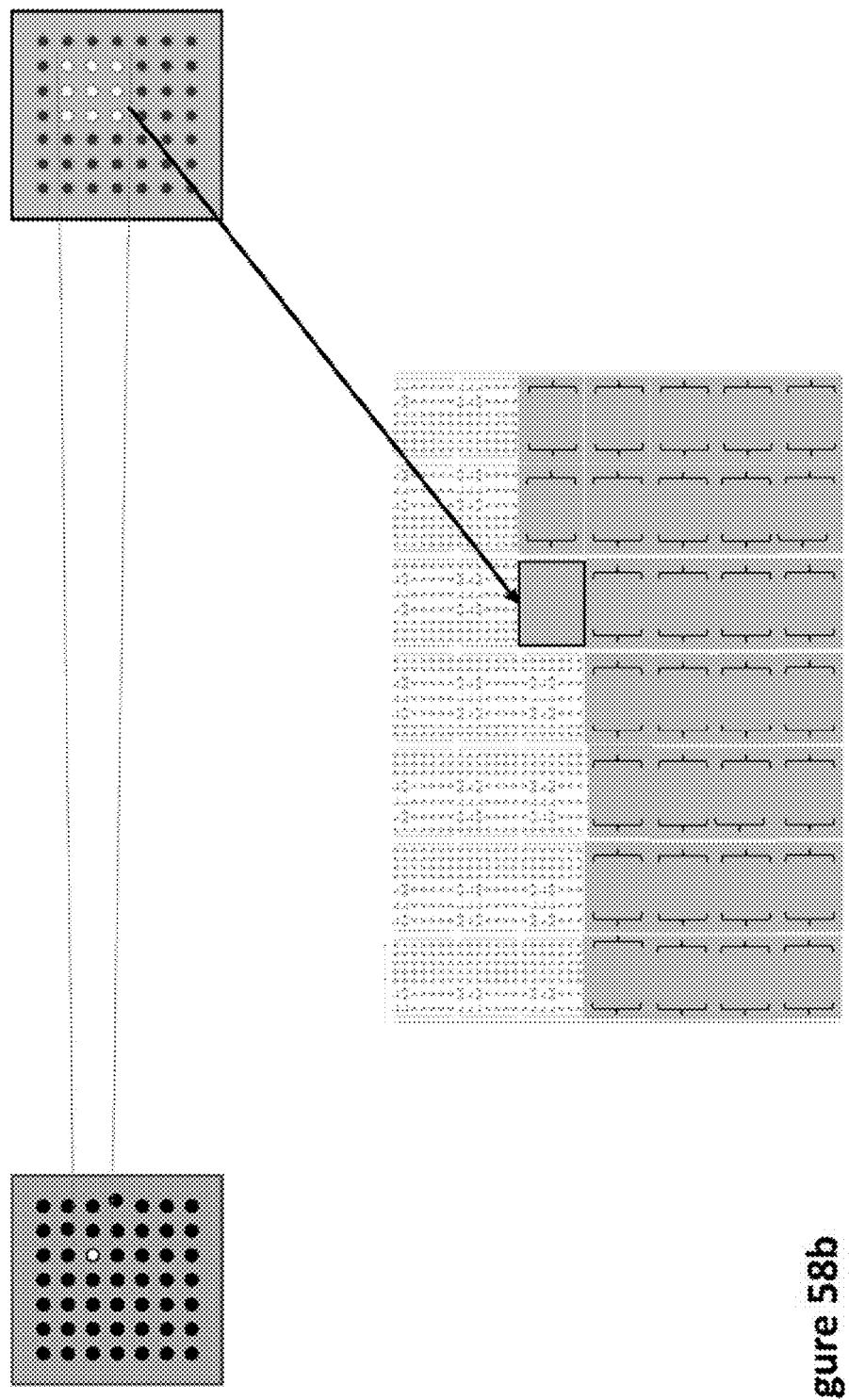
Figure 58C:
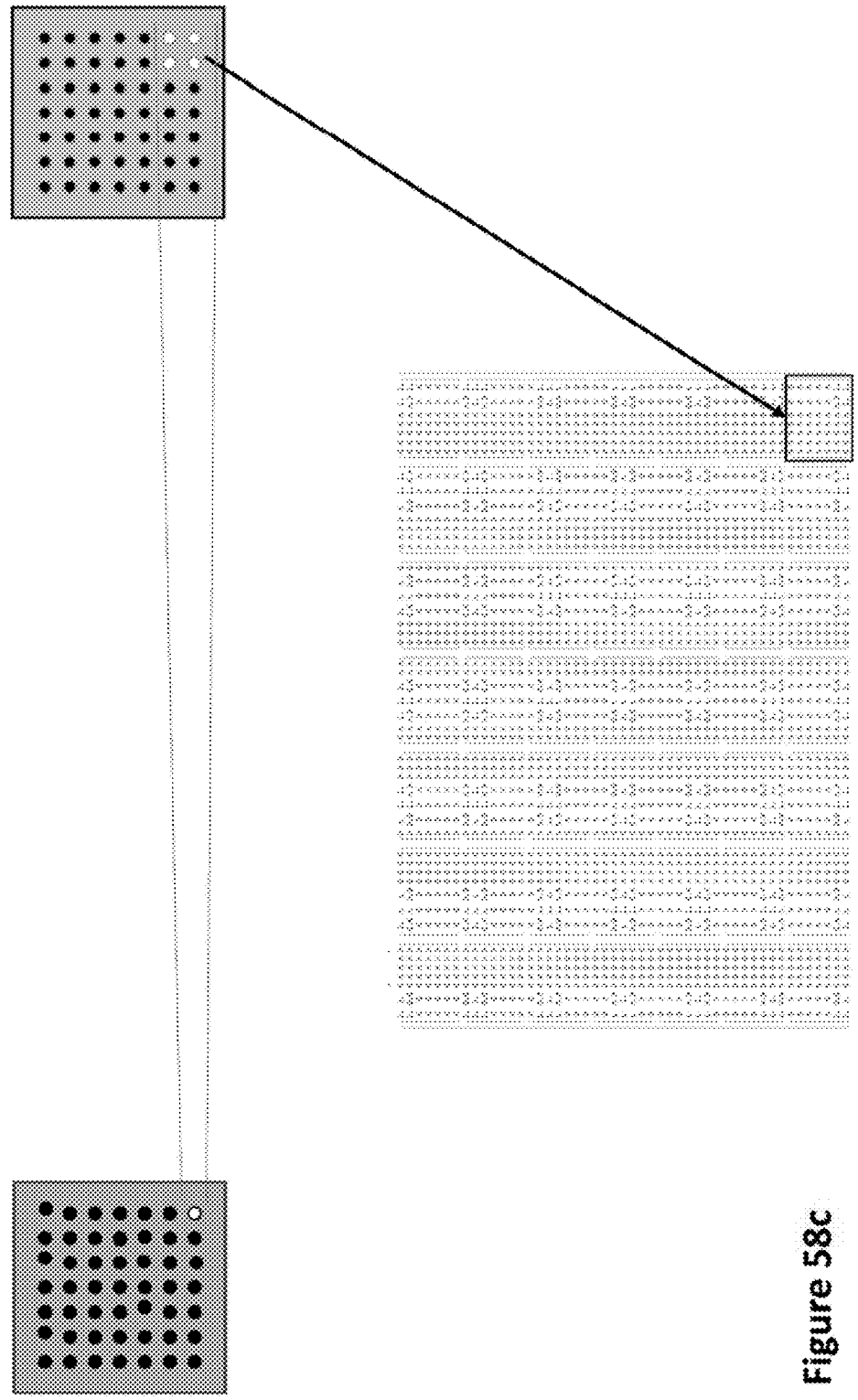

FIGS. 58a through 58c depict three of forty-nine steps of an example empirical training sequence as provided for by the invention. In an implementation of the invention, such a procedure could be performed for a selected collection of one or more separation distances between the image sensor and the source image. As described elsewhere, the source image need not be on a parallel plane and can be distributed arbitrarily in the observable space.

Figure 59:
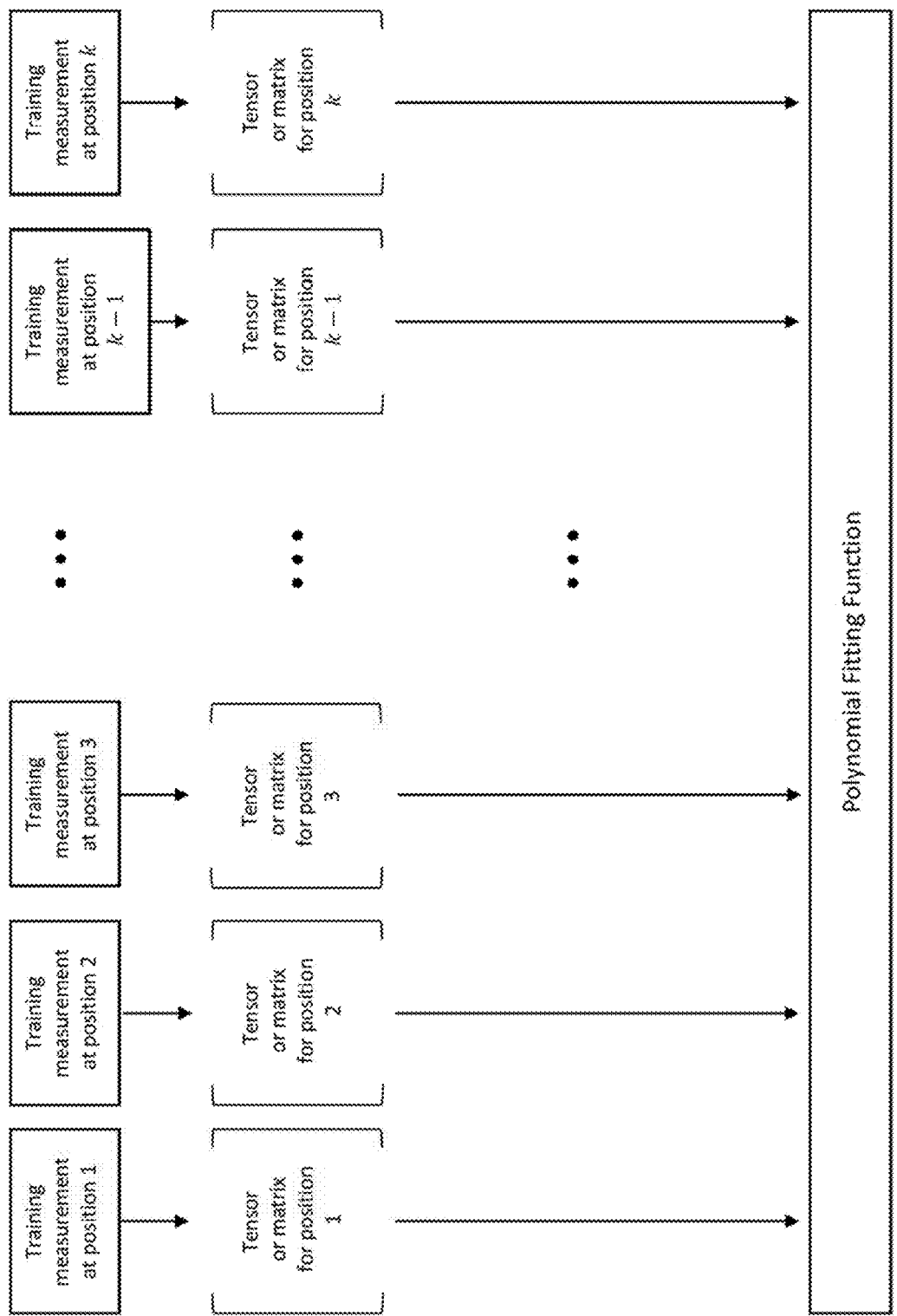
Figure 60:
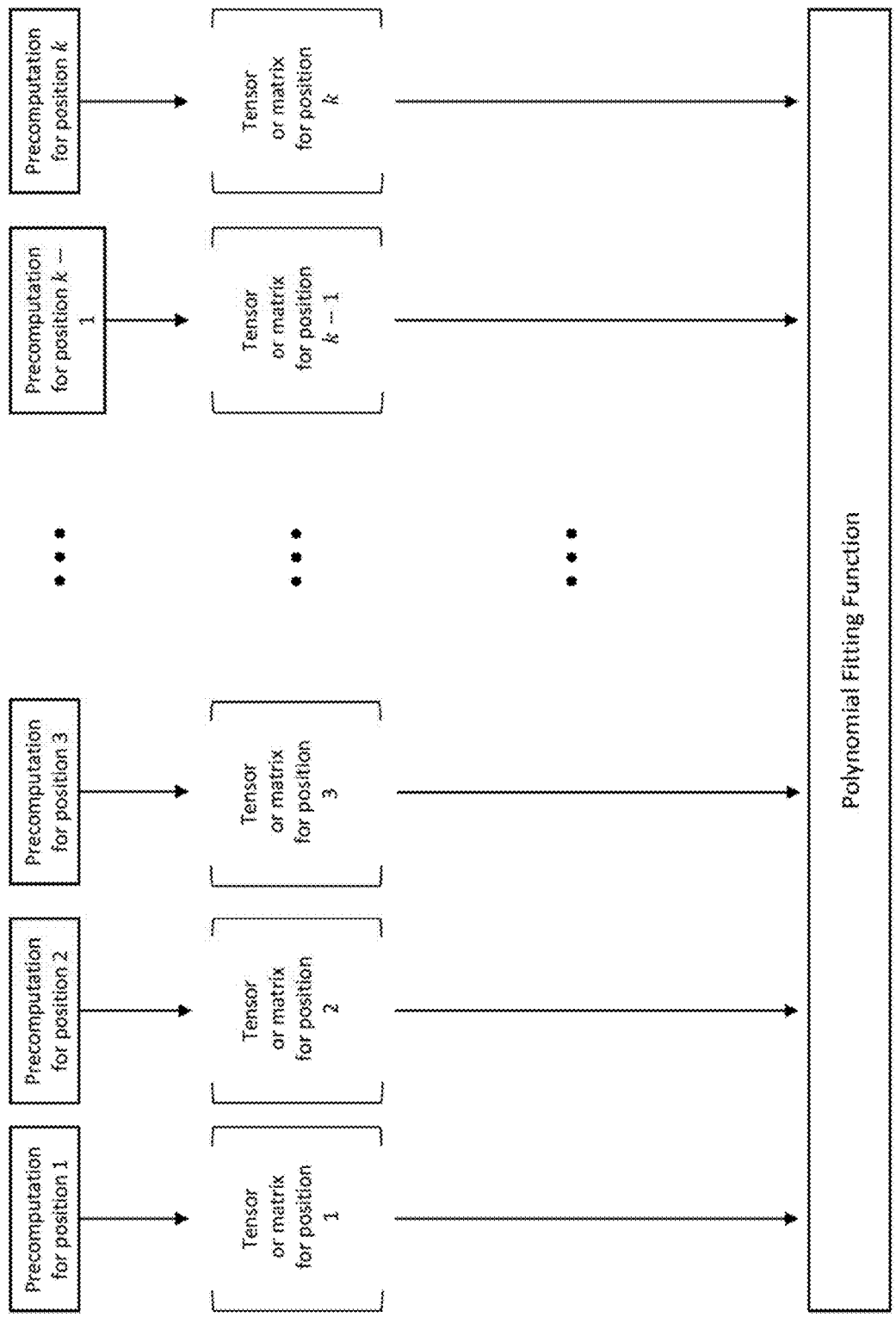

FIG. 59 depicts an example polynomial fitting function interpolation method for interpolating the numerical model, its inverse/pseudo-inverse, and/or other functions for separation distances values lying between k empirically-trained separation distances. As described elsewhere, the source image need not be on a parallel plane and can be distributed arbitrarily in the observable space FIG. 60 depicts an example polynomial fitting function interpolation method for interpolating the numerical model, its inverse/pseudo-inverse, and/or other functions for separation distances values lying between k separation distances used by a predictive-model. As described elsewhere, the source image need not be on a parallel plane and can be distributed arbitrarily in the observable space.

Figure 61:
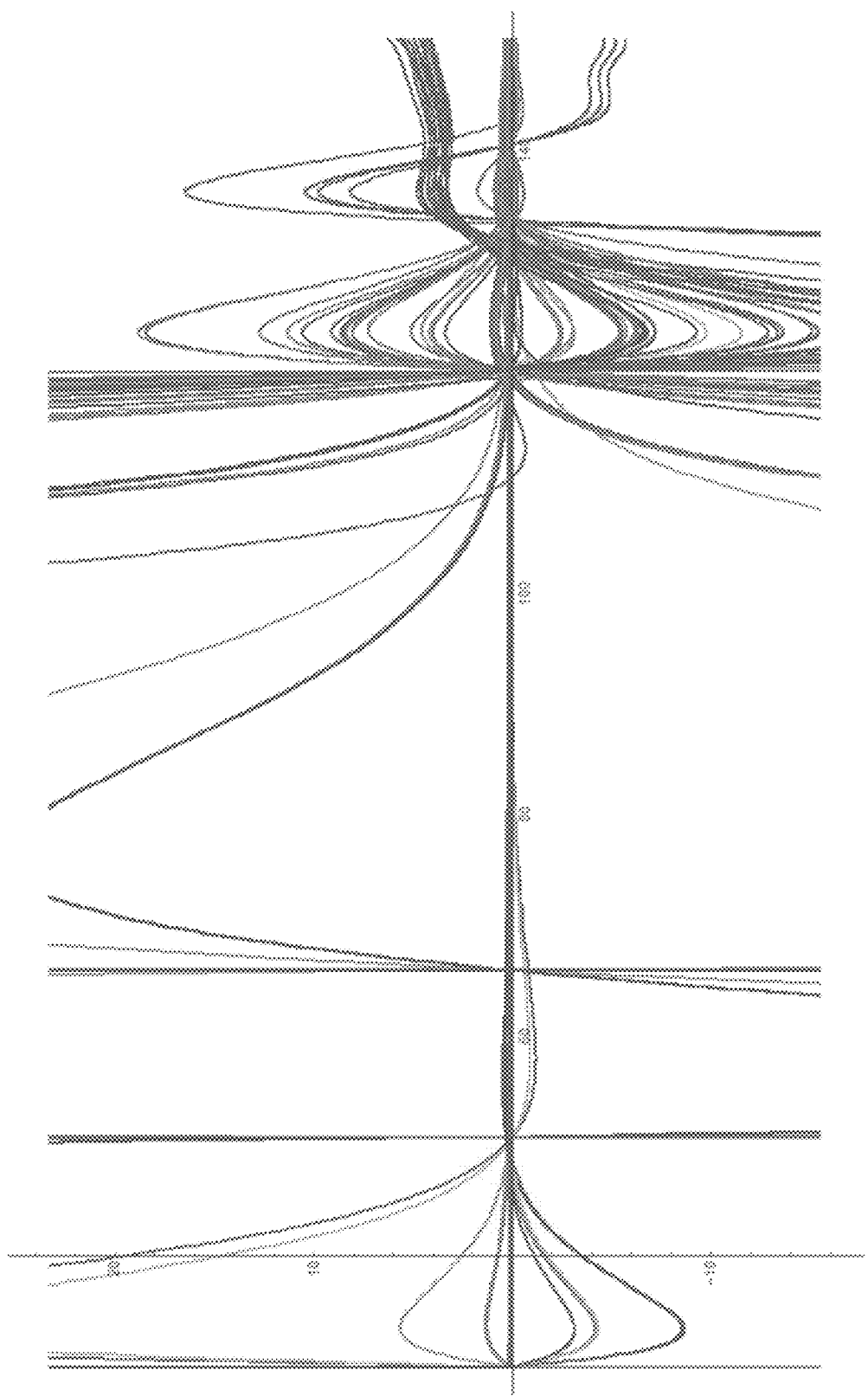

FIG. 61 depicts an example of very poor curve-fit interpolation of the matrix elements of the numerical model between measure data distances resulting from not having correct or sufficient terms in a model polynomial.

Figure 62:
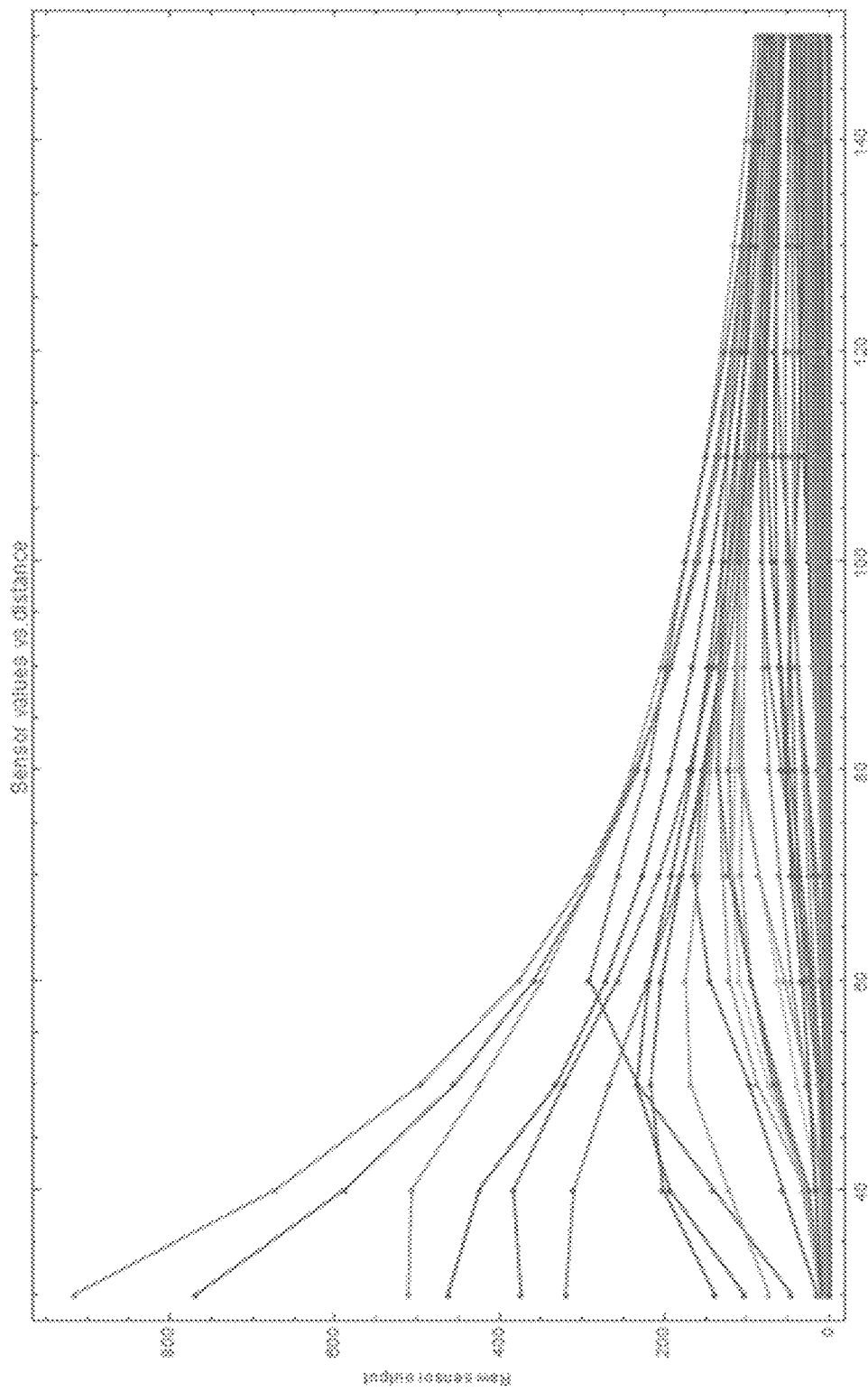

FIG. 62 depicts an example piecewise-linear interpolation of the matrix elements of the numerical model between k empirically-trained separation distances.

Figure 63A:
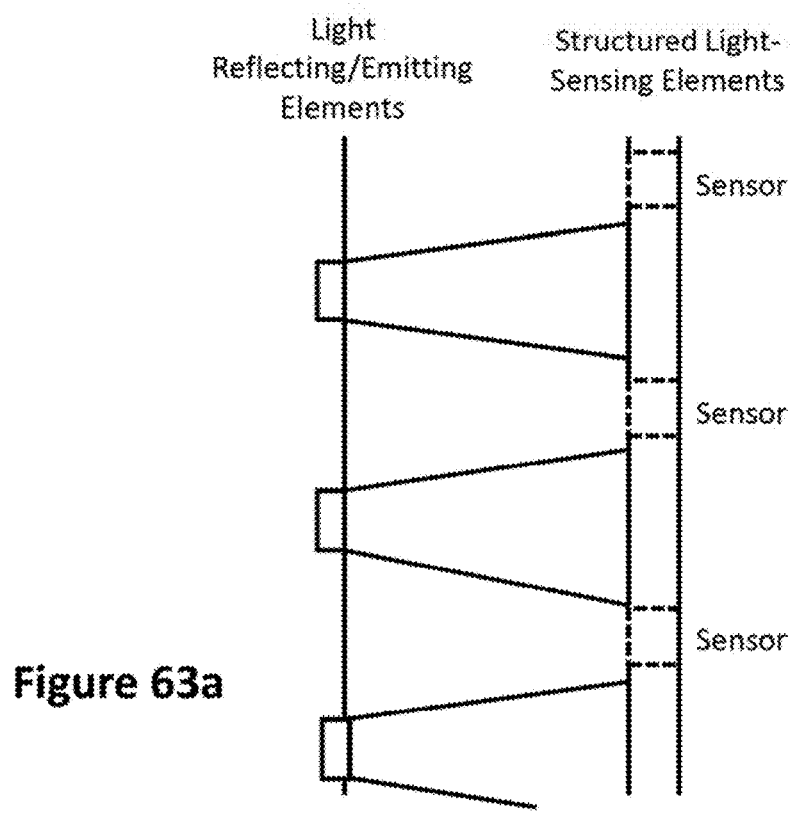
Figure 63B:
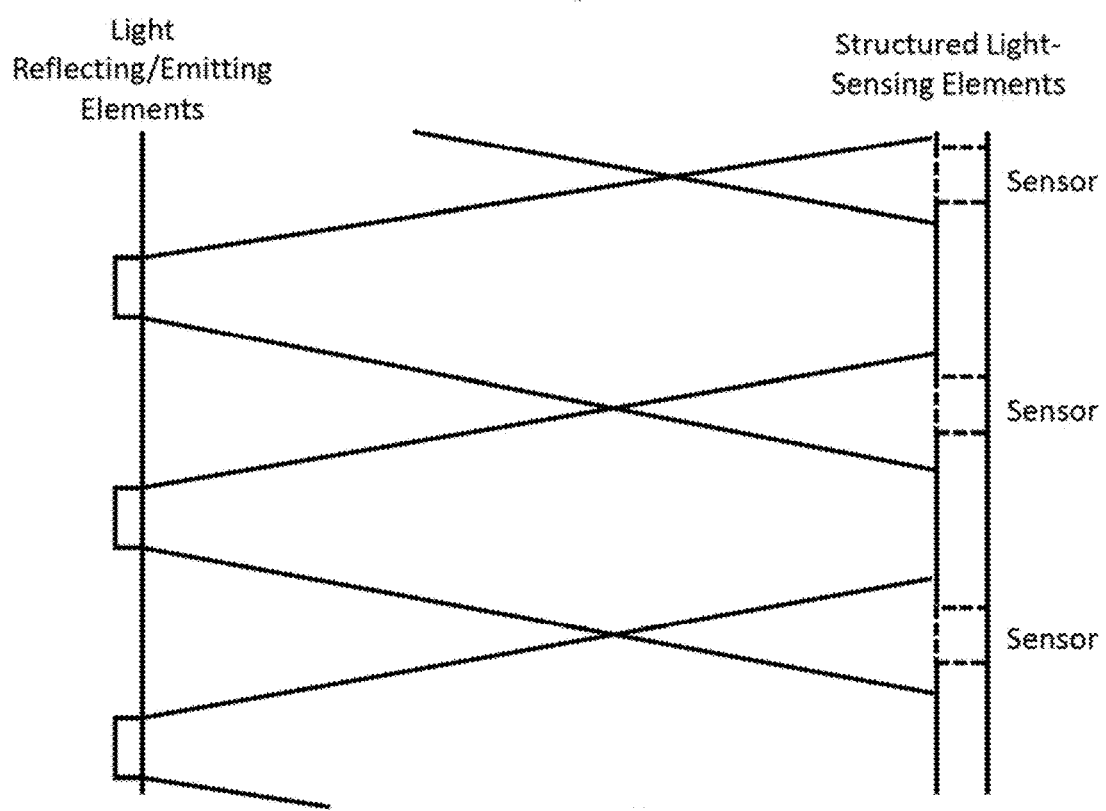

FIG. 63a depicts how with very small separation distances and certain non-alignment of source-pixel locations and sensor pixel locations some sensor pixel locations cannot receive light from proximate source-pixel locations, while FIG. 63b depicts how at slightly greater separation distances this condition does not occur; such processes can give rise to the rising and falling of selected curves in the example empirical training data shown in the example of FIG. 61.

Figure 64:
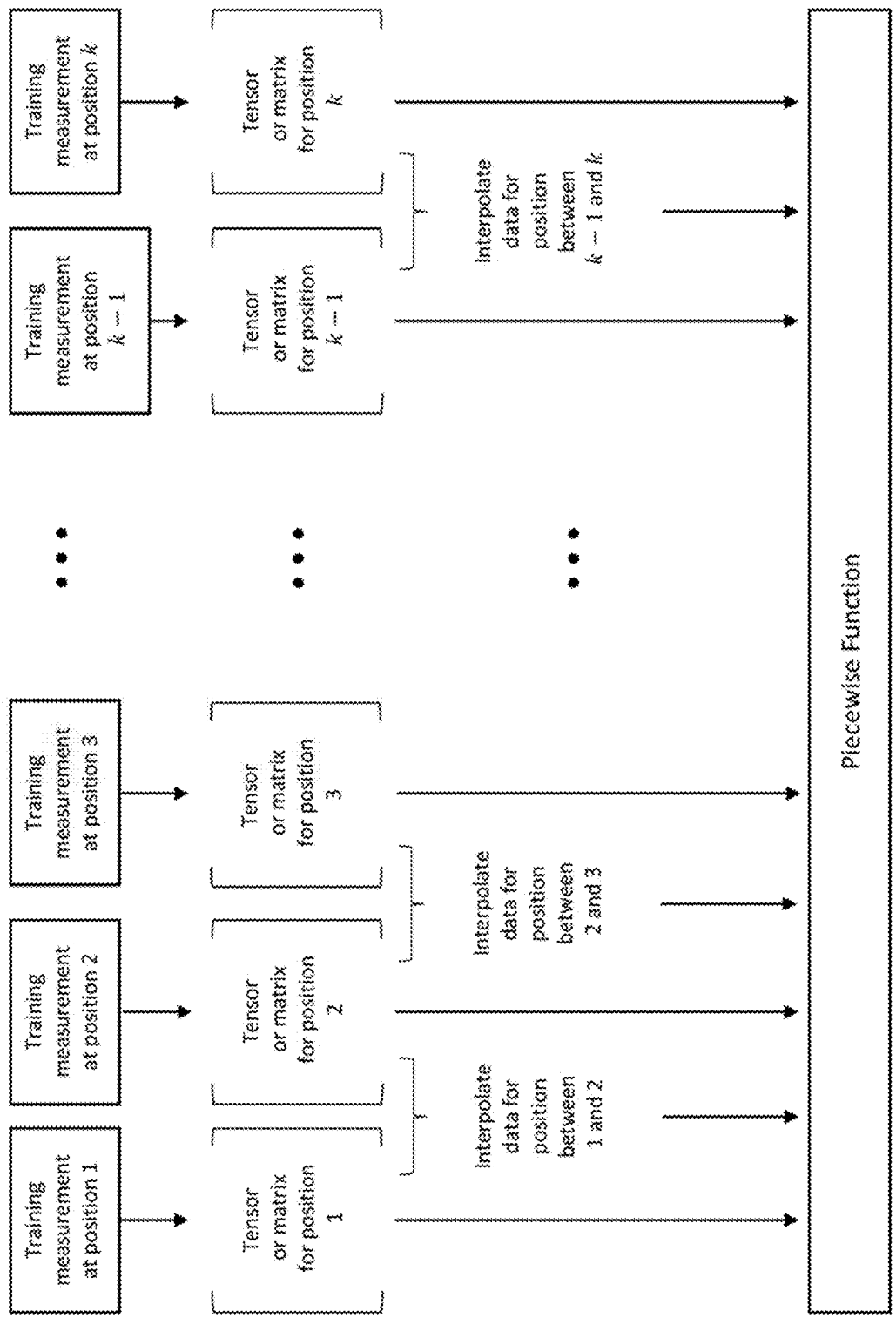

FIG. 64 depicts an example piecewise-linear interpolation method for interpolating the numerical model, its inverse/pseudo-inverse, and/or other functions for separation distances values lying between k empirically-trained separation distances. As described elsewhere, the source image need not be on a parallel plane and can be distributed arbitrarily in the observable space.

Figure 65:
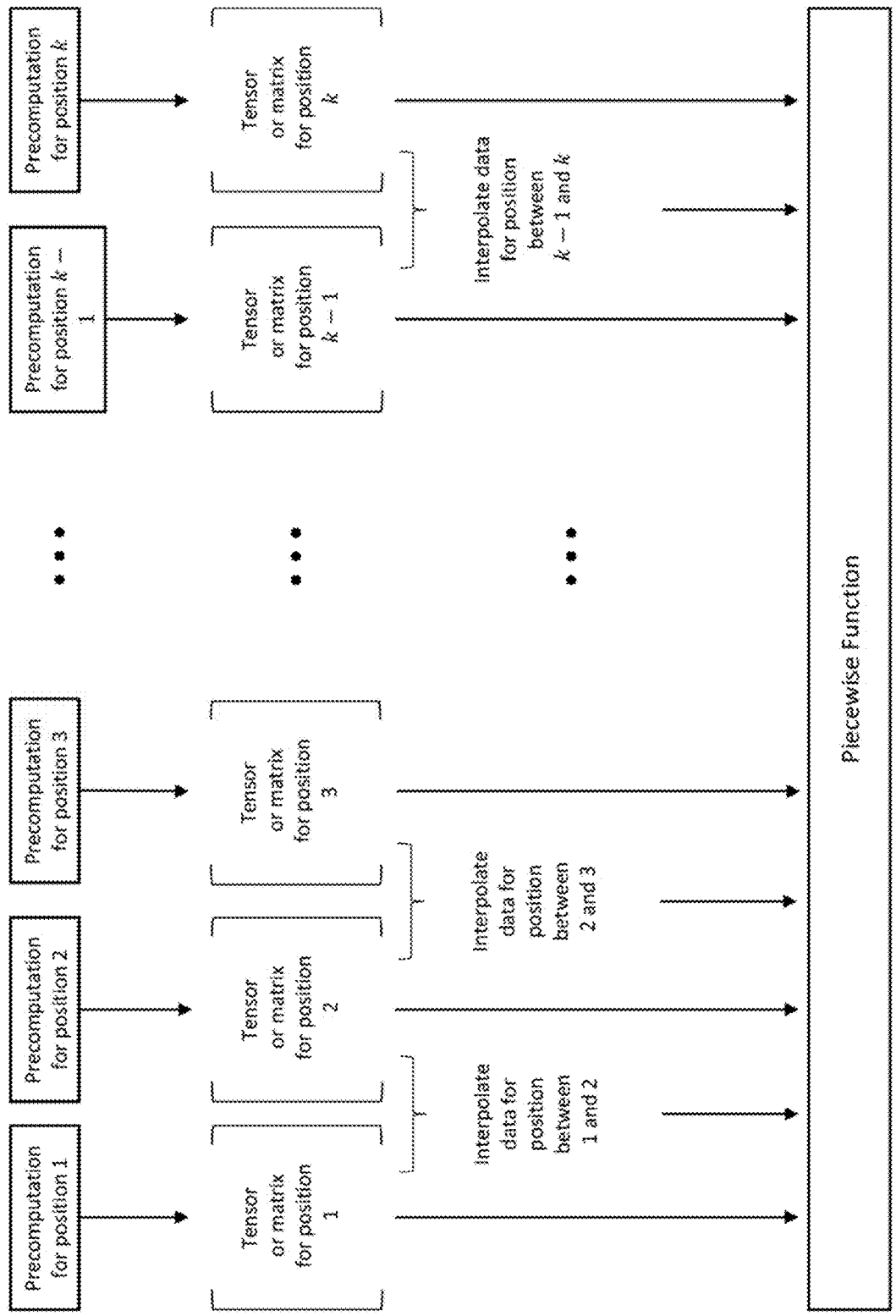

FIG. 65 depicts an example piecewise-linear interpolation method for interpolating the numerical model, its inverse/pseudo-inverse, and/or other functions for separation distances values lying between k separation distances used by a predictive-model. As described elsewhere, the source image need not be on a parallel plane and can be distributed arbitrarily in the observable space.

Figure 66:
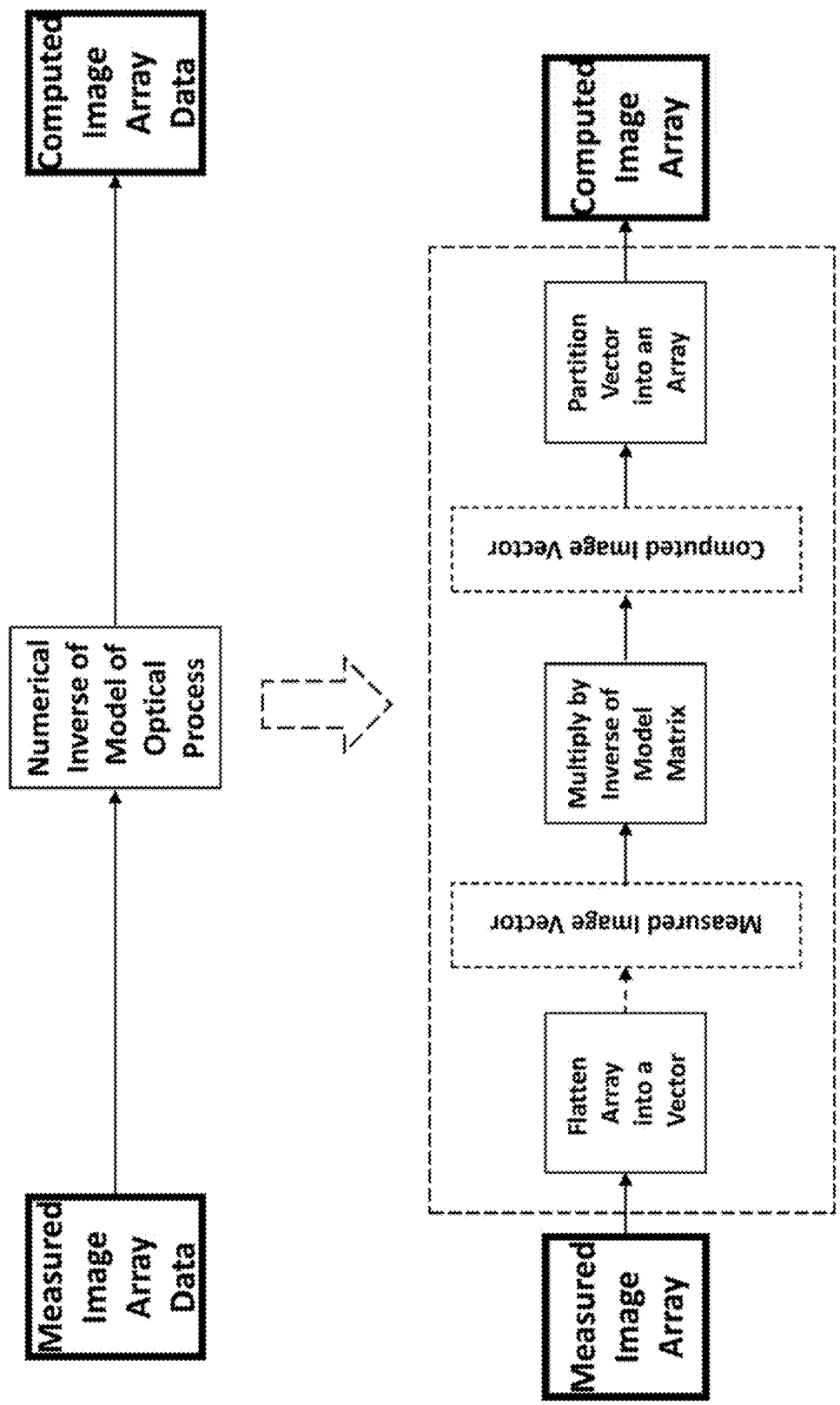

FIG. 66 depicts an abstract representation of the mathematical recovery of image from measured image array data.

Figure 67:
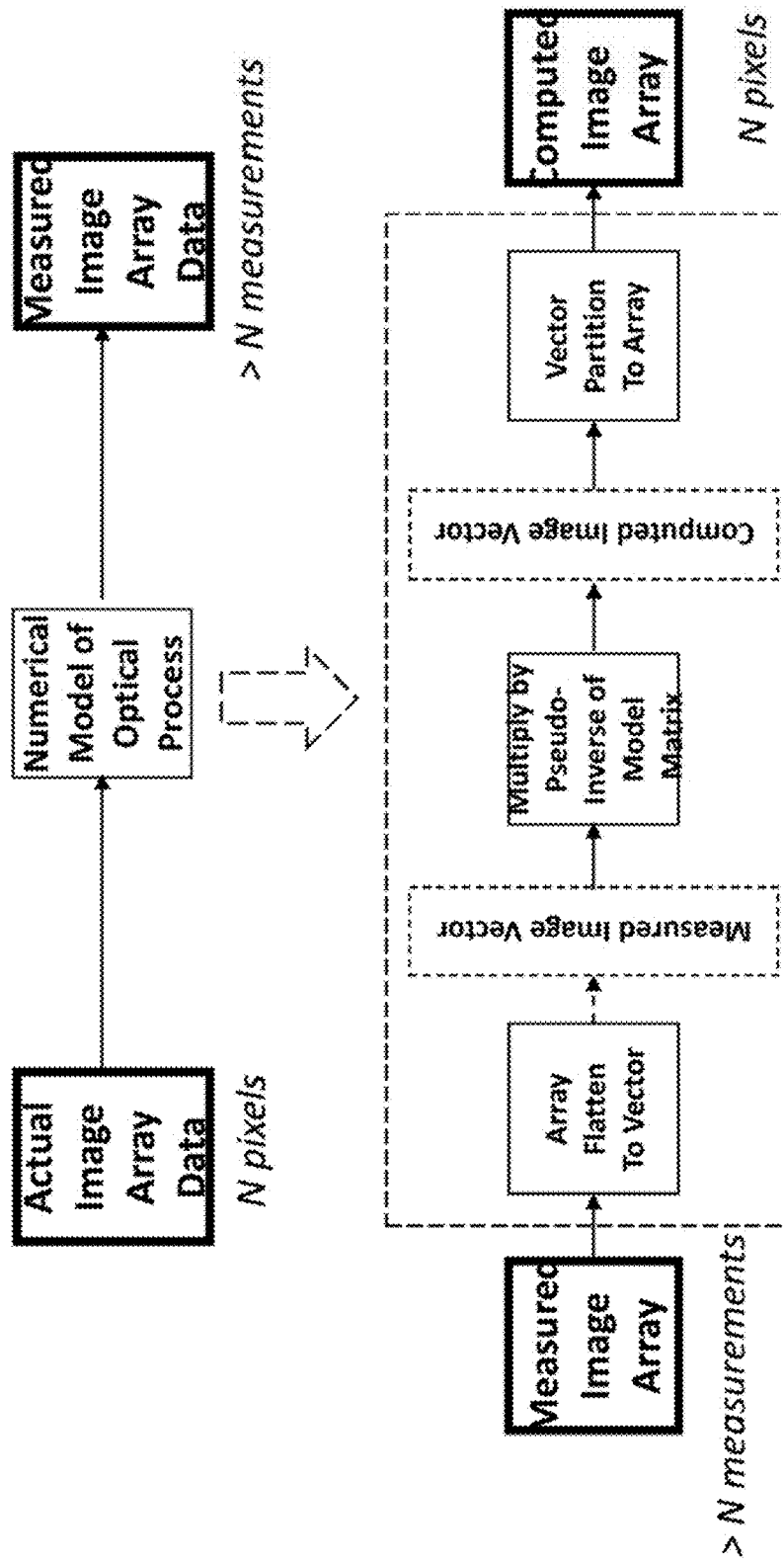
Figure 68A:
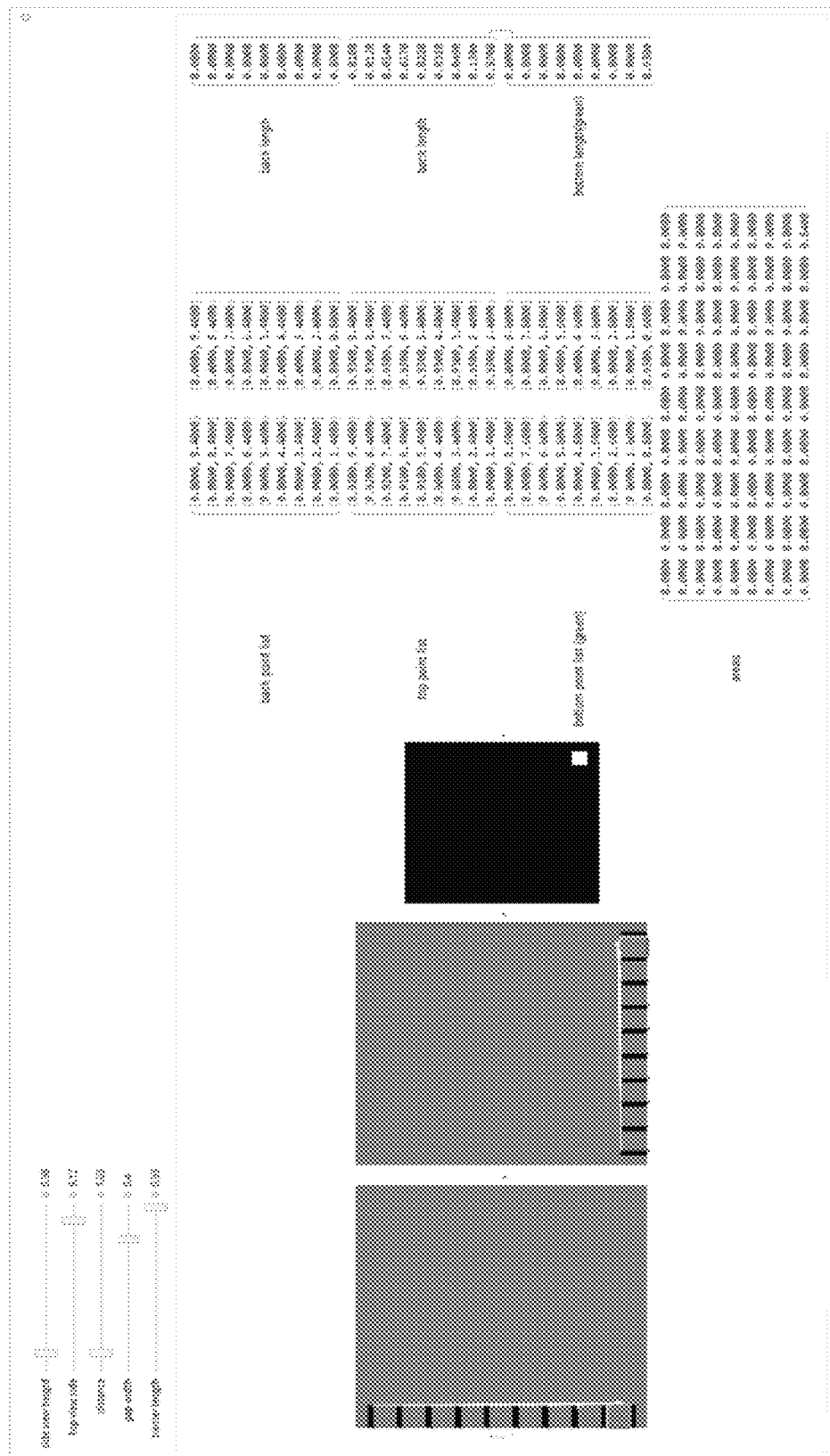
Figure 68B:
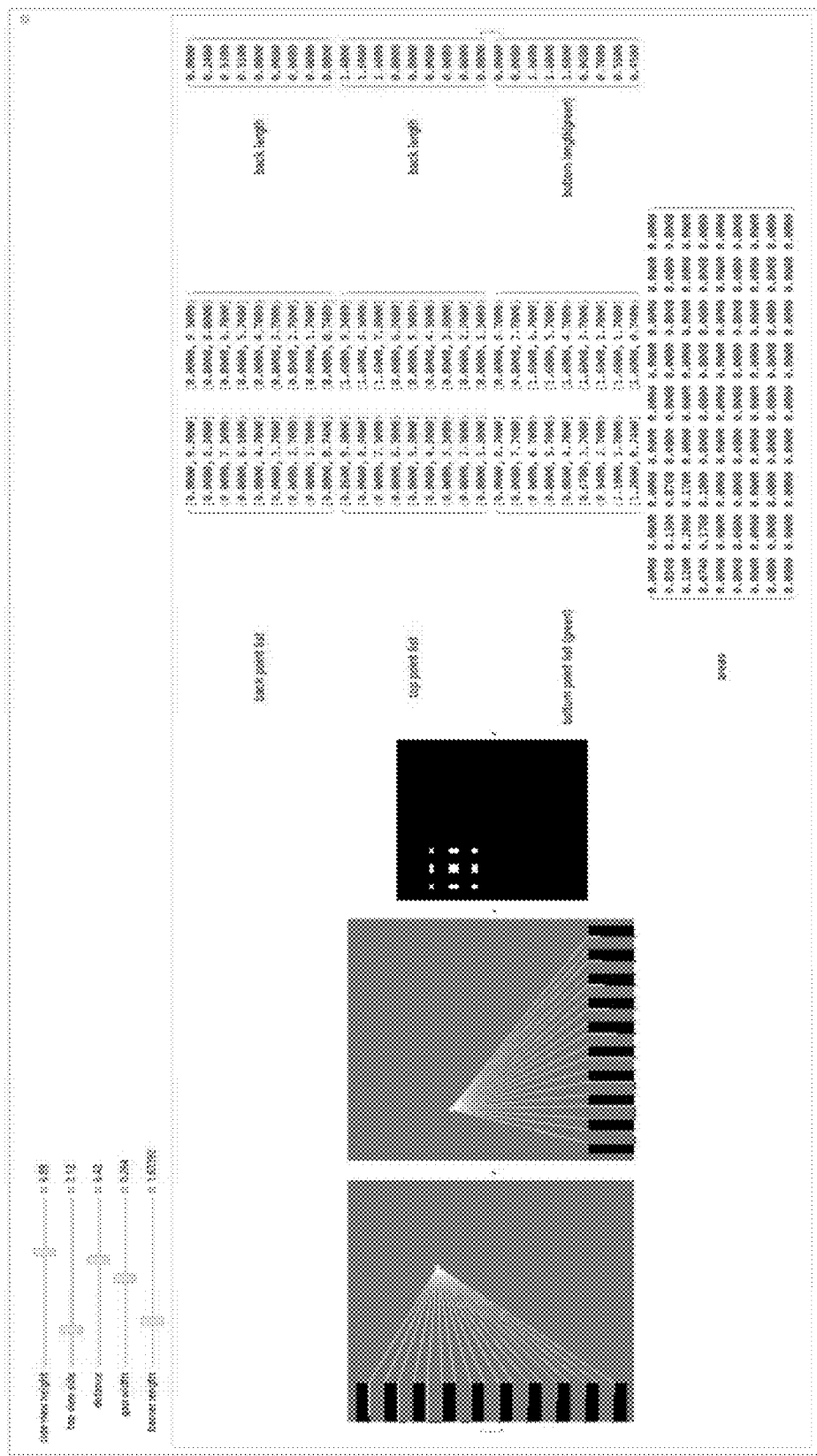
Figure 68C:
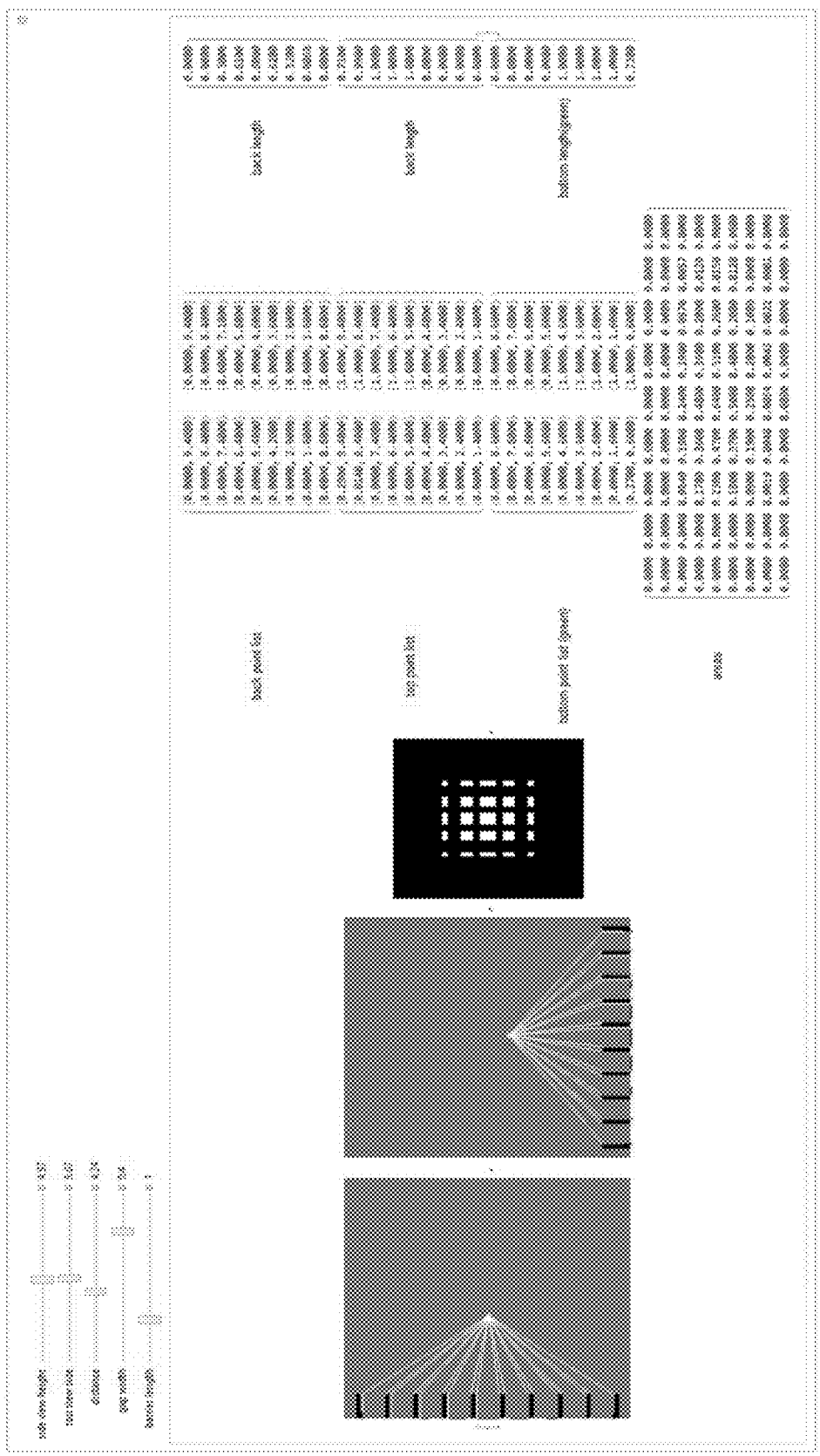
Figure 68D:
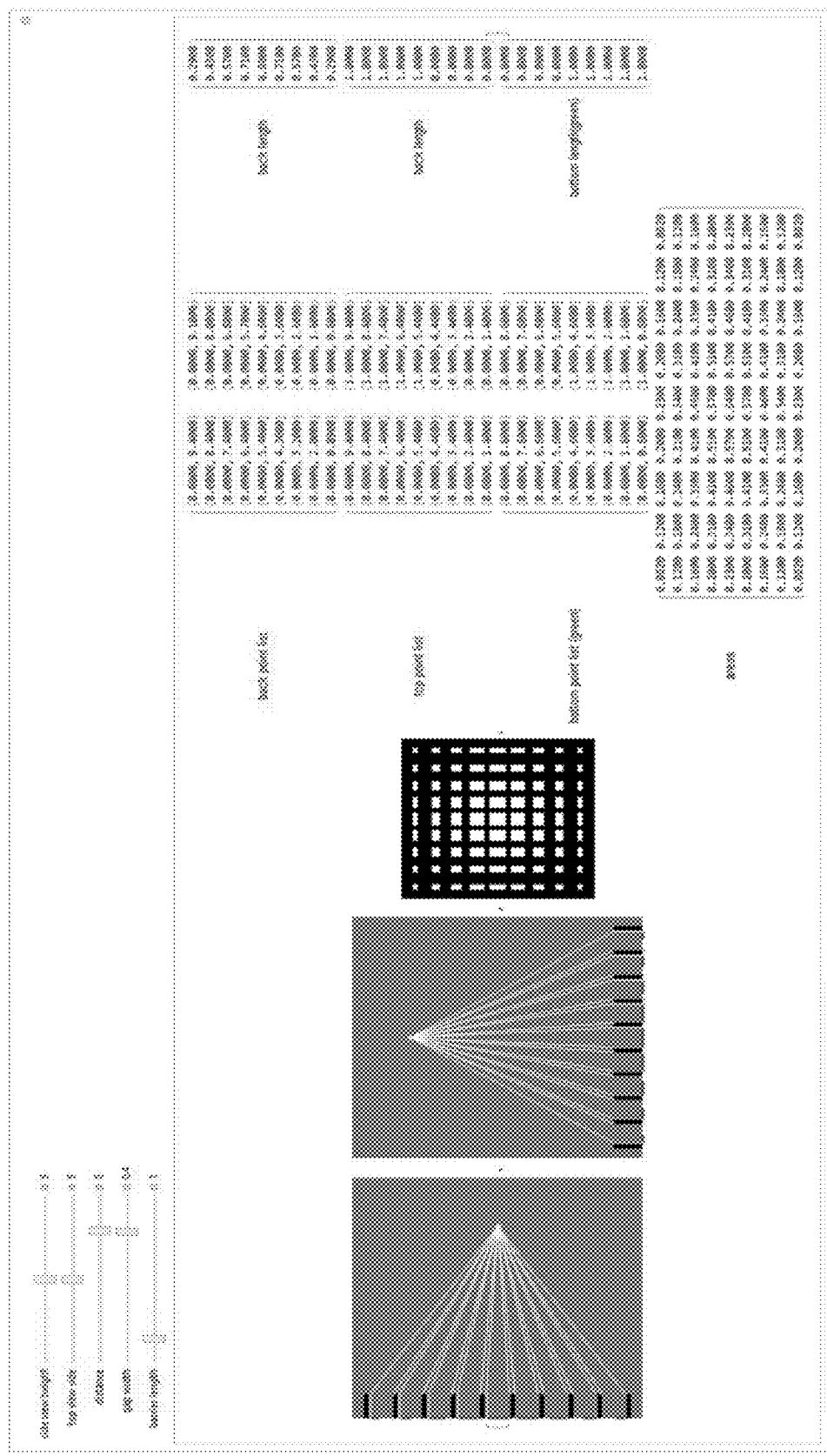

FIG. 67 depicts a variation on the representation of the mathematical recovery of image from measured image array data shown in FIG. 66 wherein more measurements are made than needed, resulting in an over-specified collection of measurements that can be expected to lead to inconsistent calculation outcomes when different subgroups of measurements are used to solve for the recovered image. As provided for by the invention, a Moore-Penrose pseudo-inverse operation gives a least-squares fit to the expected inconsistent outcomes; this is depicted in the bottom portion of the figure.

FIG. 68a through 68d depict example numerical model outcomes responsive to a single-illuminated pixel as generated for various separation distances by an example predictive analytical geometric model. The particular example predictive analytical geometric model used only accounts for vignette occultation as calculated by simple ray-trancing and does not include the effects of vignette-internal reflections, vignette-internal scattering, vignette-aperture diffraction, surface plasmoid propagation, etc.

FIG. 69a depicts three example interactive quantization-effect modeling outcomes wherein controllable quantization is artificially imposed on measurement data so as to predictively model and characterize the effects of quantizing nonlinearities imposed by electronic digital-to-analog converter processes on empirical training, predictive-model generated, and real-time measurements as they influence the quality of image recovery.

FIG. 69b depicts three example interactive offset-effect modeling outcomes wherein controllable measurement offset is artificially imposed on measurement data so as to predictively model and characterize the effects of measurement offsets imposed by electronic digital-to-analog converter processes on empirical training, predictive-model generated, and real-time measurements as they influence the quality of image recovery.

FIG. 69c depicts an example interactive noise-modeling control used to introduce synthetically-generated noise and noise processes so as to predictively model and characterize its effects. The selection shown controls additive Gaussian noise, but other noise processes associated with photodiodes can similarly be introduced.

FIGS. 70a through 70d depict example interactive modeling outcomes showing the effect of noise, offset, and both these for a 32-step (5-bit) quantized ("DN" [B2]) measurement dynamic range.

FIGS. 71a through 71d depict example interactive modeling outcomes showing the effect of noise, offset, and both these for a 64-step (6-bit) quantized ("DN") measurement dynamic range.

FIG. 72a through 72d depict example interactive modeling outcomes showing the effect of noise, offset, and both these for a 128-step (7-bit) quantized ("DN") measurement dynamic range.

FIGS. 73a through 73d depict example interactive modeling outcomes showing the effect of noise, offset, and both these for a 140-step (slightly more than 7-bit) quantized ("DN") measurement dynamic range.

FIG. 74a through 74d depict example interactive modeling outcomes showing the effect of noise, offset, and both these for a 150-step (yet more than 7-bit) quantized ("DN") measurement dynamic range.

Figure 75B:
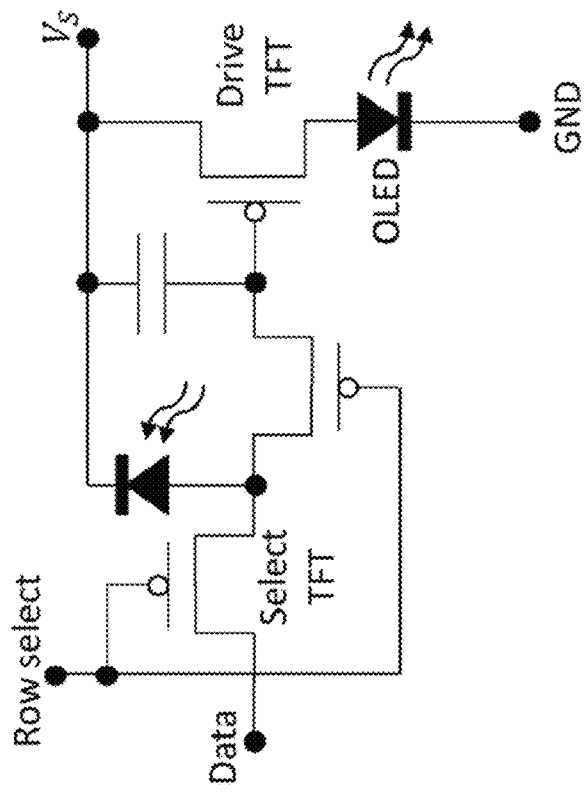
Figure 75A:
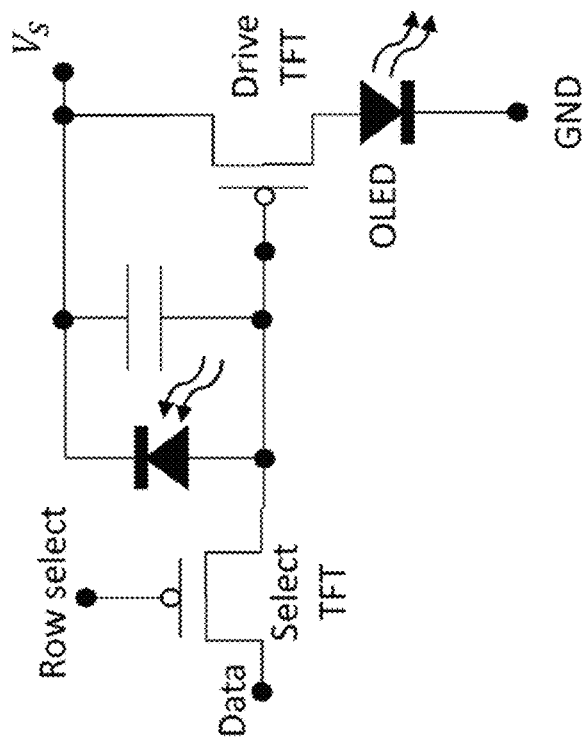

FIG. 75a, adapted from [B7] Figure C2.5.16(a), depicts a first example pixel-cell multiplexed-addressing circuit for an individual OLED within an OLED array that includes a dedicated light-coupled monitoring photodiode for use in regulating the light output of the individual OLED so as to prevent user-observed fading or other brightness-variation processes.

FIG. 75b, adapted from [B7] Figure C2.5.16(b), depicts a second example pixel-cell multiplexed-addressing circuit for an individual OLED within an OLED array that includes a dedicated light-coupled monitoring photodiode for use in regulating the light output of the individual OLED so as to prevent user-observed fading or other brightness-variation processes.

Figure 76B:
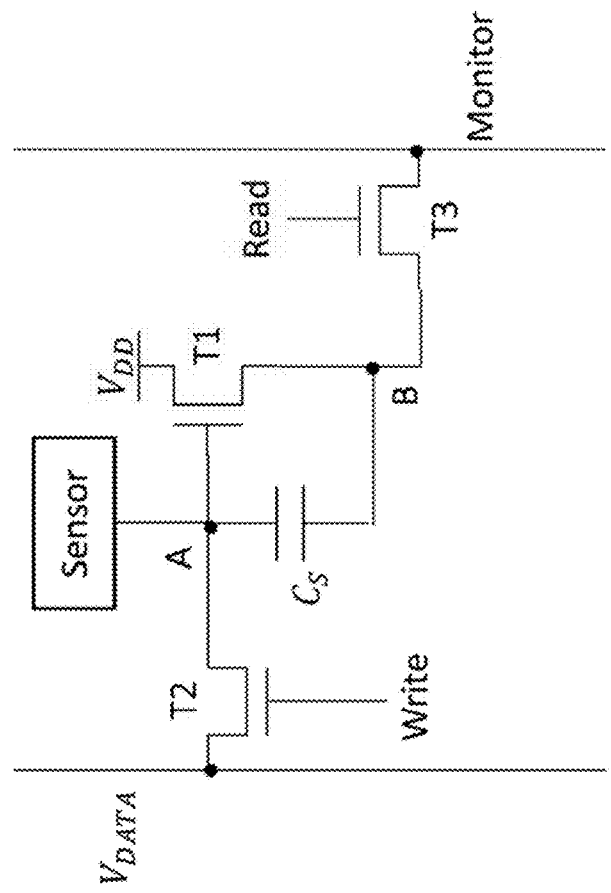
Figure 76A:
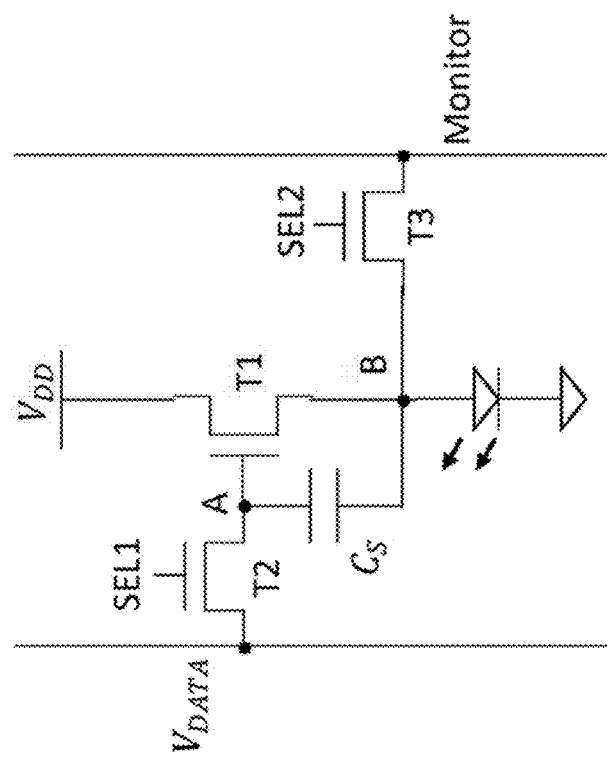

FIG. 76a, adapted from [B18], depicts an example pixel-cell multiplexed-addressing circuit for an individual OLED within an OLED array with a monitoring feature.

FIG. 76b, also adapted from [B18], depicts an example pixel-cell multiplexed-addressing circuit for an isolated high-performance photodiode or phototransistor within a high-performance photodiode or phototransistor array with a forced-measurement provision.

Figure 1:
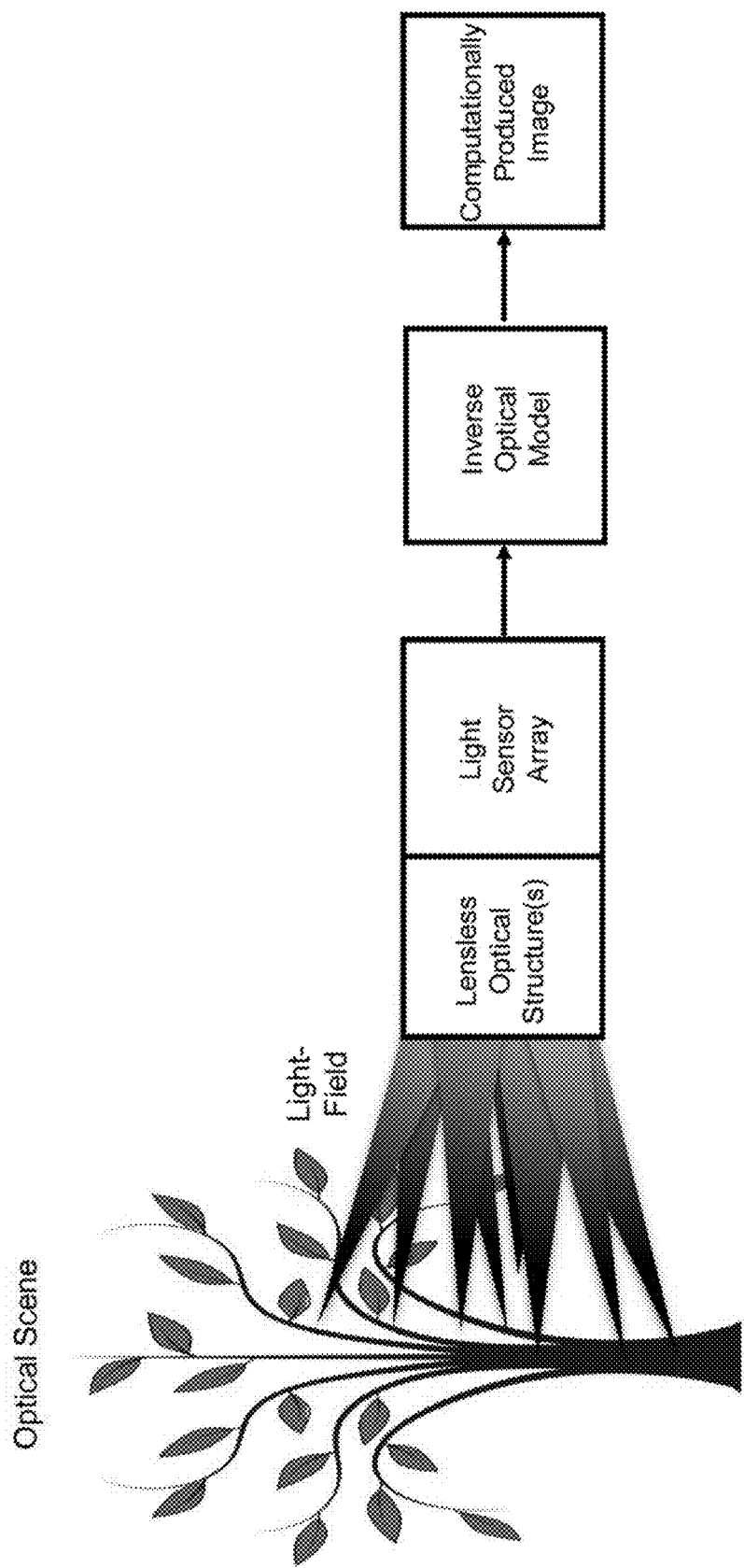
FIG. 1 depicts an example conceptual view of the underlying principles of the invention, facilitating a wide range of implementation methods and architectures.
Figure 77:
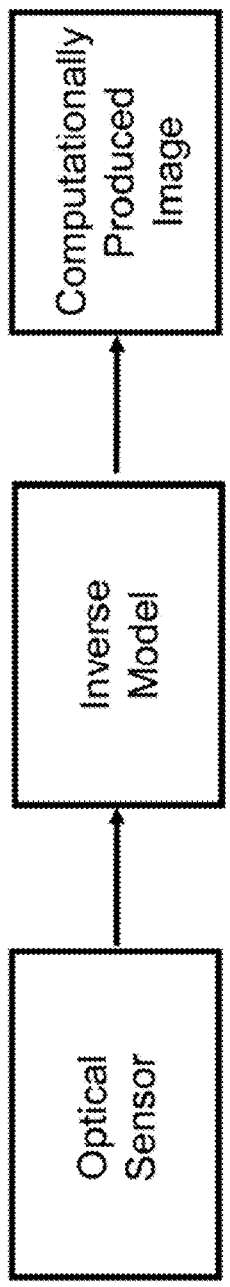

FIG. 77 depicts a simplified view of FIG. 1 showing only the signal and computational portion of FIG. 1 as will be useful in a subsequent discussion.

Figure 78:
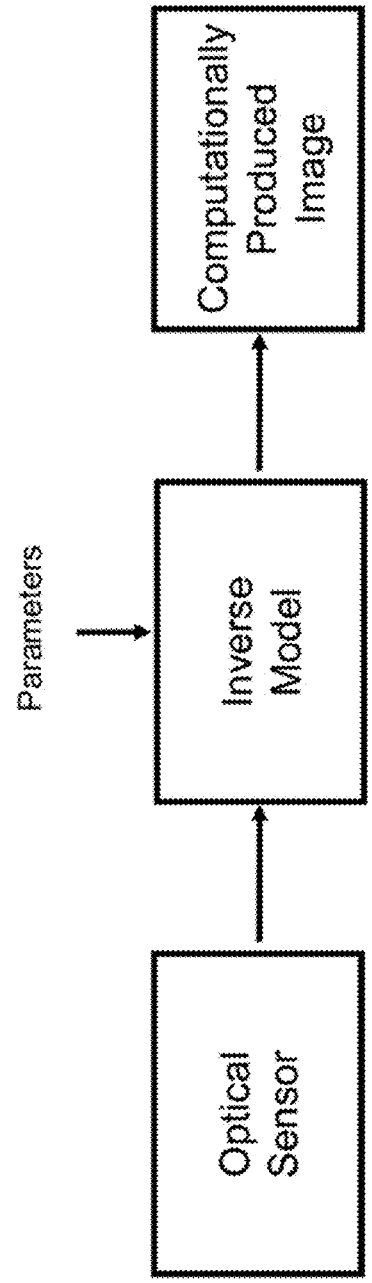

FIG. 78 depicts a variation of the arrangement represented in FIG. 77 wherein the Inverse Model is rendered as a parameterized Inverse Model which can be altered responsive to one or more provided parameters.

Figure 79:
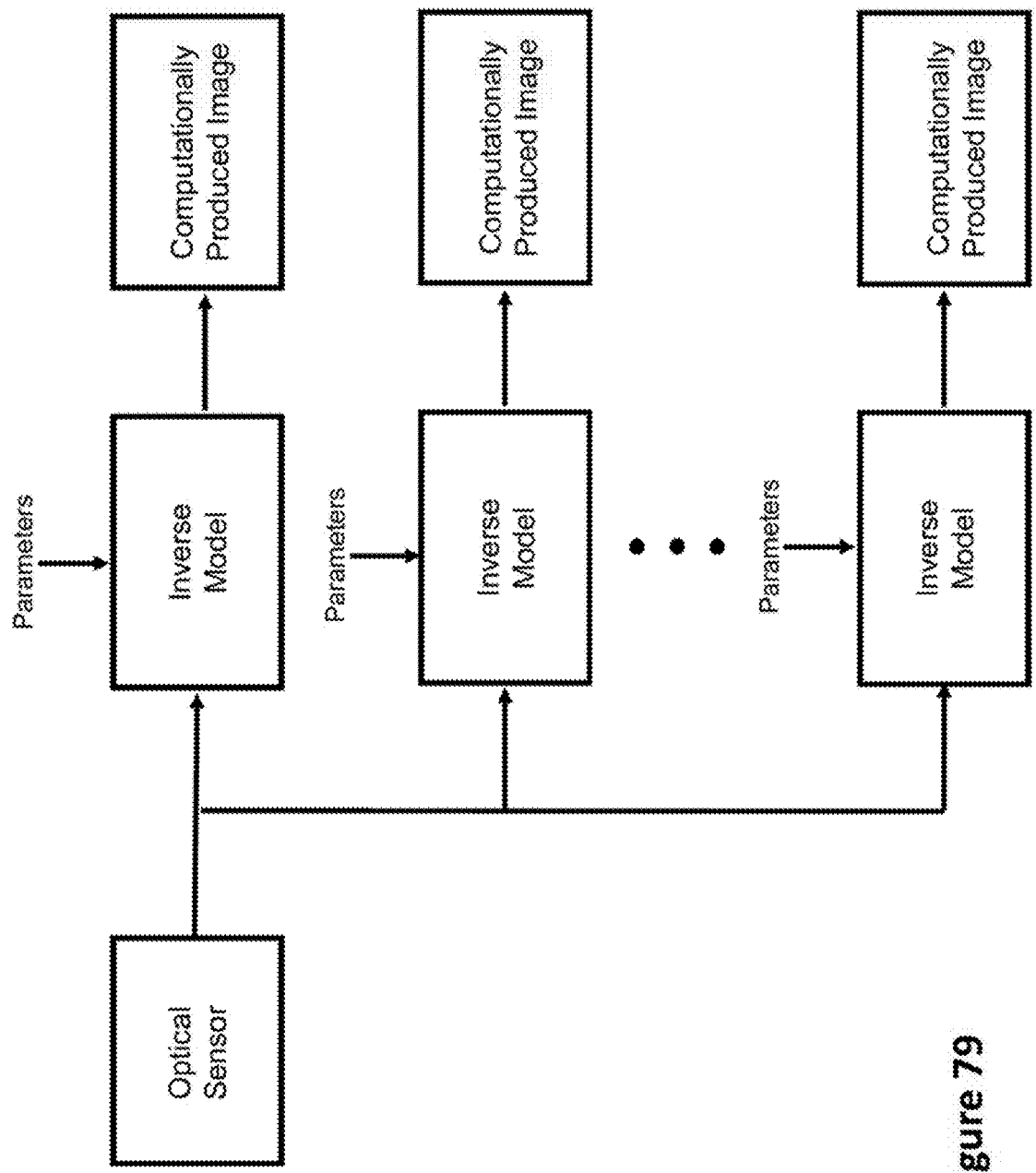

FIG. 79 depicts a variation of the arrangement represented in FIG. 78 wherein the electrical signals and/or computational data produced by the Optical Sensor are in parallel provided in whole or selected (or selectable) part to a plurality of Inverse Models, each producing one or more computationally-produced images responsive to the sensor data.

Figure 80:
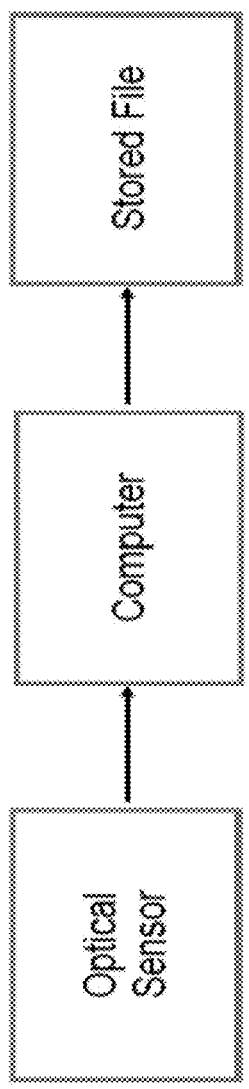

FIG. 80 depicts a variation of the arrangement represented in FIG. 78 wherein the electrical signals and/or computational data produced by the Optical Sensor is handled by a computer or computational element (such as a microprocessor, GPU, DSP chip, ALU, FPLA, combination of two or more these, pluralities of these, etc.) in some fashion that at least permits the electrical signals and/or computational data produced by the Optical Sensor to be stored as a file.

Figure 81:
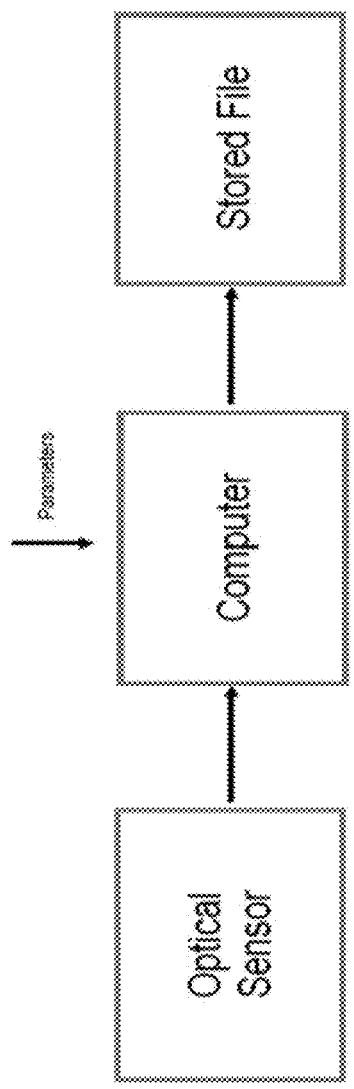

FIG. 81 depicts a variation of the arrangement represented in FIG. 78 wherein the aforementioned handling by a computer or computational element is controlled in some manner by a control parameter.

Figure 82A:
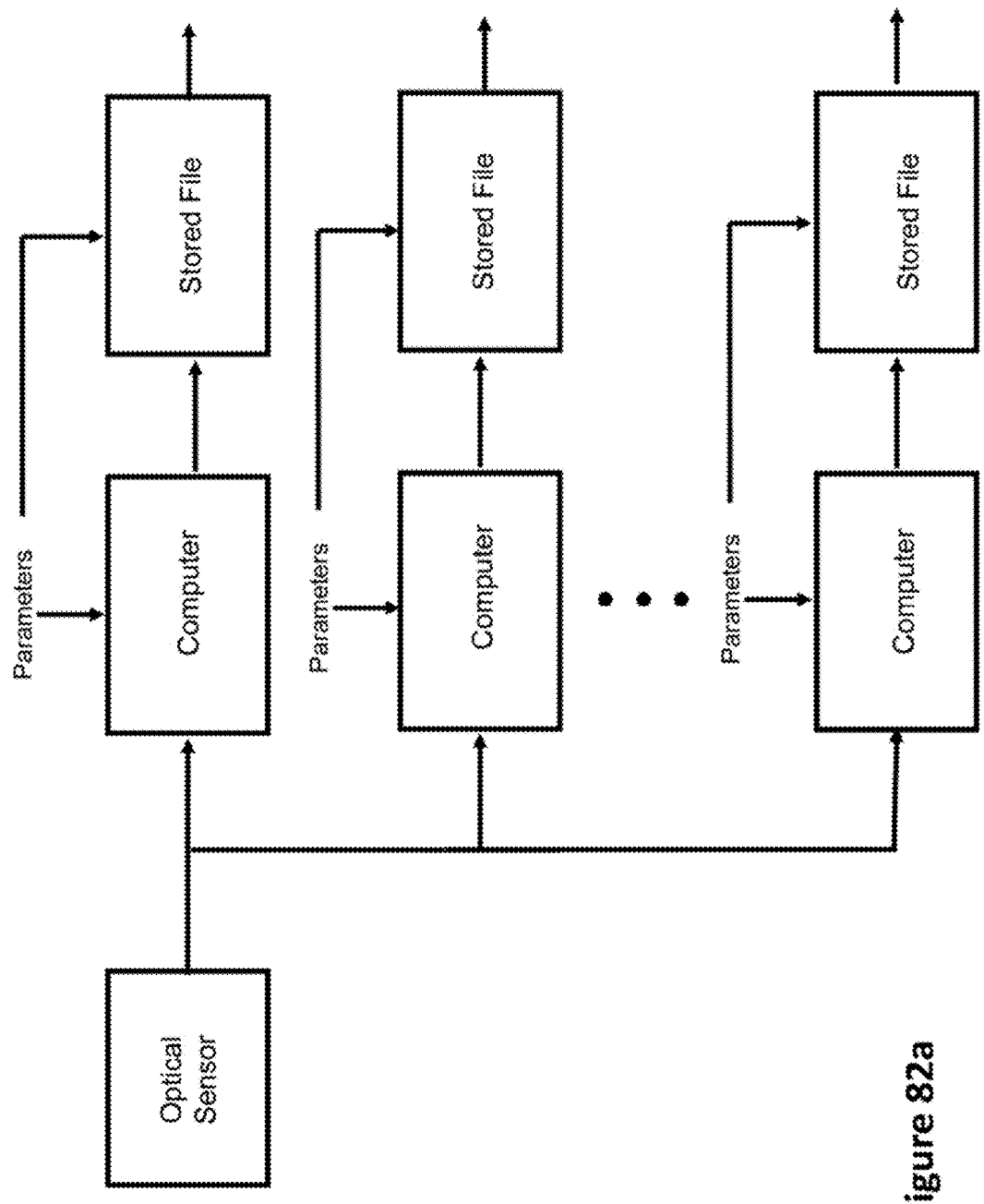

FIG. 82a depicts a variation of the arrangement represented in FIG. 81 wherein a plurality of stored files is created, for example with different parameter values associated with each stored file.

Figure 82B:
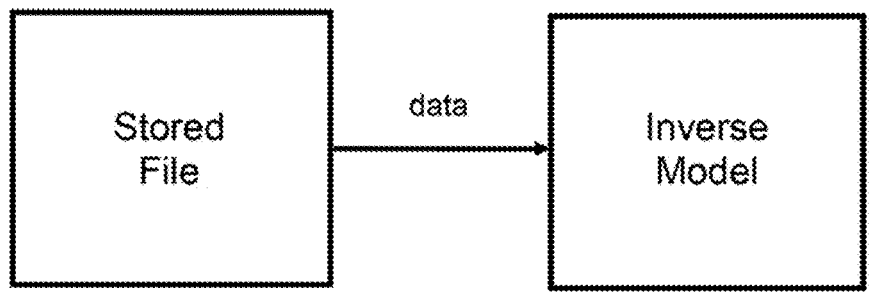

FIG. 82b depicts an example arrangement wherein a stored file is used by a fixed Inverse Model to create a computationally-produced image.

Figure 82C:
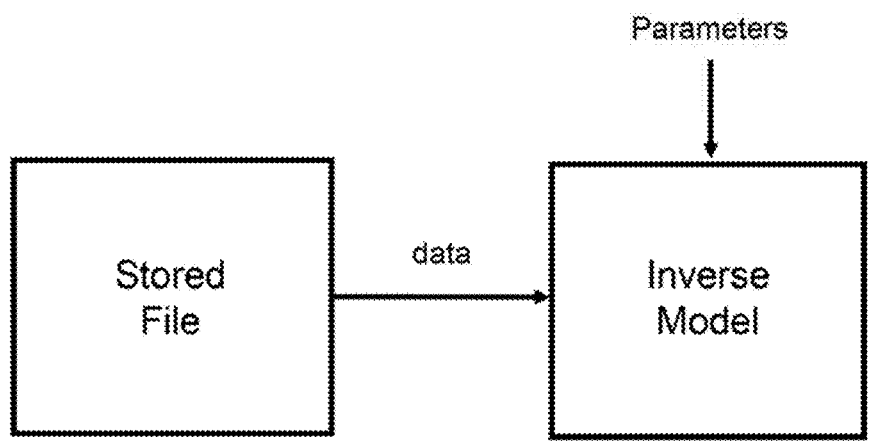

FIG. 82c depicts an example arrangement wherein a stored file is used by a parameterized Inverse Model to create a computationally-produced image, and further wherein parameter value(s) associated the parameterized Inverse Model are externally associated with each stored file.

Figure 82D:
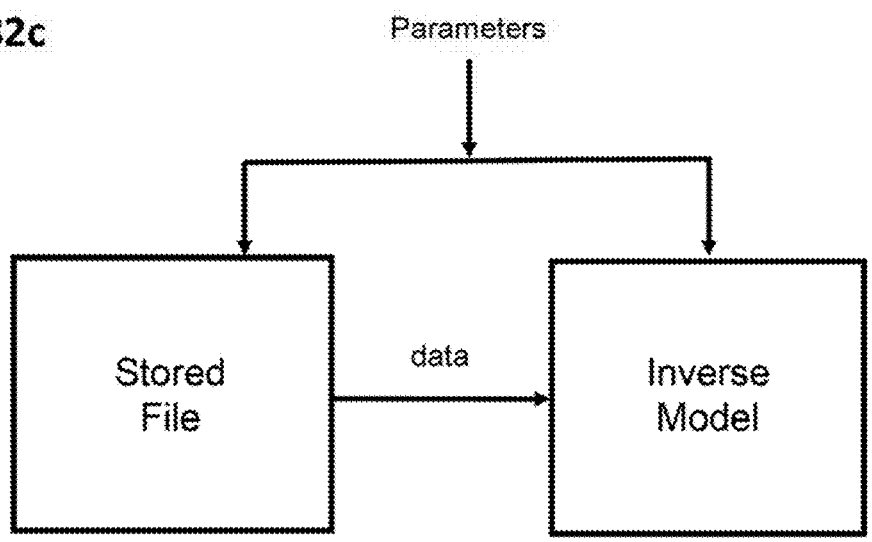

FIG. 82d depicts an example arrangement wherein a stored file is used by a parameterized Inverse Model to create a computationally-produced image, and further wherein parameter value(s) associated the parameterized Inverse Model are derived from or obtained from the stored file.

Figure 83:
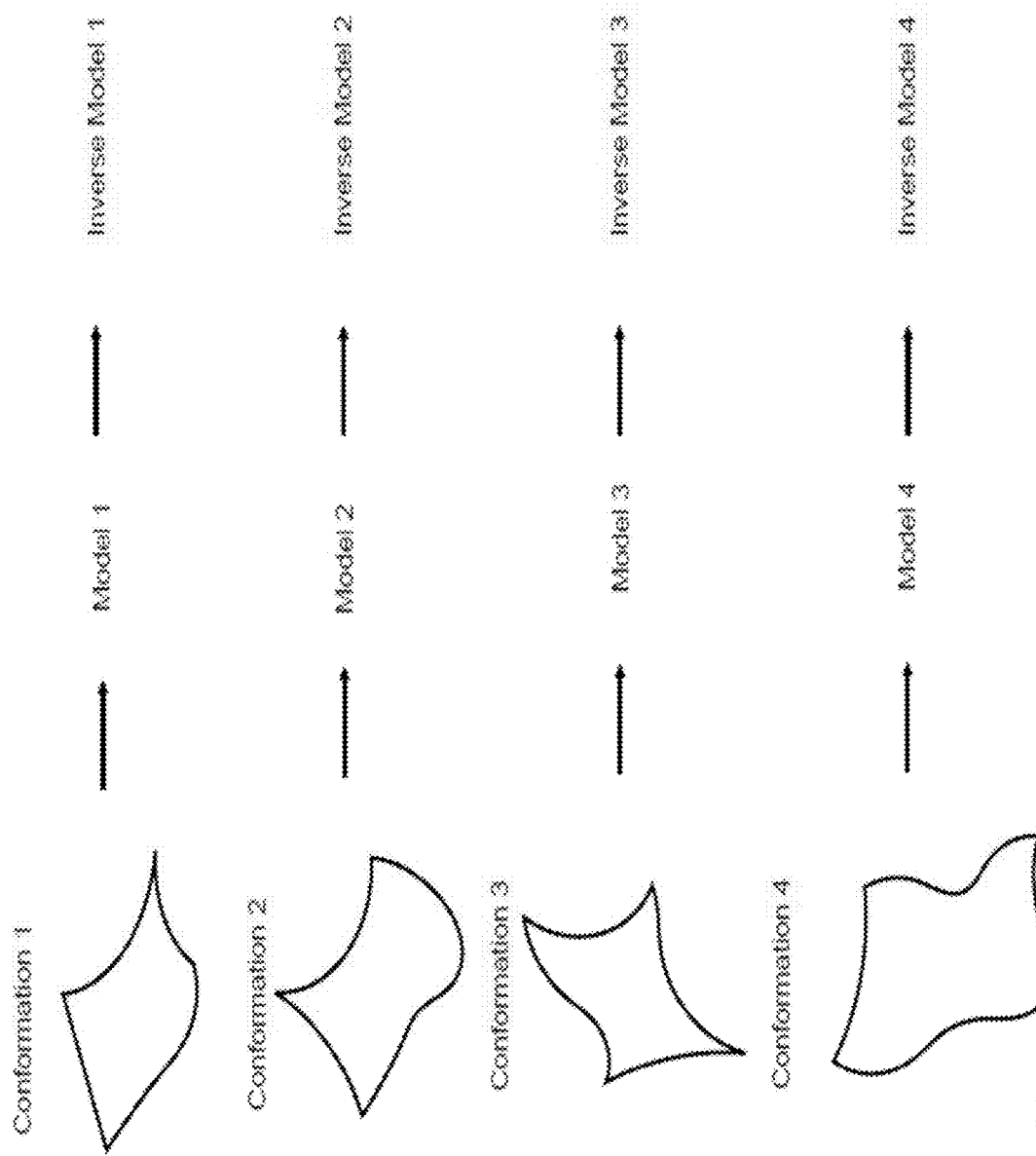
Figure 84C:
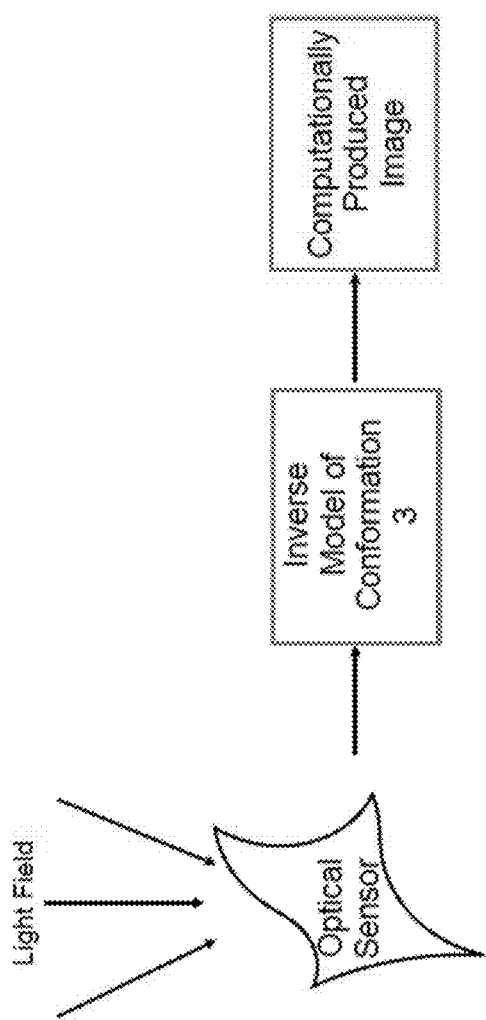
Figure 84D:
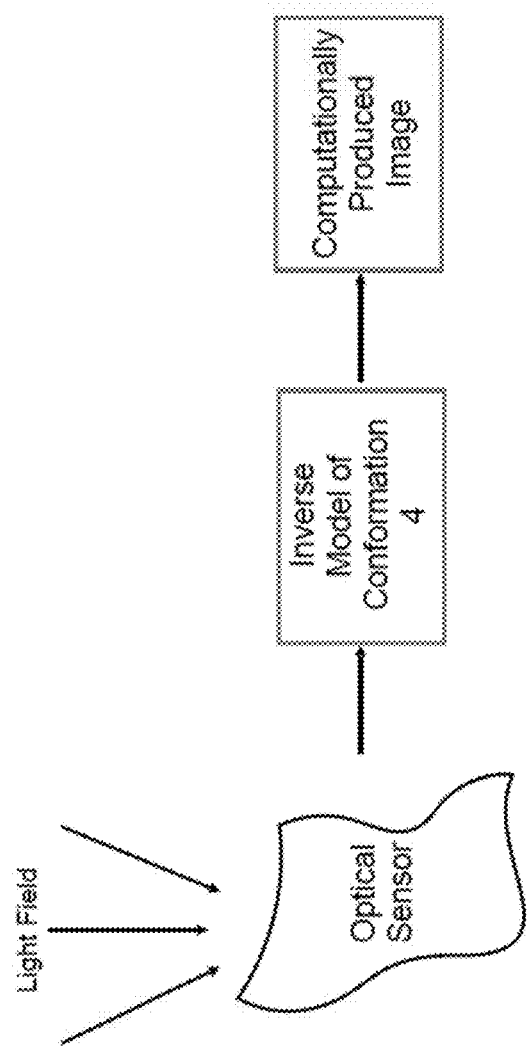

FIG. 83 depicts four example conformations of a particular bendable, flexible, and/or or pliable optical-sensor/optical-structure sheet, each conformation giving rise to an associated model for how a light field is sensed in the context of reconstructing an image, and each model giving rise to its own associated inverse model. It is noted that, as dependent on the properties and limitations of the optical-structure, there can be small blind spots in regions of sufficiently-high curvature.

Figure 85A:
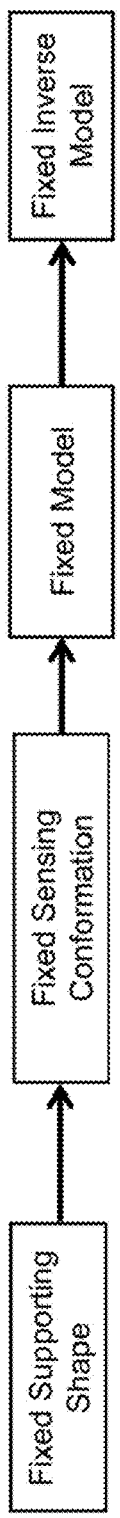

FIG. 84a through FIG. 84d depict how various conformations can be used to render a computationally derived image FIG. 85a depicts an example arrangement for an optical-sensor/optical-structure of fixed conformation.

Figure 85B:
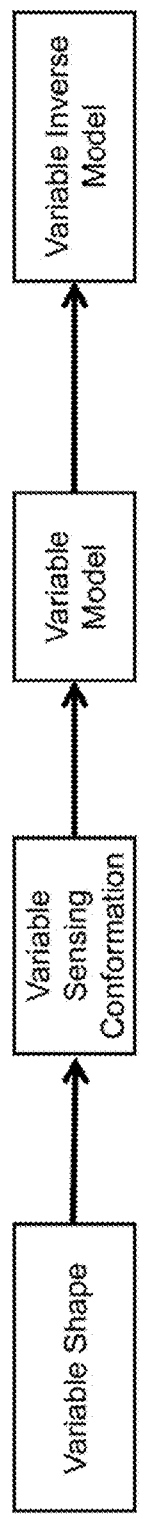

FIG. 85b depicts an example arrangement for an optical-sensor/optical-structure of variable conformation, for example should the surface bend, deform, hinge, expand, contract, etc.

Figure 85C:
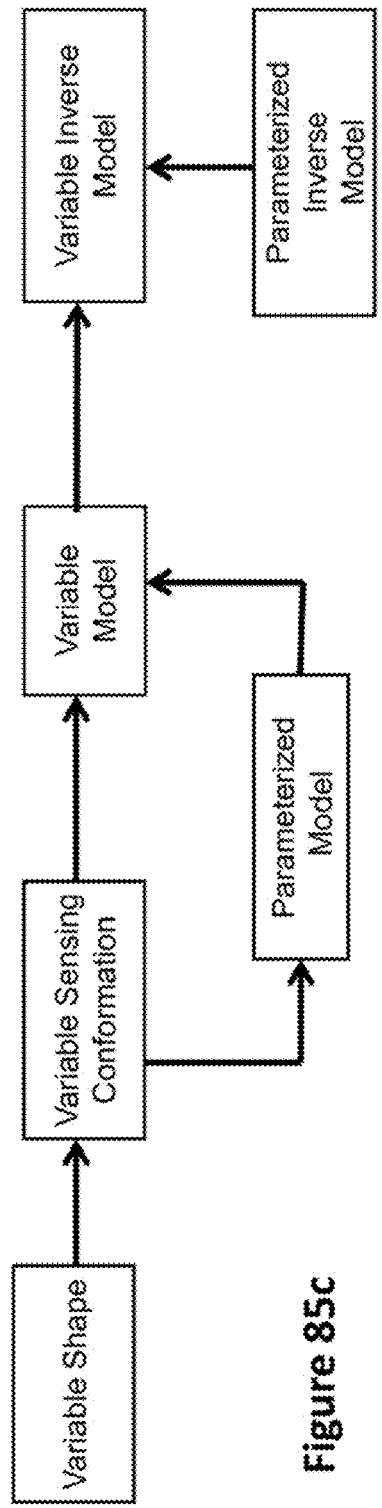

FIG. 85c depicts a variation of FIG. 85b wherein the model and the Inverse Model are parameterized.

FIG. 86a depicts an arrangement useful for using optical training to sense the present conformation of an optical-sensor/optical-structure of variable conformation, for example should the surface bend, deform, hinge, expand, contract, etc.

FIG. 86b depicts an arrangement useful for using internal sensing means to sense the present conformation of an optical-sensor/optical-structure of variable conformation, for example should the surface bend, deform, hinge, expand, contract, etc.

FIG. 86c depicts an arrangement useful for using information about a movable or changing support structure or contact arrangement to identify the present conformation of an optical-sensor/optical-structure of variable conformation, for example should the surface bend, deform, hinge, expand, contract, etc.

FIG. 86d depicts an arrangement useful for using external observation mean, for example such as one or more observing video camera(s) means to sense the present conformation of an optical-sensor/optical-structure of variable conformation, for example should the surface bend, deform, hinge, expand, contract, etc.

Figure 87A:
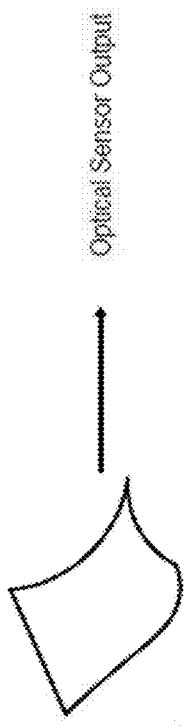

FIG. 87a depicts an optical-sensor/optical-structure of variable conformation, for example should the surface bend, deform, hinge, expand, contract, etc. producing an output signal and/or output data.

Figure 87B:
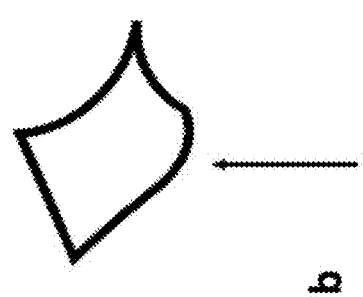

FIG. 87b depicts a controllable variable-conformation material whose shape/conformation can be controlled by externally-provide control stimulus.

Figure 87C:
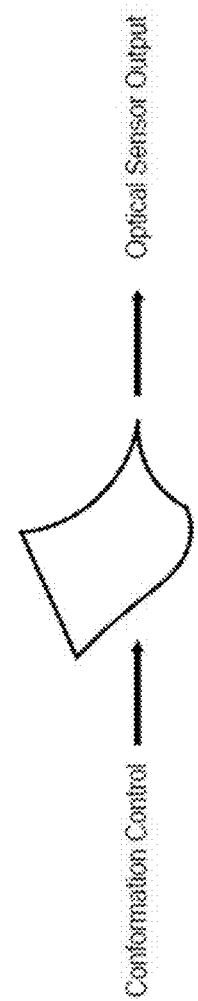

FIG. 87c depicts an optical-sensor/optical-structure of variable conformation, for example should the surface bend, deform, hinge, expand, contract, etc. producing an output signal and/or output data fabricated on, with, or co-integrated with controllable variable-conformation material whose shape/conformation can be controlled by externally-provide control stimulus.

Figure 88A:
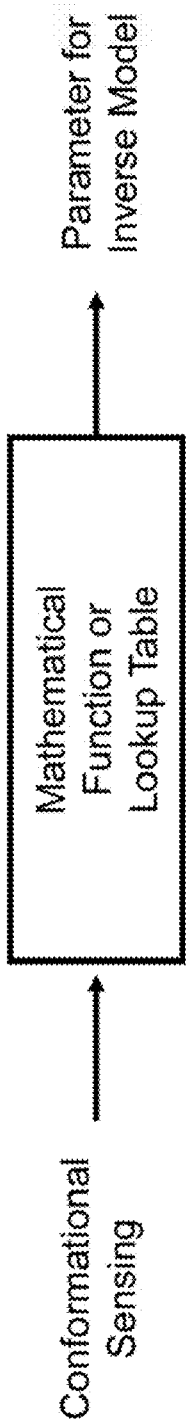

FIG. 88a depicts use of conformational sensing information to derive or compute parameter values for a parameterized Inverse Model.

Figure 88B:
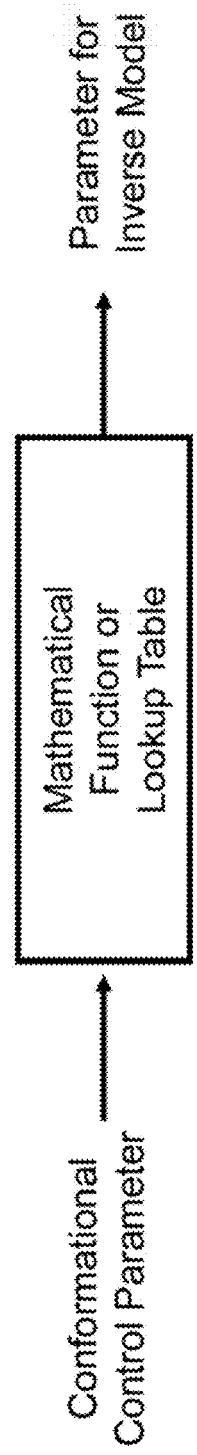

FIG. 88b depicts use of conformational control parameter information to derive or compute parameter values for a parameterized Inverse Model.

Figure 88C:

FIG. 88c depicts use of both conformational sensing information and conformational control parameter information to derive or compute parameter values for a parameterized Inverse Model.

DETAILED DESCRIPTION

In the following description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention.

In the following description, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

FIG. 7 depicts a timeline of representative patents and literature and patents in lensless imaging and light-field imaging with respect to the inventor's comprehensive lensless light-field imaging program.

Figure 8B:
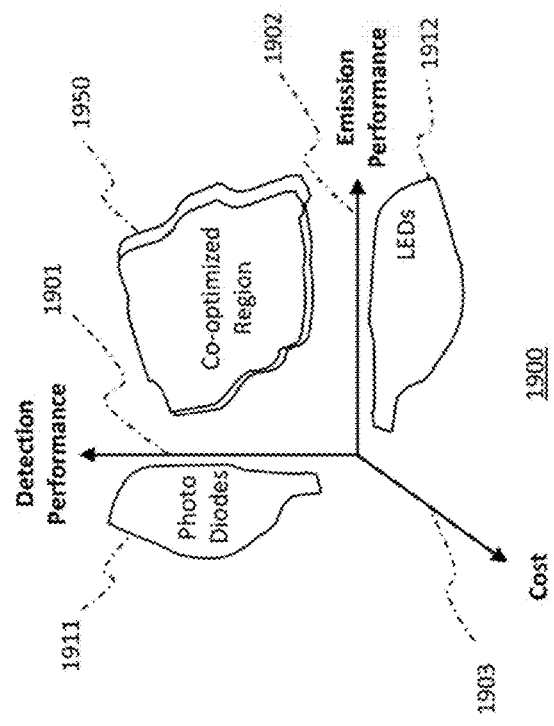
FIG. 8b, adapted from FIG. 42 of the present inventor's U.S. Pat. No. 8,830,375 and related cases, depicts an adaptation of FIG. 8a wherein different optimizations are used for implementing single function diode-junction devices such as (but not limited to) switching diodes versus light-emitting diodes (LEDs) versus photodiodes.
Figure 8A:
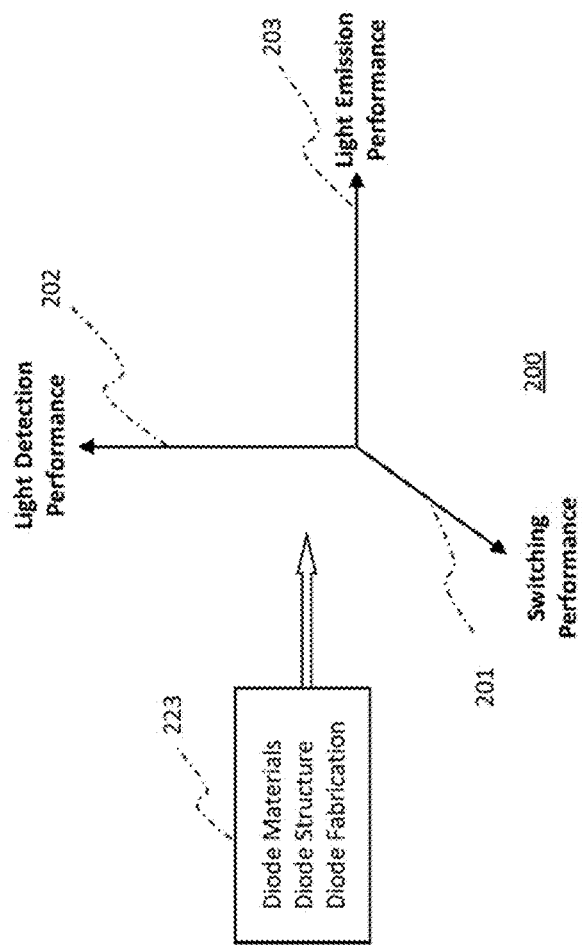
FIG. 8a, adapted from FIG. 42 of the present inventor's U.S. Pat. No. 8,830,375 and related cases, depicts a vector space of trade-offs for semiconducting diode-junction devices.

FIG. 8a, adapted from FIG. 42 of the present inventor's U.S. Pat. No. 8,830,375 and related cases, depicts a vector space of trade-offs for semiconducting diode-junction devices. As taught in the inventor's earlier patents, there are opportunities to, rather than exclusively optimize for light-sensing or light-emission, to instead co-optimize for both light-sensing and light-emission.

The present invention provides for co-optimizing of doping, electrode configurations, structure, and other attributes for both light-sensing and light-emission, giving rise to entirely new kinds of semiconductor optoelectronic elements and devices. Rapidly evolving organic semiconductor material science methods, including polymer properties and meta-material properties, can be used to improve quantum efficiency, noise performance, transparency, size requirements, electrical characteristics, etc. as well as facilitate useful manufacturing techniques such as high-resolution printing. Additional features, such as angular-selectivity and wavelength selectivity, can also be included. Additional structures, such as vignetting or aperturing arrays, reflective optical path walls to reduce incident light-loss, angular diversity, curvature, flexibility, etc. can be co-integrated, and can for example be designed to produce predictable reproducible optical sensing behaviors. Exotic features, such as predictable or and/or reproducible surface plasmon propagation to selected light sensors to further reduce incoming light loss and use of quantum dots, can be included.

FIG. 8b, adapted from FIG. 42 of the present inventor's U.S. Pat. No. 8,830,375 and related cases, depicts an adaptation of FIG. 8a wherein different optimizations are used for implementing single function diode-junction devices such as (but not limited to) switching diodes versus light-emitting diodes (LEDs) versus photodiodes.

FIG. 9a, adapted from the figure available on the internet at https://en.wikibooks.org/wiki/Introduction_to_Inorganic-_Chemistry/Electronic_Properties_of_Materials:_Super-conductors_and_Semiconductors#/media/File:PnJunction-E.PNG as retrieved Jul. 3, 2017 (top portion), depicts a representation of the active carrier flow of a forward biased switching diode wherein, by design, current-flow directional switching functions are optimized and light-emission and light-detection capabilities of PN junctions are suppressed.

FIG. 9b, adapted from the figure available on the internet at https://en.wikibooks.org/wiki/Introduction_to_Inorganic-_Chemistry/Electronic_Properties_of_Materials:_Super-conductors_and_Semiconductors#/media/File:PnJunction-E.PNG as retrieved Jul. 3, 2017 (middle portion), depicts the blocked carrier flow of a reversed biased situation for the switching diode depicted in FIG. 9a.

FIG. 9c, adapted from the figure available on the internet at https://en.wikibooks.org/wiki/Introduction_to_Inorganic-_Chemistry/Electronic_Properties_of_Materials:_Super-conductors_and_Semiconductors#/media/File:PnJunction-E.PNG as retrieved Jul. 3, 2017 (bottom portion), depicts an energy-band representation of a switching diode wherein, by design, current-flow directional switching functions are optimized and light-emission and light-detection capabilities of PN junctions are suppressed.

FIG. 9d, adapted from the image available at http://www.learnabout-electronics.org/Semiconductors/diodes 23.php as visited on Jun. 20, 2017, depicts a representation of the physical construction of a switching diode wherein, by design, current-flow directional switching functions are optimized and light-emission and light-detection capabilities of PN junctions are suppressed.

Figure 10A:
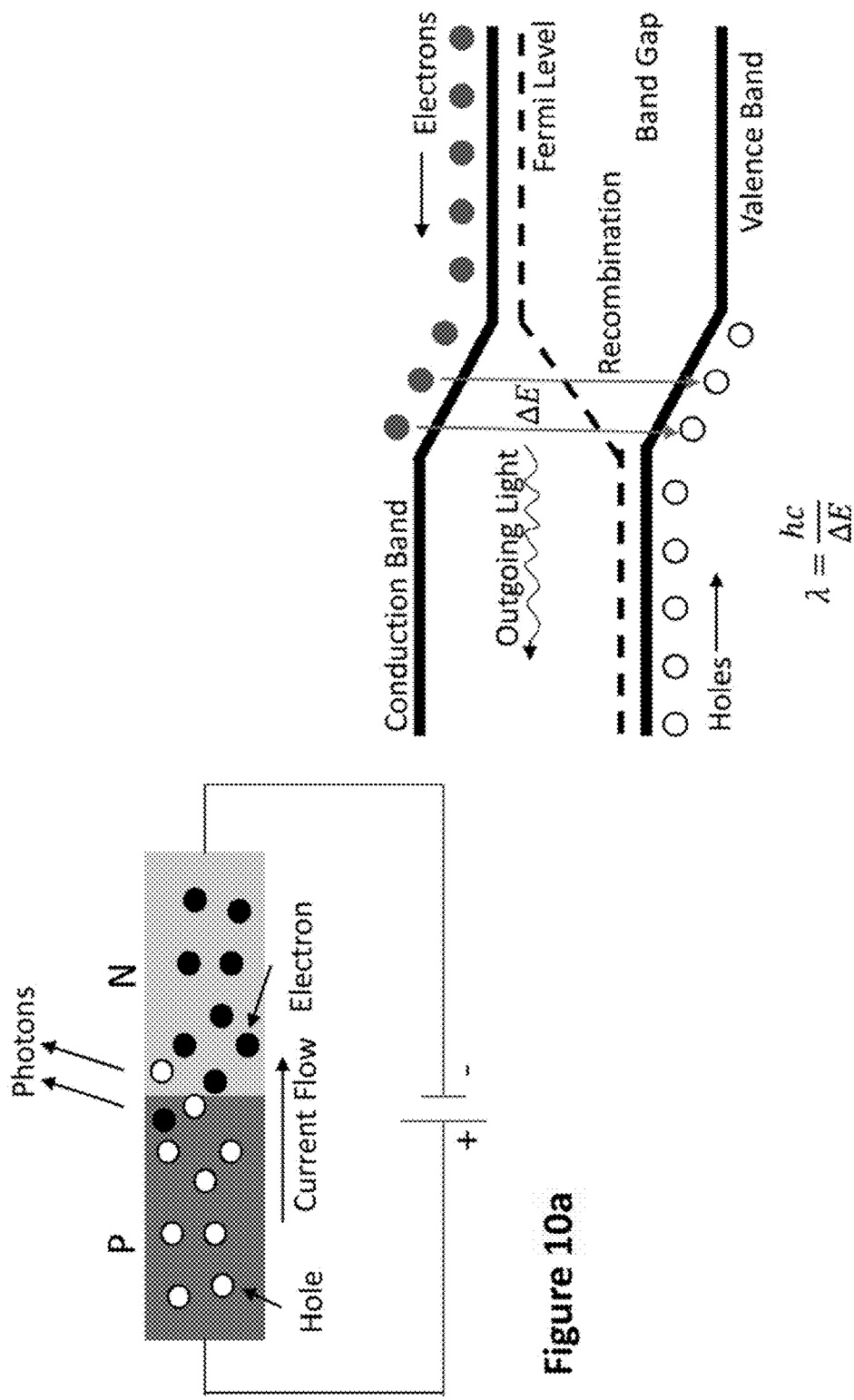
FIG. 10a, adapted from the top portion of a figure available on the internet at https://en.wikipedia.org/wiki/Light-emitting_diode#/media/File:PnJunction-LED-E.svg as retrieved Jul. 3, 2017, depicts a carrier-process representation of an operating (inorganic or organic) semiconducting PN junction light-emitting diode (LED).

FIG. 10a, adapted from the top portion of a figure available on the internet at https://en.wikipedia.org/wiki/Light-emitting_diode#/media/File:PnJunction-LED-E.svg as retrieved Jul. 3, 2017, depicts a carrier-process representation of an operating (inorganic or organic) semiconducting PN junction light-emitting diode (LED).

FIG. 10b, adapted from the bottom portion of a figure available on the internet at https://en.wikipedia.org/wiki/Light-emitting_diode#/media/File:PnJunction-LED-E.svg as retrieved Jul. 3, 2017, depicts an energy-transition representation of an operating (inorganic or organic) semiconducting PN junction light-emitting diode (LED).

Figure 4:
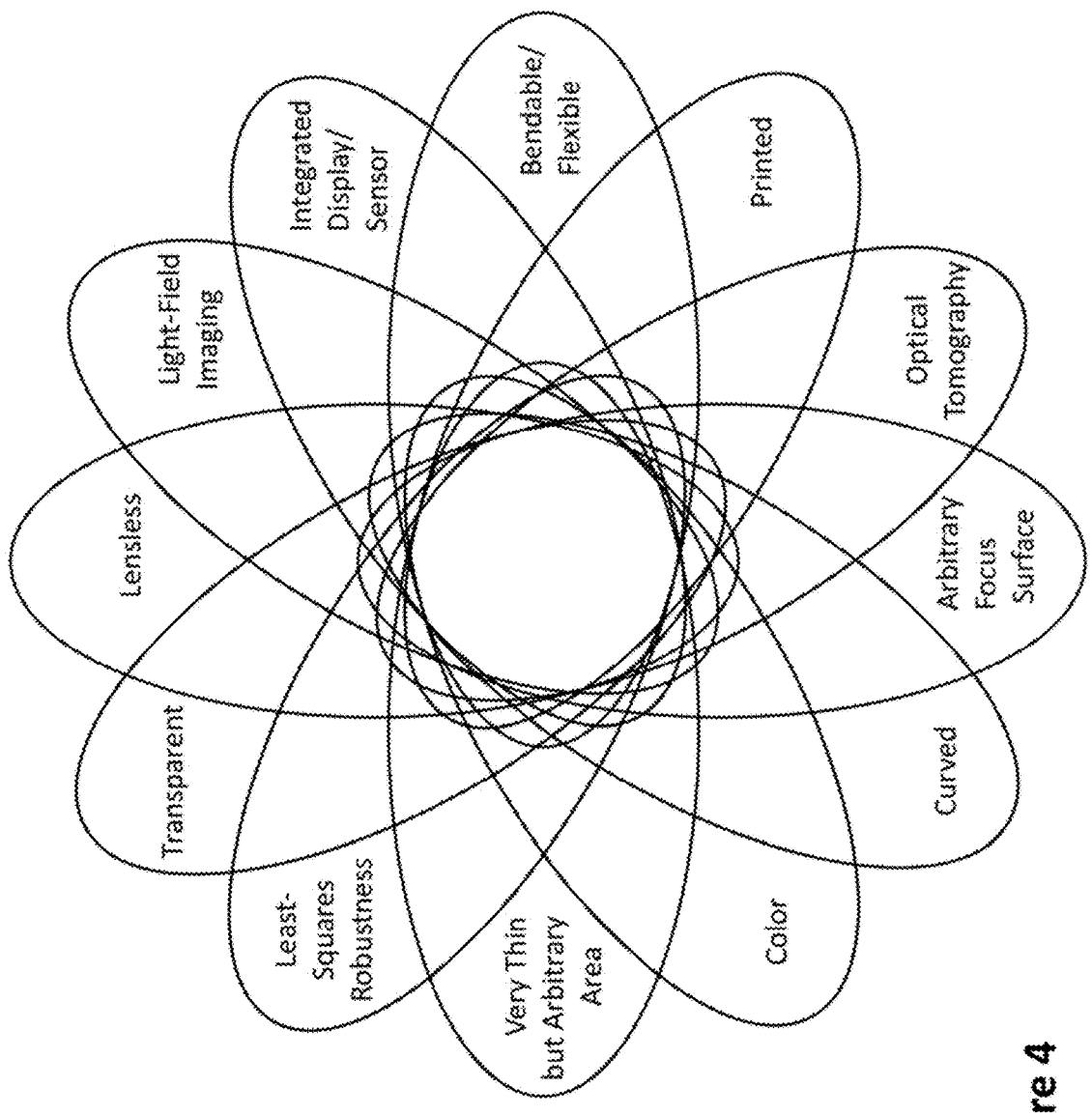
FIG. 4 depicts an illustrative representational view of the confluence of the expanded features and capabilities associated with the present invention. This depiction and the elements therein are intended as only illustrative and representative and does not provide or suggest a comprehensive or exhaustive listing, structure, or characterization.
Figure 5:
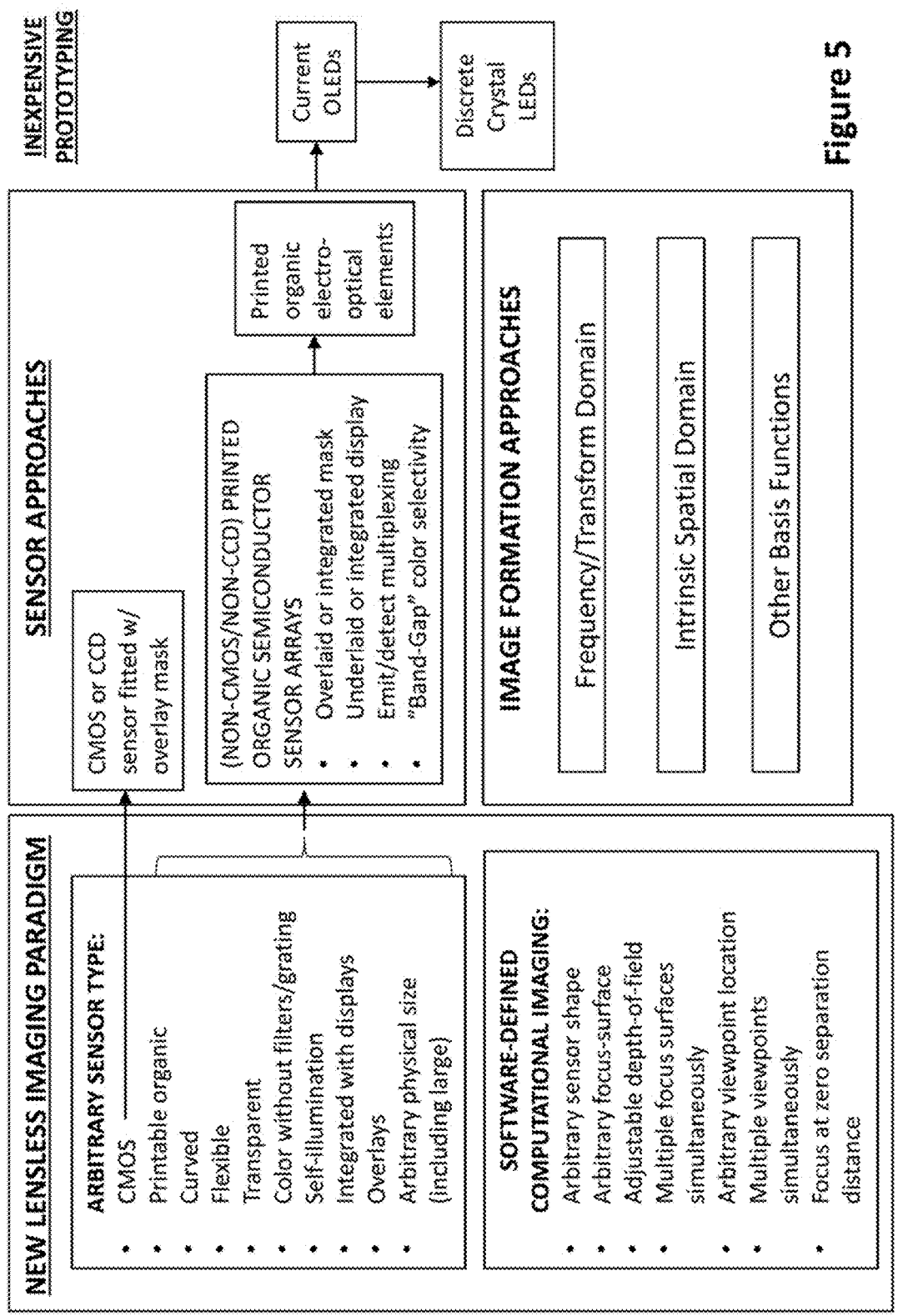
FIG. 5 depicts a more detailed view of the inventor's comprehensive lensless light-field imaging program (beginning with the inventor's 1999 patent family) is and recently-popularized coded-aperture lensless imaging.
Figure 6:
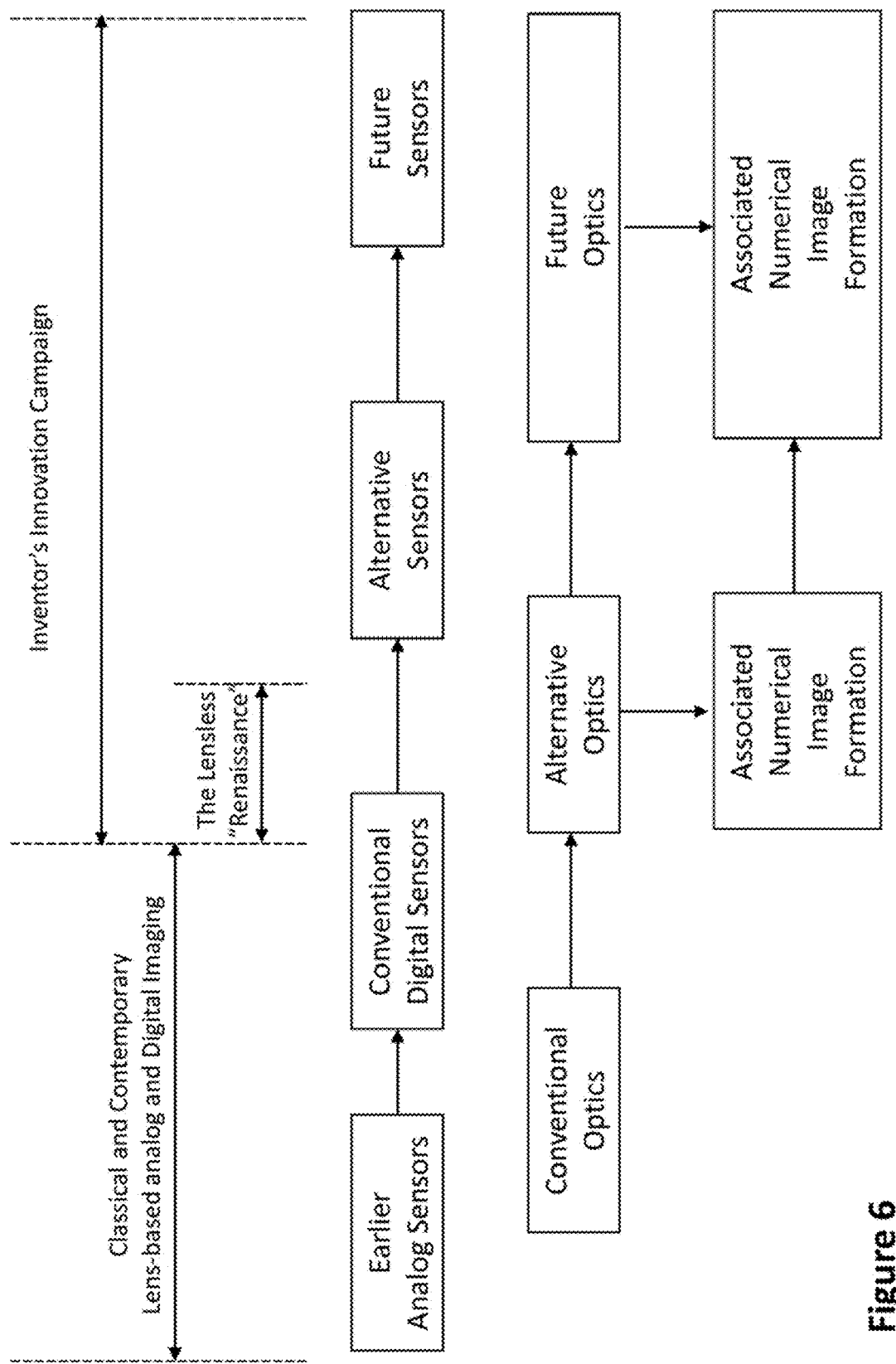
FIG. 6 depicts a functional "timeline" view of non-pinhole lensless imaging, including both the inventor's comprehensive lensless light-field imaging program (beginning with the inventor's 1999 patent family) is and recently-popularized (2011-2016) coded-aperture lensless imaging (recently termed a lensless "Computational Renaissance'" [P6]) stemming from radiation-imaging work dating from 1968 [P62].

FIG. 11a, adapted from Figure 4.7.1 of the on-line notes "Principles of Semiconductor Devices" by B. Van Zeghbroeck, 2011, available at https://ecee.colorado.edu/~bart/book/book/chapter4/ch4_7.htm as retrieved Jul. 3, 2017, depicts an abstracted structural representation of an example (inorganic or organic) simple ("simple-heterostructure") semiconducting PN junction light-emitting diode (LED).

FIG. 11b, adapted from Figure 7.1 of the on-line table of figures available on the internet at https://www.ecsarpi.edu/~schubert/Light-Emitting-Diodes-dot-org/chap07/chap07.htm as retrieved Jul. 3, 2017, depicts an abstracted structural representation of an example (inorganic or organic) more complex double-heterostructure semiconducting PN junction light-emitting diode (LED), here effectively configured as a two-PN junction sandwich. When component layers are properly doped, a P-I-N ("P-type"/"Intrinsic"/"N-type") structure is formed, confining charge carriers into a "small" energy gap surrounded by abrupt energy discontinuities that can be used to create a quantum well; the charge carriers recombine in the "Intrinsic" region and emit photons with wavelengths defined by corresponding discrete permissible energy transitions.

Figure 12A:
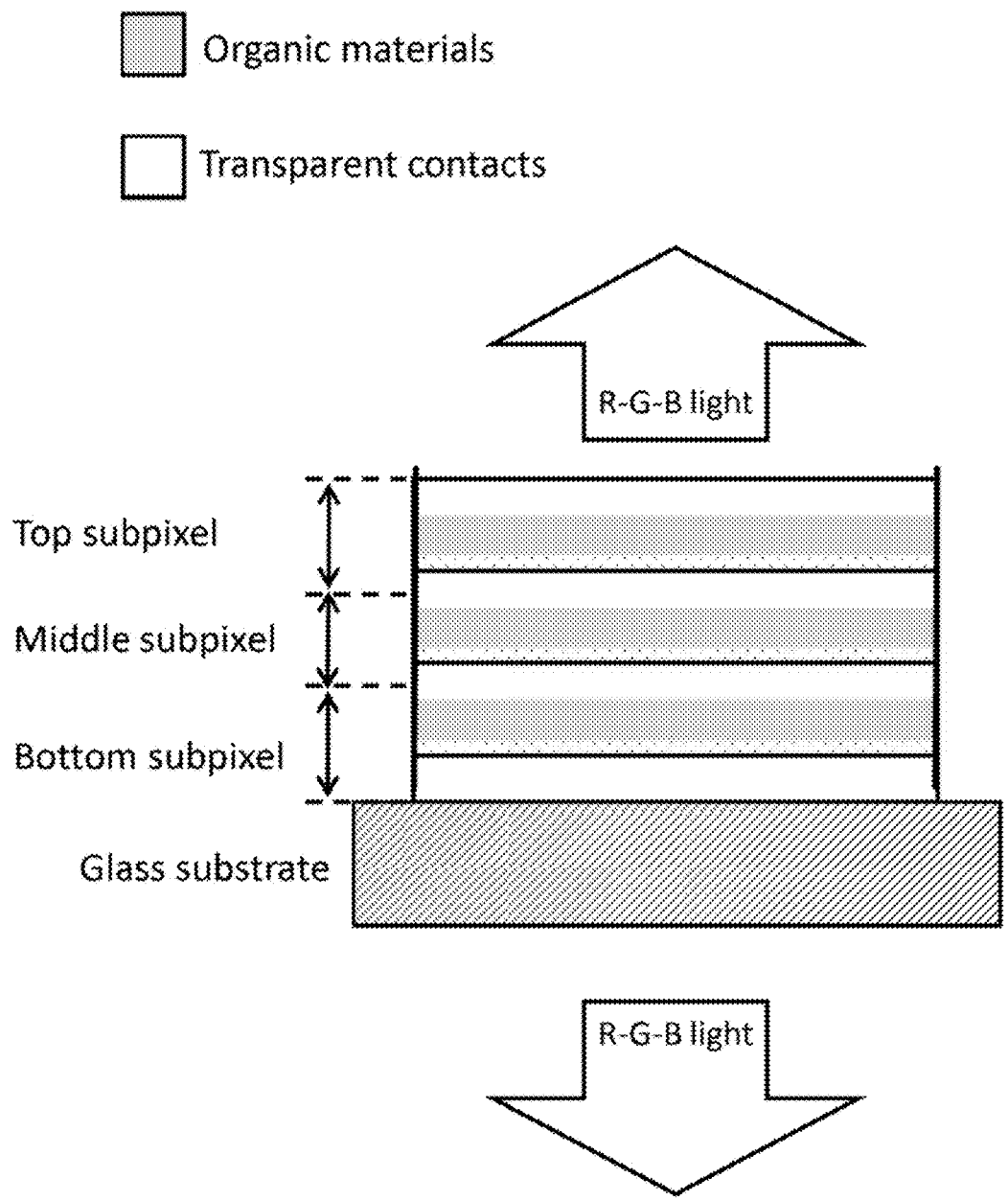
FIG. 12a (adapted from G. Gu, G. Parthasarathy, P. Burrows, T. Tian, I. Hill, A. Kahn, S. Forrest, "Transparent stacked organic light emitting devices. I. Design principles and transparent compound electrodes," Journal of Applied Physics, October 1999, vol. 86 no. 8, pp. 4067-4075) depicts an example high-level structure of a three-color transparent Stacked OLED ("SOLED") element.

FIG. 12a (adapted from G. Gu, G. Parthasarathy, P. Burrows, T. Tian, I. Hill, A. Kahn, S. Forrest, "Transparent stacked organic light emitting devices. I. Design principles and transparent compound electrodes," Journal of Applied Physics, October 1999, vol. 86 no. 8, pp. 4067-4075) depicts an example high-level structure of a three-color transparent Stacked OLED ("SOLED") element.

Figure 12B:
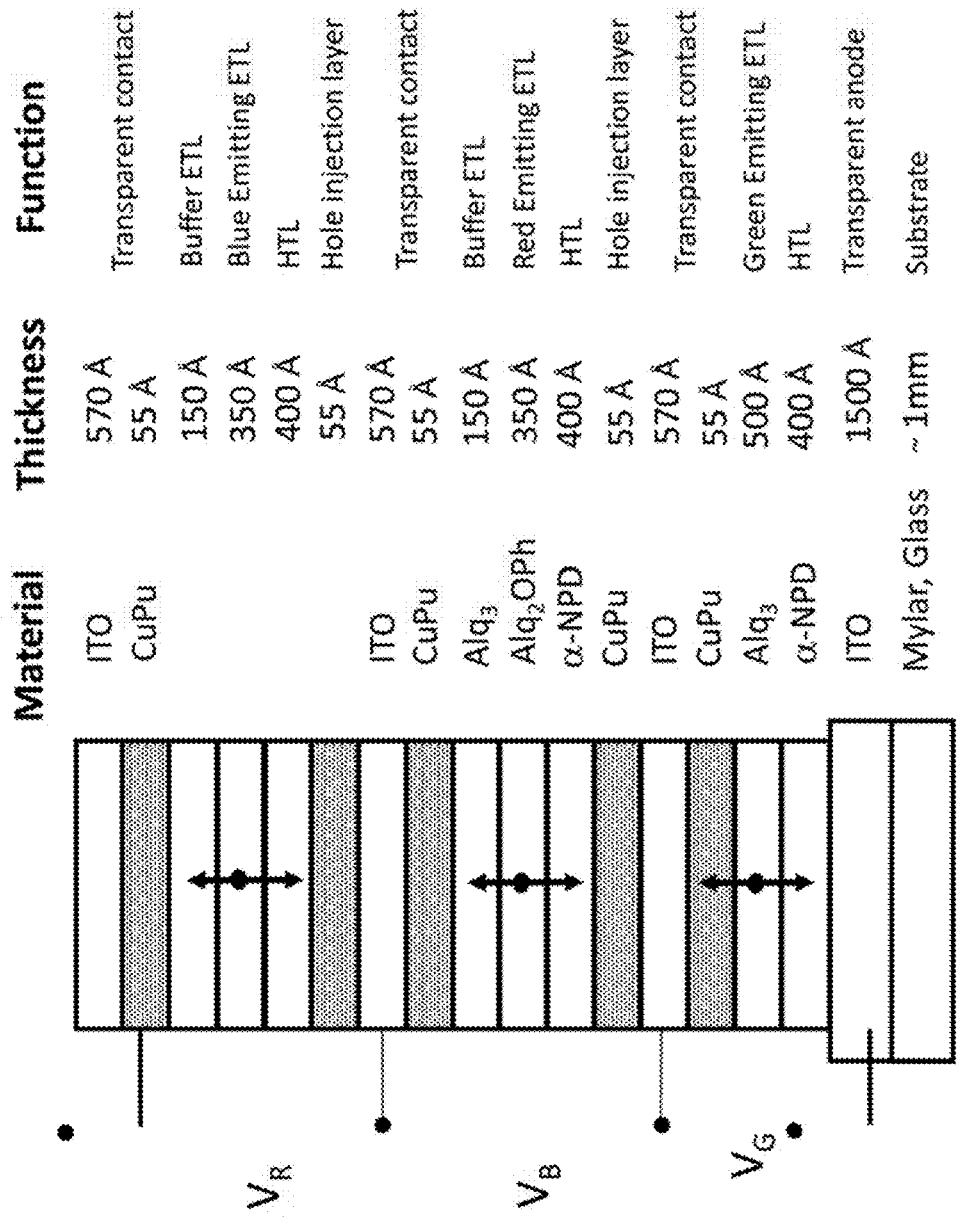
FIG. 12b (also adapted from G. Gu, G. Parthasarathy, P. Burrows, T. Tian, I. Hill, A. Kahn, S. Forrest, "Transparent stacked organic light emitting devices. I. Design principles and transparent compound electrodes," Journal of Applied Physics, October 1999, vol. 86 no. 8, pp. 4067-4075) depicts a more detailed structure of a three-color transparent SOLED element.

FIG. 12b (also adapted from G. Gu, G. Parthasarathy, P. Burrows, T. Tian, I. Hill, A. Kahn, S. Forrest, "Transparent stacked organic light emitting devices. I. Design principles and transparent compound electrodes," Journal of Applied Physics, October 1999, vol. 86 no. 8, pp. 4067-4075) depicts a more detailed structure of a three-color transparent SOLED element.

Figure 13B:
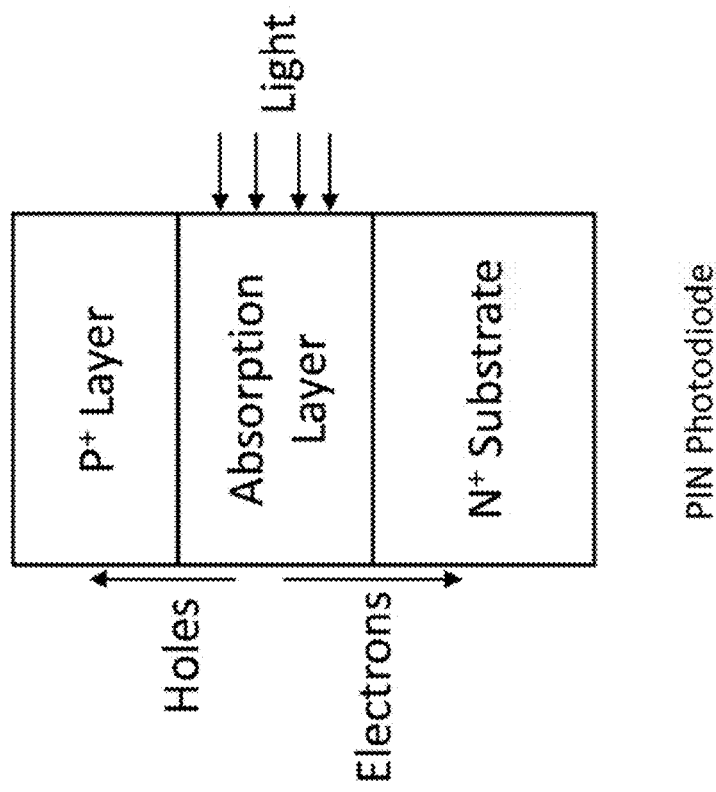
FIG. 13b, simplified and adapted from the first two figures in "Comparison of waveguide avalanche photodiodes with InP and InAlAs multiplication layer for 25 Gb/s operation"
Figure 13A:
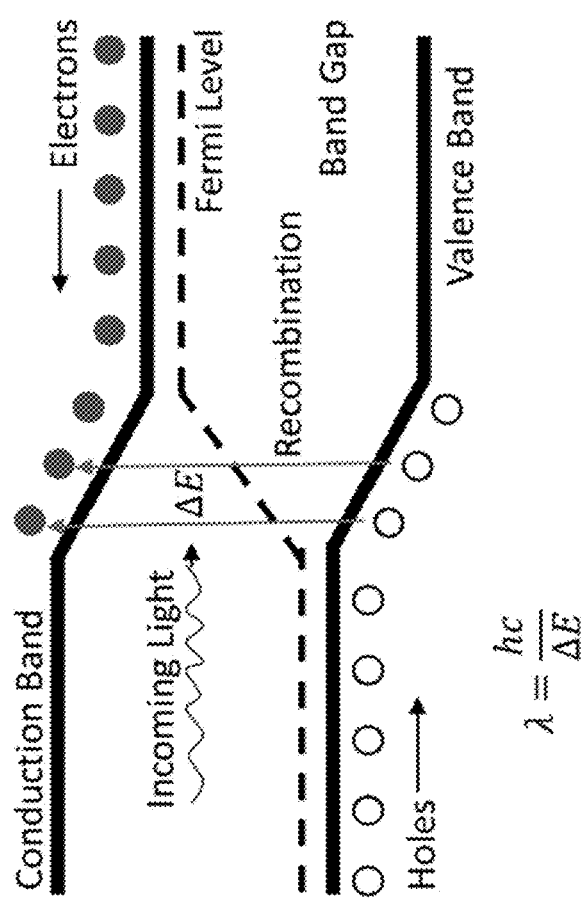
FIG. 13a, depicts an example energy-transition representation of an operating (inorganic or organic) simple semiconducting PN junction photodiode.

FIG. 13a, depicts an example energy-transition representation of an operating (inorganic or organic) simple semiconducting PN junction photodiode.

FIG. 13b, simplified and adapted from the first two figures in "Comparison of waveguide avalanche photodiodes with InP and InAlAs multiplication layer for 25 Gb/s operation" by J. Xiang and Y. Zhao, Optical Engineering, 53(4), published Apr. 28, 2014, available at http://opticalengineering.spiedigitallibrary.org/article.aspx?articleid=1867195 as retrieved Jul. 3, 2017, depicts an example structural representation of an example simple layered-structure PIN (inorganic or organic) simple semiconducting PN junction photodiode.

FIG. 14a, adapted from FIG. 2 of U.S. Pat. No. 7,202,102 "Doped Absorption for Enhanced Responsivity for High Speed Photodiodes" to J. Yao, depicts a combined energy/structure representation of a more specialized example layered-structure avalanche semiconducting PN junction photodiode.

FIG. 14b, adapted from the first two figures in "Comparison of waveguide avalanche photodiodes with InP and InAlAs multiplication layer for 25 Gb/s operation" by J. Xiang and Y. Zhao, Optical Engineering, 53(4), published Apr. 28, 2014, available at http://opticalengineering.spiedigitallibrary.org/article.aspx?articleid=1867195 as retrieved Jul. 3, 2017, depicts an example structural representation of an example layered-structure avalanche semiconducting PN junction photodiode.

FIG. 15a depicts material science and fabrication relationships among (1) transparent/non-transparent electronics and optoelectronics, (2) flexible/non-flexible electronics and optoelectronics, (3) printed/non-printed electronics and optoelectronics, and (4) organic/non-organic electronics and optoelectronics.

FIG. 15b provides a version of FIG. 15a where certain types of the electronics and optoelectronics are marked with asterisks (*) to signify functional contributions to various aspects of the present invention.

FIG. 16a, adapted from [P5], depicts a schematic representation of the arrangements and intended operational light paths for a pinhole camera. The box represents a light-tight enclosure with a pinhole opening on the left side that blocks much of the incoming light field (depicted as approaching from the right) but permits transmission of narrow-diameter incoming light rays to enter the enclosure and travel through a region of free-space so as to widen the light area to match that of a (typically rectangular) image sensor, film emulsion, display surface, etc.

FIG. 16b, adapted from [P5], depicts a schematic representation of the arrangements and intended operational light paths for a (simplified or single-lens) lens-based camera. The box represents a light-tight enclosure with a lens and supporting opening for the lens on the left side that bends most rays of the incoming light field (depicted as approaching from the right) for transmission and travel through a region of free-space defined by the lens focal length and the lens law equation so as to create focused image of a selected depth-of-field onto a (typically rectangular) image sensor, film emulsion, display surface, etc.

FIG. 16c, adapted from [P5], depicts a schematic representation of the arrangements and intended operational light paths for a mask-based camera, such as those discussed in [P62]-[P67]. The relatively flatter box represents a light-tight enclosure with a masked opening on the left side that blocks some of the incoming light field (depicted as approaching from the right) and permits transmission the remaining incoming light rays to enter the enclosure and travel through a shorter region of free-space so as to widen the light area to match that of a (typically rectangular) image sensor.

FIG. 16d depicts to a schematic representation of some aspects of the present invention and the inventor's more comprehensive lensless light-field imaging program. No free space is needed and any vignetting optical structure can directly contact and/or be co-integrated or layered upon (by deposition, printing, etc.) the image sensor surface. The optical width of such a vignetting optical structure can be as small as one light-sensing pixel in a light-sensing array, and such a vignetting optical structure can (unlike a mask or the Rambus [P4] diffraction element) have a very simple structure.

The invention further provides for vignetting arrays, aperturing arrays, or other optical structures attached to, co-fabricated on, or co-fabricated with an array of light sensors to include for example, reflective optical path walls to reduce incident light-loss, angular diversity, curvature, flexibility, etc.

The invention further provides for vignetting arrays, aperturing arrays, or other optical structures attached to, co-fabricated on, or co-fabricated with an array of light sensors to be designed to produce predictable reproducible optical sensing behaviors. The invention further provides for vignetting arrays, aperturing arrays, or other optical structures attached to, co-fabricated on, or co-fabricated with an array of light sensors to include or facilitate advance light-processing features such as predictable or and/or reproducible surface plasmon propagation to selected light sensors to further reduce incoming light loss, use of quantum dots, etc.

Additionally, the invention provides for each light-sensing pixel element in a light-sensing array to comprise one or separate wavelength-selective light-sensing sub-elements, for example as taught in the inventor's 1999 and 2008 patent families. In some implementations these sub-elements can be spatially adjacent and share the same vignetting or other light-structuring pathway. In other implementations it is advantageous to stack two or more wavelength-selective light-sensing sub-elements in layers, analogous to Stacked Organic Light Emitting Diodes (SOLEDs) as discussed in the inventor's 1999 and 2008 patent families. It is further noted that structures stacking layers of two or more wavelength-selective light-sensing sub-elements can be designed to limit or advantageously structure different vignetting effects each wavelength-selective light-sensing sub-element will experience at each particular depth in the layered stack. It is noted that recent (2016) developments in this area implement light-field imaging (without the use of microlenses) employing layers of "optical" sensors [P43].

FIG. 17 depicts an array of parallel-oriented vignetting cavities; the bottom of each cavity can comprise or direct isolated light to light-sensing structure.

FIG. 18, adapted from FIG. 12 of the present inventor's U.S. Pat. No. 8,816,263 and related cases, illustrates a simplified view of how a vignette structure can limit the range of incident angles at which rays of light within a light field are able to reach the surface of the light-sensing element within a vignetting structure covering a light-sensing element. (Importantly, reflective effects within the vignette and diffraction effects are not illustrated.)

FIG. 19, composited and adapted from FIGS. 8 and 9a through 9b of the present inventor's U.S. Pat. No. 8,830,375 and related cases, illustrates a simplified view of the process by which the degree of vignette overlap increases as separation between the object in the scene and its distance from the micro-optic structure and light sensor array increases and how the degree of vignette overlap increases from 0% to values approaching 100% as the separation distance between a scene object and the micro-optic structure and light sensor array increases. (Importantly, reflective effects within the vignette and diffraction effects are not illustrated.)

FIGS. 20a through 20c depict illustrative representations of reflection and scattering effects within a vignette. (Importantly, diffraction effects are not illustrated.)

FIG. 21, adapted from FIG. 11 b of the present inventor's U.S. Pat. No. 8,816,263 and related cases, depicts an array of parallel-oriented instances of alternating short" light-sensing structures and "tall", each parallel-oriented instance alternately staggered to create vignetting cavities surrounded by the sides of neighboring "tall" structures (which in some implementations can be light-emitting), the bottom of each cavity comprising a "short" light-sensing structure. In some implementations, the "tall" structures can be light-emitting.

Light-Field Origins, Propagation, and Lensless-Light-Field Sensing

Returning to the depiction illustrated in FIG. 1, an Optical Scene creates a Light-Field that is directed to an Optical Sensor which is preceded by one or more Lensless Optical Structure(s) that in some manner alters the light field in a predictable spatial manner. The Optical Sensor produces (typically time-varying) electrical signals and/or computational data responsive (instantly and/or within some time-delay) to light incident to the surface or other substructure(s) within the Optical Sensor at any given moment.

In terms of the mathematical development above, objects or situations producing reflected, refracted, and/or light-emitted contributions to the Light-Field can be represented in a spatially-quantized manner as a light-field source array.

FIGS. 22a through 22c depict differing illustrative 3-dimensional views of a plane the containing the sensing surface of a planar image sensor arrangement, and extending spatially in front of the planar image sensor a coordinate grid defining numerically quantizing regions on an incoming light field that can be observed by the planar image sensor arrangement. Depending on the directional capabilities of the planar image sensor arrangement, the shape of the observable light field can have a different shape than the illustrative rectangular parallelepiped.

FIG. 23a depicts an example spatial quantization of a light field extending spatially in front of the planar image sensor into a lattice of distinct indexable volume elements (voxels).

FIG. 23b depicts an example spatial quantization of the light field voxel lattice of FIG. 23a by representing the aggregate of light-emission, light reflection, and/or light propagation within the voxel as (1) having a composite quantitative value of light representing the combined aggregate of light-emission, light reflection, and/or light propagation within the volume of voxel which is (2) concentrated at a point in the interior of the voxel. If the light-field is indexed by wavelength or wavelength range, the composite quantitative value can be represented as a function of an associated wavelength index or quantized-wavelength index. The point within each voxel in the light field can be used to define a spatially-quantized vector field representing a physical spatially-continuous vector field (and/or numerical representation thereof). Accordingly, composite quantitative value of light representing the combined aggregate of light-emission, light reflection, and/or light propagation within the volume of voxel can further be represented as a function with a directional argument. In such a manner, the spatial and spectral (wavelength) aspects of a spatially (and if relevant, spectrally) quantized representation of a physical light field can be computationally represented as a multiple-index array.

Case A: Fixed Separation Distance:

Although it will be shown that the constraints on this arrangement can be extremely relaxed, in can be initially convenient to regard the objects or situations producing contributions to the light-field as lying in a plane parallel to an image sensor plane, and the contributions to the light-field comprising a planar (for example rectangular, other shapes explicitly admissible) array of light-providing "light-source" spatially-quantized pixels, each "light-source" pixel emitting light that in various manners make their way to a parallel spatially-separated image sensor plane. The image sensor plane comprises a planar (for example rectangular, other shapes explicitly admissible) array of light-providing spatially-quantized "light-sensing" pixels, these "light-sensing" pixels producing an electrical signal that can be further processed. The discussion and capabilities of this development explicitly include cases with zero separation distance between at least a planar array of light-providing "light-source" pixels and at least a planar array of "light-sensing" pixels.

As an illustration of Case A, FIG. 24 depicts a pair of illustrative 3-dimensional views of an example arrangement comprising a planar array of (emitted and/or reflected) light source elements and a parallel planar array of light-sensing elements, and a spatially-quantized light-field representation between the planes. Note the roles of planar array of light source elements and a parallel array of light-sensing elements can be interchanged.

Case B: Continuous Spatially-Varying Separation Distances—Non-Parallel Planes:

Relaxing the constraints in Case A, the above-described planes of (a) the objects or situations producing contributions to the light-field and (b) the image sensor are not parallel but rather oriented at some non-parallel and non-perpendicular dihedral angle. The resulting light-field has separation mixed distances. The discussion and capabilities of this development explicitly include cases with zero separation distance between at least a subset (even a 1-dimensional edge or even a single point) of a planar array of light-providing "light-source" pixels and a subset (even a 1-dimensional edge or even a single point) of at least a planar array of "light-sensing" pixels.

As an illustration of Case B, FIGS. 25a and 25b depict a pair of illustrative 3-dimensional views of an example variation of the arrangement depicted in FIG. 24 wherein a planar array of (emitted and/or reflected) light source elements and a planar array of light-sensing elements, are not parallel planes. Note the roles of planar array of light source elements and a parallel array of light-sensing elements can be interchanged.

As another illustration of Case B, FIG. 26a depicts another illustrative 3-dimensional view of an example variation of the arrangement depicted in FIGS. 25a and 25b wherein the dihedral angle between the planes is farther from parallel. Note the roles of planar array of light source elements and a parallel array of light-sensing elements can be interchanged.

As yet another illustration of Case B, FIG. 26b depicts an illustrative 3-dimensional view of another example of the arrangements depicted in FIGS. 25a, 25b, and 26a wherein the dihedral angle between the planes is sloped in two dimensions. Note the roles of planar array of light source elements and a parallel array of light-sensing elements can be interchanged.

Example C: Continuous Spatially-Varying Separation Distances—Curved Surfaces

Relaxing the constraints in Case A in yet another way, one or both of (a) the objects or situations producing contributions to the light-field and/or (b) the image sensor reside on smoothly-curved non-planar surface. The resulting light-field has separation mixed distances and in some cases possible occultation depending on variations in curvature. The discussion and capabilities of this development explicitly include cases with zero separation distance between at least a subset (even a 1-dimensional edge or even a single point) of a planar array of light-providing "light-source" pixels and a subset (even a 1-dimensional edge or even a single point) of at least a planar array of "light-sensing" pixels.

As an illustration of Case C, FIGS. 27a and 27b depict a pair of illustrative 3-dimensional views of an example of a non-planar curved surface and a planar surface with a spatially-quantized light-field representation between the two surfaces. Note that conceptually that (1) the planar surface could comprise light-sensing elements that observe the non-planar curved surface which in this role comprises (reflective or emitting) light source elements, or (2) if the imaging surface can be rendered as the depicted illustrative non-planar curved surface, the non-planar curved surface could comprise light-sensing elements that observe the planar surface which in this role comprises (reflective or emitting) light source elements. It is noted that regions of the non-planar curved surface that are convex or concave with respect to the planar surface can be observationally occulted from some regions of the planar surface.

As another illustration of Case C, FIGS. 28a and 28b depict a pair of illustrative 3-dimensional views of a variation on FIGS. 27a and 27b featuring different example non-planar curved surface. Note here, too, that conceptually that (1) the planar surface could comprise light-sensing elements that observe the non-planar curved surface which in this role comprises (reflective or emitting) light source elements, or (2) if the imaging surface can be rendered as the depicted illustrative non-planar curved surface, the non-planar curved surface could comprise light-sensing elements that observe the planar surface which in this role comprises (reflective or emitting) light source elements. It is also noted that regions of the non-planar curved surface that are convex or concave with respect to the planar surface can be observationally occulted from some regions of the planar surface.

As a variation of Case C, FIG. 29 depicts an illustrative example cross-section of a non-planar (rigid or flexible) curved surface sensor and non-planar curved surface object with a spatially-quantized light-field representation between the two surfaces. Either or both of the curved surfaces can be configured to be a camera, and such arrangements can be fabricated by printing or other deposition fabrication processes. Depending on the spatial arrangement, some portions of some of one of the curved surfaces can be observationally occulted from some regions of the other curved surface. Note the roles of the plurality of planar arrays of light source elements and a parallel array of light-sensing elements can be interchanged.

Case D: Multiple Parallel Planes of Mixed Discrete Separation Distances:

Relaxing the constraints in Case A in still another way, either one or both of (a) the objects or situations producing contributions to the light-field and/or (b) the image sensor resides on more than one planar surfaces but with various separation distances, typically a mix of separation distances. A resulting light-field comprises mixed separation distances with abrupt changes in the separation distance.

As an illustration of Case D, FIGS. 30a through 30c depict a variety of illustrative 3-dimensional views of an example variation of the arrangement depicted in FIGS. 24, 25a, 25b, 26a, and 25b wherein the array of (emitted and/or reflected) light source elements are split among a plurality of smaller parallel planes at different separation distances from the planar array of light-sensing elements. Depending on the spatial arrangement, some portions of some of the smaller parallel planes can be observationally occulted from some regions of the planar surface. Note the roles of the plurality of planar arrays of light source elements and a parallel array of light-sensing elements can be interchanged.

Case E: Combinations of at Least One Parallel Planes and at Least One Non-Multiple Parallel Plane:

Generalizing in Case D further, one or more instances of the situations of Case A and Case B are combined, resulting in a more complex light-field. In many situations occultation of portions of light fields can occur, for example in cases where one non-transparent source array blocks at least a portion of the light emitted by another source array as viewed by (one or more of the) sensor array(s).

As an illustration of Case E, FIGS. 31a and 31b depict a variety of illustrative 3-dimensional views of an example variation of the arrangement depicted in FIGS. 24, 25a, 25b, 26a, and 25b wherein the array of (emitted and/or reflected) light source elements are distributed over a connected group of planes, at least one parallel to the planar array of light-sensing elements. Depending on the spatial arrangement, some portions of some of the non-parallel planes can be observationally occulted from some regions of the planar surface. Note the roles of the plurality of planar arrays of light source elements and a parallel array of light-sensing elements can be interchanged.

Case F: More Complex Combinations of Mixed Discrete and Continuous Spatially-Varying Separation Distances:

Generalizing in Case E further, one or more instances of the situations of at least one of Case A and Case B are combined with at least one instance of the situation of Case C, resulting in yet a more complex light-field. In many situations occultation of portions of light fields can occur, for example in cases where one non-transparent source array blocks at least a portion of the light emitted by another source array as viewed by (one or more of the) sensor array(s).

As an illustration of Case F, FIGS. 32a through 32c depict a variety of illustrative 3-dimensional views of an example wherein the array of (emitted and/or reflected) light source elements are distributed over a complex collection of connected and disconnected planes, some of which are parallel to the planar array of light-sensing elements, and some of which observationally occulted others from some regions of the planar surface by being situated directly in front of others. Note the roles of the plurality of planar arrays of light source elements and a parallel array of light-sensing elements can be interchanged.

FIGS. 33a and 33b depict example inward-directed or outward-directed sensor-pixel lattice locations distributed on a rigid or elastic curved convex-shaped surface. As considered elsewhere, leveraging the co-integration of light-emitting and light-sensing elements as taught in the inventor's 1999 patent family, the camera can be configured to provide self-illumination, for example when used as an elastically-fitted cap that serves as a zero-separation-distance contact-imaging camera monitoring the surface of an enclosed object. As explained elsewhere, since an arbitrary-shaped "focus-surface" can be computationally defined, should the elastic cap only make contact with some portions of an object enshrouded by such a (self-illuminating if needed) elastic cap, focused images of the entire encapsulated region of the non-occulted surface of the enshrouded object can be produced.

FIGS. 34a through 34d depicts examples of pairs of curved and sharply-angled surfaces, one of the pair inside the other of that pair. In any of the arrangements depicted, at least one of the inner surface and the outer surface can be a camera arranged to view the other surface. As considered elsewhere, the camera can be configured to provide self-illumination.

FIGS. 35a through 35c depict illustrative examples of bumpy and/or pitted sensor surfaces that can provide angular diversity. Such arrangements can also be used to provide sensor robustness via spatial diversity, to provide directed angle-orientation viewing, and to provide other types of functions.

FIG. 36 depicts example correspondences between a physical optical arrangement comprising an optical process (including for example vignetting optics and free-space separation should the image sensor not be in contact with the actual source image) and a mathematical model of that physical optical arrangement (transforming an actual image array data to measured image array data by a numerical model of the optical process.

FIG. 37 depicts an illustrative example of Mathematical Recovery of an approximate representation of the actual Image from Measured Image Array Data obtained by operating on the Measured Image Array Data by a Numerical Inverse of the Model of the Optical Process as depicted in FIG. 36.

FIG. 38, adapted from FIG. 2b of the present inventor's U.S. Pat. No. 8,830,375 and related cases, depicts an exemplary embodiment comprising a micro-optic structure, a light sensor array, an image formation signal processing operation and an optional additional subsequent image processing operations, herein the micro-optic structure and light sensor array are grouped into a first subsystem, and the image formation signal processing operation and subsequent image processing operations are grouped into a second subsystem. As discussed in the present inventor's U.S. Pat. No. 8,830,375 and related cases, various other arrangements are possible and provided for by aspects of the invention.

FIG. 39a depicts an example scheme wherein manufacturing, physical, optical, and mathematical considerations are used to create a reproducible manufacturing design such that is adequate manufacturing tolerances are obtained an analytical predictive model can be used to produce numerical models of the optical situations to be recovered without the use of empirical measurements.

FIG. 39b depicts an example variation on the scheme presented in FIG. 39a wherein post-manufacturing empirical measurements are used to further fine-calibrate the system performance of each particular manufactured article.

FIG. 40 depicts an example representation of example serialization processes and de-serialization processes for image recovery from an inverse or pseudo-inverse model as provided for by the invention.

FIG. 41 depicts a representation of example serialization processes transforming a measured image produced by a light-field travelling through an optical structure (here a vignette array) at being measured by a sensor array.

FIG. 42 depicts a representation of example empirical image-basis "training" sequence, or alternatively a collection of predictive-model-generated image-bases that directly populate a JK×NM matrix providing a numerical model of the optical environment from which a future image will later be recovered as provided for by aspects of the invention.

FIG. 43a depicts a representation of example image recovery process using an inverse square-matrix representing an approximate inverse model as provided for by the invention.

Generalized Inverse/Pseudo-Inverse Remarks

There are a number of types of generalized inverses that have been developed and surveyed in the literature; for example see [B9] Section 3.3, [B10] pp. 110-111, and the tables in [B11] pp. 14-17. Some types of generalized inverses are uniquely-defined while others are non-uniquely defined in terms of infinite families. The notion of a generalized inverse applies to not only to finite-dimensional matrices but more broadly to (infinite-dimensional) linear operators; see for example [B12].

The Moore-Penrose generalized inverse, a special case of the Bjerhammar "intrinsic inverses" (see [B10] p. 105 and [P1], is uniquely-defined ([B13] p. 180), exists for any rectangular (or square) matrix regardless of matrix rank ([B13] p. 179, [B14] p. 196, [B15] p. 19) and provides many properties found in matrix inverse ([B14], p. 196) and beyond.

In particular, the Moore-Penrose generalized inverse inherently provides a unique solution providing a "Least-Squares" statistical fit in cases where solvable subsets of the larger number of equations give different inconsistent solutions; see for example [B15] pp. 17-19.

There are other types of generalized inverses that also provide least-squares properties; for example see entries annotated (3.1) and (3.2) in the table pp. 14 as well as sections 3.1-3.2 of [B11] as well as section 4.4.1 of [B13].

Further, the Moore-Penrose generalized inverse can be used to determine whether a solution to a set of linear equations exists ([B13] pp. 190-191).

Various extended definitions and generalized forms of the Moore-Penrose generalized inverse exist; see for example section 4.4.3 of [B13].

Some of the other types of generalized inverses are not useful for solving over-specified systems of linear equations (more equations than variables), for example the Drazin inverse which is restricted to square matrices and has more abstract applications; see for example [B13] Section 5.5.

FIG. 43b depicts a representation of example image recovery process using a generalized-inverse or pseudo-inverse matrix representing an approximate pseudo-inverse underspecified model as provided for by the invention. Underspecifed arrangements have been of interest in sub-Nyquist rate "compressive sampling" which can also be applied more broadly than optical sensing (see for example [P60]), and naturally fit into the classical regularized ill-posed inverse problem paradigm employed endemically in the coded aperture lensless imaging systems and approaches reviewed in review section A at the opening of the present patent application. The regularized ill-posed inverse problem paradigm gives rise to Moore-Penrose pseudo-inverse matrices or matrices similar to those (as presented in [P4] for example). Additionally, it is noted that the Moore-Penrose pseudo-inverse matrices and some of the other types of generalized inverse matrices can provide "best-fit" (Least square error) solutions to underspecified (fewer numbers of measurements than needed to uniquely solve for an image), fully-specified (exactly the number of measurements needed to uniquely solve for an image), and overspecified (fewer numbers of measurements than needed to uniquely solve for an image) situations and arrangements. However, the use of the Moore-Penrose pseudo-inverse matrices and other types of generalized inverses as taught in the inventor's 2008 patent family are directed to deliver additional advantages for pre-designed overspecified measurement situations and not the result of the regularized ill-posed inverse problem paradigm now widely used in coded aperture imaging and many other types of optical systems design and analysis see for example [B5], [B6]).

FIG. 43c depicts a representation of example image recovery process using a generalized-inverse or pseudo-inverse matrix representing an approximate generalized-inverse or pseudo-inverse overspecified model as provided for by the invention.

Use of a generalized-inverse or pseudo-inverse (and use of the Moore-Penrose pseudo-inverse in particular) in solving for a "best-fit" image from overspecified (and likely inconsistent) measurement data was introduced in a 2008 inventor's patent family. It is noted that slightly-related work in the area of improving digital Image resolution by use of "oversampling" can be found in the far earlier publication by Wiman [P3], but that is a different idea and goal. Rather, the inventor's use of use of a generalized-inverse or pseudo-inverse (and Moore-Penrose pseudo-inverse in particular) in solving for a "best-fit" image from overspecified (and likely inconsistent) measurement data provides robustness of image recovery with respect to damage or occultation of portions of the image sensor, etc.

FIG. 44a depicts a simple computational approach for image recovery as provided for by the invention, for example as taught in the inventor's 1999 and 2008 patent families. Such a depicts a simple computational approach compares favorably with far more numerically-complex spectral or transform computation (which numerically amounts to additional basis rotation transformation steps) as would be used in spectral or transform methods. For comparison, FIG. 44b depicts an example representation of a far more numerically-complex spectral or transform computation (which numerically amounts to additional basis rotation transformation steps) as would be used in spectral or transform methods.

The inventor's comprehensive lensless light-field imaging program (beginning with the inventor's 1999 patent family) includes a framework covering the approaches depicted in FIGS. 44a and 44b and various situations leading to these such as deconvolution methods. It is the inventor's view that the inventor's comprehensive lensless light-field imaging program (beginning with the inventor's 1999 patent family) includes a framework admitting most of visual-light coded aperture and angular-selective light-sensor approaches to various degrees.

FIG. 44c depicts a comparison of the approach depicted in FIG. 44a and the approach depicted in FIG. 44b, demonstrating comparative reasons to reject the far more numerically-complex spectral or transform computational approached represented in FIG. 44b.

FIG. 45 depicts the use of classical ill-posed inverse-problem regularization methods as employed in the Rambus [P4] and Rice University "Flat Cam" [P5] implementations as well as other coded aperture imaging implementations. These classical ill-posed inverse-problem regularization methods are widely used in many areas but also have an established role in optical systems design and analysis; see for example [B5] and [B6].

FIG. 46 depicts an abstract representation of an "Identity structure" within a (necessarily-sparse) Identity 4-tensor.

FIG. 47 depicts an abstract representation of a dilation around the "Identity structure" within a (necessarily-sparse) Identity 4-tensor.

FIG. 48 depicts a ((7×7)×(7×7)) "matrix-of-matrices" representation of a (7×7×7×7) Identity 4-tensor as abstracted in FIG. 46.

FIG. 49 depicts an example ((7×7)×(7×7)) "matrix-of-matrices" representation of the dilation around the "Identity structure" of a (7×7×7×7) 4-tensor as abstracted in FIG. 46.

FIG. 50 depicts an abstract representation of the trade-off between Space/Inverse-Space/Spatial Frequency Localization Methods and the sparcity of numerical model tensors, matrices, and their inverses.

FIGS. 51a through 51e depict how the sparcity of an example numerical model matrix serializing a numerical model 4-tensor degrades as the image source moves farther and farther from the image sensor (using numerical models at each distances predicted by an analytical geometric predictive model provided for by the invention).

FIG. 52 depicts an example ((7×7)×(7×7)) "matrix-of-matrices" representation of the numerical model 4-tensor and example measured image (right) at zero separation distance from a single-illuminated-pixel source image (left). As described elsewhere, the source image need not be on a parallel plane and can be distributed arbitrarily in space.

FIG. 53 depicts an example ((7×7)×(7×7)) "matrix-of-matrices" representation of the numerical model 4-tensor and example measured image (right) at a small non-zero separation distance from the same single-illuminated-pixel source image (left) as in FIG. 52.

FIG. 54 depicts an example ((7×7)×(7×7)) "matrix-of-matrices" representation of the numerical model 4-tensor and example measured image (right) at zero separation distance from a two-illuminated-pixel source image (left). As described elsewhere, the source image need not be on a parallel plane and can be distributed arbitrarily in space.

FIG. 55 depicts an example ((7×7)×(7×7)) "matrix-of-matrices" representation of the numerical model 4-tensor and example measured image (right) at a small non-zero separation distance from the same two-illuminated-pixel source image (left) as in FIG. 54.

FIG. 56 depicts an example ((7×7)×(7×7)) "matrix-of-matrices" representation of the numerical model 4-tensor and example measured image (right) at zero separation distance from a more closely-spaced two-illuminated-pixel source image (left). As described elsewhere, the source image need not be on a parallel plane and can be distributed arbitrarily in space.

FIG. 57 depicts an example ((7×7)×(7×7)) "matrix-of-matrices" representation of the numerical model 4-tensor and example measured image (right) at a small non-zero separation distance from the same more closely-spaced two-illuminated-pixel source image (left) as in FIG. 56.

FIGS. 58a through 58c depict three of forty-nine steps of an example empirical training sequence as provided for by the invention. In an implementation of the invention, such a procedure could be performed for a selected collection of one or more separation distances between the image sensor and the source image. As described elsewhere, the source image need not be on a parallel plane and can be distributed arbitrarily in the observable space.

Lensless Light-Field Imaging as an Associated Inverse Problem

The Inverse Model depiction illustrated in FIG. 1 can be configured to, in some appropriate manner, undo the effects of the incoming light's optical travel first within the Light-Field preceding the optical structure(s) and then through the Lensless Optical Structure(s) to where it reaches the Optical Sensor where the incident light converted to an electrical signal that can be further processed. If a mathematical model is a close match to the composite effects of these optical and optoelectrical processes, and if the model is mathematically invertible, applying the inverse of the model to the measured data can create a computationally-produced image which, for example, can be further arranged to be useful for human or machine use.

The Inverse Model can, for example, be implemented as a matrix, a 4-tensor, or other mathematical and/or data and/or logical operation.

The Inverse Model can be fixed or adjustable, can be implemented in a lumped or distributed manner, and can be unique or variationally-replicated in various manners. The optical structure can be fixed or reconfigurable, and can be arranged to be in a fixed position with respect to the Optical Sensor or can be configured to be movable in some manner with respect to the Optical Sensor. Additionally, at this level of abstraction, one or both of the Optical Sensor and Lensless Optical Structure(s) themselves can be variable in their electrical, physical, optical, mechanical, and other characteristics. For example, one or both of the Optical Sensor and Lensless Optical Structure(s) themselves can be any one or more of flat, curved, bendable, elastic, elastically-deformable, plastically-deformable, etc.

The Inverse Model can be derived from analytical optical models, empirical measurements, or combinations of these. In some embodiments the Inverse Model can be parametrized using interpolation.

Interpolation-based parameterization can be particularly useful if the Inverse Model is based on a collection of selected empirical measurements, or if the analytical optical model involves complex numerical computations.

FIG. 59 depicts an example polynomial fitting function interpolation method for interpolating the numerical model, its inverse/pseudo-inverse, and/or other functions for separation distances values lying between k empirically-trained separation distances. As described elsewhere, the source image need not be on a parallel plane and can be distributed arbitrarily in the observable space. In general the polynomial fitting function can be expected to include terms with negative exponential powers expected due to the overall "$1/r^2$" enveloping attention as the serration distance "r" increases.

FIG. 60 depicts an example polynomial fitting function interpolation method for interpolating the numerical model, its inverse/pseudo-inverse, and/or other functions for separation distances values lying between k separation distances used by a predictive-model. As described elsewhere, the source image need not be on a parallel plane and can be distributed arbitrarily in the observable space. Hereto in general the polynomial fitting function can be expected to include terms with negative exponential powers expected due to the overall "$1/r^2$" enveloping attention as the serration distance "r" increases.

FIG. 61 depicts an example of very poor curve-fit interpolation of the matrix elements of the numerical model between measure data distances resulting from not having sufficient terms in a model polynomial expansion and/or inclusion of terms with negative exponential powers expected due to the overall "$1/r^2$" enveloping attention as the serration distance "r" increases.

FIG. 62 depicts an example piecewise-linear interpolation of the matrix elements of the numerical model between k empirically-trained separation distances. (Measurement data and piecewise-linear plot made by Michael Hörlng.)

Using an empirically-trained numerical model for representing the linear transformation invoked by the optical arrangement, it is clearly possible to train the system to focus on an arbitrarily-shaped surface, including one that is curved, bend, or irregularly-shaped; the inversion math "does not care" as long as the resulting numerical model matrix is non-singular, and the recovered image will be obtained in the same manner as if the focus-surface was a parallel plane. Accordingly, in principle a predictive analytical model can be used to generate the numerical model matrix, and by either means (empirically-trained or predictively-modeled) the system and methods can be arranged to focus on an arbitrarily-shaped surface, including one that is curved, bend, or irregularly-shaped.

FIG. 63a depicts how with very small separation distances and certain non-alignment of source-pixel locations and sensor pixel locations some sensor pixel locations cannot receive light from proximate source-pixel locations, while FIG. 63b depicts how at slightly greater separation distances this condition does not occur; such processes can give rise to the rising and falling of selected curves in the example empirical training data shown in the example of FIG. 61. (This analysis performed by Michael Hörlng.)

FIG. 64 depicts an example piecewise-linear interpolation method for interpolating the numerical model, its inverse/pseudo-inverse, and/or other functions for separation distances values lying between k empirically-trained separation distances. As described elsewhere, the source image need not be on a parallel plane and can be distributed arbitrarily in the observable space.

FIG. 65 depicts an example piecewise-linear interpolation method for interpolating the numerical model, its inverse/pseudo-inverse, and/or other functions for separation distances values lying between k separation distances used by a predictive-model. As described elsewhere, the source image need not be on a parallel plane and can be distributed arbitrarily in the observable space.

FIG. 66 depicts an abstract representation of the mathematical recovery of image from measured image array data.

FIG. 67 depicts a variation on the representation of the mathematical recovery of image from measured image array data shown in FIG. 66 wherein more measurements are made than needed, resulting in an over-specified collection of measurements that can be expected to lead to inconsistent calculation outcomes when different subgroups of measurements are used to solve for the recovered image. As provided for by the invention, a Moore-Penrose pseudo-inverse operation gives a least-squares fit to the expected inconsistent outcomes; this is depicted in the bottom portion of the figure.

FIG. 68a through 68d depict example numerical model outcomes responsive to a single-illuminated pixel as generated for various separation distances by an example predictive analytical geometric model. The particular example predictive analytical geometric model used only accounts for vignette occultation as calculated by simple ray-trancing and does not include the effects of vignette-internal reflections, vignette-internal scattering, vignette-aperture diffraction, surface plasmoid propagation, etc.

FIG. 69a depicts three example interactive quantization-effect modeling outcomes wherein controllable quantization is artificially imposed on measurement data so as to predictively model and characterize the effects of quantizing nonlinearities imposed by electronic digital-to-analog converter processes on empirical training, predictive-model generated, and real-time measurements as they influence the quality of image recovery.

FIG. 69b depicts three example interactive offset-effect modeling outcomes wherein controllable measurement offset is artificially imposed on measurement data so as to predictively model and characterize the effects of measurement offsets imposed by electronic digital-to-analog converter processes on empirical training, predictive-model generated, and real-time measurements as they influence the quality of image recovery.

There are many noise processes inherent to light sensing and associated electronics and various resulting performance limitations and tradeoffs; see for example [P44], [B2]. A very general performance perspective is provided in the book by Janesick [B2]. In the limit, highest performance will be obtained by single-electron sensors and amplifies; as to steps towards array sensors of this type see the paper by Richardson [P33]. The invention provides for inclusion of these considerations. FIG. 69c depicts an example interactive noise-modeling control used to introduce synthetically-generated noise and noise processes so as to predictively model and characterize its effects. The selection shown controls additive Gaussian noise, but other noise processes associated with photodiodes (1/f noise, dark-current shot (Poissonian) noise, photon shot (Poissonian) noise, Johnson and other circuit noise, dark-current thermal noise, spectral noise, detector amplifier noise, etc.) can similarly be introduced.

FIGS. 70a through 70d depict example interactive modeling outcomes showing the effect of noise, offset, and both these for a 32-step (5-bit) quantized ("DN" [B2]) measurement dynamic range.

FIGS. 71a through 71d depict example interactive modeling outcomes showing the effect of noise, offset, and both these for a 64-step (6-bit) quantized ("DN") measurement dynamic range.

FIGS. 72a through 72d depict example interactive modeling outcomes showing the effect of noise, offset, and both these for a 128-step (7-bit) quantized ("DN") measurement dynamic range.

FIGS. 73a through 73d depict example interactive modeling outcomes showing the effect of noise, offset, and both these for a 140-step (slightly more than 7-bit) quantized ("DN") measurement dynamic range.

FIGS. 74a through 74d depict example interactive modeling outcomes showing the effect of noise, offset, and both these for a 150-step (yet more than 7-bit) quantized ("DN") measurement dynamic range.

FIG. 75a, adapted from [B7] Figure C2.5.16(a), depicts a first example pixel-cell multiplexed-addressing circuit for an individual OLED within an OLED array that includes a dedicated light-coupled monitoring photodiode for use in regulating the light output of the individual OLED so as to prevent user-observed fading or other brightness-variation processes. The adjacent photodiodes used for pixel-by-pixel closed-loop feedback of OLED brightness.

FIG. 75b, adapted from [B7] Figure C2.5.16(b), depicts a second example pixel-cell multiplexed-addressing circuit for an individual OLED within an OLED array that includes a dedicated light-coupled monitoring photodiode for use in regulating the light output of the individual OLED so as to prevent user-observed fading or other brightness-variation processes. There are many other subsequent developments since the publishing of this books tentatively-toned remarks; for example recently-announced OLED phones are said to be using this technique.

FIG. 76a, adapted from [B18], depicts an example pixel-cell multiplexed-addressing circuit for an individual OLED within an OLED array with a monitoring feature.

FIG. 76b, also adapted from [B18], depicts an example pixel-cell multiplexed-addressing circuit for an isolated high-performance photodiode or phototransistor within a high-performance photodiode or phototransistor array with a forced-measurement provision.

Additional Functional Architectures

As descried earlier, FIG. 1 depicts an example conceptual view of the underlying principles of the invention, facilitating a wide range of implementation methods and architectures. In this depiction, an Optical Scene creates a Light-Field that is directed to an Optical Sensor which is preceded by one or more Lensless Optical Structure(s) that in some manner alters the light field in a predictable spatial manner. The Optical Sensor produces (typically time-varying) electrical signals and/or computational data responsive (instantly and/or within some time-delay) to light incident to the surface or other substructure(s) within the Optical Sensor at any given moment. The depicted Inverse Model can be configured to, in some appropriate manner, undo the effects of the incoming light's optical travel first within the Light-Field preceding the optical structure(s) and then through the Lensless Optical Structure(s) to where it reaches the Optical Sensor, resulting in a computationally-produced image which, for example, can be arranged to be useful for human or machine use. The Inverse Model can, for example, be implemented as a matrix, a 4-tensor, or other mathematical and/or data and/or logical operation. The Inverse Model can be fixed or adjustable, can be implemented in a lumped or distributed manner, and can be unique or variationally-replicated in various manners. The optical structure can be fixed or reconfigurable, and can be arranged to be in a fixed position with respect to the Optical Sensor or can be configured to be movable in some manner with respect to the Optical Sensor. Additionally, at this level of abstraction, one or both of the Optical Sensor and Lensless Optical Structure(s) themselves can be variable in their electrical, physical, optical, mechanical, and other characteristics. For example, one or both of the Optical Sensor and Lensless Optical Structure(s) themselves can be any one or more of flat, curved, bendable, elastic, elastically-deformable, plastically-deformable, etc.

FIG. 77 depicts a simplified view of FIG. 1 showing only the signal and computational portion of FIG. 1 as will be useful in a subsequent discussion. It is understood that in FIG. 77 and related figures that the Optical Scene, Light-Field, and Lensless Optical Structure(s) can have the arrangements with respect to the Optical Sensor like that, similar to, extensible from, or in appropriate manners alternative to that depicted in FIG. 1.

FIG. 78 depicts a variation of the arrangement represented in FIG. 77 wherein the Inverse Model is rendered as a parameterized Inverse Model which can be altered responsive to one or more provided parameters. For example, the parameters provided to the parameterized Inverse Model could control a surrogate viewpoint, specify one or more "focus planes" (or more generally "focus surfaces"), etc. rating to what the Inverse Model "undoes." Accordingly, this arrangement allows a plurality of imaging capabilities and functions to be selectably and/or adjustably be supported by the more general arrangement of FIG. 77.

FIG. 79 depicts a variation of the arrangement represented in FIG. 78 wherein the electrical signals and/or computational data produced by the Optical Sensor are in parallel provided in whole or selected (or selectable) part to a plurality of Inverse Models, each producing one or more computationally-produced images responsive to the sensor data. Although the Inverse Models shown in FIG. 79 are depicted as parameterized Inverse Models, the invention provides for some or all of the plurality of Inverse Models to be non-parameterized Inverse Models.

FIG. 80 depicts a variation of the arrangement represented in FIG. 78 wherein the electrical signals and/or computational data produced by the Optical Sensor is handled by a computer or computational element (such as a microprocessor, GPU, DSP chip, ALU, FPLA, combination of two or more these, pluralities of these, etc.) in some fashion that at least permits the electrical signals and/or computational data produced by the Optical Sensor to be stored as a file.

FIG. 81 depicts a variation of the arrangement represented in FIG. 78 wherein the aforementioned handling by a computer or computational element is controlled in some manner by a control parameter. The control parameter for example can specify an aspect of the name of the Stored File, specify an aspect of the format of the Stored File, specify a selection of specific portions of the electrical signals and/or computational data produced by the Optical Sensor, specify or control data operations on the electrical signals and/or computational data produced by the Optical Sensor, specify or mathematical operations on the electrical signals and/or computational data produced by the Optical Sensor, specify or control logical operations on the electrical signals and/or computational data produced by the Optical Sensor, etc.

FIG. 82a depicts a variation of the arrangement represented in FIG. 81 wherein a plurality of stored files is created, for example with different parameter values associated with each stored file. Although a separate computer function is depicted for each of the stored file, the invention provides for these computer functions to be implemented with or executed on any of a single computer or computational element (such as a microprocessor, GPU, DSP chip, ALU, FPLA, combination of two or more these, pluralities of these, etc.), a plurality of computers or computational elements, an individually-dedicated computer or computational element, etc. The parameter values used in creating each Stored File can be either externally associated with each stored file, or can be stored as part of the stored file in a direct or encoded form.

FIG. 82b depicts an example arrangement wherein a stored file is used by a fixed Inverse Model to create a computationally-produced image.

FIG. 82c depicts an example arrangement wherein a stored file is used by a parameterized Inverse Model to create a computationally-produced image, and further wherein parameter value(s) associated the parameterized Inverse Model are externally associated with each stored file.

FIG. 82d depicts an example arrangement wherein a stored file is used by a parameterized Inverse Model to create a computationally-produced image, and further wherein parameter value(s) associated the parameterized Inverse Model are derived from or obtained from the stored file.

FIG. 83 depicts four example conformations of a particular bendable, flexible, and/or or pliable optical-sensor/optical-structure sheet, each conformation giving rise to an associated model for how a light field is sensed in the context of reconstructing an image, and each model giving rise to its own associated inverse model. It is noted that, as dependent on the properties and limitations of the optical-structure, there can be small blind spots in regions of sufficiently-high curvature.

FIG. 84a through FIG. 84d depict how various conformations can be used to render a computationally derived image FIG. 85a depicts an example arrangement for an optical-sensor/optical-structure of fixed conformation.

FIG. 85b depicts an example arrangement for an optical-sensor/optical-structure of variable conformation, for example should the surface bend, deform, hinge, expand, contract, etc.

FIG. 85c depicts a variation of FIG. 85b wherein the model and the Inverse Model are parameterized.

FIG. 86a depicts an arrangement useful for using optical training to sense the present conformation of an optical-sensor/optical-structure of variable conformation, for example should the surface bend, deform, hinge, expand, contract, etc.

FIG. 86*b* depicts an arrangement useful for using internal sensing means to sense the present conformation of an optical-sensor/optical-structure of variable conformation, for example should the surface bend, deform, hinge, expand, contract, etc. It is noted that a prototype for a commercial (panoramic camera) product employing a flexible OLED display, (c) conformation deformation sensing has been presented and is described in [P36].

FIG. 86*c* depicts an arrangement useful for using information about a movable or changing support structure or contact arrangement to identify the present conformation of an optical-sensor/optical-structure of variable conformation, for example should the surface bend, deform, hinge, expand, contract, etc.

FIG. 86*d* depicts an arrangement useful for using external observation mean, for example such as one or more observing video camera(s) means to sense the present conformation of an optical-sensor/optical-structure of variable conformation, for example should the surface bend, deform, hinge, expand, contract, etc.

FIG. 87*a* depicts an optical-sensor/optical-structure of variable conformation, for example should the surface bend, deform, hinge, expand, contract, etc. producing an output signal and/or output data.

FIG. 87*b* depicts a controllable variable-conformation material whose shape/conformation can be controlled by externally-provide control stimulus.

FIG. 87*c* depicts an optical-sensor/optical-structure of variable conformation, for example should the surface bend, deform, hinge, expand, contract, etc. producing an output signal and/or output data fabricated on, with, or co-integrated with controllable variable-conformation material whose shape/conformation can be controlled by externally-provide control stimulus.

FIG. 88*a* depicts use of conformational sensing information to derive or compute parameter values for a parameterized Inverse Model.

FIG. 88*b* depicts use of conformational control parameter information to derive or compute parameter values for a parameterized Inverse Model.

FIG. 88*c* depicts use of both conformational sensing information and conformational control parameter information to derive or compute parameter values for a parameterized Inverse Model.

Imaging Algorithms

The development to follow is broad enough to cover a wide variety of sensor types and imaging frameworks, and can be expanded further. Although the development to follow readily supports the advanced features made possible by curved, flexible/bendable, transparent, light-emitting, and other types of advanced sensors taught in the present patent application and earlier inventor patent families, many of the techniques can be readily applied to appreciate optical arrangements, devices, and situations employing traditional image sensors such as CMOS, CCD, vidicon, etc. Accordingly, the present invention provides for the use of a wide range of image sensor types including CMOS, CCD, vidicon, flat, curved, flexible/bendable, transparent, light-emitting, and other types of advanced sensors taught in the present patent application and earlier inventor patent families, as well as other know and future types of image sensors.

Traditional Notation Conventions for Vectors, Matrices, and Matrix-Vector (Left) Multiplication Let x be an M-dimensional column vector (i.e., an array of dimension 1×M) comprising elements $\{x_m\}$ $1 \le m \le M$ $$x = \begin{bmatrix} x_1 \\ \vdots \\ x_M \end{bmatrix}$$

and y be a J-dimensional column vector (i.e., an array of dimension 1×M) comprising elements $\{y_j\}$ $1 \le j \le J$ $$y = \begin{bmatrix} y_1 \\ \vdots \\ y_J \end{bmatrix}$$

Let A be a J×M matrix (an array of dimension J×M) comprising elements $\{a_{jm}\}$, $1 \le j \le J$, $1 \le m \le M$:

$$A = \begin{bmatrix} a_{11} & \cdots & a_{1K} \\ \vdots & \ddots & \vdots \\ a_{J1} & \cdots & a_{JK} \end{bmatrix}$$

The "matrix product" of a J×M matrix A with an M-dimensional column vector x can produce a J-dimensional column vector y; by "left multiplication" convention this is denoted as $$y = Ax$$

where each element $y_j$ of resulting a J-dimensional column vector y is calculated as $$y_j = \sum_{m=1}^{M} a_{jm} x_m$$

for each j an integer such that $1 \le j \le J$. Then the entire a J-dimensional column vector y is given by $$y = \begin{bmatrix} y_1 \\ \vdots \\ y_J \end{bmatrix} = \begin{bmatrix} \sum_{m=1}^{M} a_{1m} x_m \\ \vdots \\ \sum_{m=1}^{M} a_{Jm} x_m \end{bmatrix}$$

Use to Represent Spatial Line-Array (1-Dimensional) Imaging (as Used in Fax and Spectrometry Sensors)

In the above, one is using the matrix A as a transformational mapping from column vector x to column vector y $$x \overset{A}{\to} y$$

analogous 4-Tensor Representation of Spatial Grid-Array (2-dimensional) Imaging.

For example, if column vector x represents a line-array of data (such as light source values directed to a line-array light-measurement sensor used in a fax scanner or optical spectrometer), the matrix A can represent a composite chain of linear optical processes, electro-optical processes, and interface electronics (transconductance, transimpedance, amplification, etc.) processes that result in measured data represented by a column vector y. Here the indices of the vectors and matrix signify unique well-defined discrete (step-wise) spatial positions in an underlying 1-dimensional spatial structure.

A visual image as humans experience it through vision and conventional photography, as well as other analogous phenomena, has an underlying 2-dimensional spatial structure. In digital imaging, unique well-defined discrete (step-wise) spatial positions within an underlying 2-dimensional spatial structure are identified and/or employed—in the context of this discussion these may be called "pixels."

Mathematically, a 2-dimensional array of mathematically-valued elements, such as a matrix, can provide a mathematical representation of an image wherein the indices of an element identify an individual pixel's spatial location and the value of that mathematical element represents the "brightness" of that pixel. For example, an J×K array of measured 2-dimensional image data arranged as row and columns can be represented as a matrix of "brightness" values:

$$Q = \begin{bmatrix} q_{11} & \cdots & q_{1K} \\ \vdots & & \vdots \\ q_{J1} & \cdots & q_{JK} \end{bmatrix}$$

A convenient shorthand for this can be denoted as $Q=\{q_{jk}\}$ where it is understood each of the two indices span a range of consecutive non-zero integer values $1 \le j \le J, 1 \le k \le K.$ Similarly, a source image (2-dimensional array) can be represented as a matrix:

$$S = \begin{bmatrix} s_{11} & \cdots & s_{1N} \\ \vdots & & \vdots \\ s_{M1} & \cdots & s_{MN} \end{bmatrix}$$

A similar convenient shorthand for this is denoted $S=\{s_{mn}\}$ where it is understood each of the two indices span a range of consecutive non-zero integer values $1 \le m \le M, 1 \le n \le N.$ A source image S can be transformed by linear optical processes, linear sensor processes, and linear electronics processes into a measured image Q. This can be represented mathematically as a linear matrix-to-matrix transformation $\mathbb{T}$ mapping the matrix S to the matrix Q $S \xrightarrow{\mathbb{T}} Q$ akin to employing the earlier matrix A as a linear vector-to-vector transformational (for example, mapping column vector x to column vector y):

$x \xrightarrow{A} y$

Most generally this linear transformation $\mathbb{T}$ can be represented by a 4-dimensional array 4-tensor:

$\mathbb{T}=\{t_{jkmn}\}$ $1 \le j \le J$ $1 \le k \le K$ $1 \le m \le M$ $1 \le n \le N$ with the understanding that the following multiplication rule is represented by the tensor $\mathbb{T}$ "multiplying" the matrix S, namely each element $q_{jk}$ of resulting matrix Q is given by $$q_{jk} = \sum_{m=1}^{M} \sum_{n=1}^{N} t_{jkmn} s_{mn}$$

$1 \le j \le J, 1 \le k \le K.$

Note this convention corresponds in form to the matrix case presented earlier:

$$y_j = \sum_{k=1}^{K} a_{jk} x_k$$

$1 \le k \le K$

The corresponding "multiplicative" product of the 4-tensor $\mathbb{T}$ with matrix S to give matrix Q can be represented as $Q = \mathbb{T} S$ which compares analogously to the "multiplicative" product of the matrix A with the vector x to give the vector y $y=Ax$ With its four tensor-element indices and tensor-matrix product organized in this way, the 4-tensor $\mathbb{T}$ with elements $t_{jkmn}$ can be readily and conveniently represented as a matrix-of-matrices where interior matrix blocks are indexed by row j and column k and the elements with each of the interior matrices are indexed by row m and column n. More specifically, the 4-tensor element $t_{jkmn}$ resides in an inner matrix residing in row m and column n of an inner matrix that resides in row j and column k of the outer matrix. The resulting matrix-of-a-matrices representation for the 4-tensor $\mathbb{T}=\{t_{jkmn}\}$ with $1 \le j \le J, 1 \le k \le K, 1 \le m \le M, 1 \le n \le N$ would be:

$$\mathbb{T} = \begin{bmatrix} \begin{bmatrix} t_{1111} & \cdots & t_{111N} \\ \vdots & \ddots & \vdots \\ t_{11M1} & \cdots & t_{11MN} \end{bmatrix} & \cdots & \begin{bmatrix} t_{1K11} & \cdots & t_{1K1N} \\ \vdots & \ddots & \vdots \\ t_{1KM1} & \cdots & t_{1KMN} \end{bmatrix} \\ & \vdots & \\ \begin{bmatrix} t_{J111} & \cdots & t_{J11N} \\ \vdots & \ddots & \vdots \\ t_{J1M1} & \cdots & t_{J1MN} \end{bmatrix} & \cdots & \begin{bmatrix} t_{JK11} & \cdots & t_{JK1N} \\ \vdots & \ddots & \vdots \\ t_{JKM1} & \cdots & t_{JKMN} \end{bmatrix} \end{bmatrix}$$

This matrix-of-a-matrices structure where the mapping $$S \xrightarrow{\mathbb{T}} Q$$

is defined by $$q_{jk} = \sum_{m=1}^{M} \sum_{n=1}^{N} t_{jkmn} s_{mn}$$

$1 \le j \le J, 1 \le k \le K.$ provides several important opportune outcomes, among these being:

Property:
The individual entries $t_{jkmn}$ of each interior matrix having block-position index $\{j, k\}$ scale the contribution of each element $s_{mn}$ which sum together to the quantity $q_{jk}$ comprised within the matrix Q; this can be seen directly by just considering fixed values for $\{j, k\}$ in the defining relation $$q_{jk} = \sum_{m=1}^{M} \sum_{n=1}^{N} t_{jkmn} s_{mn}$$

Utility:
this is also the way MatrixForm[*] displays the 4-array $\mathbb{T}$ in Mathematica.™

Remark 1: It is noted that the 4-tensor $\mathbb{T}$ as defined thus far is represented in this "matrix of matrices" structure, the interior matrices are organized so that each interior matrix having block-position index $\{j,k\}$ is associated with the corresponding outcome quantity $q_{jk}$. An attractive property of this representation, as called out above, is that the value of the output quantity $q_{jk}$ is the sum of all the pointwise products of values of source image pixels $s_{mn}$ scaled by the corresponding elements in the interior matrix that has block-position index $\{j, k\}$. Thus, in an optical imaging context, the values of elements in the interior matrix that has block-position index $\{j, k\}$ graphically show the multiplicative "gain" (or "sensitivity") attributed to each of the same-positioned source image pixels $s_{mn}$ in the image source matrix S. In more pedestrian but intuitively useful terms, the values of elements in the interior matrix that has block-position index $\{j,k\}$ display the "heat map" of responsiveness of an observed or measured sensor pixel $q_{jk}$ in the observed or measured image matrix Q to source image pixels $s_{mn}$ in the image source matrix S.

Remark 2: From this it is further noted that other kinds of 4-tensors could be reorganized in other ways that have other attractive merits. For example, a 4-tensor $\Psi$ comprising elements $\psi_{mnjk}$ can be defined by the simple index reordering $$\psi_{mnjk} = t_{jkmn};$$

each interior matrix in the "matrix of matrices" structure for the 4-tensor $\Psi$ having block-position index $\{m, n\}$ represents a discrete "point-spread function" for a source pixel at position $\{m, n\}$ into individual outcome pixels at position $\{j, k\}$ as can be seen from the resulting relation $$q_{jk} = \sum_{m=1}^{M} \sum_{n=1}^{N} \psi_{mnjk} s_{mn}$$

Although "point-spread function" representation imposed by the "matrix of matrices" structure for 4-tensor $\Psi$ has obvious customary attraction, the discourse will continue in terms of the 4-tensor $\mathbb{T}$ comprising elements $t_{jkmn}$ as defined by $$q_{jk} = \sum_{m=1}^{M} \sum_{n=1}^{N} t_{jkmn} s_{mn}$$

because of its organizational similarity with the conventional matrix definition $$y_j = \sum_{k=1}^{K} a_{jk} x_k$$

and with the understanding that all the subsequent development can be transformed from the definitions used for 4-tensor $\mathbb{T}$ to the "point-spread" oriented for 4-tensor $\Psi$ by the index re-mapping $$\psi_{mnjk} = t_{jkmn}.$$

Remark 3: It is noted that for a (variables-separable) "separable" two-dimensional transform, such as the two-dimensional DFT, DCT, DST, etc., commonly used in traditional spectral image processing affairs of the j and m indices are handled entirely separate from affairs of the k and n indices, so $q_{jk}$ takes the restricted "variables-separable" form, for example when J=M and K=N $$q_{jk} = \sum_{m=1}^{M} \sum_{n=1}^{N} d_{jm} d_{kn} s_{mn}$$

in which case $$t_{jkmn} = d_{jm} d_{kn}$$

For example, for the normalized DFT matrices operating on an image of M rows and N columns, these $d_{jm}$ and $d_{kn}$ element are:

$$d_{jm} = \frac{e^{-2\pi i (j-1)(m-1)}}{\sqrt{M}}$$

and $$d_{kn} = \frac{e^{-2\pi i (k-1)(n-1)}}{\sqrt{N}}$$

where $i = \sqrt{-1}$.

As another example of other kinds of 4-tensors be reorganized in other ways with attractive merits, a "variables-separable" 4-tensor $\Phi$ comprising elements $\phi_{mnjk}$ can be defined by the simple index reordering $\phi_{jmkn} = t_{jkmn}$ which separately associates rows (indexed by j) in matrix Q with rows (indexed by m) in matrix S and separately associates columns (indexed by k) in matrix Q with columns (indexed by n) in matrix S.

Remark 4: To further illustrate details and develop intuition of the "matrix of matrices" structure, or at least the aforedescribed organization of indices and multiplication rule, one could employ the dimension signifier (J×J)×(M×N). As some examples:

$$\mathbb{T}_{(3\times3)\times(3\times3)} = \begin{bmatrix} \begin{bmatrix} t_{1111} & t_{1112} & t_{1113} \\ t_{1121} & t_{1122} & t_{1123} \\ t_{1131} & t_{1132} & t_{1133} \end{bmatrix} & \begin{bmatrix} t_{1211} & t_{1212} & t_{1213} \\ t_{1221} & t_{1222} & t_{1223} \\ t_{1231} & t_{1232} & t_{1233} \end{bmatrix} & \begin{bmatrix} t_{1311} & t_{1312} & t_{1313} \\ t_{1321} & t_{1322} & t_{1323} \\ t_{1331} & t_{1332} & t_{1333} \end{bmatrix} \\ \begin{bmatrix} t_{2111} & t_{2112} & t_{2113} \\ t_{2121} & t_{2122} & t_{2123} \\ t_{2131} & t_{2132} & t_{2133} \end{bmatrix} & \begin{bmatrix} t_{2211} & t_{2212} & t_{2213} \\ t_{2221} & t_{2222} & t_{2223} \\ t_{2231} & t_{2232} & t_{2233} \end{bmatrix} & \begin{bmatrix} t_{2311} & t_{2312} & t_{2313} \\ t_{2321} & t_{2322} & t_{2323} \\ t_{2331} & t_{2332} & t_{2333} \end{bmatrix} \\ \begin{bmatrix} t_{3111} & t_{3112} & t_{3113} \\ t_{3121} & t_{3122} & t_{3123} \\ t_{3131} & t_{3132} & t_{3133} \end{bmatrix} & \begin{bmatrix} t_{3211} & t_{3212} & t_{3213} \\ t_{3221} & t_{3222} & t_{3223} \\ t_{3231} & t_{3232} & t_{3233} \end{bmatrix} & \begin{bmatrix} t_{3311} & t_{3312} & t_{3313} \\ t_{3321} & t_{3322} & t_{3323} \\ t_{3331} & t_{3332} & t_{3333} \end{bmatrix} \end{bmatrix}$$

$$\mathbb{T}_{(5\times4)\times(3\times2)} = \begin{bmatrix} \begin{bmatrix} t_{1111} & t_{1112} \\ t_{1121} & t_{1122} \\ t_{1131} & t_{1132} \end{bmatrix} & \begin{bmatrix} t_{1211} & t_{1212} \\ t_{1221} & t_{1222} \\ t_{1231} & t_{1232} \end{bmatrix} & \begin{bmatrix} t_{1311} & t_{1312} \\ t_{1321} & t_{1322} \\ t_{1331} & t_{1332} \end{bmatrix} & \begin{bmatrix} t_{1411} & t_{1412} \\ t_{1421} & t_{2422} \\ t_{1431} & t_{1432} \end{bmatrix} \\ \begin{bmatrix} t_{2111} & t_{2112} \\ t_{2121} & t_{2122} \\ t_{2131} & t_{2132} \end{bmatrix} & \begin{bmatrix} t_{2211} & t_{2212} \\ t_{2221} & t_{2222} \\ t_{2231} & t_{2232} \end{bmatrix} & \begin{bmatrix} t_{2311} & t_{2312} \\ t_{2321} & t_{2322} \\ t_{2331} & t_{2332} \end{bmatrix} & \begin{bmatrix} t_{2411} & t_{2412} \\ t_{2421} & t_{2422} \\ t_{2431} & t_{2432} \end{bmatrix} \\ \begin{bmatrix} t_{3111} & t_{3112} \\ t_{3121} & t_{3122} \\ t_{3131} & t_{3132} \end{bmatrix} & \begin{bmatrix} t_{3211} & t_{3212} \\ t_{3221} & t_{3222} \\ t_{3231} & t_{3232} \end{bmatrix} & \begin{bmatrix} t_{3311} & t_{3312} \\ t_{3321} & t_{3322} \\ t_{3331} & t_{3332} \end{bmatrix} & \begin{bmatrix} t_{3411} & t_{3412} \\ t_{3421} & t_{3422} \\ t_{3431} & t_{3432} \end{bmatrix} \\ \begin{bmatrix} t_{4111} & t_{4112} \\ t_{4121} & t_{4122} \\ t_{4131} & t_{4132} \end{bmatrix} & \begin{bmatrix} t_{4211} & t_{4212} \\ t_{4221} & t_{4222} \\ t_{4231} & t_{4232} \end{bmatrix} & \begin{bmatrix} t_{4311} & t_{4312} \\ t_{4321} & t_{4322} \\ t_{4331} & t_{4332} \end{bmatrix} & \begin{bmatrix} t_{4411} & t_{4412} \\ t_{4421} & t_{4422} \\ t_{4431} & t_{4432} \end{bmatrix} \\ \begin{bmatrix} t_{5111} & t_{5112} \\ t_{5121} & t_{5122} \\ t_{5131} & t_{5132} \end{bmatrix} & \begin{bmatrix} t_{5211} & t_{5212} \\ t_{5221} & t_{5222} \\ t_{5231} & t_{5232} \end{bmatrix} & \begin{bmatrix} t_{5311} & t_{5312} \\ t_{5321} & t_{5322} \\ t_{5331} & t_{5332} \end{bmatrix} & \begin{bmatrix} t_{5411} & t_{5412} \\ t_{5421} & t_{5422} \\ t_{5431} & t_{5432} \end{bmatrix} \end{bmatrix}$$

$$\mathbb{T}_{(2\times3)\times(5\times4)} = \begin{bmatrix} \begin{bmatrix} t_{1111} & t_{1112} & t_{1113} & t_{1114} \\ t_{1121} & t_{1122} & t_{1123} & t_{1124} \\ t_{1131} & t_{1132} & t_{1133} & t_{1134} \\ t_{1141} & t_{1142} & t_{1143} & t_{1144} \\ t_{1151} & t_{1152} & t_{1153} & t_{1154} \end{bmatrix} & \begin{bmatrix} t_{1211} & t_{1212} & t_{1213} & t_{1214} \\ t_{1221} & t_{1222} & t_{1223} & t_{1224} \\ t_{1231} & t_{1232} & t_{1233} & t_{1234} \\ t_{1241} & t_{1242} & t_{1243} & t_{1244} \\ t_{1251} & t_{1252} & t_{1253} & t_{1254} \end{bmatrix} & \begin{bmatrix} t_{1311} & t_{1312} & t_{1313} & t_{1314} \\ t_{1321} & t_{1322} & t_{1323} & t_{1324} \\ t_{1331} & t_{1332} & t_{1333} & t_{1334} \\ t_{1341} & t_{1342} & t_{1343} & t_{1344} \\ t_{1351} & t_{1352} & t_{1353} & t_{1354} \end{bmatrix} \\ \begin{bmatrix} t_{2111} & t_{2112} & t_{2113} & t_{2114} \\ t_{2121} & t_{2122} & t_{2123} & t_{2124} \\ t_{2131} & t_{2132} & t_{2133} & t_{2134} \\ t_{2141} & t_{2142} & t_{2143} & t_{2144} \\ t_{2151} & t_{2152} & t_{2153} & t_{2154} \end{bmatrix} & \begin{bmatrix} t_{2211} & t_{2212} & t_{2213} & t_{2214} \\ t_{2221} & t_{2222} & t_{2223} & t_{2224} \\ t_{2231} & t_{2232} & t_{2233} & t_{2234} \\ t_{2241} & t_{2242} & t_{2243} & t_{2244} \\ t_{2251} & t_{2252} & t_{2253} & t_{2254} \end{bmatrix} & \begin{bmatrix} t_{2311} & t_{2312} & t_{2313} & t_{2314} \\ t_{2321} & t_{2322} & t_{2323} & t_{2324} \\ t_{2331} & t_{2332} & t_{2333} & t_{2334} \\ t_{2341} & t_{2342} & t_{2343} & t_{2344} \\ t_{2351} & t_{2352} & t_{2353} & t_{2354} \end{bmatrix} \end{bmatrix}$$

$$\mathbb{T}_{(5\times4)\times(2\times3)} = \begin{bmatrix} \begin{bmatrix} t_{1111} & t_{1112} & t_{1113} \\ t_{1121} & t_{1122} & t_{1123} \end{bmatrix} & \begin{bmatrix} t_{1211} & t_{1212} & t_{1213} \\ t_{1221} & t_{1222} & t_{1223} \end{bmatrix} & \begin{bmatrix} t_{1311} & t_{1312} & t_{1313} \\ t_{1321} & t_{1322} & t_{1323} \end{bmatrix} & \begin{bmatrix} t_{1411} & t_{1412} & t_{1413} \\ t_{1421} & t_{1422} & t_{1423} \end{bmatrix} \\ \begin{bmatrix} t_{2111} & t_{2112} & t_{2113} \\ t_{2121} & t_{2122} & t_{2123} \end{bmatrix} & \begin{bmatrix} t_{2211} & t_{2212} & t_{2213} \\ t_{2221} & t_{2222} & t_{2223} \end{bmatrix} & \begin{bmatrix} t_{2311} & t_{2312} & t_{2313} \\ t_{2321} & t_{2322} & t_{2323} \end{bmatrix} & \begin{bmatrix} t_{2411} & t_{2412} & t_{2413} \\ t_{2421} & t_{2422} & t_{2423} \end{bmatrix} \\ \begin{bmatrix} t_{3111} & t_{3112} & t_{3113} \\ t_{3121} & t_{3122} & t_{3123} \end{bmatrix} & \begin{bmatrix} t_{3211} & t_{3212} & t_{3213} \\ t_{3221} & t_{3222} & t_{3223} \end{bmatrix} & \begin{bmatrix} t_{3311} & t_{3312} & t_{3313} \\ t_{3321} & t_{3322} & t_{3323} \end{bmatrix} & \begin{bmatrix} t_{3411} & t_{3412} & t_{3413} \\ t_{3421} & t_{3422} & t_{3423} \end{bmatrix} \\ \begin{bmatrix} t_{4111} & t_{4112} & t_{4113} \\ t_{4121} & t_{4122} & t_{4123} \end{bmatrix} & \begin{bmatrix} t_{4211} & t_{4212} & t_{4213} \\ t_{4221} & t_{4222} & t_{4223} \end{bmatrix} & \begin{bmatrix} t_{4311} & t_{4312} & t_{4313} \\ t_{4321} & t_{4322} & t_{4323} \end{bmatrix} & \begin{bmatrix} t_{4411} & t_{4412} & t_{4413} \\ t_{4421} & t_{4422} & t_{4423} \end{bmatrix} \\ \begin{bmatrix} t_{5111} & t_{5112} & t_{5113} \\ t_{5121} & t_{5122} & t_{5123} \end{bmatrix} & \begin{bmatrix} t_{5211} & t_{5212} & t_{5213} \\ t_{5221} & t_{5222} & t_{5223} \end{bmatrix} & \begin{bmatrix} t_{5311} & t_{5312} & t_{5313} \\ t_{5321} & t_{5322} & t_{5323} \end{bmatrix} & \begin{bmatrix} t_{5411} & t_{5412} & t_{5413} \\ t_{5421} & t_{5422} & t_{5423} \end{bmatrix} \end{bmatrix}$$

Examples of Transpose Operations for 4-Tensors

Various types of "Transpose" operations involving self-inverting index-exchange operations for one or two pairs of indices can be defined from $(4\cdot 3\cdot 2\cdot 1)-1=23$ index re-organizations overall.

Perhaps some of the most useful of these would include:
- "2134-Transpose": Exchanging rows and columns within the outer matrix structure (i.e., exchanging order of first two indices) $v_{kjmn}=t_{jkmn}$; $t_{kjmn}=v_{jkmn}$;
- "1243-Transpose": Exchanging rows and columns within the inner matrix structure (i.e., exchanging order of last two indices) $v_{jknm}=t_{jkmn}$; $t_{jknm}=v_{jkmn}$;
- "2143-Transpose": Exchanging rows and columns within the outer matrix structure (exchanging order of first two indices) and exchanging rows and columns within the inner matrix structure (exchanging order of last two indices) together $v_{kjnm}=t_{jkmn}$; $t_{kjnm}=v_{jkmn}$;
- "3412-Transpose": Exchanging row-column pair of outer matrix structure (first two indices) with the row-column pair of inner matrix structure (last two indices) $v_{mnjk}=t_{mnjk}$; $t_{mnjk}=v_{jkmn}$;
- "1324-Transpose": Grouping the row indices of both the inner and outer matrix structures (first and third indices) followed by grouping the column indices of both the inner and outer matrix structures (second and fourth indices) $v_{jmkn}=t_{jkmn}$; $t_{jmkn}=v_{jkmn}$.

Incidentally it is noted, for example that:

$$\mathbb{T} \xrightarrow{\text{3412-Transpose}} \Psi$$

("matrix analogy" to "point spread function" re-organization from above)

$$\Psi \xrightarrow{\text{3412-Transpose}} \mathbb{T}$$

("point spread function" to "matrix analogy" re-organization)

$$\mathbb{T} \xrightarrow{\text{1324-Transpose}} \Phi$$

("matrix analogy" to "variables-separable" re-organization from above)

$$\Phi \xrightarrow{\text{1324-Transpose}} \mathbb{T}$$

("variables-separable" to "matrix analogy" re-organization)

The "Identity" 4-Tensor

As with an N×N "Identity" matrix employing the mapping $$y_j = \sum_{n=1}^{N} a_{mn} x_n$$

to map an N-dimensional vector to a copy of itself, using $$a_{mn}=\delta_{mn}$$

where $\delta_{pq}$ is the "Kronecker delta"

$$\delta_{pq} = \begin{cases} 0 \text{ if } p \neq q \\ 1 \text{ if } p = q \end{cases}$$

an "Identity" 4-tensor (for example J=M and K=N) mapping a M×N matrix to an M×N copy of itself results from employing the mapping:

$$q_{ik} = \sum_{m=1}^{M} \sum_{n=1}^{N} t_{jkmn} s_{mn}$$

with $$t_{jkmn}=\delta_{jm}\delta_{kn}.$$

Note that with this (variables-separable) structure gives $q_{jk}=s_{jk}$ for each $1 \leq j \leq M$, $1 \leq k \leq N$.

Using the "matrix-of-matrices" representation, a (3×3)×(3×3) Identity 4-tensor $\mathbb{I}_{(3\times 3)\times(3\times 3)}$ would have the form:

$$\mathbb{I}_{(3\times 3)\times(3\times 3)} = \begin{bmatrix} \begin{bmatrix} 1 & 0 & 0 \\ 0 & 0 & 0 \\ 0 & 0 & 0 \end{bmatrix} & \begin{bmatrix} 0 & 1 & 0 \\ 0 & 0 & 0 \\ 0 & 0 & 0 \end{bmatrix} & \begin{bmatrix} 0 & 0 & 1 \\ 0 & 0 & 0 \\ 0 & 0 & 0 \end{bmatrix} \\ \begin{bmatrix} 0 & 0 & 0 \\ 1 & 0 & 0 \\ 0 & 0 & 0 \end{bmatrix} & \begin{bmatrix} 0 & 0 & 0 \\ 0 & 1 & 0 \\ 0 & 0 & 0 \end{bmatrix} & \begin{bmatrix} 0 & 0 & 0 \\ 0 & 0 & 1 \\ 0 & 0 & 0 \end{bmatrix} \\ \begin{bmatrix} 0 & 0 & 0 \\ 0 & 0 & 0 \\ 1 & 0 & 0 \end{bmatrix} & \begin{bmatrix} 0 & 0 & 0 \\ 0 & 0 & 0 \\ 0 & 1 & 0 \end{bmatrix} & \begin{bmatrix} 0 & 0 & 0 \\ 0 & 0 & 0 \\ 0 & 0 & 1 \end{bmatrix} \end{bmatrix}$$

Such a (3×3)×(3×3) Identity 4-tensor would map a 3×3 pixel source image S to a 3×3 pixel result image Q with Q=S.

More generally Identity 4-Tensors map an M×N matrix to an M×N matrix, but the matrices need not individually (row-column) "symmetric"—that is one does not require M=N.

For example, using the "matrix-of-matrices" representation, a (3×2)×(3×2) Identity 4-Tensor $\mathbb{I}_{(3\times 2)\times(3\times 2)}$ that maps a 3×2 matrix to a 3×2 matrix would have the form:

$$\mathbb{I}_{(3\times 2)\times(3\times 2)} = \begin{bmatrix} \begin{bmatrix} 1 & 0 \\ 0 & 0 \\ 0 & 0 \end{bmatrix} & \begin{bmatrix} 0 & 1 \\ 0 & 0 \\ 0 & 0 \end{bmatrix} \\ \begin{bmatrix} 0 & 0 \\ 1 & 0 \\ 0 & 0 \end{bmatrix} & \begin{bmatrix} 0 & 0 \\ 0 & 1 \\ 0 & 0 \end{bmatrix} \\ \begin{bmatrix} 0 & 0 \\ 0 & 0 \\ 1 & 0 \end{bmatrix} & \begin{bmatrix} 0 & 0 \\ 0 & 0 \\ 0 & 1 \end{bmatrix} \end{bmatrix}$$

Such a (3×2)×(3×2) Identity 4-tensor would map a 3×2 pixel source image S to a 3×2 pixel result image Q with Q=S.

For each of these Identity 4-tensor examples, regarding Remark 1 above (as to interpreting the values of elements in the interior matrix with block-position index {j, k} in an (m×N)×(M×N) "matrix of matrices" as representing a "heat map" of responsiveness of an observed or measured sensor pixel $q_{jk}$ in the observed or measured image matrix Q to source image pixels $s_{mn}$ in the image source matrix S), the structure of an M×N×M×N Identity 4-tensor is crystal clear as to it rendering $q_{jk}=s_{jk}$ for each $1 \le j \le M$, $1 \le k \le N$.

Re-Indexing and Reorganization a 4-Tensor-Operator Matrix-to-Matrix (Image-to-Image) Equation as a Matrix-Operator Vector-to-Vector Equation Although in an image the row and column ordering, two-dimensional neighboring arrangement of pixels, and other such two-dimensional indexing details are essential, some linear transformations act entirely independently of the two-dimensional index structure. An example, are situations where one can regard the relationships defined by a tensor mapping between matrices such as $$Q = \mathbb{T} S$$

as simply representing a set of simultaneous equations $$q_{jk} = \sum_{m=1}^{M} \sum_{n=1}^{N} t_{jkmn} s_{mn}$$

$$1 \le j \le J, 1 \le k \le K.$$

In such circumstances one could without consequence uniquely re-index the variables with an indexing scheme that serializes the index sequence in an invertible way. For example, one can define two serializing indices p and q to serialize a J×K×M×N dimensional 4-tensor $\mathbb{T}$ comprising elements $t_{jkmn}$ into a JK×MN dimensional matrix T comprising elements $t_{pq}$ using the index-mapping relations $$p = (j-1)K + k$$

$$r = (m-1)N + n$$

those relations can be inverted via $$j = \text{Mod}(p-1, K) + 1$$

$$k = \text{Floor}(p^{-1}/K) + 1 = \text{Ceiling}[p/K]$$

$$m = \text{Mod}(r-1, N) + 1$$

$$n = \text{Floor}(r^{-1}/N) + 1 = \text{Ceiling}[r/N]$$

Using these, one can define the serialized-index vectors q, comprising elements $$q_p, 1 \le p \le JK,$$

and s, comprising elements $$s_r, 1 \le r \le MN,$$

which are simply "scanned" or "flattened" versions of matrix Q, comprising elements $$q_{jk}, 1 \le j \le J, \le k \le K$$

and matrix S, comprising elements $$s_{mn}, 1 \le m \le M, 1 \le n \le N$$

An example "scanning" or "flattening" index correspondence is $$q_{(j-1)K+k} \leftrightarrow q_{jk}, 1 \le j \le J, 1 \le k \le K$$

$$s_{(m-1)N+n} \leftrightarrow s_{mn}, 1 \le m \le M, 1 \le n \le N$$

and its corresponding inverse correspondence is $$q_p \leftrightarrow q_{\text{Mod}(p-1,N)+1, \text{Ceiling}(p/K)}, 1 \le p \le JK$$

$$s_r \leftrightarrow s_{\text{Mod}(r-1,N)+1, \text{Ceiling}(r/N)}, 1 \le r \le MN.$$

The last pair of these index correspondences can be used to formally define index-serializing mappings $$q_p = q_{\text{Mod}(p-1,N)+1, \text{Ceiling}(p/K)}, 1 \le p \le JK$$

$$s_r = s_{\text{Mod}(r-1,N)+1, \text{Ceiling}(r/N)}, 1 \le r \le MN$$

that provide a flattening reorganization of the elements $q_{jk}$ comprised by the J×K-dimensional matrix Q into a vector q comprising elements $q_p$, and a flattening reorganization of the elements $s_{mn}$ comprised the M×N-dimensional matrix S into a vector s comprising elements $s_r$. These result in flattening transformations Q→q and →s.

The first pair of the index correspondences can be used to formally define index-vectorizing mappings $$q_{jk} = q_{(j-1)K+k}, 1 \le j \le J, 1 \le k \le K$$

$$s_{mn} = s_{(m-1)N+n}, 1 \le m \le M, 1 \le n \le N$$

that provide a partitioning reorganization of the elements $q_p$ of vector q into the elements $q_{jk}$ comprised by the J×K-dimensional matrix Q, and a partitioning reorganization of the elements $s_r$ of vector q into the elements $s_{mn}$ comprised the M×N-dimensional matrix S. These result in partitioning transformations q→Q and s→S which reconstruct the matrices Q and S from the serialized vectors q and s.

In a corresponding way, one can use these same serialized-indices to correspondingly re-label and reorganize the values of the (J×K)×(M×N)-dimensional tensor $\mathbb{T}$ to the JK×MN-dimensional matrix T. The mapping $\mathbb{T} \to T$ is given by $$t_{(j-1)K+k, (m-1)N+n} = t_{jkmn}$$

$$1 \le j \le J, 1 \le k \le K, 1 \le m \le M, 1 \le n \le N$$

and the reverse mapping $T \to \mathbb{T}$ is given by $$t_{\text{Mod}(p-1,K)+1, \text{Ceiling}(p/K), \text{Mod}(r-1,K)+1, \text{Ceiling}(r/N)} = t_{pr}$$

$$1 \le p \le JK, 1 \le r \le MN$$

Thus, because of the transformational equivalence between $$q_{jk} = \sum_{m=1}^{M} \sum_{n=1}^{N} t_{jkmn} s_{mn} \text{ (Matrix-Tensor equation)}$$

and $$q_p = \sum_{p=1}^{M*N} t_{pr} s_r \text{ (Vector-Matrix equation)}$$

for the same (but re-indexed) variables, this allows one to exactly represent the matrix-tensor equation $$Q = \mathbb{T} S$$

as an equivalent vector-matrix equation $$q = Ts$$

More generally, the index serialization functions can be arbitrary as long as they are one-to-one and onto over the full range and domain of the respective indices, and invertably map pairs of integers to single integers. For example they could be organized as a scan in other ways, or even follow fixed randomly-assigned mapping. In general one can write:

$$q_{jk} = \sum_{m=1}^{M}\sum_{n=1}^{N} t_{jkmn} s_{mn} \overset{\equiv}{\to} q_p = \sum_{p=1}^{M*N} t_{pr} s_r$$

and $$q_p = \sum_{p=1}^{M*N} t_{pr} s_r \overset{\equiv}{\to} q_{jk} = \sum_{m=1}^{M}\sum_{n=1}^{N} t_{jkmn} s_{mn}$$

or more compactly $$Q = \mathbb{T} S \xrightarrow{\text{index serialization}} q = Ts$$

$$q = Ts \xrightarrow{\text{index vectorization}} Q = \mathbb{T} S$$

or more abstractly $$Q = \mathbb{T} S \xrightarrow{\text{Array Flatten}} q = Ts$$

$$q = Ts \xrightarrow{\text{Array Partition}} Q = \mathbb{T} S.$$

This is extremely valuable as it allows for matrix methods to solve inverse problems or implement transformations on images in terms of matrices. Of course matrix methods have been used in variables-separable image processing for decades employing various ad hoc constructions. Those ad hoc constructions could be formalized with the aforedescribed 4-tensor representation should one be interested in the exercises, but more importantly the computation of the aforedescribed 4-tensor representation and the formal isomorphic equivalence between 4-tensor linear transformations mapping matrices (representing images) to matrices (representing images) and matrix transformations mapping vectors to vectors allows clarity and methodology to complicated non-variables-separable linear imaging transformations, inverses, pseudo-inverses, etc. Also importantly the aforedescribed 4-tensor representation readily extends to mappings among tensors as may be useful in color, multiple-wavelength, tomographic, spatial-data, and many other settings and applications.

Additionally, as an aside: the aforedescribed 4-tensor representation naturally defines eigenvalue/eigenmatrix and eigenvalue/eigentensor problems; for example the eigenvalue/eigenmatrix problem $$\mathbb{T} Z_i = \lambda_i Z_i \quad 1 \le i \le JK$$

for $\mathbb{T}$ a $J \times K \times J \times K$ 4-tensor, the collection of indexed scalars $\{\lambda_i\}$ $1 \le i \le JK$ the scalar eigenvalues, and the collection of indexed matrices $\{Z_i\}$ $1 \le i \le JK$ the eigenmatrices is equivalent to the eigenvalue/eigenvector problem $$Tz_i = \lambda_i z_i \quad 1 \le i \le JK$$

via $$\mathbb{T} \xrightarrow{\text{Array Flatten}} T;\; Z_i \xrightarrow{\text{Array Flatten}} z_i$$

for calculation and analysis and transformed back via $$T \xrightarrow{\text{Array Partition}} \mathbb{T};\; z_i \xrightarrow{\text{Array Partition}} Z_i$$

These general process can be order-extended and further generalized to similarly transform eigenvalue/eigentensor problems into equivalent eigenvalue/eigenvector problems, and extended further in various ways to replace the eigenvalue scalars with an "eigenvalue array."

As and additional aside, these same and similar approaches employing $$T \xrightarrow{\text{Array Partition}} \mathbb{T};\; z_i \xrightarrow{\text{Array Partition}} Z_i$$

$$\mathbb{T} \xrightarrow{\text{Array Flatten}} T;\; Z_i \xrightarrow{\text{Array Flatten}} z_i$$

and other combined or more generalized reorganization methods $$\mathbb{T} \xrightarrow{\text{Tensor Index Serialization, IndexVectorization, IndexReorganization}} \mathbb{V}$$

can be order-extended and further generalized to similarly transform the vast understanding, rules, bases, transformations, vector spaces, spaces of matrices, properties of matrices, and matrix-vector equations into a wide range of tensor understandings, tensor rules, tensor bases, tensor transformations, and properties of tensors, spaces of tensors, and tensor-matrix and tensor-tensor equations.

Attention is next directed to inversion and then to image formation, and then after first developing and using extensions of the aforedescribed 4-tensor representation to mappings among tensors) expanding these to color/multiple-wavelength imaging applications.

Inverse of a 4-Tensor

Accordingly, for $$Q = \mathbb{T} S \text{ with } M=J, N=K,$$

if all the represented individual equations are linearly independent and of full rank, then the matrix T defined by $$\mathbb{T} \xrightarrow{\text{Array Flatten}} T;\; T \xrightarrow{\text{Array Partition}} \mathbb{T}$$

is invertible and the pixel values of the source image S can be obtained from the pixel values of the measurement Q by simply inverting the matrix T:

$$s = T^{-1} q$$

where the corresponding "flattening" and "partitioning" index transformations are employed among the matrices and vectors $$S \xrightarrow{\text{Array Flatten}} s;\; s \xrightarrow{\text{Array Partition}} S$$

$$Q \xrightarrow{\text{Array Flatten}} q;\; q \xrightarrow{\text{Array Partition}} Q.$$

Further, the pixel values of the source image S can be obtained from the pixel values of the measurement Q by simply inverting the matrix T to obtain $T^{-1}$, multiplying the flattened measurement data q with $T^{-1}$ to obtain the vector s, and partitioning the result into the source (image) matrix S:

$$Q \xrightarrow{\text{Array Flatten}} q \xrightarrow{T^{-1}q} s \xrightarrow{\text{Array Partition}} S$$

It is noted that effectively the column vectors of the matrix T serve as the natural linearly-independent spanning basis of the composite sensor and optical arrangement corresponding to a particular positioning situation. The natural linearly-independent spanning basis is not necessarily orthogonal, although it can of course be orthogonalized if useful using Gram-Schmitt of other methods. Additionally, the natural linearly-independent spanning basis can be transformed into other coordinate systems defined by other basis functions should that be useful. Such transformations can include the effects of discrete Fourier transforms, wavelet transforms, Walsh/Hadamard transforms, geometric rotations and scaling transforms, etc.

The simple approach employing $T^{-1}$ reconstructs the image by simply reproducing individual columns of an identity matrix, more precisely a diagonal matrix whose non-zero diagonal elements represent the light amplitude at a particular pixel. The invention provides for the replacement of this simple approach with other methods fitting into the same structure or delivering the same effect; for example projection techniques, matched filters, generalized inverses, SVD operations, sparse matrix operations, etc. These can be formatted in Tensor or matrix paradigms in view of the formal transformational tensor/matrix isomorphism established above. An example of this, namely the pseudo inverse case of a generalized inverse operation.

It is noted that the matrix T can become quite large, making inversion and subsequent operations described above numerically and computationally challenging. The invention provides for separating matrix T operations into smaller blocks (for example JPEG and MPEG regularly employ 8×8 and 16×16 blocks). The invention provides for these blocks to be non-overlapping, to overlap, and to be interleaved. The invention further provides for blocked inversion results involving overlapping blocks or interleaving blocks to be combined by linear or other operations to suppress block-boundary artifacts.

Pseudo-Inverse of a 4-Tensor

Further, because in image capture a system usually spatially quantizes natural source image without a pixel structure, it is additional possible to measure a larger number of pixels than will be used in the final delivered image, that is M<J and N<K.

In traditional image processing such an excess-measurement scheme can be used in various "oversampling" methods, or could be decimated via resampling. Instead of these, the excess measurements can be used to create an over-specified system of equations that provides other opportunities. For example, the resulting over-specified matrix T can be used to generate a generalized inverse $T^+$.

For example, if the 4-tensor $\mathbb{T}$ represents a transformation of a 2-dimensional (monochromatic) "source image" represented as an M×N matrix of "brightness" values:

$$S = \begin{bmatrix} s_{11} & \cdots & s_{1N} \\ \vdots & & \vdots \\ s_{M1} & \cdots & s_{MN} \end{bmatrix}$$

to a J×K array of measured 2-dimensional (monochromatic) image data represented as a J×K matrix of "brightness" values:

$$Q = \begin{bmatrix} q_{11} & \cdots & q_{1K} \\ \vdots & & \vdots \\ q_{J1} & \cdots & q_{JK} \end{bmatrix}$$

with $M < J, N < K$, via $$q_{jk} = \sum_{m=1}^{M} \sum_{n=1}^{N} t_{jkmn} s_{mn}$$

$$1 \le j \le J, 1 \le k \le K.$$

represented as $$Q = \mathbb{T} S$$

then a pseudo-inverse tensor $\mathbb{T}^+$ can be defined via:

$$\mathbb{T} \xrightarrow{\text{Array Flatten}} T \xrightarrow{\text{Pseudo-Inverse Formulation}} T^+ \xrightarrow{\text{Array Partition}} \mathbb{T}^+$$

and represented as $$S = \mathbb{T}^+ Q$$

Further, the pixel values of the source image S can be obtained from the pixel values of the measurement Q by forming the pseudo-inverse of the matrix T, multiplying the flattened measurement data q with $T^+$ to obtain the vector s, and partitioning the result into the source (image) matrix S:

$$Q \xrightarrow{\text{Array Flatten}} q \xrightarrow{T^+ q} s \xrightarrow{\text{Array Partition}} S$$

There are a number of pseudo-inverses and related singular-value decomposition operators, but of these it can be advantageous for the optical imaging methods to be described for the generalized inverse $T^+$ to be specifically the "Moore-Penrose" generalized (left) inverse defined (when a matrix T has all linearly-independent columns) using the matrix transpose $T^T$ or conjugate transpose $T^\dagger$ of T and matrix inverse operations as:

$$T^+ = (T^T T)^{-1} T^T \text{ for real-valued } T$$

$$T^+ = (T^\dagger T)^{-1} T^\dagger \text{ for complex-valued } T$$

(There is also Moore-Penrose generalized "right" inverse defined when a matrix T has all linearly-independent rows.) The Moore-Penrose generalized inverse inherently provides a "Least-Squares" statistical fit where solvable subsets of the larger number of equations give different inconsistent solutions. This "Least-Squares" statistical fit can provide robustness to the imaging system, for example in the case where one or more sensor elements degrade, are damaged, are occulted by dirt, are occulted by objects, are altered by transparent or translucent droplets or deposits, etc.

Using the Moore-Penrose generalized inverse for real-valued pixel quantities, the pixel values of the source image S can be obtained from the pixel values of the measurement Q by forming the pseudo-inverse of the matrix T, multiplying the flattened measurement data q with $T^+$ to obtain the vector s, and partitioning the result into the source (image) matrix S:

$$Q \xrightarrow{\text{Array Flatten}} q \xrightarrow{(T^TT)^{-1}T^Tq} s \xrightarrow{\text{Array Partition}} S$$

Configurations for Applications

Drawing on the functionality described above and taught in the Inventor's related lensless imaging patent filings listed at the beginning of this application, a wide range of additional provisions and configurations can be provided so as to support of vast number of valuable and perhaps slightly revolutionary imaging applications.

In an example generalizing assessment, the invention provides for a rigid or flexible surface to be configured to implement a lensless light-field sensor, producing electrical signals that can be used in real time, or stored and later retrieved, and provided to a computational inverse model algorithm executing on computational hardware comprising one or more computing elements so as to implement a lensless light-field camera.

In another aspect of the invention, a rigid surface is configured to additionally function as a housing and thus operate as a "seeing housing".

In another aspect of the invention, a rigid surface is configured to additionally function as a protective plate and thus operate as a "seeing armor".

In another aspect of the invention, a rigid surface is configured to additionally function as an attachable tile and thus operate as a "seeing tile".

In another aspect of the invention, a rigid surface is configured to additionally function as an attachable film and thus operate as a "seeing film".

In another aspect of the invention, a flexible surface is configured to additionally function as an attachable film and thus operate as a "seeing film".

In another aspect of the invention, a flexible surface is configured to additionally function as a garment and thus operate as a "seeing garment".

In another aspect of the invention, a flexible surface is configured to additionally function as a shroud and thus operate as a "seeing shroud".

In another aspect of the invention, a flexible surface is configured to additionally function as an enveloping skin and thus operate as a "seeing skin".

In another aspect of the invention, the rigid or flexible surface is small in size.

In another aspect of the invention, the rigid or flexible surface is large in size.

In another aspect of the invention, the rigid or flexible surface is flat.

In another aspect of the invention, the rigid or flexible surface is curved.

In another aspect of the invention, the rigid or flexible surface is rendered as a polytope.

In another aspect of the invention, the rigid or flexible surface is rendered as a dome.

In another aspect of the invention, the rigid or flexible surface is rendered as a part of a sphere.

In another aspect of the invention, the rigid or flexible surface is rendered as a part of a spheroid.

In another aspect of the invention, the rigid or flexible surface is rendered as a sphere.

In another aspect of the invention, the rigid or flexible surface is rendered as a spheroid.

In another aspect of the invention, the rigid or flexible surface is transparent.

In another aspect of the invention, the rigid or flexible surface is translucent.

In another aspect of the invention, the rigid or flexible surface is opaque.

In another aspect of the invention, the rigid or flexible surface performs contact sensing.

In another aspect of the invention, the rigid or flexible surface is configured to perform contact image sensing with near-zero separation distance.

In another aspect of the invention, the rigid or flexible surface is configured to perform contact image sensing with zero separation distance.

In another aspect of the invention, the rigid or flexible surface performs distributed optical imaging.

In another aspect of the invention, the rigid or flexible surface performs distributed optical sensing.

In another aspect of the invention, the rigid or flexible surface performs image sensing of ultraviolet light.

In another aspect of the invention, the rigid or flexible surface performs image sensing of infrared light.

In another aspect of the invention, the rigid or flexible surface performs image sensing of selected ranges of visible color light.

In another aspect of the invention, the rigid or flexible surface performs imaging.

In another aspect of the invention, the rigid or flexible surface performs distributed chemical sensing employing optical chemical sensing properties of at least one material.

In another aspect of the invention, the rigid or flexible surface performs distributed radiation sensing employing optical radiation sensing properties of at least one material.

In another aspect of the invention, the rigid or flexible surface performs distributed magnetic field sensing employing optical magnetic field sensing properties of at least one material.

In another aspect of the invention, the rigid or flexible surface is configured to emit light.

In another aspect of the invention, the rigid or flexible surface is configured to operate as a light-emitting display.

In another aspect of the invention, the rigid or flexible surface is configured to operate as a selectively self-illuminating contact imaging sensor.

In another aspect of the invention, the computational inverse model algorithm is configured to provide variable focusing.

In another aspect of the invention, the computational inverse model algorithm is configured to mixed depth-of-field focusing.

In another aspect of the invention, the computational inverse model algorithm is configured to implement a viewpoint with a controllable location.

In another aspect of the invention, the computational inverse model algorithm is configured to implement a plurality of viewpoints, each viewpoint having a separately controllable location.

In another aspect of the invention, the computational inverse model algorithm is configured to provide pairs of outputs so as to function as a stereoscopic camera.

In another aspect of the invention, the computational inverse model algorithm is configured to capture a panoramic view.

In another aspect of the invention, the computational inverse model algorithm is configured to capture a 360-degree view.

In another aspect of the invention, the computational inverse model algorithm is configured to capture a partial spherical view.

In another aspect of the invention, the computational inverse model algorithm is configured to capture a full spherical view.

In another aspect of the invention, the rigid or flexible surface is configured to perform enveloping image sensing with near-zero separation distance.

In another aspect of the invention, the rigid or flexible surface is configured to perform contact enveloping sensing with zero separation distance.

In another aspect of the invention, the rigid or flexible surface is configured to operate as a selectively self-illuminating enveloping imaging sensor.

In another aspect of the invention, the computational inverse model algorithm is configured to operate at slow-frame video rates.

In another aspect of the invention, the computational inverse model algorithm is configured to operate at conventional video rates.

In another aspect of the invention, the computational inverse model algorithm and computational hardware is configured to operate at high-speed video rates.

CLOSING

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

While the invention has been described in detail with reference to disclosed embodiments, various modifications within the scope of the invention will be apparent to those of ordinary skill in this technological field. It is to be appreciated that features described with respect to one embodiment typically can be applied to other embodiments.

The invention can be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

Although exemplary embodiments have been provided in detail, various changes, substitutions and alternations could be made thereto without departing from spirit and scope of the disclosed subject matter as defined by the appended claims. Variations described for the embodiments may be realized in any combination desirable for each particular application. Thus particular limitations and embodiment enhancements described herein, which may have particular advantages to a particular application, need not be used for all applications. Also, not all limitations need be implemented in methods, systems, and apparatuses including one or more concepts described with relation to the provided embodiments. Therefore, the invention properly is to be construed with reference to the claims.

CITED REFERENCES

Cited Books

[B1] D. J. Brady, *Optical Imaging and Spectroscopy*, Wiley, 2009, ISBN 978-0-470-04823-8.

[B2] J. R. Janesick, *Photon Transfer DN→λ*, SPIE Press, 2007, ISBN 978-0-819-6722-5.

[B3] A. J. Devaney, *Mathematical Foundations of Imaging, Tomography and Wavefield Inversion*, Cambridge University Press, 2012, ISBN 978-0-521-11974-0.

[B4] C. Zhang and T. Chen, *Light Field Sampling*, Morgan and Claypool, 2006, ISBN 978-1-598-29076-9.

[B5] O. Scherzer, M. Grasmair, H. Grossauer, M. Haltmeier, F. Lenzen, *Variational Methods in Imaging*, Springer, 2009, ISBN 978-0-387-30931-6.

[B6] M. Elad, *Sparse and Redundant Representations*, Springer, 2010, ISBN 978-1-4419-7010-4.

[B7] J. P. Dakin, R. G. W. Brown, eds. *Handbook of Optoelectronics Vol 1*, Taylor and Francis, 2012, ISBN 978-0-7503-0646-1.

[B8] H. Caulfied, "Holography Shadow Casting," in E. Camatini (ed.), *Progress in Electro-Optics: Reviews of Recent Developments*, NATO Advanced Study Institute, Series B (Physics), 1973/1975.

[B9] H. Yanai, K. Takeuchi, Y. Takane, *Projection Matrices, Generalized Inverse Matrices, and Singular Value Decomposition*, Springer, 2011, ISBN 978-1-4419-9886-6.

[B10] A. Bjerhammar, *Theory of Errors and Generalized Matrix Inverses*, Elsevier, 1973.

[B11] R. R. Roa, S. K. Mitra, *Generalized inverses of Matrices and its Applications*, Wiley, 1971, ISBN 0-471-70821-6.

[B12] C. W. Groetsch, *Generalized Inverses of Linear Operators—Representation and Approximation*, Marcel Dekker, Inc., 1977, ISBN 0824766156.

[B13] R. Piziak, P. L. Odell, *Matrix Theory—From Generalized Inverses to Jordan Form*, Chapman & Hall/CRC, 2007, ISBN 978-1-58488-625-0.

[B14] E. Chang, "The Generalized Inverse and Interpolation Theory," in *Recent Applications of Generalized Inverses*, S. L. Campbell (ed.), Pitman, 1982, ISBN 0-273-08550-6.

[B15] A. Albert, *Regression and the Moore-Penrose Pseudoinverse*, Academic Press, 1972, *Library of Congress No. 72-77337* (subsequently ISBN 0-120-48450-1).

[B16] J. Wagner D. Keszler, R. Presley, *Transparent Electronics*, Springer 2008, ISBN 978-0-378-72341-9.

[B17] A. Facchetti, T. Marks, eds., *Transparent Electronics—From Synthesis to Applications*, 2010, ISBN 978-0-470-99077-3.

[B18] R. Chaji, A. Nathan, *Thin Film Transistor Circuits and Systems*, Cambridge, 2013, ISBN 978-1-107-01233-2.

[B19] T. Tsujimura, *OLED Displays—Fundamentals and Applications*, Wiley, 2012, ISBN 978-1-118-14051-2.

[B20] G. Held, *Introduction to Light Emitting Diode Technology and Applications*, C R C, 2009, ISBN 978-1-4200-7662-2.

[B21] R. Shinar, J. Shinar (eds.), *Organic Electronics in Sensors and Biotechnology*, McGraw Hill, 2009, ISBN 978-0-07-159675-6, Chapter 6 and Section 5.5.

[B22] D. R. Gamota, P. Brazis, K. Kalyanasundaram, J. Zhang, *Printed Organic and Molecular Electronics*, Kluwer, 2004, ISBN 1-4020-7707-6.

[B23] E. Cantatore (ed.), *Applications of Organic and Printed Electronics—A Technology-Enabled Revolution*, Springer, 2013, ISBN 978-1-4614-3160-2.

[B24] A. E. Javier, *Solution-Processable Materials for Printable Electronics*, UMI/Proquest, 2010, ISBN: 978-1-1240-0854-7

[B25] Z. Cui, *Printed Electronics: Materials, Technologies and Applications*, Wiley, 2016, ISBN 978-1-1189-2092-3.

[B26] A. Facchetti, "Materials and Process Engineering for Printed and Flexible Optoelectronic Devices," in *Frontiers of Engineering: National Academy of Engineering, Reports on Leading-Edge Engineering from the 2013 Symposium,* National Academies Press, 2014, ISBN 978-0-309-29603-8, pp 113-125.

[B27] B. Gnade, N. Fruehauf, B. Chalamala, J. Jang, Jin (eds), *Flexible Electronics—Materials and Device Technology,* (Proceedings 769), Materials Research Society, 2003, ISBN 1558997067.

[B28] W. Wong, *Flexible Electronics: Materials and Applications*, Springer, 2009, ISBN 978-0-3877-4362-2.

[B29] S. Logothetidis, *Handbook of Flexible Organic Electronics*, Woodhead Publishing, 2014, ISBN 978-1-7824-2035-4.

[B30] M. Caironi, *Large Area and Flexible Electronics*, Wiley-VCH, 2015, ISBN 978-3-5273-3639-5.

[B31] G. Shen, *Flexible Electronics: From Materials to Devices*, World Scientific Publishing Co, 2015, ISBN 978-9-8146-5198-1.

[B32] F. Gardiner, *Polymer Electronics—A Flexible Technology*, Smithers Rapra Technology, 2009, ISBN 978-1-8473-5421-1.

Cited Articles, Presentations, and Technical Papers

[P1] A. Bjerhammar, "A Generalized Matrix Algebra", *N.R.C. Can. Div. Appl. Phys.*, Ottawa., 1957.

[P2] R. D. Jansen-van Vuuren, A. Armin, A. K. Pandey, P. L. Burn, P. Meredith, "Organic Photodiodes: The Future of Full Color Detection and Image Sensing," *Advanced Materials*, Vol 28, Issue 24, Jun. 22, 2016, pp. 4766-4802.

[P3] H. Wiman, "Improvement of Digital Image Resolution by Oversampling," *XVIIth ISPRS Congress—Technical Commission II: Systems for Data Processing and Analysis*, Aug. 2-14, 1992, Washington, D.C., USA, L. W. Fritz, J. R. Lucus (eds), in *ISPRS Archives—Volume XXIX Part B2*, 1992, International Society for Photogrammetry and Remote Sensing, 1993, pp. 323-327.

[P4] D. G. Stork, P. R. Gill. "Lensless Ultra-Miniature CMOS Computational Imagers and Sensors." *Proc. SENSORCOMM* (2013): 186-190.

[P5] M. S. Asif, et al. "Flatcam: Thin, Lensless Cameras Using Coded Aperture and Computation." *IEEE Transactions on Computational Imaging* (2017).

[P6] V. Boominathan, et al., "Lensless Imaging: A Computational Renaissance," *IEEE Signal Processing Magazine* 33(5), September 2016, pp. 23-35. Available at http://www.ece.rice.edu/~vb10/documents/2016/Lensless_Imaging_Computational_Renaissance.pdf

[P7] G. Williams, C. Backhouse, H. Aziz, "Integration of Organic Light Emitting Diodes and Organic Photodetectors for Lab-on-a-Chip-Detection Systems", *Electronics,* Vol 3, Feb. 13, 2014, pp. 43-75.

[P8] F. Krujatz, O. R. Hild, K. Fehse, et al. "Exploiting the Potential of OLED-Based Photo-Organic Sensors for Biotechnological Applications" *Chemical Sciences Journal*, Vol 7, Issue 3, Jul. 18, 2016.

[P9] M. Punke, S. Mozer, M. Stroisch, "Organic Semiconductor Devices for Micro-Optical Applications", *Proc of Spie*, Vol 6185, Apr. 3, 2006.

[P10] R. Bhattacharya, et al. "Organic LED Pixel Array on a Dome", *Proceedings of the IEEE*, Vol 93, Issue 7, Jul. 5, 2005, pp. 1273-1280.

[P11] D. L. Cade, "Hitachi's Lensless Camera Uses Moire and Math, Not Glass, to Take Photos", *Hitachi Press Release*, Nov. 16, 2016. Available at https://petapixel.com/2016/11/16/hitachis-lensless-camera-uses-moire-math-not-glass-take-photos/ as retrieved Jun. 20, 2017.

[P12] Hitachi, "Lensless-Camera Technology for Easily Adjusting Focus on Video Images after Image Capture", *Hitachi Press Release*, Nov. 15, 2016. Retrieved Jun. 20, 2017 from http://www.hitachi.com/New/cnews/month/2016/11/161115.html

[P13] Hitachi, "Technical Explanation of "Hitachi Lensless Camera"", *Hitachi,* Dec. 5, 2016 Retrieved Jun. 20, 2017 from https://physics.stackexchange.com/questions/296640/technical-explanation-of-hitachi-lensless-camera.

[P14] Hitachi, "Lensless Camera Technology for Adjusting Video Focus After Image Capture", *Hitachi Press Release*, Nov. 21, 2016. Retrieved Jun. 20, 2017 from https://phys.org/news/2016-11-lensless-camera-technology-adjusting-video.html

[P15] Sumito, "Organic Photodiodes", *Sumito Chemical Printed Electronics*, visited on Jun. 20, 2017. Retrieved Jun. 20, 2017 from https://www.sumitomo-chem.co.jp/printedelectronics/en/application/photodiodes.html.

[P16] Fraunhofer Research Institution for Organics, Materials And Electronic Devices, "Smart Optoelectronic Micro-Sensors By OLED-On-Silicon", *Fraunhofer Comedd.* Available at https://www.comedd.fraunhofer.de/content/dam/comedd/common/products/COM EDD/oledcmos-e.pdf retrieved Jun. 20, 2017.)

[P17] M. G. Han, K. B. Park, et al. "Narrow-Band Organic Photodiodes for High-Resolution Imaging", *Applied Materials & Interfaces*, Vol 8, Issue 39, Sep. 13, 2016, pp. 26143-26151.

[P18] W. Wang, F. Zhang, et al. "Highly Narrowband Photomultiplication Type Organic Photodetectors", *Nano Letters*, Vol 17, Issue 3, pp. 1995-2002, Feb. 6, 2017.

[P19] D. H. Kim, K. S. Kim, et al. "A High Performance Semitransparent Organic Photodetector with Green Color Selectivity" *Applied Physics Letter*, Vol 105, 2014.

[P20] R. Hany, "Transparent Organic Photodiodes", *EMPA*, Retrieved Jun. 20, 2017 from https://www.empa.ch/web/s209/organic-photodiodes.

[P21] F. Arca, *Organic Photodiodes for Industrial Sensing and Medical Imaging,* Dissertation, Technische Universität München Lehrstuhl für Nanoelektronik, Mar. 3, 2013. Retrieved Jun. 20, 2017 from https://mediatum.ub.tum.de/doc/1197763/458492.pdf

[P22] "Organic Photodiodes for Sensor Applications", *Fraunhofer Comedd*, May 14, 2014. Retrieved Jun. 20, 2017 from https://phys.org/news/2014-05-photodiodes-sensor-applications.html.

[P23] B. A. Katchman, J. T. Smith, et al. "Application of Flat Panel OLED Display Technology for the Point-of-Care Detection of Circulating Cancer Biomarkers", *Scientific Reports*, Vol 6, Article number: 29057, Jul. 4, 2016.

[P24] Y. Y. Noh, D. Y. Kim, "Organic Phototransistor Based on Pentacene as an Efficient Red Light Sensor" *Solid-State Electronics*, Vol 51, Issue 7, July 2007, pp. 1052-1055.

[P25] X. Liu, E. K. Lee, et al. "Flexible Organic Phototransistor Array with Enhanced Responsivity via Metal-Ligand Charge Transfer", "*Applied Materials & Interfaces*" Vol 8, Issue 11, Mar. 1, 2016, pp. 7291-7299.

[P26] H. W. Zan, S. C. Kao, S. R. Ouyang, "Pentacene-Based Organic Phototransistor with High Sensitivity to Weak Light and Wide Dynamic Range" *IEEE*, Vol 31, Issue 2, Jan. 19, 2010, pp. 135-137.

[P27] K. J. Baeg, M. Binda, "Organic Light Detectors: Photodiodes and Phototransistors", *Advanced Materials*, Volume 25, Issue 31, Aug. 21, 2013, Pages 4267-4295.

[P28] A. Koppelhuber, O. Bimber, "Towards a Transparent, Flexible, Scalable and Disposable Image Sensor Using Thin Film Luminescent Concentrators" *Optics Express*, Vol 21, Issue 4, 2013, pp. 4796-4810.

[P29] A. Pierre, A. Gaikwad, A. C. Arias, "Charge-integrating organic heterojunction phototransistors for wide-dynamic-range image sensors," *Nature Photonics* 11, 2017, pp. 193-199.

[P30] M. Ramuz, L. BUrgi, P. Seitz, "High sensitivity organic photodiodes with low dark currents and increased lifetimes," *Organic Electronics*, Vol. 9, Issue 3, June 2008, pp. 369-376.

[P31] A. Busboom, H. Elders-Boll, H. Schotten, "Uniformly Redundant Arrays," *Experimental Astronomy*, June 1998, Volume 8, Issue 2, pp. 97-123.

[P32] R. Marcia, Z. Harmany, R. Willett, "Compressive Coded Aperture Imaging," *Computational Imaging VII*, SPIE Proceedings Vol. 7246 (72460G), Feb. 3, 2009.

[P33] W. H. Richardson, "Design of an Ultrasensitive Active Pixel Sensor That Is Based on Silicon Nanostructures," *SPIE DSS Conference, Micro- and Nanotechnology Sensors, Systems, and Applications III*, Paper 8031-92, (May 2011).

[P34] M. Hirsch, *BiDi Screen: Depth and Lighting Aware Interaction and Display*, MS Thesis, MIT, Aug. 13, 2009 (Available at https://dam-prod.media.mit.edu/x/files/thesis/2009/mhirsch-ms.pdf as retrieved Jul. 2, 2017.)

[P35] M. Grosse, G. Wetzstein, A. Grundhoefer, O. Bimber, "Coded Aperture Projection," *ACM Transactions on Graphics* 29(3), Volume 29 Issue 2, March 2010; also *ACM SIGGRAPH*, Jul. 25-29, 2010. (Available at http://web.media.mit.edu/~gordonw/CodedApertureProjection/ as retrieved Jul. 2, 2017.)

[P36] T. Barribeau, "Shooting Full Panoramas Is Easy with Bendable Flexcam Camera," *Imaging Resource*, Aug. 19, 2013. (Available at http://www.imaging-resource.com/news/2013/08/19/Shooting-full-panoramas-is-easy-with-bendable-Flexcam-camera as retrieved Jul. 1, 2017.)

[P37] H. Evarts, "A Flexible Camera: A Radically Different Approach to Imaging" *Columbia Engineering*, Apr. 13, 2016 (Available at http://engineering.columbia.edu/flexible-camera-radically-different-approach-imaging as retrieved Jul. 1, 2017)

[P38] D. Sims, Y. Yue, S. Nayar, "Towards Flexible Sheet Cameras: Deformable Lens Arrays with Intrinsic Optical Adaptation," IEEE International Conference on Computational Photography (ICCP), May 2016. (Available at http://www.cs.columbia.edu/CAVE/projects/flexible_sheet_cameras/Sims_ICCP1 6.pdf as retrieved Jul. 1, 2017.))

[P39] R. Perkins, "Ultra-Thin Camera Creates Images Without Lenses," CalTech, Jun. 21, 2017. (Available at http://www.caltech.edu/news/ultra-thin-camera-creates-images-without-lenses-78731 as retrieved Jul. 2, 2017.)

[P40] R. Ng, M. Levoy, M. Bredif, G. Duval, M. Horowitz, P. Hanrahan, "Light Field Photography with a Hand-Held Plenoptic Camera," *Stanford University Computer Science Tech Report* CSTR 2005-02, 2005. (Available at https://graphics.stanford.edu/papers/lfcamera/lfcamera-150 dpi.pdf visited Jul. 2, 2017.)

[P41] R. Butler, "Lytro Light Field Camera first look with Ren Ng," *Digital Photography Review*, Oct. 19, 2011. (Available at https://www.dpreview.com/articles/7237351494/lytro-light-field-camera-first-look-with-ren-ng visited Jul. 2, 2017.)

[P42] V. Koifman, "Toshiba Announces Light Field Camera Module," *Image Sensors World*, Dec. 27, 2012. (Available http://image-sensors-world.blogspot.com/2012/12/toshiba-announces-light-field-camera.html as retrieved Jul. 2, 2017.)

[P43] LightField Forum, "New Light Field Tech to use Sensor Layers instead of Microlenses," *LightField Forum*, May 15, 2016. (Available at http://lightfield-forum.com/2016/03/new-light-field-tech-to-use-transparent-sensor-layers-instead-of-microlenses/ as retrieved Jul. 2, 2017.) [P44] W. Wang, "Optical Detectors," slide presentation (date unknown). Available at http://depts.washington.edu/mictech/optics/sensors/detector.pdf as retrieved Jul. 2, 2017.

[P45] E. Fenimore, "Coded Aperture Imaging: The Modulation Transfer Function for Uniformly Redundant Arrays," *Appl Opt* 19 (14), Jul. 15, 1980, pp. 2465-2471.

[P46] M. Levoy, "Light fields and computational imaging," *Computer*, vol. 39, no. 8, August 2006, pp. 46-55.

[P47] A. Zomet and S. K. Nayar, "Lensless imaging with a controllable aperture," in *IEEE Computer Society Conference on Computer Vision and Pattern Recognition*, vol. 1, 2006, pp. 339-346.

[P48] M. Duarte, M. Davenport, D. Takhar, J. Laska, T. Sun, K. Kelly, R. Baraniuk, "Single-Pixel Imaging via Compressive Sampling, *IEEE Signal Processing Magazine*, 2008, 25, pp. 83-91.

[P49] A. Nathan, A. Ahnood, M. Cole, "Flexible Electronics: The Next Ubiquitous Platform," *Proceedings of the IEEE*, Volume: 100, Issue: Special Centennial Issue, May 13, 2012, pp. 1486-1517.

[P50] Phys Org, "Researchers Achieve Major Breakthrough in Flexible Electronics," *Phys Org News*, Jan. 13, 2017, available at https://phys.org/news/2017-01-major-breakthrough-flexible-electronics.html retrieved Jul. 8, 2017.

[P51] Phys Org, "New Hybrid Inks for Printed, Flexible Electronics Without Sintering," *Phys Org News*, Apr. 10, 2017, available at https://phys.org/news/2017-04-hybrid-inks-flexible-electronics-sintering.html as retrieved Jul. 8, 2017.

[P52] Interuniversitair Micro-Electronica Centrum (IMEC), "Thin-film flexible electronics," Available at https://www.imec-int.com/en/thin-film-flexible-electronics retrieved Jul. 8, 2017.

[P53] A. Abouraddy, O. Shapira, M. Bayindir, J. Arnold, F. Sorin, D. Hinczewski, J. Joannopoulos, Y. Fink, "Large-scale optical-field measurements with geometric fibre constructs," *Nature Mat.* 5(7), 532-536 (2006).

[P54] T. Ng, W. Wong, M. Chabinyc, S. Sambandan, and R. Street, "Flexible image sensor array with bulk heterojunction organic photodiode," Appl. Phys. Lett. 92(21), 213303 (2008).

[P55] T. Hayes, "Flexible image sensors move nearer to market," Optics.org, Jul. 16, 2013, available at http://optics.org/news/4/7/22 as retrieved Jul. 9, 2017.

[P56] K. Chopra, S. Major, D. Pandya, "Transparent conductors—A Status Review," Thin Solid Films, Volume 102, Issue 1, Apr. 8, 1983, pp. 1-46.

[P57] F. Yu, S. Wu, X. Wang, G. Zhang, H. Luaband, L. Qiu, "Flexible and low-voltage organic phototransistors," RSC Advances 7(19), February 2017, pp. 11572-11577.

[P58] S. Garlapati, T. Baby, S. Dehm, M. Hammad, V. Chakravadhanula, R. Kruk, H. Hahn, S. Dasgupta, "Ink-Jet Printed CMOS Electronics from Oxide Semiconductors," Nano Micro Small, Volume 11, Issue 29, Aug. 5, 2015, pp. 3591-3596.

[P59] G. Huang, H. Jiang, K. Matthews, P. Wilford, "Lensless Imaging by Compressive Sensing," IEEE International Conference on Image Processing, ICIP 2013, Paper #2393, (Available at https://arxiv.org/abs/1305.7181 as retrieved Jul. 10, 2017.)

[P60] D. Thapaa, K. Raahemifarb, V. Lakshminarayanan, "Less is more: compressive sensing in optics and image science," Journal of Modern Optics, Vol. 62, No. 3, 2015, pp. 169-183.

[P61] Erickson, Evan L., et al. "Miniature lensless computational infrared imager." Electronic Imaging 2016.12 (2016): 1-4.

[P62] R. H. Dicke, "Scatter-Hole Cameras for X-Rays and Gamma Rays," Astrophys. J. 153, L101 (1968).

[P63] E. Fenimore and T. Cannon, "Coded Aperture Imaging with Uniformly Redundant Arrays," Appl. Opt. 17, 337 (1978).

[P64] E. Fenimore, 'Coded aperture imaging: predicted performance of uniformly redundant arrays." Applied Optics 17.22 (1978): 3562-3570.

[P65] S. Gottesman, "Coded Apertures: Past, Present, and Future Application and Design." Optical Engineering Applications. International Society for Optics and Photonics, 2007.

[P66] C. Zhou, S. Nayar, "Computational cameras: Convergence of Optics and Processing." IEEE Transactions on Image Processing 20.12 (2011): 3322-3340.

[P67] A. Veeraraghavan, et al., "Dappled photography: Mask enhanced cameras for heterodyned light fields and coded aperture refocusing." ACM Trans. Graph. 26.3 (2007): 69.

[P68] A. Levin, et al., "Image and depth from a conventional camera with a coded aperture." ACM transactions on graphics (TOG) 26.3 (2007): 70

[P69] H. Jiang, G. Huang, P. Wilford, "Multi-view in lensless compressive imaging," APSIPA Transactions on Signal and Information Processing, 3. (2014) doi: 10.1017/ATSIP.2014.16

[P70] G. Kim, et al. "Lensless Photography with only an image sensor," arXiv preprint arXiv:1702.06619 (2017).

[P71] X. Yuan, et al., "Lensless compressive imaging," arXiv preprint arXiv:1508.03498 (2015).

[P72] Yuan, Xin, et al. Block-wise Lensless Compressive Camera," arXiv preprint arXiv:1701.05412 (2017).

[P73] O. Cossairt, M. Gupta, S. Nayar, "When Does Computational Imaging Improve Performance?" IEEE Transactions on Image Processing 22.2 (2013): 447-458.

[P74] Pierre, Adrien, et al., "High Detectivity All-Printed Organic Photodiodes." Advanced Materials 27.41 2015, pp. 6411-6417.

[P75] Someya, Takao, et al. "Integration of Organic FETs with Organic Photodiodes for a Large Area, Flexible, and Lightweight Sheet Image Scanners." IEEE Transactions on Electron Devices, 52.11 2005, pp. 2502-2511.

What is claimed is:

1. A lensless light-field imaging system, comprising:
an array of light sensing elements, each light-sensing element comprising a light-sensing area and each light-sensing element configured to generate an electrical photocurrent responsive to an amplitude of incoming light striking a light-sensing surface, each light-sensing surface arranged to experience angularly-varying sensitivity responsive to a direction of each path of the incoming light striking the light-sensing surface;
electronics configured to interface the array of light sensing elements and further configured to provide a plurality of electronically-represented digital numbers, each digital number responsive to light received by at least one light-sensing element in the array of light sensing elements, producing a result comprising a plurality of electronically-represented digital numbers;
an algorithm configured to execute on a computational processor, the algorithm for computing a two-dimensional image representation from the plurality of electronically-represented digital numbers, the two-dimensional image representation corresponding to portion of a focused image at a separation distance value measured perpendicular to the light-sensing surface of the one of the light sensing elements in the array of light sensing elements, there being a plurality of separation distance values,
wherein each of the electronically-represented digital numbers are responsive to the amplitude of incoming light striking the light-sensing surface of an associated light sensing element in the array of light sensing elements and a plurality of focused image portions, and
wherein the plurality of separation distance values are not a substantially same numeric value.

2. The lensless light-field imaging system of claim 1, wherein the light sensing elements of the array of light sensing elements are oriented in space to form a curved surface.

3. The lensless light-field imaging system of claim 1, wherein spatial positions of the plurality of focused image portions form a planar surface.

4. The lensless light-field imaging system of claim 1, wherein the light sensing elements of the array of light sensing elements are oriented in space to form a planar surface.

5. The lensless light-field imaging system of claim 1, wherein spatial positions of the plurality of focused image portions form a curved surface.

6. The lensless light-field imaging system of claim 1, wherein the light sensing elements of the array of light sensing elements are oriented in space to form a first curved surface and spatial positions of the plurality of focused image portions form a second curved surface.

7. The lensless light-field imaging system of claim 1, wherein the algorithm is controlled by at least one separation distance parameter.

8. The lensless light-field imaging system of claim 1, wherein the light sensing elements comprise organic semiconductors.

9. The lensless light-field imaging system of claim 1, wherein the light sensing elements comprise semiconductors that are co-optimized for both light emission and light sensing.

10. The lensless light-field imaging system of claim 1, wherein the light sensing elements are arranged to emit light for an interval of time.

11. The lensless light-field imaging system of claim 1, wherein the angularly-varying sensitivity of the light sensing elements results at least in part from a structure of the light sensing elements.

12. The lensless light-field imaging system of claim 1, wherein the angularly-varying sensitivity of the light sensing elements results at least in part from a structure attached to the array of light sensing elements.

13. The lensless light-field imaging system of claim 12, wherein the structure attached to the array of light sensing elements comprises segregated optical paths.

14. The lensless light-field imaging system of claim 13, wherein the segregated optical paths are created by separating surfaces.

15. The lensless light-field imaging system of claim 13, wherein the separating surfaces are at least partially-reflective.

16. The lensless light-field imaging system of claim 13, wherein at least one of the light sensing elements is color selective.

17. The lensless light-field imaging system of claim 13, wherein a color selective property results from a band gap property of a semiconductor device element comprised by the at least one of the light sensing elements.

18. The lensless light-field imaging system of claim 1, wherein the algorithm comprises array multiplication of numerical values obtained from calculation of a generalized inverse matrix.

19. The lensless light-field imaging system of claim 1, wherein the algorithm comprises array multiplication of numerical values obtained from an interpolation.

20. The lensless light-field imaging system of claim 1, wherein the algorithm comprises array multiplication of numerical values obtained from a predictive analytical model.

21. The lensless light-field imaging system of claim 1, wherein the algorithm comprises array multiplication of numerical values derived from a predictive analytical model.

22. The lensless light-field imaging system of claim 1, wherein the algorithm comprises array multiplication of numerical values derived from empirical measurements.

* * * * *